(12) United States Patent
Mills

(10) Patent No.: US 12,732,131 B2
(45) Date of Patent: Sep. 8, 2026

(54) PHOTOVOLTAIC POWER GENERATION SYSTEMS AND METHODS REGARDING SAME

(71) Applicant: Brilliant Light Power, Inc., Newtown, PA (US)

(72) Inventor: Randell L. Mills, Newtown, PA (US)

(73) Assignee: Brilliant Light Power, Inc., Newtown, PA (US)

( * ) Notice: Subject to any disclaimer, the term of this patent is extended or adjusted under 35 U.S.C. 154(b) by 0 days.

(21) Appl. No.: 15/123,292

(22) PCT Filed: Apr. 1, 2014

(86) PCT No.: PCT/US2014/032584
§ 371 (c)(1),
(2) Date: Sep. 2, 2016

(87) PCT Pub. No.: WO2015/134047
PCT Pub. Date: Sep. 11, 2015

(65) Prior Publication Data

US 2017/0070180 A1 Mar. 9, 2017

Related U.S. Application Data

(60) Provisional application No. 61/972,807, filed on Mar. 31, 2014, provisional application No. 61/968,839,
(Continued)

(51) Int. Cl.
*H02S 10/10* (2014.01)
*C25B 1/04* (2021.01)
(Continued)

(52) U.S. Cl.
CPC ................ *H02S 10/10* (2014.12); *C25B 1/04* (2013.01); *G21H 1/12* (2013.01);
(Continued)

(58) Field of Classification Search
None
See application file for complete search history.

(56) References Cited

U.S. PATENT DOCUMENTS 9,116,537 B2 * 8/2015 Celanovic ................ G05F 1/67
9,994,450 B2 * 6/2018 Coyle ...................... B01J 4/002
(Continued)

FOREIGN PATENT DOCUMENTS

DE 202008006451 U1 * 9/2008 ............ H02S 10/30
JP 2004202420 A * 7/2004
(Continued)

OTHER PUBLICATIONS

U.S. Appl. No. 12/153,613 Non-Final Rejection of Feb. 28, 2011 (Year: 2011).*
(Continued)

*Primary Examiner* — Ryan S Cannon
(74) *Attorney, Agent, or Firm* — Jonathan D. Ball; Scott Goncher; Greenberg Traurig, LLP

(57) ABSTRACT

A solid fuel power source that provides at least one of electrical and thermal power comprising (i) at least one reaction, cell for the catalysis of atomic hydrogen to form hydrinos, (ii) a chemical fuel mixture comprising at least two components chosen from: a source of $H_2O$ catalyst or $H_2O$ catalyst; a source of atomic hydrogen or atomic hydrogen; reactants to form the source of $H_2O$ catalyst or $H_2O$ catalyst and a source of atomic hydrogen or atomic hydrogen; one or more reactants to initiate the catalysis of atomic hydrogen; and a material to cause the fuel to be highly conductive, (iii) at least one set of electrodes that confine the fuel and an electrical power source that provides a short burst of low-voltage, high-current electrical energy to initiate rapid kinetics of the hydrino reaction and an energy gain due to forming hydrinos, (iv) a product recovery systems such as a vapor condenser, (v) a reloading system, (vi) at
(Continued)

least one of hydration, thermal, chemical, and electrochemical systems to regenerate the fuel from the reaction products, (vii) a heat sink that accepts the heat from the power-producing reactions, (viii) a photovoltaic power converter comprising at least one of a concentrated solar power device, and at least one triple-junction photovoltaic cell, monocrystalline cell, polycrystalline cell, amorphous cell, string/ribbon silicon cell, multi-junction cell, homojunction cell, heterojunction cell, p-i-n device, thin-film cells, dye-sensitized cell, and an organic photovoltaic cell, and an antireflection coating, an optical impedance matching coating, and a protective coating.

11 Claims, 39 Drawing Sheets

Related U.S. Application Data filed on Mar. 21, 2014, provisional application No. 61/949,271, filed on Mar. 7, 2014, provisional application No. 61/947,019, filed on Mar. 3, 2014.

(51) Int. Cl.

| | |
|---|---|
| ***G21H 1/12*** | (2006.01) |
| ***H01J 37/32*** | (2006.01) |
| ***H02S 40/22*** | (2014.01) |
| ***H02S 40/32*** | (2014.01) |
| ***H02S 40/38*** | (2014.01) |
| ***H10F 10/161*** | (2025.01) |

(52) U.S. Cl.

CPC ........ *H01J 37/32009* (2013.01); *H02S 40/22* (2014.12); *H02S 40/32* (2014.12); *H02S 40/38* (2014.12); *H10F 10/161* (2025.01); *H01M 2250/402* (2013.01); *Y02B 90/10* (2013.01); *Y02E 10/52* (2013.01); *Y02E 10/542* (2013.01); *Y02E 60/32* (2013.01); *Y02E 60/36* (2013.01); *Y02P 20/133* (2015.11)

(56) References Cited

U.S. PATENT DOCUMENTS

| | | | | |
|---|---|---|---|---|
| 10,443,139 | B2 | 10/2019 | Mills | |
| 10,753,275 | B2 | 8/2020 | Mills | |
| 2005/0120715 | A1 | 6/2005 | Labrador | |
| 2009/0038958 | A1 | 2/2009 | Coyle | |
| 2009/0196801 | A1 | 8/2009 | Mills | |
| 2009/0226774 | A1* | 9/2009 | Friscia | H01M 8/186 429/532 |
| 2011/0305961 | A1* | 12/2011 | Gladkov | F23G 7/061 429/417 |
| 2016/0290223 | A1 | 10/2016 | Mills | |
| 2017/0104426 | A1 | 4/2017 | MIlls | |
| 2018/0159459 | A1 | 6/2018 | Mills | |
| 2019/0372449 | A1 | 12/2019 | Mills | |
| 2020/0002828 | A1 | 1/2020 | MIlls | |
| 2020/0366180 | A1 | 11/2020 | Mills | |
| 2020/0403555 | A1 | 12/2020 | Mills | |

FOREIGN PATENT DOCUMENTS

| | | | | |
|---|---|---|---|---|
| WO | 9642085 | A2 | 5/1996 | |
| WO | WO-2008098044 | A2 * | 8/2008 | C25B 1/04 |
| WO | 2015075566 | A1 | 5/2015 | |
| WO | 2015184252 | A1 | 12/2015 | |
| WO | 2016182605 | A1 | 11/2016 | |
| WO | 2017127447 | A1 | 7/2017 | |
| WO | 2017210204 | A1 | 12/2017 | |
| WO | 2018203953 | A1 | 11/2018 | |
| WO | 2018222569 | A1 | 12/2018 | |

OTHER PUBLICATIONS

L. Pauling and E. B. Wilson, "Introduction Quantum Mechanics With Applications to Chemistry", Dover Publications, Inc., New York (Year: 1985).*

H. A. Haus, "On the radiation from point charges", American Journal of Physics 54, p. 1126-1129 (Year: 1986).*

Mills, R. L., "The Grand Unified Theory of Classical Physics", vol. 1: Atomic Physics [posted at http://www.blacklightpower.com/theory/bookdownload.shtml] (Year: 2011).*

H. A. Bethe, E. E. Saltpeter, "Quantum Mechanics of One- and Two-Electron Atoms", Plenum Publishing Corporation, New York (Year: 1977).*

R. P. Feynman, R. B. Leighton, M. Sands, "The Feynman Lectures on Physics: Quantum Mechanics", Addison-Wesley Publishing Company, Reading Massachusetts (Year: 1964).*

P. M. Morse, H. Feshbach, "Methods of Theoretical Physics, Part I: Chapters 1 to 8", McGraw-Hill Book Company, New York (Year: 1953).*

Ira N. Levine, "Quantum Chemistry, Fifth Edition", Prentice-Hall, Upper Saddle River, New Jersey, p. 134-141 (Year: 2000).*

Definition of "plasma" [retrieved from https://en.wikipedia.org/wiki/Plasma_(physics) on Mar. 15, 2023]. (Year: 2023).*

Machine translation of JP2004202420A (Year: 2004).*

Machine translation of DE202008006451Ua (Year: 2008).*

Booker R. et al., "Report on the Power Output of a Solid Pellet Water Bath Calorimeter, Light Power Output of a Solid Pellet, and Suncell Output Power at Brilliant Light Power," UNC Asheville, Department of Physics. 2016. p. 1-44.

Fu et al., "New opportunities for nuclear and atomic physics on the femto- to nanometer scale with ultra-high-intensity lasers," Matter Radiat. Extremes 7, 024201 (2022).

Hagen et al, "Electron paramagnetic resonance proof for the existence of molecular hydrino," International Journal of Hydrogen Energy, vol. 7 (2022) p. 23751-23761.

Mills et al., "Hydrino States of Hydrogen," p. 1-127.

Phillips et al., "Evidence of catalytic production of hot atomic hydrogen in RF generated hydrogen/helium plasmas," International Journal of Hydrogen Energy, vol. 33 (2008) p. 7185-7196.

Va'vra J., A new way to explain the 511 keV signal from the center of the Galaxy and its possible consequences, p. 1-10. 2018.

A Rathke, "A critical analysis of the hydrino model," New Journal of Physics, 7 (2005): 127.

Mills et al., "Catalyst Induced Hydrino Transition (CIHT) electrochemical cell" Int. J of Energy Res 38 (2014):1741-1765.

Wang, "Move over Rossi. Blacklight Power is claiming megawatts from their super-controversial hydrino process and devices" http://Nextbigfuture.com2014/01/move-over-rossi-blacklight-power-is.html.

* cited by examiner 452
454

452
454

452
454

452
454

PHOTOVOLTAIC POWER GENERATION SYSTEMS AND METHODS REGARDING SAME

CROSS-REFERENCES TO RELATED APPLICATIONS

This application is a national stage filing under 35 U.S.C. § 371 of International Application No. PCT/US2014/032584 and claims the benefit of priority of U.S. Provisional Application Nos. 61/947,019, filed Mar. 3, 2014; 61/949,271, filed Mar. 7, 2014; 61/968,839, filed Mar. 21, 2014; and 61/972,807, filed Mar. 31, 2014, all of which are herein incorporated by reference in their entirety.

The present disclosure relates to the field of power generation and, in particular, to systems, devices, and methods for the generation of power. More specifically, embodiments of the present disclosure are directed to power generation devices and systems, as well as related methods, which produce optical power, plasma, and thermal power and produces electrical power via an optical to electric power converter, plasma to electric power converter, photon to electric power converter, or a thermal to electric power converter. In addition, embodiments of the present disclosure describe systems, devices, and methods that use the ignition of a water or water-based fuel source to generate optical power, mechanical power, electrical power, and/or thermal power using photovoltaic power converters. These and other related embodiments are described in detail in the present disclosure.

Power generation can take many forms, harnessing the power from plasma. Successful commercialization of plasma may depend on power generation systems capable of efficiently forming plasma and then capturing the power of the plasma produced.

Plasma may be formed during ignition of certain fuels. These fuels can include water or water-based fuel source. During ignition, a plasma cloud of electron-stripped atoms is formed, and high optical power may be released. The high optical power of the plasma can be harnessed by an electric converter of the present disclosure. The ions and excited state atoms can recombine and undergo electronic relaxation to emit optical power. The optical power can be converted to electricity with photovoltaics.

Certain embodiments of the present disclosure are directed to a power generation system comprising: a plurality of electrodes configured to deliver power to a fuel to ignite the fuel and produce a plasma; a source of electrical power configured to deliver electrical energy to the plurality of electrodes; and at least one photovoltaic power converter positioned to receive at least a plurality of plasma photons.

In one embodiment, the present disclosure is directed to a power system that generates at least one of direct electrical energy and thermal energy comprising:

at least one vessel;

reactants comprising:

a) at least one source of catalyst or a catalyst comprising nascent $H_2O$;

b) at least one source of atomic hydrogen or atomic hydrogen;

c) at least one of a conductor and a conductive matrix; and at least one set of electrodes to confine the hydrino reactants, a source of electrical power to deliver a short burst of high-current electrical energy;

a reloading system;

at least one system to regenerate the initial reactants from the reaction products, and at least one plasma dynamic converter or at least one photovoltaic converter.

In one exemplary embodiment, a method of producing electrical power may comprise supplying a fuel to a region between a plurality of electrodes; energizing the plurality of electrodes to ignite the fuel to form a plasma; converting a plurality of plasma photons into electrical power with a photovoltaic power converter; and outputting at least a portion of the electrical power.

In another exemplary embodiment, a method of producing electrical power may comprise supplying a fuel to a region between a plurality of electrodes; energizing the plurality of electrodes to ignite the fuel to form a plasma; converting a plurality of plasma photons into thermal power with a photovoltaic power converter; and outputting at least a portion of the electrical power.

In an embodiment of the present disclosure, a method of generating power may comprise delivering an amount of fuel to a fuel loading region, wherein the fuel loading region is located among a plurality of electrodes; igniting the fuel by flowing a current of at least about 2,000 $A/cm^2$ through the fuel by applying the current to the plurality of electrodes to produce at least one of plasma, light, and heat; receiving at least a portion of the light in a photovoltaic power converter; converting the light to a different form of power using the photovoltaic power converter; and outputting the different form of power.

In an additional embodiment, the present disclosure is directed to a water arc plasma power system comprising: at least one closed reaction vessel; reactants comprising at least one of source of $H_2O$ and $H_2O$; at least one set of electrodes; a source of electrical power to deliver an initial high breakdown voltage of the $H_2O$ and provide a subsequent high current, and a heat exchanger system, wherein the power system generates arc plasma, light, and thermal energy, and at least one photovoltaic power converter.

Certain embodiments of the present disclosure are directed to a power generation system comprising: an electrical power source of at least about 2,000 $A/cm^2$ or of at least about 5,000 kW; a plurality of electrodes electrically coupled to the electrical power source; a fuel loading region configured to receive a solid fuel, wherein the plurality of electrodes is configured to deliver electrical power to the solid fuel to produce a plasma; and at least one of a plasma power converter, a photovoltaic power converter, and thermal to electric power converter positioned to receive at least a portion of the plasma, photons, and/or heat generated by the reaction. Other embodiments are directed to a power generation system, comprising: a plurality of electrodes; a fuel loading region located between the plurality of electrodes and configured to receive a conductive fuel, wherein the plurality of electrodes are configured to apply a current to the conductive fuel sufficient to ignite the conductive fuel and generate at least one of plasma and thermal power; a delivery mechanism for moving the conductive fuel into the fuel loading region; and at least one of a photovoltaic power converter to convert the plasma photons into a form of power, or a thermal to electric converter to convert the thermal power into a nonthermal form of power comprising electricity or mechanical power. Further embodiments are directed to a method of generating power, comprising: delivering an amount of fuel to a fuel loading region, wherein the fuel loading region is located among a plurality of electrodes; igniting the fuel by flowing a current of at least about 2,000 $A/cm^2$ through the fuel by applying the current to the plurality of electrodes to produce at least one of plasma, light, and heat; receiving at least a portion of the light in a photovoltaic power converter; converting the light to a different form of power using the photovoltaic power converter; and outputting the different form of power.

Additional embodiments are directed to a power generation system, comprising: an electrical power source of at least about 5,000 kW; a plurality of spaced apart electrodes, wherein the plurality of electrodes at least partially surround a fuel, are electrically connected to the electrical power source, are configured to receive a current to ignite the fuel, and at least one of the plurality of electrodes is moveable; a delivery mechanism for moving the fuel; and a photovoltaic power converter configured to convert plasma generated from the ignition of the fuel into a non-plasma form of power. Additionally provided in the present disclosure is a power generation system, comprising: an electrical power source of at least about 2,000 A/cm$^2$; a plurality of spaced apart electrodes, wherein the plurality of electrodes at least partially surround a fuel, are electrically connected to the electrical power source, are configured to receive a current to ignite the fuel, and at least one of the plurality of electrodes is moveable; a delivery mechanism for moving the fuel; and a photovoltaic power converter configured to convert plasma generated from the ignition of the fuel into a non-plasma form of power.

Another embodiments is directed to a power generation system, comprising: an electrical power source of at least about 5,000 kW or of at least about 2,000 A/cm$^2$; a plurality of spaced apart electrodes, wherein at least one of the plurality of electrodes includes a compression mechanism; a fuel loading region configured to receive a fuel, wherein the fuel loading region is surrounded by the plurality of electrodes so that the compression mechanism of the at least one electrode is oriented towards the fuel loading region, and wherein the plurality of electrodes are electrically connected to the electrical power source and configured to supply power to the fuel received in the fuel loading region to ignite the fuel; a delivery mechanism for moving the fuel into the fuel loading region; and a photovoltaic power converter configured to convert photons generated from the ignition of the fuel into a non-photon form of power. Other embodiments of the present disclosure are directed to a power generation system, comprising: an electrical power source of at least about 2,000 A/cm$^2$; a plurality of spaced apart electrodes, wherein at least one of the plurality of electrodes includes a compression mechanism; a fuel loading region configured to receive a fuel, wherein the fuel loading region is surrounded by the plurality of electrodes so that the compression mechanism of the at least one electrode is oriented towards the fuel loading region, and wherein the plurality of electrodes are electrically connected to the electrical power source and configured to supply power to the fuel received in the fuel loading region to ignite the fuel; a delivery mechanism for moving the fuel into the fuel loading region; and a plasma power converter configured to convert plasma generated from the ignition of the fuel into a non-plasma form of power.

Embodiments of the present disclosure are also directed to power generation system, comprising: a plurality of electrodes; a fuel loading region surrounded by the plurality of electrodes and configured to receive a fuel, wherein the plurality of electrodes is configured to ignite the fuel located in the fuel loading region; a delivery mechanism for moving the fuel into the fuel loading region; a photovoltaic power converter configured to convert photons generated from the ignition of the fuel into a non-photon form of power; a removal system for removing a byproduct of the ignited fuel; and a regeneration system operably coupled to the removal system for recycling the removed byproduct of the ignited fuel into recycled fuel. Certain embodiments of the present disclosure are also directed to a power generation system, comprising: an electrical power source configured to output a current of at least about 2,000 A/cm$^2$ or of at least about 5,000 kW; a plurality of spaced apart electrodes electrically connected to the electrical power source; a fuel loading region configured to receive a fuel, wherein the fuel loading region is surrounded by the plurality of electrodes, and wherein the plurality of electrodes is configured to supply power to the fuel to ignite the fuel when received in the fuel loading region; a delivery mechanism for moving the fuel into the fuel loading region; and a photovoltaic power converter configured to convert a plurality of photons generated from the ignition of the fuel into a non-photon form of power. Certain embodiments may further include one or more of output power terminals operably coupled to the photovoltaic power converter; a power storage device; a sensor configured to measure at least one parameter associated with the power generation system; and a controller configured to control at least a process associated with the power generation system. Certain embodiments of the present disclosure are also directed to a power generation system, comprising: an electrical power source configured to output a current of at least about 2,000 A/cm$^2$ or of at least about 5,000 kW; a plurality of spaced apart electrodes, wherein the plurality of electrodes at least partially surround a fuel, are electrically connected to the electrical power source, are configured to receive a current to ignite the fuel, and at least one of the plurality of electrodes is moveable; a delivery mechanism for moving the fuel; and a photovoltaic power converter configured to convert photons generated from the ignition of the fuel into a different form of power.

Additional embodiments of the present disclosure are directed to a power generation system, comprising: an electrical power source of at least 5,000 kW or of at least about 2,000 A/cm$^2$; a plurality of spaced apart electrodes electrically connected to the electrical power source; a fuel loading region configured to receive a fuel, wherein the fuel loading region is surrounded by the plurality of electrodes, and wherein the plurality of electrodes is configured to supply power to the fuel to ignite the fuel when received in the fuel loading region; a delivery mechanism for moving the fuel into the fuel loading region; a photovoltaic power converter configured to convert a plurality of photons generated from the ignition of the fuel into a non-photon form of power; a sensor configured to measure at least one parameter associated with the power generation system; and a controller configured to control at least a process associated with the power generation system. Further embodiments are directed to a power generation system, comprising: an electrical power source of at least 2,000 A/cm$^2$; a plurality of spaced apart electrodes electrically connected to the electrical power source; a fuel loading region configured to receive a fuel, wherein the fuel loading region is surrounded by the plurality of electrodes, and wherein the plurality of electrodes is configured to supply power to the fuel to ignite the fuel when received in the fuel loading region; a delivery mechanism for moving the fuel into the fuel loading region; a plasma power converter configured to convert plasma generated from the ignition of the fuel into a non-plasma form of power; a sensor configured to measure at least one parameter associated with the power generation system; and a controller configured to control at least a process associated with the power generation system.

Certain embodiments of the present disclosure are directed to a power generation system, comprising: an electrical power source of at least about 5,000 kW or of at least about 2,000 A/cm$^2$; a plurality of spaced apart electrodes electrically connected to the electrical power source; a fuel loading region configured to receive a fuel, wherein the fuel loading region is surrounded by the plurality of electrodes, and wherein the plurality of electrodes is configured to supply power to the fuel to ignite the fuel when received in the fuel loading region, and wherein a pressure in the fuel loading region is a partial vacuum; a delivery mechanism for moving the fuel into the fuel loading region; and a photovoltaic power converter configured to convert plasma generated from the ignition of the fuel into a non-plasma form of power. Some embodiments may include one or more of the following additional features: the photovoltaic power converter may be located within a vacuum cell; the photovoltaic power converter may include at least one of an antireflection coating, an optical impedance matching coating, or a protective coating; the photovoltaic power converter may be operably coupled to a cleaning system configured to clean at least a portion of the photovoltaic power converter; the power generation system may include an optical filter; the photovoltaic power converter may comprise at least one of a monocrystalline cell, a polycrystalline cell, an amorphous cell, a string/ribbon silicon cell, a multi-junction cell, a homojunction cell, a heterojunction cell, a p-i-n device, a thin-film cell, a dye-sensitized cell, and an organic photovoltaic cell; and the photovoltaic power converter may comprise at multi-junction cell, wherein the multi-junction cell comprises at least one of an inverted cell, an upright cell, a lattice-mismatched cell, a lattice-matched cell, and a cell comprising Group III-V semiconductor materials.

Additional exemplary embodiments are directed to a system configured to produce power, comprising: a fuel supply configured to supply a fuel; a power supply configured to supply an electrical power; and at least one gear configured to receive the fuel and the electrical power, wherein the at least one gear selectively directs the electrical power to a local region about the gear to ignite the fuel within the local region. In some embodiments, the system may further have one or more of the following features: the fuel may include a powder; the at least one gear may include two gears; the at least one gear may include a first material and a second material having a lower conductivity than the first material, the first material being electrically coupled to the local region; and the local region may be adjacent to at least one of a tooth and a gap of the at least one gear. Other embodiments may use a support member in place of a gear, while other embodiments may use a gear and a support member. Some embodiments are directed to a method of producing electrical power, comprising: supplying a fuel to a gear; rotating the gear to localize at least some of the fuel at a region of the gear; supplying a current to the gear to ignite the localized fuel to produce energy; and converting at least some of the energy produced by the ignition into electrical power. In some embodiments, rotating the gear may include rotating a first gear and a second gear, and supplying a current may include supplying a current to the first gear and the second gear.

Other embodiments are directed to a power generation system, comprising: an electrical power source of at least about 2,000 A/cm$^2$; a plurality of spaced apart electrodes electrically connected to the electrical power source; a fuel loading region configured to receive a fuel, wherein the fuel loading region is surrounded by the plurality of electrodes, and wherein the plurality of electrodes is configured to supply power to the fuel to ignite the fuel when received in the fuel loading region, and wherein a pressure in the fuel loading region is a partial vacuum; a delivery mechanism for moving the fuel into the fuel loading region; and a photovoltaic power converter configured to convert plasma generated from the ignition of the fuel into a non-plasma form of power.

Further embodiments are directed to a power generation cell, comprising: an outlet port coupled to a vacuum pump; a plurality of electrodes electrically coupled to an electrical power source of at least 5,000 kW; a fuel loading region configured to receive a water-based fuel comprising a majority $H_2O$, wherein the plurality of electrodes is configured to deliver power to the water-based fuel to produce at least one of an arc plasma and thermal power; and a power converter configured to convert at least a portion of at least one of the arc plasma and the thermal power into electrical power. Also disclosed is a power generation system, comprising: an electrical power source of at least 5,000 A/cm$^2$; a plurality of electrodes electrically coupled to the electrical power source; a fuel loading region configured to receive a water-based fuel comprising a majority $H_2O$, wherein the plurality of electrodes is configured to deliver power to the water-based fuel to produce at least one of an arc plasma and thermal power; and a power converter configured to convert at least a portion of at least one of the arc plasma and the thermal power into electrical power. In an embodiment, the power converter comprises a photovoltaic converter of optical power into electricity.

Additional embodiments are directed to a method of generating power, comprising: loading a fuel into a fuel loading region, wherein the fuel loading region includes a plurality of electrodes; applying a current of at least about 2,000 A/cm$^2$ to the plurality of electrodes to ignite the fuel to produce at least one of an arc plasma and thermal power; performing at least one of passing the arc plasma through a photovoltaic converter to generate electrical power; and passing the thermal power through a thermal-to-electric converter to generate electrical power; and outputting at least a portion of the generated electrical power. Also disclosed is a power generation system, comprising: an electrical power source of at least 5,000 kW; a plurality of electrodes electrically coupled to the power source, wherein the plurality of electrodes is configured to deliver electrical power to a water-based fuel comprising a majority $H_2O$ to produce a thermal power; and a heat exchanger configured to convert at least a portion of the thermal power into electrical power; and a photovoltaic power converter configured to convert at least a portion of the light into electrical power. In addition, another embodiment is directed to a power generation system, comprising: an electrical power source of at least 5,000 kW; a plurality of spaced apart electrodes, wherein at least one of the plurality of electrodes includes a compression mechanism; a fuel loading region configured to receive a water-based fuel comprising a majority $H_2O$, wherein the fuel loading region is surrounded by the plurality of electrodes so that the compression mechanism of the at least one electrode is oriented towards the fuel loading region, and wherein the plurality of electrodes are electrically connected to the electrical power source and configured to supply power to the water-based fuel received in the fuel loading region to ignite the fuel; a delivery mechanism for moving the water-based fuel into the fuel loading region; and a photovoltaic power converter configured to convert plasma generated from the ignition of the fuel into a non-plasma form of power.

BRIEF DESCRIPTION OF THE DRAWINGS

The accompanying drawings, which are incorporated in and constitute a part of this specification, illustrate several embodiments of the disclosure and together with the description, serve to explain the principles of the disclosure. In the drawings.

Figure 1:
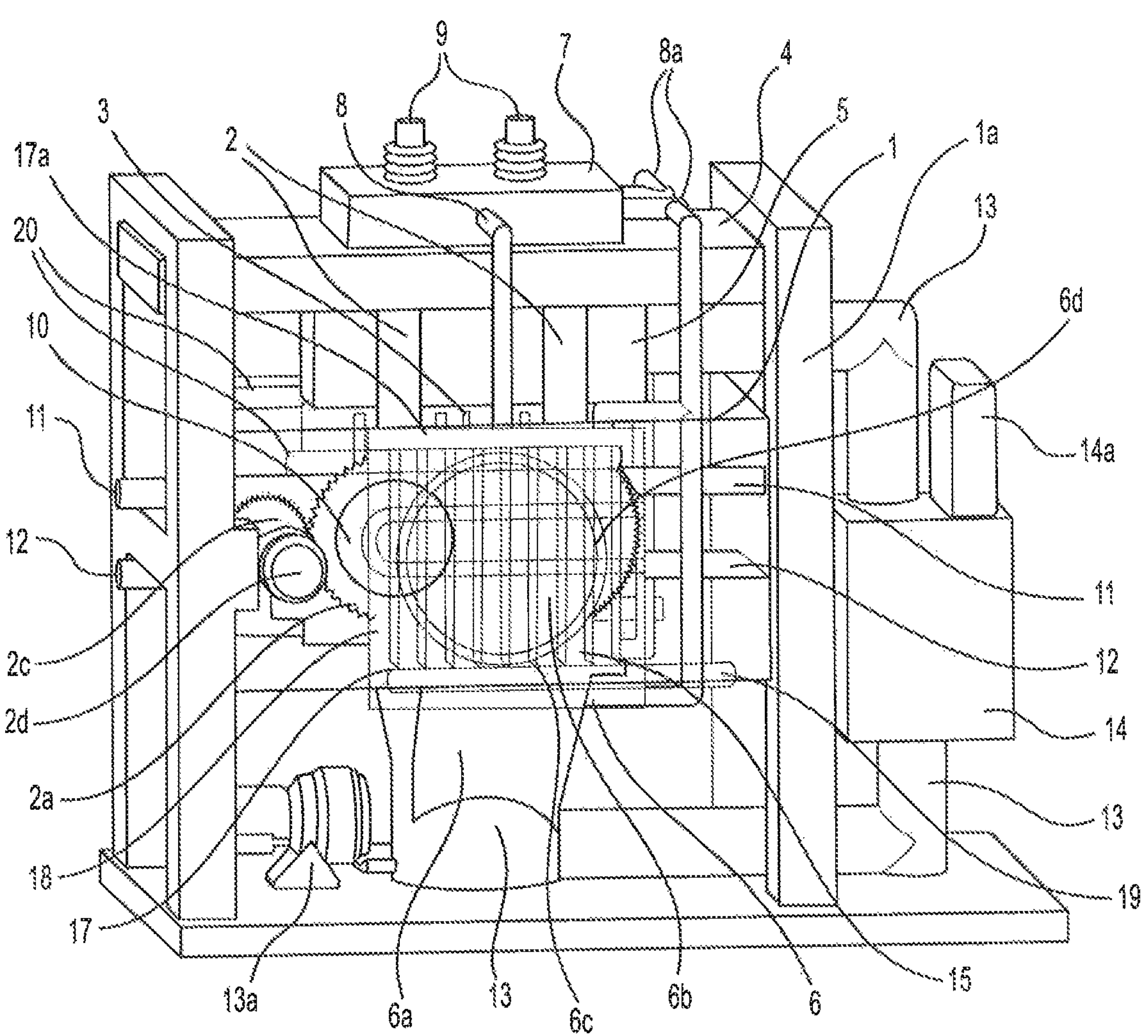
FIG. 1 is a schematic drawing of a SF-CIHT cell power generator showing a plasmadynamic converter in accordance with an embodiment of the present disclosure.

Disclosed here in are catalyst systems to release energy from atomic hydrogen to form lower energy states wherein the electron shell is at a closer position relative to the nucleus. The released power is harnessed for power generation and additionally new hydrogen species and compounds are desired products. These energy states are predicted by classical physical laws and require a catalyst to accept energy from the hydrogen in order to undergo the corresponding energy-releasing transition.

Classical physics gives closed-form solutions of the hydrogen atom, the hydride ion, the hydrogen molecular ion, and the hydrogen molecule and predicts corresponding species having fractional principal quantum numbers. Using Maxwell's equations, the structure of the electron was derived as a boundary-value problem wherein the electron comprises the source current of time-varying electromagnetic fields during transitions with the constraint that the bound n=1 state electron cannot radiate energy. A reaction predicted by the solution of the H atom involves a resonant, nonradiative energy transfer from otherwise stable atomic hydrogen to a catalyst capable of accepting the energy to form hydrogen in lower-energy states than previously thought possible. Specifically, classical physics predicts that atomic hydrogen may undergo a catalytic reaction with certain atoms, excimers, ions, and diatomic hydrides which provide a reaction with a net enthalpy of an integer multiple of the potential energy of atomic hydrogen, $E_h$=27.2 eV where $E_h$ is one Hartree. Specific species (e.g. $He^+$, $Ar^+$, $Sr^+$, K, Li, HCl, and NaH, OH, SH, SeH, nascent $H_2O$, nH (n=integer)) identifiable on the basis of their known electron energy levels are required to be present with atomic hydrogen to catalyze the process. The reaction involves a nonradiative energy transfer followed by q·13.6 eV continuum emission or q·13.6 eV transfer to H to form extraordinarily hot, excited-state H and a hydrogen atom that is lower in energy than unreacted atomic hydrogen that corresponds to a fractional principal quantum number. That is, in the formula for the principal energy levels of the hydrogen atom:

$$E_n = -\frac{e^2}{n^2 8\pi\varepsilon_o a_H} = -\frac{13.598\ \text{eV}}{n^2}. \tag{1}$$

$$n = 1, 2, 3, \ldots \tag{2}$$

where $a_H$ is the Bohr radius for the hydrogen atom (52.947 pm), e is the magnitude of the charge of the electron, and $\epsilon_o$ is the vacuum permittivity, fractional quantum numbers:

$$n = 1, \frac{1}{2}, \frac{1}{3}, \frac{1}{4}, \ldots, \frac{1}{p}; \text{ where } p \le 137 \text{ is an integer} \tag{3}$$

replace the well known parameter n=integer in the Rydberg equation for hydrogen excited states and represent lower-energy-state hydrogen atoms called "hydrinos." Then, similar to an excited state having the analytical solution of Maxwell's equations, a hydrino atom also comprises an electron, a proton, and a photon. However, the electric field of the latter increases the binding corresponding to desorption of energy rather than decreasing the central field with the absorption of energy as in an excited state, and the resultant photon-electron interaction of the hydrino is stable rather than radiative.

The n=1 state of hydrogen and the $$n = \frac{1}{\text{integer}}$$

states of hydrogen are nonradiative, but a transition between two nonradiative states, say n=1 to n=1/2, is possible via a nonradiative energy transfer. Hydrogen is a special case of the stable states given by Eqs. (1) and (3) wherein the corresponding radius of the hydrogen or hydrino atom is given by $$r = \frac{a_H}{p}, \tag{4}$$

where p=1, 2, 3, . . . . In order to conserve energy, energy must be transferred from the hydrogen atom to the catalyst in units of $$m \cdot 27.2\ \text{eV},\ m = 1, 2, 3, 4, \ldots$$

and the radius transitions to $$\frac{a_H}{m+p}.$$

The catalyst reactions involve two steps of energy release: a nonradiative energy transfer to the catalyst followed by additional energy release as the radius decreases to the corresponding stable final state. It is believed that the rate of catalysis is increased as the net enthalpy of reaction is more closely matched to m·27.2 eV. It has been found that catalysts having a net enthalpy of reaction within ±10%, preferably ±5%, of m·27.2 eV are suitable for most applications. In the case of the catalysis of hydrino atoms to lower energy states, the enthalpy of reaction of m·27.2 eV (Eq. (5)) is relativistically corrected by the same factor as the potential energy of the hydrino atom.

Thus, the general reaction is given by

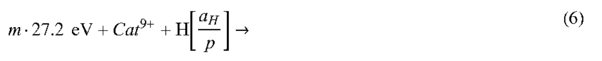

$$m \cdot 27.2\ \text{eV} + Cat^{q+} + \text{H}\left[\frac{a_H}{p}\right] \rightarrow Cat^{(q+r)+} + re^- + \text{H}^*\left[\frac{a_H}{(m+p)}\right] + m \cdot 27.2\ \text{eV} \tag{6}$$

$$\text{H}^*\left[\frac{a_H}{(m+p)}\right] \rightarrow \text{H}\left[\frac{a_H}{(m+p)}\right] + \left[(m+p)^2 - p^2\right] \cdot 13.6\ \text{eV} - m \cdot 27.2\ \text{eV} \tag{7}$$

$$Cat^{(q+r)+} + re^- \rightarrow Cat^{q+} + m \cdot 27.2\ \text{eV and} \tag{8}$$

the overall reaction is $$\text{H}\left[\frac{a_H}{p}\right] \rightarrow \text{H}\left[\frac{a_H}{(m+p)}\right] + \left[(m+p)^2 - p^2\right] \cdot 13.6\ \text{eV} \tag{9}$$

q, r, m, and p are integers.

$$\text{H}^*\left[\frac{a_H}{(m+p)}\right]$$

has the radius of the hydrogen atom (corresponding to 1 in the denominator) and a central field equivalent to (m+p) times that of a proton, and $$\text{H}\left[\frac{a_H}{(m+p)}\right]$$

is the corresponding stable state with the radius of $$\frac{1}{(m+p)}$$

that of H. As the electron undergoes radial acceleration from the radius of the hydrogen atom to a radius of $$\frac{1}{(m+p)}$$

this distance, energy is released as characteristic light emission or as third-body kinetic energy. The emission may be in the form of an extreme-ultraviolet continuum radiation having an edge at $$[(p+m)^2 - p^2 - 2m] \cdot 13.6 \text{ eV or}$$

$$\frac{91.2}{[(m+p)^2 - p^2 - 2m]} \text{ nm}$$

and extending to longer wavelengths. In addition to radiation, a resonant kinetic energy transfer to form fast H may occur. Subsequent excitation of these fast H(n=1) atoms by collisions with the background $H_2$ followed by emission of the corresponding H(n=3) fast atoms gives rise to broadened Balmer α emission. Alternatively, fast H is a direct product of H or hydrino serving as the catalyst wherein the acceptance of the resonant energy transfer regards the potential energy rather than the ionization energy. Conservation of energy gives a proton of the kinetic energy corresponding to one half the potential energy in the former case and a catalyst ion at essentially rest in the latter case. The H recombination radiation of the fast protons gives rise to broadened Balmer α emission that is disproportionate to the inventory of hot hydrogen consistent with the excess power balance.

In the present disclosure the terms such as hydrino reaction, H catalysis, H catalysis reaction, catalysis when referring to hydrogen, the reaction of hydrogen to form hydrinos, and hydrino formation reaction all refer to the reaction such as that of Eqs. (6-9)) of a catalyst defined by Eq. (5) with atomic H to form states of hydrogen having energy levels given by Eqs. (1) and (3). The corresponding terms such as hydrino reactants, hydrino reaction mixture, catalyst mixture, reactants for hydrino formation, reactants that produce or form lower-energy state hydrogen or hydrinos are also used interchangeably when referring to the reaction mixture that performs the catalysis of H to H states or hydrino states having energy levels given by Eqs. (1) and (3).

The catalytic lower-energy hydrogen transitions of the present disclosure require a catalyst that may be in the form of an endothermic chemical reaction of an integer m of the potential energy of uncatalyzed atomic hydrogen, 27.2 eV, that accepts the energy from atomic H to cause the transition. The endothermic catalyst reaction may be the ionization of one or more electrons from a species such as an atom or ion (e.g. m=3 for $Li \rightarrow Li^{2+}$) and may further comprise the concerted reaction of a bond cleavage with ionization of one or more electrons from one or more of the partners of the initial bond (e.g. m=2 for $NaH \rightarrow Na^{2+}+H$). $He^+$ fulfills the catalyst criterion—a chemical or physical process with an enthalpy change equal to an integer multiple of 27.2 eV since it ionizes at 54.417 eV, which is 2·27.2 eV. An integer number of hydrogen atoms may also serve as the catalyst of an integer multiple of 27.2 eV enthalpy. Hydrogen atoms H(1/p) p=1, 2, 3, . . . 137 can undergo further transitions to lower-energy states given by Eqs. (1) and (3) wherein the transition of one atom is catalyzed by one or more additional H atoms that resonantly and nonradiatively accepts m·27.2 eV with a concomitant opposite change in its potential energy. The overall general equation for the transition of H(1/p) to H(1/(m+p)) induced by a resonance transfer of m·27.2 eV to H(1/p') is represented by $$H(1/p') + H(1/p) \rightarrow H + H(1/(m+p)) + [2pm + m^2 - p'^2 + 1] \cdot 13.6 \text{ eV} \quad (10)$$

Hydrogen atoms may serve as a catalyst wherein m=1, m=2, and m=3 for one, two, and three atoms, respectively, acting as a catalyst for another. The rate for the two-atom-catalyst, 2H, may be high when extraordinarily fast H collides with a molecule to form the 2H wherein two atoms resonantly and nonradiatively accept 54.4 eV from a third hydrogen atom of the collision partners. By the same mechanism, the collision of two hot $H_2$ provide 3H to serve as a catalyst of 3·27.2 eV for the fourth. The EUV continua at 22.8 nm and 10.1 nm, extraordinary (>100 eV) Balmer α line broadening, highly excited H states, the product gas $H_2(1/4)$, and large energy release is observed consistent with predictions.

H(1/4) is a preferred hydrino state based on its multipolarity and the selection rules for its formation. Thus, in the case that H(1/3) is formed, the transition to H(1/4) may occur rapidly catalyzed by H according to Eq. (10). Similarly, H(1/4) is a preferred state for a catalyst energy greater than or equal to 81.6 eV corresponding to m=3 in Eq. (5). In this case the energy transfer to the catalyst comprises the 81.6 eV that forms that H*(1/4) intermediate of Eq. (7) as well as an integer of 27.2 eV from the decay of the intermediate. For example, a catalyst having an enthalpy of 108.8 eV may form H*(1/4) by accepting 81.6 eV as well as 27.2 eV from the H*(1/4) decay energy of 122.4 eV. The remaining decay energy of 95.2 eV is released to the environment to form the preferred state H(1/4) that then reacts to form $H_2(1/4)$.

A suitable catalyst can therefore provide a net positive enthalpy of reaction of m·27.2 eV. That is, the catalyst resonantly accepts the nonradiative energy transfer from hydrogen atoms and releases the energy to the surroundings to affect electronic transitions to fractional quantum energy levels. As a consequence of the nonradiative energy transfer, the hydrogen atom becomes unstable and emits further energy until it achieves a lower-energy nonradiative state having a principal energy level given by Eqs. (1) and (3). Thus, the catalysis releases energy from the hydrogen atom with a commensurate decrease in size of the hydrogen atom, $r_n = na_H$ where n is given by Eq. (3). For example, the catalysis of H(n=1) to H(n=1/4) releases 204 eV, and the hydrogen radius decreases from $a_H$ to $$\frac{1}{4}a_H.$$

The catalyst product, H(1/p), may also react with an electron to form a hydrino hydride ion $H^-(1/p)$, or two H(1/p) may react to form the corresponding molecular hydrino $H_2(1/p)$. Specifically, the catalyst product, H(1/p), may also react with an electron to form a novel hydride ion $H^-(1/p)$ with a binding energy $E_B$:

$$E_B = \frac{\hbar^2\sqrt{s(s+1)}}{8\mu_e a_0^2\left[\frac{1+\sqrt{s(s+1)}}{p}\right]^2} - \frac{\pi\mu_0 e^2\hbar^2}{m_e^2}\left(\frac{1}{a_H^3} + \frac{2^2}{a_0^3\left[\frac{1+\sqrt{s(s+1)}}{p}\right]^3}\right) \quad (11)$$

where p=integer >1, s=1/2, ℏ is Planck's constant bar, $\mu_o$ is the permeability of vacuum, $m_e$ is the mass of the electron, $\mu_e$ is the reduced electron mass given by $$\mu_e = \frac{m_e m_p}{\frac{m_e}{\sqrt{\frac{3}{4}}} + m_p}$$

where $m_p$ is the mass of the proton, $a_o$ is the Bohr radius, and the ionic radius is $$r_1 = \frac{a_0}{p}\left(1 + \sqrt{s(s+1)}\right).$$

From Eq. (11), the calculated ionization energy of the hydride ion is 0.75418 eV, and the experimental value is 6082.99±0.15 $cm^{-1}$ (0.75418 eV). The binding energies of hydrino hydride ions may be measured by X-ray photoelectron spectroscopy (XPS).

Upfield-shifted NMR peaks are direct evidence of the existence of lower-energy state hydrogen with a reduced radius relative to ordinary hydride ion and having an increase in diamagnetic shielding of the proton. The shift is given by the sum of the contributions of the diamagnetism of the two electrons and the photon field of magnitude p (Mills GUTCP Eq. (7.87)):

$$\frac{\Delta B_T}{B} = -\mu_0 \frac{pe^2}{12 m_e a_0\left(1 + \sqrt{s(s+1)}\right)}\left(1 + p\alpha^2\right) = -\left(p29.9 + p^2 1.59 \times 10^{-3}\right)\text{ppm} \quad (12)$$

where the first term applies to $H^-$ with p=1 and p=integer >1 for $H^-(1/p)$ and α is the fine structure constant. The predicted hydrino hydride peaks are extraordinarily upfield shifted relative to ordinary hydride ion. In an embodiment, the peaks are upfield of TMS. The NMR shift relative to TMS may be greater than that known for at least one of ordinary $H^-$, $H_2$, or $H^+$ alone or comprising a compound. The shift may be greater than at least one of 0, −1, −2, −3, −4, −5, −6, −7, −8, −9, −10, −11, −12, −13, −14, −15, −16, −17, −18, −19, −20, −21, −22, −23, −24, −25, −26, −27, −28, −29, −30, −31, −32, −33, −34, −35, −36, −37, −38, −39, and −40 ppm. The range of the absolute shift relative to a bare proton, wherein the shift of TMS is about −31.5 relative to a bare proton, may be $-(p29.9+p^2 2.74)$ ppm (Eq. (12)) within a range of about at least one of ±5 ppm, ±10 ppm, ±20 ppm, ±30 ppm, ±40 ppm, ±50 ppm, ±60 ppm, ±70 ppm, ±80 ppm, ±90 ppm, and ±100 ppm. The range of the absolute shift relative to a bare proton may be $-(p29.9+p^2 1.59\times10^{-3})$ ppm (Eq. (12)) within a range of about at least one of about 0.1% to 99%, 1% to 50%, and 1% to 10%. In another embodiment, the presence of a hydrino species such as a hydrino atom, hydride ion, or molecule in a solid matrix such as a matrix of a hydroxide such as NaOH or KOH causes the matrix protons to shift upfield. The matrix protons such as those of NaOH or KOH may exchange. In an embodiment, the shift may cause the matrix peak to be in the range of about −0.1 ppm to −5 ppm relative to TMS. The NMR determination may comprise magic angle spinning $^1H$ nuclear magnetic resonance spectroscopy (MAS $^1H$ NMR).

H(1/p) may react with a proton and two H(1/p) may react to form $H_2(1/p)^+$ and $H_2(1/p)$, respectively. The hydrogen molecular ion and molecular charge and current density functions, bond distances, and energies were solved from the Laplacian in ellipsoidal coordinates with the constraint of nonradiation.

$$(\eta-\zeta)R_\xi \frac{\partial}{\partial\xi}\left(R_\xi \frac{\partial\phi}{\partial\xi}\right) + (\zeta-\xi)R_\eta \frac{\partial}{\partial\eta}\left(R_\eta \frac{\partial\phi}{\partial\eta}\right) + (\xi-\eta)R_\zeta \frac{\partial}{\partial\zeta}\left(R_\zeta \frac{\partial\phi}{\partial\zeta}\right) = 0 \quad (13)$$

The total energy $E_T$ of the hydrogen molecular ion having a central field of +pe at each focus of the prolate spheroid molecular orbital is $$E_T = -p^2\left\{\begin{array}{c} \frac{e^2}{8\pi\varepsilon_o a_H}(4\ln 3 - 1 - 2\ln 3) \\ \left[1 + p\sqrt{\frac{2\hbar\sqrt{\frac{\frac{2e^2}{4\pi\varepsilon_o(2a_H)^3}}{m_e}}}{m_e c^2}}\right] - \\ \frac{1}{2}\hbar\sqrt{\frac{\frac{pe^2}{4\pi\varepsilon_o\left(\frac{2a_H}{p}\right)^3} - \frac{pe^2}{8\pi\varepsilon_o\left(\frac{3a_H}{p}\right)^3}}{\mu}} \end{array}\right\} = -p^2 16.13392\text{ eV} - p^3 0.118755\text{ eV} \quad (14)$$

where p is an integer, c is the speed of light in vacuum, and μ is the reduced nuclear mass. The total energy of the hydrogen molecule having a central field of +pe at each focus of the prolate spheroid molecular orbital is $$E_T = -p^2\left\{\begin{array}{c} \frac{e^2}{8\pi\varepsilon_o a_0}\left[\left(2\sqrt{2} - \sqrt{2} + \frac{\sqrt{2}}{2}\right)\ln\frac{\sqrt{2}+1}{\sqrt{2}-1} - \sqrt{2}\right] \\ \left[1 + p\sqrt{\frac{2\hbar\sqrt{\frac{\frac{2e^2}{4\pi\varepsilon_o a_0^3}}{m_e}}}{m_e c^2}}\right] - \\ \frac{1}{2}\hbar\sqrt{\frac{\frac{pe^2}{4\pi\varepsilon_o\left(\frac{a_0}{p}\right)^3} - \frac{pe^2}{8\pi\varepsilon_o\left(\frac{\left(1+\frac{1}{\sqrt{2}}\right)a_0}{p}\right)^3}}{\mu}} \end{array}\right\} = -p^2 31.351\text{ eV} - p^3 0.326469\text{ eV} \quad (15)$$

The bond dissociation energy, $E_D$, of the hydrogen molecule $H_2(1/p)$ is the difference between the total energy of the corresponding hydrogen atoms and $E_T$ $$E_D = E(2H(1/p)) - E_T \quad (16)$$

where $$E(2H(1/p)) = -p^2 27.20\text{ eV} \quad (17)$$

$E_D$ is given by Eqs. (16-17) and (15):

-continued $$E_D = -p^2 27.20\ \text{eV} - E_T = -p^2 27.20\ \text{eV} - (-p^2 31.351\ \text{eV} - p^3 0.326469\ \text{eV}) = p^2 4.151\ \text{eV} + p^3 0.326469\ \text{eV} \quad (18)$$

$H_2(1/p)$ may be identified by X-ray photoelectron spectroscopy (XPS) wherein the ionization product in addition to the ionized electron may be at least one of the possibilities such as those comprising two protons and an electron, a hydrogen (H) atom, a hydrino atom, a molecular ion, hydrogen molecular ion, and $H_2(1/p)^+$ wherein the energies may be shifted by the matrix.

The NMR of catalysis-product gas provides a definitive test of the theoretically predicted chemical shift of $H_2(1/p)$. In general, the $^1$H NMR resonance of $H_2(1/p)$ is predicted to be upfield from that of $H_2$ due to the fractional radius in elliptic coordinates wherein the electrons are significantly closer to the nuclei. The predicted shift, $$\frac{\Delta B_T}{B},$$

for $H_2(1/p)$ is given by the sum of the contributions of the diamagnetism of the two electrons and the photon field of magnitude p (Mills GUTCP Eqs. (11.415-11.416)):

$$\frac{\Delta B_T}{B} = -\mu_0\left(4 - \sqrt{2}\ln\frac{\sqrt{2}+1}{\sqrt{2}-1}\right)\frac{pe^2}{36a_0m_e}(1 + p\alpha^2) \quad (19)$$

$$\frac{\Delta B_T}{B} = -(p28.01 + p^2 1.49\times10^{-3})\text{ppm} \quad (20)$$

where the first term applies to $H_2$ with p=1 and p=integer >1 for $H_2(1/p)$. The experimental absolute $H_2$ gas-phase resonance shift of −28.0 ppm is in excellent agreement with the predicted absolute gas-phase shift of −28.01 ppm (Eq. (20)). The predicted molecular hydrino peaks are extraordinarily upfield shifted relative to ordinary $H_2$. In an embodiment, the peaks are upfield of TMS. The NMR shift relative to TMS may be greater than that known for at least one of ordinary $H^-$, H, $H_2$, or $H^+$ alone or comprising a compound. The shift may be greater than at least one of 0, −1, −2, −3, −4, −5, −6, −7, −8, −9, −10, −11, −12, −13, −14, −15, −16, −17, −18, −19, −20, −21, −22, −23, −24, −25, −26, −27, −28, −29, −30, − 31, −32, −33, −34, −35, −36, −37, −38, −39, and −40 ppm. The range of the absolute shift relative to a bare proton, wherein the shift of TMS is about −31.5 ppm relative to a bare proton, may be $-(p28.01+p^2 2.56)$ ppm (Eq. (20)) within a range of about at least one of ±5 ppm, ±10 ppm, ±20 ppm, ±30 ppm, ±40 ppm, ±50 ppm, ±60 ppm, ±70 ppm, ±80 ppm, ±90 ppm, and ±100 ppm. The range of the absolute shift relative to a bare proton may be $-(p28.01+p^2 1.49\times10^{-3})$ ppm (Eq. (20)) within a range of about at least one of about 0.1% to 99%, 1% to 50%, and 1% to 10%.

The vibrational energies, $E_{vib}$, for the $\upsilon$=0 to $\upsilon$=1 transition of hydrogen-type molecules $H_2(1/p)$ are $$E_{vib} = p^2 0.515902\ \text{eV} \quad (21)$$

where p is an integer.

The rotational energies, $E_{rot}$, for the J to J+1 transition of hydrogen-type molecules $H_2(1/p)$ are $$E_{rot} = E_{J+1} - E_J = \frac{\hbar^2}{I}[J+1] = p^2(J+1)0.01509\ \text{eV} \quad (22)$$

where p is an integer and I is the moment of inertia. Ro-vibrational emission of $H_2(1/4)$ was observed on e-beam excited molecules in gases and trapped in solid matrix.

The $p^2$ dependence of the rotational energies results from an inverse p dependence of the internuclear distance and the corresponding impact on the moment of inertia I. The predicted internuclear distance 2c' for $H_2(1/p)$ is $$2c' = \frac{a_o\sqrt{2}}{p} \quad (23)$$

At least one of the rotational and vibration energies of $H_2(1/p)$ may be measured by at least one of electron-beam excitation emission spectroscopy, Raman spectroscopy, and Fourier transform infrared (FTIR) spectroscopy. $H_2(1/p)$ may be trapped in a matrix for measurement such as in at least one of MOH, MX, and $M_2CO_3$ (M=alkali; X=halide) matrix.

I. Catalysts $He^+$, $Ar^-$, $Sr^-$, Li, K, NaH, nH (n=integer), and $H_2O$ are predicted to serve as catalysts since they meet the catalyst criterion—a chemical or physical process with an enthalpy change equal to an integer multiple of the potential energy of atomic hydrogen, 27.2 eV. Specifically, a catalytic system is provided by the ionization of t electrons from an atom each to a continuum energy level such that the sum of the ionization energies of the t electrons is approximately m·27.2 eV where m is an integer. Moreover, further catalytic transitions may occur such as in the case wherein H(1/2) is first formed:

$$n = \frac{1}{2} \to \frac{1}{3}, \frac{1}{3} \to \frac{1}{4}, \frac{1}{4} \to \frac{1}{5},$$

and so on. Once catalysis begins, hydrinos autocatalyze further in a process called disproportionation wherein H or H(1/p) serves as the catalyst for another H or H(1/p') (p may equal p').

Hydrogen and hydrinos may serves as catalysts. Hydrogen atoms H(1/p) p=1, 2, 3, . . . 137 can undergo transitions to lower-energy states given by Eqs. (1) and (3) wherein the transition of one atom is catalyzed by a second that resonantly and nonradiatively accepts m·27.2 eV with a concomitant opposite change in its potential energy. The overall general equation for the transition of H(1/p) to H(1/(m+p)) induced by a resonance transfer of m·27.2 eV to H(1/p') is represented by Eq. (10). Thus, hydrogen atoms may serve as a catalyst wherein m=1, m=2, and m=3 for one, two, and three atoms, respectively, acting as a catalyst for another. The rate for the two- or three-atom-catalyst case would be appreciable only when the H density is high. But, high H densities are not uncommon A high hydrogen atom concentration permissive of 2H or 3H serving as the energy acceptor for a third or fourth may be achieved under several circumstances such as on the surface of the Sun and stars due to the temperature and gravity driven density, on metal surfaces that support multiple monolayers, and in highly dissociated plasmas, especially pinched hydrogen plasmas. Additionally, a three-body H interaction is easily achieved when two H atoms arise with the collision of a hot H with $H_2$. This event can commonly occur in plasmas having a large population of extraordinarily fast H. This is evidenced by the unusual intensity of atomic H emission. In such cases, energy transfer can occur from a hydrogen atom to two others within sufficient proximity, being typically a few angstroms via multipole coupling. Then, the reaction between three hydrogen atoms whereby two atoms resonantly and nonradiatively accept 54.4 eV from the third hydrogen atom such that 2H serves as the catalyst is given by $$54.4\ \text{eV} + 2\text{H} + \text{H} \rightarrow 2\text{H}^+_{fast} + 2e^- + \text{H}^*\left[\frac{a_H}{3}\right] + 54.4\ \text{eV} \quad (24)$$

$$\text{H}^*\left[\frac{a_H}{3}\right] \rightarrow \text{H}\left[\frac{a_H}{3}\right] + 54.4\ \text{eV} \quad (25)$$

$$2\text{H}^+_{fast} + 2e^- \rightarrow 2\text{H} + 54.4\ \text{eV} \quad (26)$$

And, the overall reaction is $$\text{H} \rightarrow \text{H}\left[\frac{a_H}{3}\right] + [3^2 - 1^2] \cdot 13.6\ \text{eV} \quad (27)$$

wherein $$\text{H}^*\left[\frac{a_H}{3}\right]$$

has the radius of the hydrogen atom and a central field equivalent to 3 times that of a proton and $$\text{H}\left[\frac{a_H}{3}\right]$$

is the corresponding stable state with the radius of 1/3 that of H. As the electron undergoes radial acceleration from the radius of the hydrogen atom to a radius of 1/3 this distance, energy is released as characteristic light emission or as third-body kinetic energy.

In another H-atom catalyst reaction involving a direct transition to $$\left[\frac{a_H}{4}\right]$$

state, two hot $H_2$ molecules collide and dissociate such that three H atoms serve as a catalyst of 3·27.2 eV for the fourth. Then, the reaction between four hydrogen atoms whereby three atoms resonantly and nonradiatively accept 81.6 eV from the fourth hydrogen atom such that 3H serves as the catalyst is given by $$81.6\ \text{eV} + 3\text{H} + \text{H} \rightarrow 3\text{H}^+_{fast} + 3e^- + \text{H}^*\left[\frac{a_H}{4}\right] + 81.6\ \text{eV} \quad (28)$$

-continued $$\text{H}^*\left[\frac{a_H}{4}\right] \rightarrow \text{H}\left[\frac{a_H}{4}\right] + 122.4\ \text{eV} \quad (29)$$

$$3\text{H}^+_{fast} + 3e^- \rightarrow 3\text{H} + 81.6\ \text{eV} \quad (30)$$

And, the overall reaction is $$\text{H} \rightarrow \text{H}\left[\frac{a_H}{4}\right] + [4^2 - 1^2] \cdot 13.6\ \text{eV} \quad (31)$$

The extreme-ultraviolet continuum radiation band due to the $$\text{H}^*\left[\frac{a_H}{4}\right]$$

intermediate of Eq. (28) is predicted to have short wavelength cutoff at 122.4 eV (10.1 nm) and extend to longer wavelengths. This continuum band was confirmed experimentally. In general, the transition of H to $$\text{H}\left[\frac{a_H}{p = m + 1}\right]$$

due by the acceptance of m·27.2 eV gives a continuum band with a short wavelength cutoff and energy $$E_{\left(H \rightarrow H\left[\frac{a_H}{p=m+1}\right]\right)}$$

given by $$E_{\left(H \rightarrow H\left[\frac{a_H}{p=m+1}\right]\right)} = m^2 \cdot 13.6\ \text{eV} \quad (32)$$

$$\lambda_{\left(H \rightarrow H\left[\frac{a_H}{p=m+1}\right]\right)} = \frac{91.2}{m^2}\ \text{nm} \quad (33)$$

and extending to longer wavelengths than the corresponding cutoff. The hydrogen emission series of 10.1 nm, 22.8 nm, and 91.2 nm continua were observed experimentally in interstellar medium, the Sun and white dwarf stars.

The potential energy of $H_2O$ is 81.6 eV (Eq. (43)) [Mills GUT]. Then, by the same mechanism, the nascent $H_2O$ molecule (not hydrogen bonded in solid, liquid, or gaseous state) may serve as a catalyst (Eqs. (44-47)). The continuum radiation band at 10.1 nm and going to longer wavelengths for theoretically predicted transitions of H to lower-energy, so called "hydrino" states, was observed only arising from pulsed pinched hydrogen discharges first at BlackLight Power, Inc. (BLP) and reproduced at the Harvard Center for Astrophysics (CfA). Continuum radiation in the 10 to 30 nm region that matched predicted transitions of H to hydrino states, were observed only arising from pulsed pinched hydrogen discharges with metal oxides that are thermodynamically favorable to undergo H reduction to form HOH catalyst; whereas, those that are unfavorable did not show any continuum even though the low-melting point metals tested are very favorable to forming metal ion plasmas with strong short-wavelength continua in more powerful plasma sources.

Alternatively, a resonant kinetic energy transfer to form fast H may occur consistent with the observation of extraordinary Balmer α line broadening corresponding to high-kinetic energy H. The energy transfer to two H also causes pumping of the catalyst excited states, and fast H is produced directly as given by exemplary Eqs. (24), (28), and (47) and by resonant kinetic energy transfer.

II. Hydrinos

A hydrogen atom having a binding energy given by $$\text{Binding Energy} = \frac{13.6 \text{ eV}}{(1/p)^2} \tag{34}$$

where p is an integer greater than 1, preferably from 2 to 137, is the product of the H catalysis reaction of the present disclosure. The binding energy of an atom, ion, or molecule, also known as the ionization energy, is the energy required to remove one electron from the atom, ion or molecule. A hydrogen atom having the binding energy given in Eq. (34) is hereafter referred to as a "hydrino atom" or "hydrino." The designation for a hydrino of radius $$\frac{a_H}{p},$$

where $a_H$ is the radius of an ordinary hydrogen atom and p is an integer, is $$H\left[\frac{a_H}{p}\right].$$

A hydrogen atom with a radius $a_H$ is hereinafter referred to as "ordinary hydrogen atom" or "normal hydrogen atom." Ordinary atomic hydrogen is characterized by its binding energy of 13.6 eV.

Hydrinos are formed by reacting an ordinary hydrogen atom with a suitable catalyst having a net enthalpy of reaction of $$m \cdot 27.2 \text{ eV} \tag{35}$$

where m is an integer. It is believed that the rate of catalysis is increased as the net enthalpy of reaction is more closely matched to m·27.2 eV. It has been found that catalysts having a net enthalpy of reaction within ±10%, preferably ±5%, of m·27.2 eV are suitable for most applications.

This catalysis releases energy from the hydrogen atom with a commensurate decrease in size of the hydrogen atom, $r_n = na_H$. For example, the catalysis of H(n=1) to H(n=1/2) releases 40.8 eV, and the hydrogen radius decreases from $a_H$ to $$\frac{1}{2}a_H.$$

A catalytic system is provided by the ionization of t electrons from an atom each to a continuum energy level such that the sum of the ionization energies of the t electrons is approximately m·27.2 eV where m is an integer. As a power source, the energy given off during catalysis is much greater than the energy lost to the catalyst. The energy released is large as compared to conventional chemical reactions. For example, when hydrogen and oxygen gases undergo combustion to form water

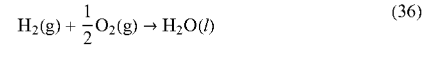

$$H_2(g) + \frac{1}{2}O_2(g) \rightarrow H_2O(l) \tag{36}$$

the known enthalpy of formation of water is $\Delta H_f = -286$ kJ/mole or 1.48 eV per hydrogen atom. By contrast, each (n=1) ordinary hydrogen atom undergoing catalysis releases a net of 40.8 eV. Moreover, further catalytic transitions may occur:

$$n = \frac{1}{2} \rightarrow \frac{1}{3}, \frac{1}{3} \rightarrow \frac{1}{4}, \frac{1}{4} \rightarrow \frac{1}{5},$$

and so on. Once catalysis begins, hydrinos autocatalyze further in a process called disproportionation. This mechanism is similar to that of an inorganic ion catalysis. But, hydrino catalysis should have a higher reaction rate than that of the inorganic ion catalyst due to the better match of the enthalpy to m·27.2 eV.

III. Hydrino Catalysts and Hydrino Products

Hydrogen catalysts capable of providing a net enthalpy of reaction of approximately m·27.2 eV where m is an integer to produce a hydrino (whereby t electrons are ionized from an atom or ion) are given in TABLE 1. The atoms or ions given in the first column are ionized to provide the net enthalpy of reaction of m·27.2 eV given in the tenth column where m is given in the eleventh column. The electrons, that participate in ionization are given with the ionization potential (also called ionization energy or binding energy). The ionization potential of the nth electron of the atom or ion is designated by $IP_n$ and is given by the CRC. That is for example, $Li + 5.39172 \text{ eV} \rightarrow Li^+ + e^-$ and $Li^+ + 75.6402 \text{ eV} \rightarrow Li^{2+} + e^-$. The first ionization potential, $IP_1 = 5.39172$ eV, and the second ionization potential, $IP_2 = 75.6402$ eV, are given in the second and third columns, respectively. The net enthalpy of reaction for the double ionization of Li is 81.0319 eV as given in the tenth column, and m=3 in Eq. (5) as given in the eleventh column.

TABLE 1

Hydrogen Catalysts.

| Catalyst | IP1 | IP2 | IP3 | IP4 | IP5 | IP6 | IP7 | IP8 | Enthalpy | m |
|---|---|---|---|---|---|---|---|---|---|---|
| Li | 5.39172 | 75.6402 | | | | | | | 81.032 | 3 |
| Be | 9.32263 | 18.2112 | | | | | | | 27.534 | 1 |
| Mg | 7.646235 | 15.03527 | 80.1437 | 109.2655 | 141.27 | | | | 353.3607 | 13 |

TABLE 1-continued

| Hydrogen Catalysts. | | | | | | | | | | |
|---|---|---|---|---|---|---|---|---|---|---|
| Catalyst | IP1 | IP2 | IP3 | IP4 | IP5 | IP6 | IP7 | IP8 | Enthalpy | m |
| K | 4.34066 | 31.63 | 45.806 | | | | | | 81.777 | 3 |
| Ca | 6.11316 | 11.8717 | 50.9131 | 67.27 | | | | | 136.17 | 5 |
| Ti | 6.8282 | 13.5755 | 27.4917 | 43.267 | 99.3 | | | | 190.46 | 7 |
| V | 6.7463 | 14.66 | 29.311 | 46.709 | 65.2817 | | | | 162.71 | 6 |
| Cr | 6.76664 | 16.4857 | 30.96 | | | | | | 54.212 | 2 |
| Mn | 7.43402 | 15.64 | 33.668 | 51.2 | | | | | 107.94 | 4 |
| Fe | 7.9024 | 16.1878 | 30.652 | | | | | | 54.742 | 2 |
| Fe | 7.9024 | 16.1878 | 30.652 | 54.8 | | | | | 109.54 | 4 |
| Co | 7.881 | 17.083 | 33.5 | 51.3 | | | | | 109.76 | 4 |
| Co | 7.881 | 17.083 | 33.5 | 51.3 | 79.5 | | | | 189.26 | 7 |
| Ni | 7.6398 | 18.1688 | 35.19 | 54.9 | 76.06 | | | | 191.96 | 7 |
| Ni | 7.6398 | 18.1688 | 35.19 | 54.9 | 76.06 | 108 | | | 299.96 | 11 |
| Cu | 7.72638 | 20.2924 | | | | | | | 28.019 | 1 |
| Zn | 9.39405 | 17.9644 | | | | | | | 27.358 | 1 |
| Zn | 9.39405 | 17.9644 | 39.723 | 59.4 | 82.6 | 108 | 134 | 174 | 625.08 | 23 |
| Ga | 5.999301 | 20.51514 | | | | | | | 26.5144 | 1 |
| As | 9.8152 | 18.633 | 28.351 | 50.13 | 62.63 | 127.6 | | | 297.16 | 11 |
| Se | 9.75238 | 21.19 | 30.8204 | 42.945 | 68.3 | 81.7 | 155.4 | | 410.11 | 15 |
| Kr | 13.9996 | 24.3599 | 36.95 | 52.5 | 64.7 | 78.5 | | | 271.01 | 10 |
| Kr | 13.9996 | 24.3599 | 36.95 | 52.5 | 64.7 | 78.5 | 111 | | 382.01 | 14 |
| Rb | 4.17713 | 27.285 | 40 | 52.6 | 71 | 84.4 | 99.2 | | 378.66 | 14 |
| Rb | 4.17713 | 27.285 | 40 | 52.6 | 71 | 84.4 | 99.2 | 136 | 514.66 | 19 |
| Sr | 5.69484 | 11.0301 | 42.89 | 57 | 71.6 | | | | 188.21 | 7 |
| Nb | 6.75885 | 14.32 | 25.04 | 38.3 | 50.55 | | | | 134.97 | 5 |
| Mo | 7.09243 | 16.16 | 27.13 | 46.4 | 54.49 | 68.8276 | | | 220.10 | 8 |
| Mo | 7.09243 | 16.16 | 27.13 | 46.4 | 54.49 | 68.8276 | 125.664 | 143.6 | 489.36 | 18 |
| Ru | 7.3605 | 16.76 | 28.47 | 50 | 60 | | | | 162.5905 | 6 |
| Pd | 8.3369 | 19.43 | | | | | | | 27.767 | 1 |
| Sn | 7.34381 | 14.6323 | 30.5026 | 40.735 | 72.28 | | | | 165.49 | 6 |
| Te | 9.0096 | 18.6 | | | | | | | 27.61 | 1 |
| Te | 9.0096 | 18.6 | 27.96 | | | | | | 55.57 | 2 |
| Cs | 3.8939 | 23.1575 | | | | | | | 27.051 | 1 |
| Ba | 5.211664 | 10.00383 | 35.84 | 49 | 62 | | | | 162.0555 | 6 |
| Ba | 5.21 | 10 | 37.3 | | | | | | | |
| Ce | 5.5387 | 10.85 | 20.198 | 36.758 | 65.55 | | | | 138.89 | 5 |
| Ce | 5.5387 | 10.85 | 20.198 | 36.758 | 65.55 | 77.6 | | | 216.49 | 8 |
| Pr | 5.464 | 10.55 | 21.624 | 38.98 | 57.53 | | | | 134.15 | 5 |
| Sm | 5.6437 | 11.07 | 23.4 | 41.4 | | | | | 81.514 | 3 |
| Gd | 6.15 | 12.09 | 20.63 | 44 | | | | | 82.87 | 3 |
| Dy | 5.9389 | 11.67 | 22.8 | 41.47 | | | | | 81.879 | 3 |
| Pb | 7.41666 | 15.0322 | 31.9373 | | | | | | 54.386 | 2 |
| Pt | 8.9587 | 18.563 | | | | | | | 27.522 | 1 |
| $He^+$ | | 54.4178 | | | | | | | 54.418 | 2 |
| $Na^+$ | | 47.2864 | 71.6200 | 98.91 | | | | | 217.816 | 8 |
| $Mg^{2+}$ | | | 80.1437 | | | | | | 80.1437 | 3 |
| $Rb^+$ | | 27.285 | | | | | | | 27.285 | 1 |
| $Fe^{3+}$ | | | | 54.8 | | | | | 54.8 | 2 |
| $Mo^{2+}$ | | | 27.13 | | | | | | 27.13 | 1 |
| $Mo^{4+}$ | | | | | 54.49 | | | | 54.49 | 2 |
| $In^{3+}$ | | | | 54 | | | | | 54 | 2 |
| $Ar^+$ | | 27.62 | | | | | | | 27.62 | 1 |
| $Sr^+$ | | 11.03 | 42.89 | | | | | | 53.92 | 2 |

The hydrino hydride ion of the present disclosure can be formed by the reaction of an electron source with a hydrino, that is, a hydrogen atom having a binding energy of about $$\frac{13.6\ \text{eV}}{n^2},\ \text{where } n = \frac{1}{p}$$

and p is an integer greater than 1. The hydrino hydride ion is represented by $H^-(n=1/p)$ or $H^-(1/p)$:

$$H\left[\frac{a_H}{p}\right] + e^- \rightarrow H^-(n = 1/p) \tag{37}$$

$$H\left[\frac{a_H}{p}\right] + e^- \rightarrow H^-(1/p). \tag{38}$$

The hydrino hydride ion is distinguished from an ordinary hydride ion comprising an ordinary hydrogen nucleus and two electrons having a binding energy of about 0.8 eV. The latter is hereafter referred to as “ordinary hydride ion” or “normal hydride ion.” The hydrino hydride ion comprises a hydrogen nucleus including proteum, deuterium, or tritium, and two indistinguishable electrons at a binding energy according to Eqs. (39) and (40).

The binding energy of a hydrino hydride ion can be represented by the following formula:

$$\text{Binding Energy} = \frac{\hbar^2\sqrt{s(s+1)}}{8\mu_e a_0^2\left[\frac{1+\sqrt{s(s+1)}}{p}\right]^2} - \frac{\pi\mu_0 e^2\hbar^2}{m_e^2}\left(\frac{1}{a_H^3} + \frac{2^2}{a_0^3 p\left[\frac{1+\sqrt{s(s+1)}}{p}\right]^3}\right) \tag{39}$$

where p is an integer greater than one, s=1/2, π is pi, ℏ is Planck's constant bar, $\mu_o$ is the permeability of vacuum, $m_e$ is the mass of the electron, $\mu_e$ is the reduced electron mass given by $$\mu_e = \frac{m_e m_p}{\frac{m_e}{\sqrt{\frac{3}{4}}} + m_p}$$

where $m_p$ is the mass of the proton, $a_H$ is the radius of the hydrogen atom, $a_o$ is the Bohr radius, and e is the elementary charge. The radii are given by $$r_2 = r_1 = a_0\left(1+\sqrt{s(s+1)}\right);\ s = \frac{1}{2}. \tag{40}$$

The binding energies of the hydrino hydride ion, $H^-$(n=1/p) as a function of p, where p is an integer, are shown in TABLE 2.

TABLE 2

The representative binding energy of the hydrino hydride ion $H^-$ (n = 1/p) as a function of p, Eq. (39).

| Hydride Ion | $r_1(a_o)^a$ | Binding Energy (eV)$^b$ | Wavelength (nm) |
|---|---|---|---|
| $H^-$ (n = 1) | 1.8660 | 0.7542 | 1644 |
| $H^-$ (n = 1/2) | 0.9330 | 3.047 | 406.9 |
| $H^-$ (n = 1/3) | 0.6220 | 6.610 | 187.6 |
| $H^-$ (n = 1/4) | 0.4665 | 11.23 | 110.4 |
| $H^-$ (n = 1/5) | 0.3732 | 16.70 | 74.23 |
| $H^-$ (n = 1/6) | 0.3110 | 22.81 | 54.35 |
| $H^-$ (n = 1/7) | 0.2666 | 29.34 | 42.25 |
| $H^-$ (n = 1/8) | 0.2333 | 36.09 | 34.46 |
| $H^-$ (n = 1/9) | 0.2073 | 42.84 | 28.94 |
| $H^-$ (n = 1/10) | 0.1866 | 49.38 | 25.11 |
| $H^-$ (n = 1/11) | 0.1696 | 55.50 | 22.34 |
| $H^-$ (n = 1/12) | 0.1555 | 60.98 | 20.33 |
| $H^-$ (n = 1/13) | 0.1435 | 65.63 | 18.89 |
| $H^-$ (n = 1/14) | 0.1333 | 69.22 | 17.91 |
| $H^-$ (n = 1/15) | 0.1244 | 71.55 | 17.33 |
| $H^-$ (n = 1/16) | 0.1166 | 72.40 | 17.12 |
| $H^-$ (n = 1/17) | 0.1098 | 71.56 | 17.33 |
| $H^-$ (n = 1/18) | 0.1037 | 68.83 | 18.01 |
| $H^-$ (n = 1/19) | 0.0982 | 63.98 | 19.38 |
| $H^-$ (n = 1/20) | 0.0933 | 56.81 | 21.82 |
| $H^-$ (n = 1/21) | 0.0889 | 47.11 | 26.32 |
| $H^-$ (n = 1/22) | 0.0848 | 34.66 | 35.76 |
| $H^-$ (n = 1/23) | 0.0811 | 19.26 | 64.36 |
| $H^-$ (n = 1/24) | 0.0778 | 0.6945 | 1785 |

[a] Eq. (40)
[b] Eq. (39)

According to the present disclosure, a hydrino hydride ion ($H^-$) having a binding energy according to Eqs. (39) and (40) that is greater than the binding of ordinary hydride ion (about 0.75 eV) for p=2 up to 23, and less for p=24 ($H^-$) is provided. For p=2 to p=24 of Eqs. (39) and (40), the hydride ion binding energies are respectively 3, 6.6, 11.2, 16.7, 22.8, 29.3, 36.1, 42.8, 49.4, 55.5, 61.0, 65.6, 69.2, 71.6, 72.4, 71.6, 68.8, 64.0, 56.8, 47.1, 34.7, 19.3, and 0.69 eV. Exemplary compositions comprising the novel hydride ion are also provided herein.

Exemplary compounds are also provided comprising one or more hydrino hydride ions and one or more other elements. Such a compound is referred to as a "hydrino hydride compound."

Ordinary hydrogen species are characterized by the following binding energies (a) hydride ion, 0.754 eV ("ordinary hydride ion"); (b) hydrogen atom ("ordinary hydrogen atom"), 13.6 eV; (c) diatomic hydrogen molecule, 15.3 eV ("ordinary hydrogen molecule"); (d) hydrogen molecular ion, 16.3 eV ("ordinary hydrogen molecular ion"); and (e)

22.6 eV ("ordinary trihydrogen molecular ion"). Herein, with reference to forms of hydrogen, "normal" and "ordinary" are synonymous.

According to a further embodiment of the present disclosure, a compound is provided comprising at least one increased binding energy hydrogen species such as (a) a hydrogen atom having a binding energy of about $$\frac{13.6\ \text{eV}}{\left(\frac{1}{p}\right)^2},$$

such as within a range of about 0.9 to 1.1 times $$\frac{13.6\ \text{eV}}{\left(\frac{1}{p}\right)^2}$$

where p is an integer from 2 to 137; (b) a hydride ion ($H^-$) having a binding energy of about $$\text{Binding Energy} = \frac{\hbar^2\sqrt{s(s+1)}}{8\mu_e a_0^2\left[\frac{1+\sqrt{s(s+1)}}{p}\right]^2} - \frac{\pi\mu_0 e^2\hbar^2}{m_e^2}\left(\frac{1}{a_H^3} + \frac{2^2}{a_0^3\left[\frac{1+\sqrt{s(s+1)}}{p}\right]^3}\right),$$

such as within a range of about 0.9 to 1.1 times the binding energy, where p is an integer from 2 to 24;

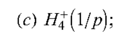

(d) a trihydrino molecular ion,

having a binding energy of about $$\frac{22.6}{\left(\frac{1}{p}\right)^2} \text{ eV}$$

such as within a range of about 0.9 to 1.1 times $$\frac{22.6}{\left(\frac{1}{p}\right)^2} \text{ eV}$$

where p is an integer from 2 to 137; (e) a dihydrino having a binding energy of about $$\frac{15.3}{\left(\frac{1}{p}\right)^2} \text{ eV}$$

such as within a range of about 0.9 to 1.1 times $$\frac{15.3}{\left(\frac{1}{p}\right)^2} \text{ eV}$$

where p is an integer from 2 to 137; (f) a dihydrino molecular ion with a binding energy of about $$\frac{16.3}{\left(\frac{1}{p}\right)^2} \text{ eV}$$

such as within a range of about 0.9 to 1.1 times $$\frac{16.3}{\left(\frac{1}{p}\right)^2} \text{ eV}$$

where p is an integer, preferably an integer from 2 to 137.

According to a further embodiment of the present disclosure, a compound is provided comprising at least one increased binding energy hydrogen species such as (a) a dihydrino molecular ion having a total energy of about $$E_T = -p^2\left\{\begin{array}{c}\frac{e^2}{8\pi\varepsilon_o a_H}(4\ln 3 - 1 - 2\ln 3)\left[1 + p\sqrt{\frac{2\hbar\sqrt{\frac{2e^2}{4\pi\varepsilon_o(2a_H)^3}}}{m_e c^2}}\right] - \\ \frac{1}{2}\hbar\sqrt{\frac{\frac{pe^2}{4\pi\varepsilon_o\left(\frac{2a_H}{p}\right)^3} - \frac{pe^2}{8\pi\varepsilon_o\left(\frac{3a_H}{p}\right)^3}}{\mu}}\end{array}\right\} = p^2 16.13392 \text{ eV} - p^3 0.118755 \text{ eV} \quad (41)$$

such as within a range of about 0.9 to 1.1 times the total energy $E_T$, where p is an integer, $\hbar$ is Planck's constant bar, $m_e$ is the mass of the electron, c is the speed of light in vacuum, and μ is the reduced nuclear mass, and (b) a dihydrino molecule having a total energy of about $$E_T = -p^2\left\{\begin{array}{c}\frac{e^2}{8\pi\varepsilon_o a_0}\left[\left(2\sqrt{2} - \sqrt{2} + \frac{\sqrt{2}}{2}\right)\ln\frac{\sqrt{2}+1}{\sqrt{2}-1} - \sqrt{2}\right] \\ \left[1 + p\sqrt{\frac{2\hbar\sqrt{\frac{e^2}{4\pi\varepsilon_o a_0^3}}}{m_e c^2}}\right] - \\ \frac{1}{2}\hbar\sqrt{\frac{\frac{pe^2}{4\pi\varepsilon_o\left(\frac{2a_0}{p}\right)^3} - \frac{pe^2}{8\pi\varepsilon_o\left(\frac{\left(1+\frac{1}{\sqrt{2}}\right)a_0}{p}\right)^3}}{\mu}}\end{array}\right\} = -p^2 31.351 \text{ eV} - p^3 0.326469 \text{ eV} \quad (42)$$

such as within a range of about 0.9 to 1.1 times $E_T$, where p is an integer and $a_o$ is the Bohr radius.

According to one embodiment of the present disclosure wherein the compound comprises a negatively charged increased binding energy hydrogen species, the compound further comprises one or more cations, such as a proton, ordinary

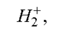

or ordinary

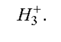

A method is provided herein for preparing compounds comprising at least one hydrino hydride ion. Such compounds are hereinafter referred to as "hydrino hydride compounds." The method comprises reacting atomic hydrogen with a catalyst having a net enthalpy of reaction of about $$\frac{m}{2} \cdot 27 \text{ eV},$$

where m is an integer greater than 1, preferably an integer less than 400, to produce an increased binding energy hydrogen atom having a binding energy of about $$\frac{13.6 \text{ eV}}{\left(\frac{1}{p}\right)^2}$$

where p is an integer, preferably an integer from 2 to 137. A further product of the catalysis is energy. The increased binding energy hydrogen atom can be reacted with an electron source, to produce an increased binding energy hydride ion. The increased binding energy hydride ion can be reacted with one or more cations to produce a compound comprising at least one increased binding energy hydride ion.

The novel hydrogen compositions of matter can comprise:

(a) at least one neutral, positive, or negative hydrogen species (hereinafter "increased binding energy hydrogen species") having a binding energy (i) greater than the binding energy of the corresponding ordinary hydrogen species, or (ii) greater than the binding energy of any hydrogen species for which the corresponding ordinary hydrogen species is unstable or is not observed because the ordinary hydrogen species' binding energy is less than thermal energies at ambient conditions (standard temperature and pressure, STP), or is negative; and (b) at least one other element. The compounds of the present disclosure are hereinafter referred to as "increased binding energy hydrogen compounds."

By "other element" in this context is meant an element other than an increased binding energy hydrogen species. Thus, the other element can be an ordinary hydrogen species, or any element other than hydrogen. In one group of compounds, the other element and the increased binding energy hydrogen species are neutral. In another group of compounds, the other element and increased binding energy hydrogen species are charged such that the other element provides the balancing charge to form a neutral compound. The former group of compounds is characterized by molecular and coordinate bonding; the latter group is characterized by ionic bonding.

Also provided are novel compounds and molecular ions comprising (a) at least one neutral, positive, or negative hydrogen species (hereinafter "increased binding energy hydrogen species") having a total energy
  (i) greater than the total energy of the corresponding ordinary hydrogen species, or
  (ii) greater than the total energy of any hydrogen species for which the corresponding ordinary hydrogen species is unstable or is not observed because the ordinary hydrogen species' total energy is less than thermal energies at ambient conditions, or is negative; and (b) at least one other element.

The total energy of the hydrogen species is the sum of the energies to remove all of the electrons from the hydrogen species. The hydrogen species according to the present disclosure has a total energy greater than the total energy of the corresponding ordinary hydrogen species. The hydrogen species having an increased total energy according to the present disclosure is also referred to as an "increased binding energy hydrogen species" even though some embodiments of the hydrogen species having an increased total energy may have a first electron binding energy less that the first electron binding energy of the corresponding ordinary hydrogen species. For example, the hydride ion of Eqs. (39) and (40) for p=24 has a first binding energy that is less than the first binding energy of ordinary hydride ion, while the total energy of the hydride ion of Eqs. (39) and (40) for p=24 is much greater than the total energy of the corresponding ordinary hydride ion.

Also provided herein are novel compounds and molecular ions comprising (a) a plurality of neutral, positive, or negative hydrogen species (hereinafter "increased binding energy hydrogen species") having a binding energy
  (i) greater than the binding energy of the corresponding ordinary hydrogen species, or
  (ii) greater than the binding energy of any hydrogen species for which the corresponding ordinary hydrogen species is unstable or is not observed because the ordinary hydrogen species' binding energy is less than thermal energies at ambient conditions or is negative; and (b) optionally one other element. The compounds of the present disclosure are hereinafter referred to as "increased binding energy hydrogen compounds."

The increased binding energy hydrogen species can be formed by reacting one or more hydrino atoms with one or more of an electron, hydrino atom, a compound containing at least one of said increased binding energy hydrogen species, and at least one other atom, molecule, or ion other than an increased binding energy hydrogen species.

Also provided are novel compounds and molecular ions comprising (a) a plurality of neutral, positive, or negative hydrogen species (hereinafter "increased binding energy hydrogen species") having a total energy
  (i) greater than the total energy of ordinary molecular hydrogen, or
  (ii) greater than the total energy of any hydrogen species for which the corresponding ordinary hydrogen species is unstable or is not observed because the ordinary hydrogen species' total energy is less than thermal energies at ambient conditions or is negative; and (b) optionally one other element. The compounds of the present disclosure are hereinafter referred to as "increased binding energy hydrogen compounds."

In an embodiment, a compound is provided comprising at least one increased binding energy hydrogen species chosen from (a) hydride ion having a binding energy according to Eqs. (39) and (40) that is greater than the binding of ordinary hydride ion (about 0.8 eV) for p=2 up to 23, and less for p=24 ("increased binding energy hydride ion" or "hydrino hydride ion"); (b) hydrogen atom having a binding energy greater than the binding energy of ordinary hydrogen atom (about 13.6 eV) ("increased binding energy hydrogen atom" or "hydrino"); (c) hydrogen molecule having a first binding energy greater than about 15.3 eV ("increased binding energy hydrogen molecule" or "dihydrino"); and (d) molecular hydrogen ion having a binding energy greater than about 16.3 eV ("increased binding energy molecular hydrogen ion" or "dihydrino molecular ion"). In the present disclosure, increased binding energy hydrogen species and compounds is also referred to as lower-energy hydrogen species and compounds. Hydrinos comprise an increased binding energy hydrogen species or equivalently a lower-energy hydrogen species.

IV. Additional MH-Type Catalysts and Reactions

In general, MH type hydrogen catalysts to produce hydrinos provided by the breakage of the M-H bond plus the ionization of t electrons from the atom M each to a continuum energy level such that the sum of the bond energy and ionization energies of the t electrons is approximately m·27.2 eV where m is an integer are given in TABLE 3A. Each MH catalyst is given in the first column and the corresponding M-H bond energy is given in column two. The atom M of the MH species given in the first column is ionized to provide the net enthalpy of reaction of m·27.2 eV with the addition of the bond energy in column two. The enthalpy of the catalyst is given in the eighth column where m is given in the ninth column. The electrons that participate in ionization are given with the ionization potential (also called ionization energy or binding energy). For example, the bond energy of NaH, 1.9245 eV, is given in column two. The ionization potential of the nth electron of the atom or ion is designated by $IP_n$ and is given by the CRC. That is for example, $Na+5.13908\ eV \rightarrow Na^+ + e^-$ and $Na^+ + 47.2864$ eV→$Na^{2+}$+$e^-$. The first ionization potential, $IP_1$=5.13908 eV, and the second ionization potential, $IP_2$=47.2864 eV, are given in the second and third columns, respectively. The net enthalpy of reaction for the breakage of the NaH bond and the double ionization of Na is 54.35 eV as given in the eighth column, and m=2 in Eq. (35) as given in the ninth column. The bond energy of BaH is 1.98991 eV and $IP_1$, $IP_2$, and $IP_3$ are 5.2117 eV, 10.00390 eV, and 37.3 eV, respectively. The net enthalpy of reaction for the breakage of the BaH bond and the triple ionization of Ba is 54.5 eV as given in the eighth column, and m=2 in Eq. (35) as given in the ninth column. The bond energy of SrH is 1.70 eV and $IP_1$, $IP_2$, $IP_3$, $IP_4$, and $IP_5$ are 5.69484 eV, 11.03013 eV, 42.89 eV, 57 eV, and 71.6 eV, respectively. The net enthalpy of reaction for the breakage of the SrH bond and the ionization of Sr to $Sr^{5+}$ is 190 eV as given in the eighth column, and m=7 in Eq. (35) as given in the ninth column.

TABLE 3A

MH type hydrogen catalysts capable of providing a net enthalpy of reaction of approximately m · 27.2 eV. Energies are in eV.

| Catalyst | M-H Bond Energy | $IP_1$ | $IP_2$ | $IP_3$ | $IP_4$ | $IP_5$ | Enthalpy | m |
|---|---|---|---|---|---|---|---|---|
| AlH | 2.98 | 5.985768 | 18.82855 | | | | 27.79 | 1 |
| AsH | 2.84 | 9.8152 | 18.633 | 28.351 | 50.13 | | 109.77 | 4 |
| BaH | 1.99 | 5.21170 | 10.00390 | 37.3 | | | 54.50 | 2 |
| BiH | 2.936 | 7.2855 | 16.703 | | | | 26.92 | 1 |
| CdH | 0.72 | 8.99367 | 16.90832 | | | | 26.62 | 1 |
| ClH | 4.4703 | 12.96763 | 23.8136 | 39.61 | | | 80.86 | 3 |
| CoH | 2.538 | 7.88101 | 17.084 | | | | 27.50 | 1 |
| GeH | 2.728 | 7.89943 | 15.93461 | | | | 26.56 | 1 |
| InH | 2.520 | 5.78636 | 18.8703 | | | | 27.18 | 1 |
| NaH | 1.925 | 5.139076 | 47.2864 | | | | 54.35 | 2 |
| NbH | 2.30 | 6.75885 | 14.32 | 25.04 | 38.3 | 50.55 | 137.26 | 5 |
| OH | 4.4556 | 13.61806 | 35.11730 | | | | 53.3 | 2 |
| OH | 4.4556 | 13.61806 | 35.11730 | 54.9355 | | | 108.1 | 4 |
| OH | 4.4556 | 13.61806 + 13.6 KE | 35.11730 + 13.6 KE | | | | 80.39 | 3 |
| RhH | 2.50 | 7.4589 | 18.08 | | | | 28.0 | 1 |
| RuH | 2.311 | 7.36050 | 16.76 | | | | 26.43 | 1 |
| SH | 3.67 | 10.36001 | 23.3379 | 34.79 | 47.222 | 72.5945 | 191.97 | 7 |
| SbH | 2.484 | 8.60839 | 16.63 | | | | 27.72 | 1 |
| SeH | 3.239 | 9.75239 | 21.19 | 30.8204 | 42.9450 | | 107.95 | 4 |
| SiH | 3.040 | 8.15168 | 16.34584 | | | | 27.54 | 1 |
| SnH | 2.736 | 7.34392 | 14.6322 | 30.50260 | | | 55.21 | 2 |
| SrH | 1.70 | 5.69484 | 11.03013 | 42.89 | 57 | 71.6 | 190 | 7 |
| TlH | 2.02 | 6.10829 | 20.428 | | | | 28.56 | 1 |

In other embodiments, $MH^-$ type hydrogen catalysts to produce hydrinos provided by the transfer of an electron to an acceptor A, the breakage of the M-H bond plus the ionization of t electrons from the atom M each to a continuum energy level such that the sum of the electron transfer energy comprising the difference of electron affinity (EA) of MH and A, M-H bond energy, and ionization energies of the t electrons from M is approximately m·27.2 eV where m is an integer are given in TABLE 3B. Each $MH^-$ catalyst, the acceptor A, the electron affinity of MH, the electron affinity of A, and the M-H bond energy, are is given in the first, second, third and fourth columns, respectively. The electrons of the corresponding atom M of MH that participate in ionization are given with the ionization potential (also called ionization energy or binding energy) in the subsequent columns and the enthalpy of the catalyst and the corresponding integer m are given in the last column. For example, the electron affinities of OH and H are 1.82765 eV and 0.7542 eV, respectively, such that the electron transfer energy is 1.07345 eV as given in the fifth column. The bond energy of OH is 4.4556 eV is given in column six. The ionization potential of the nth electron of the atom or ion is designated by $IP_n$. That is for example, O+13.61806 eV→$O^+$+$e^-$ and $O^+$+35.11730 eV→$O^{2+}$+$e^-$. The first ionization potential, $IP_1$=13.61806 eV, and the second ionization potential, $IP_2$=35.11730 eV, are given in the seventh and eighth columns, respectively. The net enthalpy of the electron transfer reaction, the breakage of the OH bond, and the double ionization of O is 54.27 eV as given in the eleventh column, and m=2 in Eq. (35) as given in the twelfth column. In other embodiments, the catalyst for H to form hydrinos is provided by the ionization of a negative ion such that the sum of its EA plus the ionization energy of one or more electrons is approximately m·27.2 eV where m is an integer. Alternatively, the first electron of the negative ion may be transferred to an acceptor followed by ionization of at least one more electron such that the sum of the electron transfer energy plus the ionization energy of one or more electrons is approximately m·27.2 eV where m is an integer. The electron acceptor may be H.

TABLE 3B

MH⁻ type hydrogen catalysts capable of providing a net enthalpy of reaction of approximately m · 27.2 eV. Energies in eV.

| Catalyst | Acceptor (A) | EA (MH) | EA (A) | Electron Transfer | M-H Bond Energy | $IP_1$ | $IP_2$ | $IP_3$ | $IP_4$ | Enthalpy | m |
|---|---|---|---|---|---|---|---|---|---|---|---|
| $OH^-$ | H | 1.82765 | 0.7542 | 1.07345 | 4.4556 | 13.61806 | 35.11730 | | | 54.27 | 2 |
| $SiH^-$ | H | 1.277 | 0.7542 | 0.5228 | 3.040 | 8.15168 | 16.34584 | | | 28.06 | 1 |
| $CoH^-$ | H | 0.671 | 0.7542 | −0.0832 | 2.538 | 7.88101 | 17.084 | | | 27.42 | 1 |
| $NiH^-$ | H | 0.481 | 0.7542 | −0.2732 | 2.487 | 7.6398 | 18.16884 | | | 28.02 | 1 |
| $SeH^-$ | H | 2.2125 | 0.7542 | 1.4583 | 3.239 | 9.75239 | 21.19 | 30.8204 | 42.9450 | 109.40 | 4 |

In other embodiments, $MH^+$ type hydrogen catalysts to produce hydrinos are provided by the transfer of an electron from an donor A which may be negatively charged, the breakage of the M-H bond, and the ionization of t electrons from the atom M each to a continuum energy level such that the sum of the electron transfer energy comprising the difference of ionization energies of MH and A, bond M-H energy, and ionization energies of the t electrons from M is approximately m·27.2 eV where m is an integer.

In an embodiment, the catalyst comprises any species such as an atom, positively or negatively charged ion, positively or negatively charged molecular ion, molecule, excimer, compound, or any combination thereof in the ground or excited state that is capable of accepting energy of m·27.2 eV, m=1, 2, 3, 4, . . . . (Eq. (5)). It is believed that the rate of catalysis is increased as the net enthalpy of reaction is more closely matched to m·27.2 eV. It has been found that catalysts having a net enthalpy of reaction within ±10%, preferably ±5%, of m·27.2 eV are suitable for most applications. In the case of the catalysis of hydrino atoms to lower energy states, the enthalpy of reaction of m·27.2 eV (Eq. (5)) is relativistically corrected by the same factor as the potential energy of the hydrino atom. In an embodiment, the catalyst resonantly and radiationless accepts energy from atomic hydrogen. In an embodiment, the accepted energy decreases the magnitude of the potential energy of the catalyst by about the amount transferred from atomic hydrogen. Energetic ions or electrons may result due to the conservation of the kinetic energy of the initially bound electrons. At least one atomic H serves as a catalyst for at least one other wherein the 27.2 eV potential energy of the acceptor is cancelled by the transfer or 27.2 eV from the donor H atom being catalyzed. The kinetic energy of the acceptor catalyst H may be conserved as fast protons or electrons. Additionally, the intermediate state (Eq. (7)) formed in the catalyzed H decays with the emission of continuum energy in the form of radiation or induced kinetic energy in a third body. These energy releases may result in current flow in the CIHT cell of the present disclosure.

In an embodiment, at least one of a molecule or positively or negatively charged molecular ion serves as a catalyst that accepts about m27.2 eV from atomic H with a decrease in the magnitude of the potential energy of the molecule or positively or negatively charged molecular ion by about m27.2 eV. For example, the potential energy of $H_2O$ given in Mills GUTCP is $$V_e = \left(\frac{3}{2}\right)\frac{-2e^2}{8\pi\varepsilon_0\sqrt{a^2-b^2}}\ln\frac{a+\sqrt{a^2-b^2}}{a-\sqrt{a^2-b^2}} = -81.8715\ \text{eV} \quad (43)$$

A molecule that accepts m·27.2 eV from atomic H with a decrease in the magnitude of the potential energy of the molecule by the same energy may serve as a catalyst. For example, the catalysis reaction (m=3) regarding the potential energy of $H_2O$ is

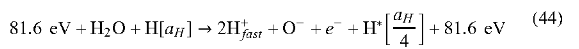

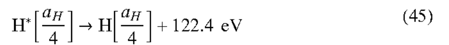

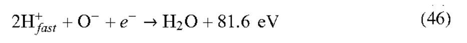

And, the overall reaction is

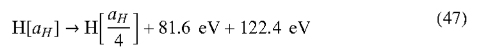

wherein $$H^*\left[\frac{a_H}{4}\right]$$

has the radius of the hydrogen atom and a central field equivalent to 4 times that of a proton and $$H\left[\frac{a_H}{4}\right]$$

is the corresponding stable state with the radius of 1/4 that of H. As the electron undergoes radial acceleration from the radius of the hydrogen atom to a radius of 1/4 this distance, energy is released as characteristic light emission or as third-body kinetic energy. Based on the 10% energy change in the heat of vaporization in going from ice at 0° C. to water at 100° C., the average number of H bonds per water molecule in boiling water is 3.6. Thus, in an embodiment, $H_2O$ must be formed chemically as isolated molecules with suitable activation energy in order to serve as a catalyst to form hydrinos. In an embodiment, the $H_2O$ catalyst is nascent $H_2O$.

In an embodiment, at least one of nH, O, nO, $O_2$, OH, and $H_2O$ (n=integer) may serve as the catalyst. The product of H and OH as the catalyst may be H(1/5) wherein the catalyst enthalpy is about 108.8 eV. The product of the reaction of H and $H_2O$ as the catalyst may be H(1/4). The hydrino product may further react to lower states. The product of H(1/4) and H as the catalyst may be H(1/5) wherein the catalyst enthalpy is about 27.2 eV. The product of H(1/4) and OH as the catalyst may be H(1/6) wherein the catalyst enthalpy is about 54.4 eV. The product of H(1/5) and H as the catalyst may be H(1/6) wherein the catalyst enthalpy is about 27.2 eV.

Additionally, OH may serve as a catalyst since the potential energy of OH is $$V_e = \left(\frac{3}{4}\right)\frac{-2e^2}{8\pi\varepsilon_0\sqrt{a^2-b^2}}\ln\frac{a+\sqrt{a^2-b^2}}{a-\sqrt{a^2-b^2}} = -40.92709 \text{ eV} \quad (48)$$

The difference in energy between the H states p=1 and p=2 is 40.8 eV. Thus, OH may accept about 40.8 eV from H to serve as a catalyst to form H(1/2).

Similarly to $H_2O$, the potential energy of the amide functional group $NH_2$ given in Mills GUTCP is −78.77719 eV. From the CRC, ΔH for the reaction of $NH_2$ to form $KNH_2$ calculated from each corresponding $\Delta H_f$ is (−128.9−184.9) kJ/mole=−313.8 kJ/mole (3.25 eV). From the CRC, ΔH for the reaction of $NH_2$ to form $NaNH_2$ calculated from each corresponding $\Delta H_f$ is (−123.8−184.9) kJ/mole=−308.7 kJ/mole (3.20 eV). From the CRC, ΔH for the reaction of $NH_2$ to form $LiNH_2$ calculated from each corresponding $\Delta H_f$ is (−179.5−184.9) kJ/mole=−364.4 kJ/mole (3.78 eV). Thus, the net enthalpy that may be accepted by alkali amides $MNH_2$ (M=K, Na, Li) serving as H catalysts to form hydrinos are about 82.03 eV, 81.98 eV, and 82.56 eV (m=3 in Eq. (5)), respectively, corresponding to the sum of the potential energy of the amide group and the energy to form the amide from the amide group. The hydrino product such as molecular hydrino may cause an upfield matrix shift observed by means such as MAS NMR.

Similarly to $H_2O$, the potential energy of the $H_2S$ functional group given in Mills GUTCP is −72.81 eV. The cancellation of this potential energy also eliminates the energy associated with the hybridization of the 3p shell. This hybridization energy of 7.49 eV is given by the ratio of the hydride orbital radius and the initial atomic orbital radius times the total energy of the shell. Additionally, the energy change of the S3p shell due to forming the two S—H bonds of 1.10 eV is included in the catalyst energy. Thus, the net enthalpy of $H_2S$ catalyst is 81.40 eV (m=3 in Eq. (5)). $H_2S$ catalyst may be formed from MHS (M=alkali) by the reaction

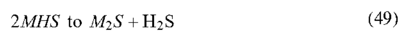

$$2MHS \text{ to } M_2S + H_2S \quad (49)$$

This reversible reaction may form $H_2S$ in an active catalytic state in the transition state to product $H_2S$ that may catalyze H to hydrino. The reaction mixture may comprise reactants that form $H_2S$ and a source of atomic H. The hydrino product such as molecular hydrino may cause an upfield matrix shift observed by means such as MAS NMR.

Furthermore, atomic oxygen is a special atom with two unpaired electrons at the same radius equal to the Bohr radius of atomic hydrogen. When atomic H serves as the catalyst, 27.2 eV of energy is accepted such that the kinetic energy of each ionized H serving as a catalyst for another is 13.6 eV. Similarly, each of the two electrons of O can be ionized with 13.6 eV of kinetic energy transferred to the O ion such that the net enthalpy for the breakage of the O—H bond of OH with the subsequent ionization of the two outer unpaired electrons is 80.4 eV as given in TABLE 3. During the ionization of $OH^-$ to OH, the energy match for the further reaction to H(1/4) and $O^{2+}+2e^-$ may occur wherein the 204 eV of energy released contributes to the CIHT cell's electrical power. The reaction is given as follows:

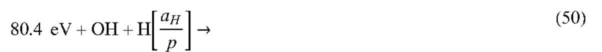

$$80.4 \text{ eV} + OH + H\left[\frac{a_H}{p}\right] \rightarrow \quad (50)$$

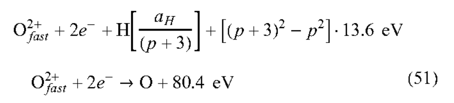

$$O_{fast}^{2+} + 2e^- + H\left[\frac{a_H}{(p+3)}\right] + [(p+3)^2 - p^2] \cdot 13.6 \text{ eV}$$

$$O_{fast}^{2+} + 2e^- \rightarrow O + 80.4 \text{ eV} \quad (51)$$

And, the overall reaction is

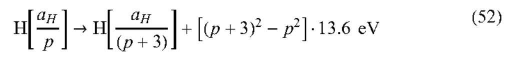

$$H\left[\frac{a_H}{p}\right] \rightarrow H\left[\frac{a_H}{(p+3)}\right] + [(p+3)^2 - p^2] \cdot 13.6 \text{ eV} \quad (52)$$

where m=3 in Eq. (5). The kinetic energy could also be conserved in hot electrons. The observation of H population inversion in water vapor plasmas is evidence of this mechanism. The hydrino product such as molecular hydrino may cause an upfield matrix shift observed by means such as MAS NMR. Other methods of identifying the molecular hydrino product such as FTIR, Raman, and XPS are given in the present disclosure.

In an embodiment wherein oxygen or a compound comprising oxygen participates in the oxidation or reduction reaction, $O_2$ may serve as a catalyst or a source of a catalyst. The bond energy of the oxygen molecule is 5.165 eV, and the first, second, and third ionization energies of an oxygen atom are 13.61806 eV, 35.11730 eV, and 54.9355 eV, respectively. The reactions $O_2 \rightarrow O + O^{2+}$, $O_2 \rightarrow O + O^{3-}$, and $2O \rightarrow 2O^+$ provide a net enthalpy of about 2, 4, and 1 times $E_h$, respectively, and comprise catalyst reactions to form hydrino by accepting these energies from H to cause the formation of hydrinos.

In an embodiment, the molecular hydrino product is observed as an inverse Raman effect (IRE) peak at about 1950 $cm^{-1}$. The peak is enhanced by using a conductive material comprising roughness features or particle size comparable to that of the Raman laser wavelength that supports a Surface Enhanced Raman Scattering (SERS) to show the IRE peak.

VI. Chemical Reactor

The present disclosure is also directed to other reactors for producing increased binding energy hydrogen species and compounds of the present disclosure, such as dihydrino molecules and hydrino hydride compounds. Further products of the catalysis are power and optionally plasma and light depending on the cell type. Such a reactor is hereinafter referred to as a "hydrogen reactor" or "hydrogen cell." The hydrogen reactor comprises a cell for making hydrinos. The cell for making hydrinos may take the form of a chemical reactor or gas fuel cell such as a gas discharge cell, a plasma torch cell, or microwave power cell, and an electrochemical cell. Exemplary embodiments of the cell for making hydrinos may take the form of a liquid-fuel cell, a solid-fuel cell, a heterogeneous-fuel cell, a CIHT cell, and an SF-CIHT cell. Each of these cells comprises: (i) a source of atomic hydrogen; (ii) at least one catalyst chosen from a solid catalyst, a molten catalyst, a liquid catalyst, a gaseous catalyst, or mixtures thereof for making hydrinos; and (iii) a vessel for reacting hydrogen and the catalyst for making hydrinos. As used herein and as contemplated by the present disclosure, the term "hydrogen," unless specified otherwise, includes not only proteum ($^1H$), but also deuterium ($^2H$) and tritium ($^3H$). Exemplary chemical reaction mixtures and reactors may comprise SF-CIHT, CIHT, or thermal cell embodiments of the present disclosure. Additional exemplary embodiments are given in this Chemical Reactor section. Examples of reaction mixtures having $H_2O$ as catalyst formed during the reaction of the mixture are given in the present disclosure. Other catalysts such as those given in TABLES 1 and 3 may serve to form increased binding energy hydrogen species and compounds. An exemplary M-H type catalyst of TABLE 3A is NaH. The reactions and conditions may be adjusted from these exemplary cases in the parameters such as the reactants, reactant wt %'s, $H_2$ pressure, and reaction temperature. Suitable reactants, conditions, and parameter ranges are those of the present disclosure. Hydrinos and molecular hydrino are shown to be products of the reactors of the present disclosure by predicted continuum radiation bands of an integer times 13.6 eV, otherwise unexplainable extraordinarily high H kinetic energies measured by Doppler line broadening of H lines, inversion of H lines, formation of plasma without a breakdown fields, and anomalously plasma afterglow duration as reported in Mills Prior Publications. The data such as that regarding the CIHT cell and solid fuels has been validated independently, off site by other researchers. The formation of hydrinos by cells of the present disclosure was also confirmed by electrical energies that were continuously output over long-duration, that were multiples of the electrical input that in most cases exceed the input by a factor of greater than 10 with no alternative source. The predicted molecular hydrino $H_2(1/4)$ was identified as a product of CIHT cells and solid fuels by MAS H NMR that showed a predicted upfield shifted matrix peak of about −4.4 ppm, ToF-SIMS and ESI-ToFMS that showed $H_2(1/4)$ complexed to a getter matrix as m/e=M+n2 peaks wherein M is the mass of a parent ion and n is an integer, electron-beam excitation emission spectroscopy and photoluminescence emission spectroscopy that showed the predicted rotational and vibration spectrum of $H_2(1/4)$ having 16 or quantum number p=4 squared times the energies of $H_2$, Raman and FTIR spectroscopy that showed the rotational energy of $H_2(1/4)$ of 1950 $cm^{-1}$, being 16 or quantum number p=4 squared times the rotational energy of $H_2$, XPS that showed the predicted total binding energy of $H_2(1/4)$ of 500 eV, and a ToF-SIMS peak with an arrival time before the m/e=1 peak that corresponded to H with a kinetic energy of about 204 eV that matched the predicted energy release for H to H(1/4) with the energy transferred to a third body H as reported in Mills Prior Publications and in R. Mills X Yu, Y. Lu, G Chu, J. He, J. Lotoski, "Catalyst Induced Hydrino Transition (CIHT) Electrochemical Cell", International Journal of Energy Research, (2013) and R. Mills, J. Lotoski, J. Kong, G Chu, J. He, J. Trevey, "High-Power-Density Catalyst Induced Hydrino Transition (CIHT) Electrochemical Cell" (2014) which are herein incorporated by reference in their entirety.

Using both a water flow calorimeter and a Setaram DSC 131 differential scanning calorimeter (DSC), the formation of hydrinos by cells of the present disclosure such as ones comprising a solid fuel to generate thermal power was confirmed by the observation of thermal energy from hydrino-forming solid fuels that exceed the maximum theoretical energy by a factor of 60 times. The MAS H NMR showed a predicted $H_2(1/4)$ upfield matrix shift of about −4.4 ppm. A Raman peak starting at 1950 $cm^{-1}$ matched the free space rotational energy of $H_2(1/4)$ (0.2414 eV). These results are reported in Mills Prior Publications and in R. Mills, J. Lotoski, W. Good, J. He, "Solid Fuels that Form HOH Catalyst", (2014) which is herein incorporated by reference in its entirety.

In an embodiment, a solid fuel reaction forms $H_2O$ and H as products or intermediate reaction products. The $H_2O$ may serve as a catalyst to form hydrinos. The reactants comprise at least one oxidant and one reductant, and the reaction comprises at least one oxidation-reduction reaction. The reductant may comprise a metal such as an alkali metal. The reaction mixture may further comprise a source of hydrogen, and a source of $H_2O$, and may optionally comprise a support such as carbon, carbide, boride, nitride, carbonitrile such as TiCN, or nitrile. The support may comprise a metal powder. In an embodiment, a hydrogen support comprises Mo or a Mo alloy such as those of the present disclosure such as MoPt, MoNi, MoCu, and MoCo. In an embodiment, oxidation of the support is avoided by methods such as selecting the other components of the reaction mixture that do not oxidize the support, selecting a non-oxidizing reaction temperature and conditions, and maintaining a reducing atmosphere such as a $H_2$ atmosphere as known by one skilled in the art. The source of H may be selected from the group of alkali, alkaline earth, transition, inner transition, rare earth hydrides, and hydrides of the present disclosure. The source of hydrogen may be hydrogen gas that may further comprise a dissociator such as those of the present disclosure such as a noble metal on a support such as carbon or alumina and others of the present disclosure. The source of water may comprise a compound that dehydrates such as a hydroxide or a hydroxide complex such as those of Al, Zn, Sn, Cr, Sb, and Pb. The source of water may comprise a source of hydrogen and a source of oxygen. The oxygen source may comprise a compound comprising oxygen. Exemplary compounds or molecules are $O_2$, alkali or alkali earth oxide, peroxide, or superoxide, $TeO_2$, $SeO_2$, $PO_2$, $P_2O_5$, $SO_2$, $SO_3$, $M_2SO_4$, $MHSO_4$, $CO_2$, $M_2S_2O_8$, $MMnO_4$, $M_2Mn_2O_4$, $M_xH_yPO_4$ (x, y=integer), $POBr_2$, $MClO_4$, $MNO_3$, NO, $N_2O$, $NO_2$, $N_2O_3$, $Cl_2O_7$, and $O_2$ (M=alkali; and alkali earth or other cation may substitute for M). Other exemplary reactants comprise reagents selected from the group of Li, LiH, $LiNO_3$, LiNO, $LiNO_2$, $Li_3N$, $Li_2NH$, $LiNH_2$, LiX, NH3, $LiBH_4$, $LiAlH_4$, $Li_3AlH_6$, LiOH, $Li_2S$, LiHS, LiFeSi, $Li_2CO_3$, $LiHCO_3$, $Li_2SO_4$, $LiHSO_4$, $Li_3PO_4$, $Li_2HPO_4$, $LiH_2PO_4$, $Li_2MoO_4$, $LiNbO_3$, $Li_2B_4O_7$ (lithium tetraborate), $LiBO_2$, $Li_2WO_4$, $LiAlCl_4$, $LiGaCl_4$, $Li_2CrO_4$, $Li_2Cr_2O_7$, $Li_2TiO_3$, $LiZrO_3$, $LiAlO_2$, $LiCoO_2$, $LiGaO_2$, $Li_2GeO_3$, $LiMn_2O_4$, $Li_4SiO_4$, $Li_2SiO_3$, $LiTaO_3$, $LiCuCl_4$, $LiPdCl_4$, $LiVO_3$, $LiIO_3$, $LiBrO_3$, $LiXO_3$ (X=F, Br, Cl, I), $LiFeO_2$, $LiIO_4$, $LiBrO_4$, $LiIO_4$, $LiXO_4$ (X=F, Br, Cl, I), $LiScO_n$, $LiTiO_n$, $LiVO_n$, $LiCrO_n$, $LiCr_2O_n$, $LiMn_2O_n$, $LiFeO_n$, $LiCoO_n$, $LiNiO_n$, $LiNi_2O_n$, $LiCuO_n$, and $LiZnO_n$, where n=1, 2, 3, or 4, an oxyanion, an oxyanion of a strong acid, an oxidant, a molecular oxidant such as $V_2O_3$, $I_2O_5$, $MnO_2$, $Re_2O_7$, $CrO_3$, $RuO_2$, AgO, PdO, $PdO_2$, PtO, $PtO_2$, and $NH_4X$ wherein X is a nitrate or other suitable anion given in the CRC, and a reductant. Another alkali metal or other cation may substitute for Li. Additional sources of oxygen may be selected from the group of $MCoO_2$, $MGaO_2$, $M_2GeO_3$, $MMn_2O_4$, $M_4SiO_4$, $M_2SiO_3$, $MTaO_3$, $MVO_3$, $MIO_3$, $MFeO_2$, $MIO_4$, $MClO_4$, $MScO_n$, $MTiO_n$, $MVO_n$, $MCrO_n$, $MCr_2O_n$, $MMn_2O_n$, $MFeO_n$, $MCoO_n$, $MNiO_n$, $MNi_2O_n$, $MCuO_n$, and $MZnO_n$, where M is alkali and n=1, 2, 3, or 4, an oxyanion, an oxyanion of a strong acid, an oxidant, a molecular oxidant such as $V_2O_3$, $I_2O_5$, $MnO_2$, $Re_2O_7$, $CrO_3$, $RuO_2$, AgO, PdO, $PdO_2$, PtO, $PtO_2$, $I_2O_4$, $I_2O_5$, $I_2O_9$, $SO_2$, $SO_3$, $CO_2$, $N_2O$, NO, $NO_2$, $N_2O_3$, $N_2O_4$, $N_2O_5$, $Cl_2O$, $ClO_2$, $Cl_2O_3$, $Cl_2O_6$, $Cl_2O_7$, $PO_2$, $P_2O_3$, and $P_2O_5$. The reactants may be in any desired ratio that forms hydrinos. An exemplary reaction mixture is 0.33 g of LiH, 1.7 g of $LiNO_3$ and the mixture of 1 g of $MgH_2$ and 4 g of activated C powder. Another exemplary reaction mixture is that of gun powder such as $KNO_3$ (75 wt %), softwood charcoal (that may comprise about the formulation $C_7H_4O$) (15 wt %), and S (10 wt %); $KNO_3$ (70.5 wt %) and softwood charcoal (29.5 wt %) or these ratios within the range of about ±1-30 wt %. The source of hydrogen may be charcoal comprising about the formulation $C_7H_4O$.

In an embodiment, the reaction mixture comprises reactants that form nitrogen, carbon dioxide, and $H_2O$ wherein the latter serves as the hydrino catalyst for H also formed in the reaction. In an embodiment, the reaction mixture comprises a source of hydrogen and a source of $H_2O$ that may comprise a nitrate, sulfate, perchlorate, a peroxide such as hydrogen peroxide, peroxy compound such as triacetone-triperoxide (TATP) or diacteone-diperoxide (DADP) that may also serve as a source of H especially with the addition of $O_2$ or another oxygen source such as a nitro compound such as nitrocellulose (APNC), oxygen or other compound comprising oxygen or oxyanion compound. The reaction mixture may comprise a source of a compound or a compound, or a source of a functional group or a functional group comprising at least two of hydrogen, carbon, hydrocarbon, and oxygen bound to nitrogen. The reactants may comprise a nitrate, nitrite, nitro group, and nitramine. The nitrate may comprise a metal such as alkali nitrate, may comprise ammonium nitrate, or other nitrates known to those skilled in the art such as alkali, alkaline earth, transition, inner transition, or rare earth metal, or Al, Ga, In, Sn, or Pb nitrates. The nitro group may comprise a functional group of an organic compound such as nitromethane, nitroglycerin, trinitrotoluene or a similar compound known to those skilled in the art. An exemplary reaction mixture is $NH_4NO_3$ and a carbon source such as a long chain hydrocarbon ($C_nH_{2n+2}$) such as heating oil, diesel fuel, kerosene that may comprise oxygen such as molasses or sugar or nitro such as nitromethane or a carbon source such as coal dust. The H source may also comprise the $NH_4$, the hydrocarbon such as fuel oil, or the sugar wherein the H bound to carbon provides a controlled release of H. The H release may be by a free radical reaction. The C may react with O to release H and form carbon-oxygen compounds such as CO, $CO_2$, and formate. In an embodiment, a single compound may comprise the functionalities to form nitrogen, carbon dioxide, and $H_2O$. A nitramine that further comprises a hydrocarbon functionality is cyclotrimethylene-trinitramine, commonly referred to as Cyclonite or by the code designation RDX. Other exemplary compounds that may serve as at least one of the source of H and the source of $H_2O$ catalyst such as a source of at least one of a source of O and a source of H are at least one selected from the group of ammonium nitrate (AN), black powder (75% $KNO_3$+15% charcoal+10% S), ammonium nitrate/fuel oil (ANFO) (94.3% AN+5.7% fuel oil), erythritol tetranitrate, trinitrotoluene (TNT), amatol (80% TNT+20% AN), tetrytol (70% tetryl+30% TNT), tetryl (2,4,6-trinitrophenylmethylnitramine ($C_7H_5N_5O_8$)), C-4 (91% RDX), C-3 (RDX based), composition B (63% RDX+36% TNT), nitroglycerin, RDX (cyclotrimethylenetrinitramine), Semtex (94.3% PETN+5.7% RDX), PETN (pentaerythritol tetranitrate), HMX or octogen (octahydro-1,3,5,7-tetranitro-1,3,5,7-tetrazocine), HNIW (CL-20) (2,4,6,8,10,12-hexanitro-2,4,6,8,10,12-hexaazaisowurtzitane), DDF, (4,4'-dinitro-3,3'-diazenofuroxan), heptanitrocubane, octanitrocubane, 2,4,6-tris(trinitromethyl)-1,3,5-triazine, TATNB (1,3,5-trinitrobenzene, 3,5-triazido-2,4,6-trinitrobenzene), trinitroanaline, TNP (2,4,6-trinitrophenol or picric acid), dunnite (ammonium picrate), methyl picrate, ethyl picrate, picrate chloride (2-chloro-1,3,5-trinitrobenzene), trinitocresol, lead styphnate (lead 2,4,6-trinitroresorcinate, $C_6HN_3O_8Pb$), TATB (triaminotrinitrobenzene), methyl nitrate, nitroglycol, mannitol hexanitrate, ethylenedinitramine, nitroguanidine, tetranitroglycoluril, nitrocellulos, urea nitrate, and hexamethylene triperoxide diamine (HMTD). The ratio of hydrogen, carbon, oxygen, and nitrogen may be in any desired ratio. In an embodiment of a reaction mixture of ammonium nitrate (AN) and fuel oil (FO) known as ammonium nitrate/fuel oil (ANFO), a suitable stoichiometry to give about a balanced reaction is about 94.3 wt % AN and 5.7 wt % FO, but the FO may be in excess. An exemplary balanced reaction of AN and nitromethane is

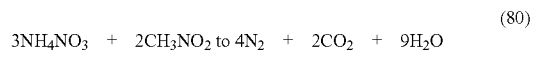

(80)

wherein some of the H is also converted to lower energy hydrogen species such as $H_2(1/p)$ and $H^-(1/p)$ such as p=4. In an embodiment, the molar ratios of hydrogen, nitrogen, and oxygen are similar such as in RDX having the formula $C_3H_6N_6O_6$.

In an embodiment, the energetics are increased by using an additional source of atomic hydrogen such as $H_2$ gas or a hydride such as alkali, alkaline earth, transition, inner transition, and rare earth metal hydrides and a dissociator such as Ni, Nb, or a noble metal on a support such as carbon, carbide, boride, or nitride or silica or alumina. The reaction mixture may produce a compression or shock wave during reaction to form $H_2O$ catalyst and atomic H to increase the kinetics to form hydrinos. The reaction mixture may comprise at least one reactant to increase the heat during the reaction to form H and $H_2O$ catalyst. The reaction mixture may comprise a source of oxygen such as air that may be dispersed between granules or prills of the solid fuel. For example AN prills may comprise about 20% air. The reaction mixture may further comprise a sensitizer such as air-filled glass beads. In an exemplary embodiment, a powdered metal such as Al is added to increase the heat and kinetics of reaction. For example, Al metal powder may be added to ANFO. Other reaction mixtures comprise pyrotechnic materials that also have a source of H and a source of catalyst such as $H_2O$. In an embodiment, the formation of hydrinos has a high activation energy that can be provided by an energetic reaction such as that of energetic or pyrotechnic materials wherein the formation of hydrinos contributes to the self-heating of the reaction mixture. Alternatively, the activation energy can be provided by an electrochemical reaction such as that of the CIHT cell that has a high equivalent temperature corresponding to 11,600 K/eV.

Another exemplary reaction mixture is $H_2$ gas that may be in the pressure range of about 0.01 atm to 100 atm, a nitrate such as an alkali nitrate such as $KNO_3$, and hydrogen dissociator such as Pt/C, Pd/C, Pt/$Al_2O_3$, or Pd/$Al_2O_3$. The mixture may further comprise carbon such as graphite or Grade GTA Grafoil (Union Carbide). The reaction ratios may be any desired such as about 1 to 10% Pt or Pd on carbon at about 0.1 to 10 wt % of the mixture mixed with the nitrate at about 50 wt %, and the balance carbon; though the ratios could be altered by a factor of about 5 to 10 in exemplary embodiments. In the case that carbon is used as a support, the temperature is maintained below that which results in a C reaction to form a compound such as a carbonate such as an alkali carbonate. In an embodiment, the temperature is maintained in a range such as about 50° C.-300° C. or about 100° C.-250° C. such that $NH_3$ is formed over $N_2$.

The reactants and regeneration reaction and systems may comprise those of the present disclosure or in my prior US patent applications such as Hydrogen Catalyst Reactor, PCT/US08/61455, filed PCT Apr. 24, 2008; Heterogeneous Hydrogen Catalyst Reactor, PCT/US09/052072, filed PCT Jul. 29, 2009; Heterogeneous Hydrogen Catalyst Power System, PCT/US10/27828, PCT filed Mar. 18, 2010; Electrochemical Hydrogen Catalyst Power System, PCT/US11/28889, filed PCT Mar. 17, 2011; $H_2O$-Based Electrochemical Hydrogen-Catalyst Power System, PCT/US12/31369 filed Mar. 30, 2012, CIHT Power System, PCT/US13/041938 filed May 21, 2013, and Power Generation Systems and Methods Regarding Same, PCT/IB2014/058177 ("Mills Prior Applications") herein incorporated by reference in their entirety.

In an embodiment, the reaction may comprise a nitrogen oxide such as $N_2O$, $NO_2$, or NO rather than a nitrate. Alternatively the gas is also added to the reaction mixture. NO, $NO_2$, and $N_2O$ and alkali nitrates can be generated by known industrial methods such as by the Haber process followed by the Ostwald process. In one embodiment, the exemplary sequence of steps is:

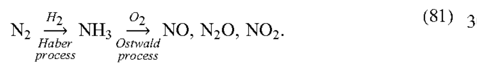 (81)

Specifically, the Haber process may be used to produce $NH_3$ from $N_2$ and $H_2$ at elevated temperature and pressure using a catalyst such as α-iron containing some oxide. The Ostwald process may be used to oxidize the ammonia to NO, $NO_2$, and $N_2O$ at a catalyst such as a hot platinum or platinum-rhodium catalyst. In an embodiment, the products are at least one of ammonia and an alkali compound. $NO_2$ may be formed from $NH_3$ by oxidation. $NO_2$ may be dissolved in water to form nitric acid that is reacted with the alkali compound such as $M_2O$, MOH, $M_2CO_3$, or $MHCO_3$ to form M nitrate wherein M is alkali.

In an embodiment, at least one reaction of a source of oxygen such as $MNO_3$ (M=alkali) to form $H_2O$ catalyst, (ii) the formation of atomic H from a source such as $H_2$, and (iii) the reaction to form hydrinos occurs by or an on a conventional catalyst such as a noble metal such as Pt that may be heated. The heated catalyst may comprise a hot filament. The filament may comprise a hot Pt filament. The source of oxygen such as $MNO_3$ may be at least partially gaseous. The gaseous state and its vapor pressure may be controlled by heating the $MNO_3$ such as $KNO_3$. The source of oxygen such as $MNO_3$ may be in an open boat that is heated to release gaseous $MNO_3$. The heating may be with a heater such as the hot filament. In an exemplary embodiment, $MNO_3$ is placed in a quartz boat and a Pt filament is wrapped around the boat to serve as the heater. The vapor pressure of the $MNO_3$ may be maintained in the pressure range of about 0.1 Torr to 1000 Torr or about 1 Torr to 100 Torr. The hydrogen source may be gaseous hydrogen that is maintained in the pressure range of about 1 Torr to 100 atm, about 10 Torr to 10 atm, or about 100 Torr to 1 atm. The filament also serves to dissociate hydrogen gas that may be supplied to the cell through a gas line. The cell may also comprise a vacuum line. The cell reactions give rise to $H_2O$ catalyst and atomic H that react to form hydrinos. The reaction may be maintained in a vessel capable of maintaining at least one of a vacuum, ambient pressure, or a pressure greater than atmospheric. The products such as $NH_3$ and MOH may be removed from the cell and regenerated. In an exemplary embodiment, $MNO_3$ reacts with the hydrogen source to form $H_2O$ catalyst and $NH_3$ that is regenerated in a separate reaction vessel or as a separate step by oxidation. In an embodiment, the source of hydrogen such as $H_2$ gas is generated from water by at least one of electrolysis or thermally. Exemplary thermal methods are the iron oxide cycle, cerium(IV) oxide-cerium(III) oxide cycle, zinc zinc-oxide cycle, sulfur-iodine cycle, copper-chlorine cycle and hybrid sulfur cycle and others known to those skilled in the art. Exemplary cell reactions to form $H_2O$ catalyst that reacts further with H to form hydrinos are (82)

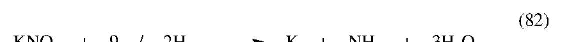

(83)

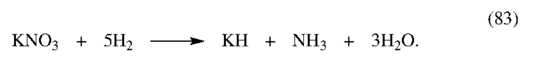

(84)

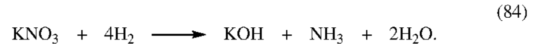

(85)

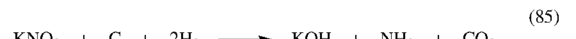

(86)

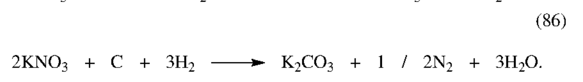

An exemplary regeneration reaction to form nitrogen oxides is given by Eq. (81). Products such a K, KH, KOH, and $K_2CO_3$ may be reacted with nitric acid formed by addition of nitrogen oxide to water to form $KNO_2$ or $KNO_3$. Additional suitable exemplary reactions to form at least one of the reacts $H_2O$ catalyst and $H_2$ are given in TABLES 4, 5, and 6.

TABLE 4

Thermally reversible reaction cycles regarding $H_2O$ catalyst and $H_2$. [L. C. Brown, G. E. Besenbruch, K. R. Schultz, A. C. Marshall, S. K. Showalter, P. S. Pickard and J. F. Funk, Nuclear Production of Hydrogen Using Thermochemical Water-Splitting Cycles, a preprint of a paper to be presented at the International Congress on Advanced Nuclear Power Plants (ICAPP) in Hollywood, Florida, Jun. 19-13, 2002, and published in the *Proceedings*.]

| Cycle | Name | T/E* | T (° C.) | Reaction |
|---|---|---|---|---|
| 1 | Westinghouse | T | 850 | $2H_2SO_4(g) \rightarrow 2SO_2(g) + 2H_2O(g) + O_2(g)$ |
| | | E | 77 | $SO_2(g) + 2H_2O(a) \rightarrow \rightarrow H_2SO_4(a) + H_2(g)$ |
| 2 | Ispra Mark 13 | T | 850 | $2H_2SO_4(g) \rightarrow 2SO_2(g) + 2H_2O(g) + O_2(g)$ |
| | | E | 77 | $2HBr(a) \rightarrow Br_2(a) + H_2(g)$ |
| | | T | 77 | $Br_2(l) + SO_2(g) + 2H_2O(l) \rightarrow 2HBr(g) + H_2SO_4(a)$ |

TABLE 4-continued

Thermally reversible reaction cycles regarding $H_2O$ catalyst and $H_2$. [L. C. Brown, G. E. Besenbruch, K. R. Schultz, A. C. Marshall, S. K. Showalter, P. S. Pickard and J. F. Funk, Nuclear Production of Hydrogen Using Thermochemical Water-Splitting Cycles, a preprint of a paper to be presented at the International Congress on Advanced Nuclear Power Plants (ICAPP) in Hollywood, Florida, Jun. 19-13, 2002, and published in the *Proceedings*.]

| Cycle | Name | T/E* | T (° C.) | Reaction |
|---|---|---|---|---|
| 3 | UT-3 Univ. of Tokyo | T | 600 | $2Br_2(g) + 2CaO \rightarrow 2CaBr_2 + O_2(g)$ |
| | | T | 600 | $3FeBr_2 + 4H_2O \rightarrow Fe_3O_4 + 6HBr + H_2(g)$ |
| | | T | 750 | $CaBr_2 + H_2O \rightarrow CaO + 2HBr$ |
| | | T | 300 | $Fe_3O4 + 8HBr \rightarrow Br_2 + 3FeBr_2 + 4H_2O$ |
| 4 | Sulfur-Iodine | T | 850 | $2H_2SO_4(g) \rightarrow 2SO_2(g) + 2H_2O(g) + O_2(g)$ |
| | | T | 450 | $2HI \rightarrow I_2(g) + H_2(g)$ |
| | | T | 120 | $I_2 + SO_2(a) + 2H_2O \rightarrow 2HI(a) + H_2SO_4(a)$ |
| 5 | Julich Center EOS | T | 800 | $2Fe_3O_4 + 6FeSO_4 \rightarrow 6Fe_2O_3 + 6SO_2 + O_2(g)$ |
| | | T | 700 | $3FeO + H_2O \rightarrow Fe_3O_4 + H_2(g)$ |
| | | T | 200 | $Fe_2O_3 + SO_2 \rightarrow FeO + FeSO_4$ |
| 6 | Tokyo Inst. Tech. Ferrite | T | 1000 | $2MnFe_2O_4 + 3Na_2CO_3 + H_2O \rightarrow 2Na_3MnFe_2O_6 + 3CO_2(g) + H_2(g)$ |
| | | T | 600 | $4Na_3MnFe_2O_6 + 6CO_2(g) \rightarrow 4MnFe_2O_4 + 6Na_2CO_3 + O_2(g)$ |
| 7 | Hallett Air Products 1965 | T | 800 | $2Cl_2(g) + 2H_2O(g) \rightarrow 4HCl(g) + O_2(g)$ |
| | | E | 25 | $2HCl \rightarrow Cl_2(g) + H_2(g)$ |
| 8 | Gaz de France | T | 725 | $2K + 2KOH \rightarrow 2K_2O + H_2(g)$ |
| | | T | 825 | $2K_2O \rightarrow 2K + K_2O_2$ |
| | | T | 125 | $2K_2O_2 + 2H_2O \rightarrow 4KOH + O_2(g)$ |
| 9 | Nickel Ferrite | T | 800 | $NiMnFe_4O_6 + 2H_2O \rightarrow NiMnFe_4O_8 + 2H_2(g)$ |
| | | T | 800 | $NiMnFe_4O_8 \rightarrow NiMnFe_4O_6 + O_2(g)$ |
| 10 | Aachen Univ Julich 1972 | T | 850 | $2Cl_2(g) + 2H_2O(g) \rightarrow 4HCl(g) + O_2(g)$ |
| | | T | 170 | $2CrCl_2 + 2HCl \rightarrow 2CrCl_3 + H_2(g)$ |
| | | T | 800 | $2CrCl_3 \rightarrow 2CrCl_2 + Cl_2(g)$ |
| 11 | Ispra Mark 1C | T | 100 | $2CuBr_2 + Ca(OH)_2 \rightarrow 2CuO + 2CaBr_2 + H_2O$ |
| | | T | 900 | $4CuO(s) \rightarrow 2Cu_2O(s) + O_2(g)$ |
| | | T | 730 | $CaBr_2 + 2H_2O \rightarrow Ca(OH)_2 + 2HBr$ |
| | | T | 100 | $Cu_2O + 4HBr \rightarrow 2CuBr_2 + H_2(g) + H_2O$ |
| 12 | LASL-U | T | 25 | $3CO_2 + U_3O_8 + H_2O \rightarrow 3UO_2CO_3 + H_2(g)$ |
| | | T | 250 | $3UO_2CO_3 \rightarrow 3CO_2(g) + 3UO_3$ |
| | | T | 700 | $6UO_3(s) \rightarrow 2U_3O_8(s) + O_2(g)$ |
| 13 | Ispra Mark 8 | T | 700 | $3MnCl_2 + 4H_2O \rightarrow Mn_3O_4 + 6HCl + H_2(g)$ |
| | | T | 900 | $3MnO_2 \rightarrow Mn_3O_4 + O_2(g)$ |
| | | T | 100 | $4HCl + Mn_3O_4 \rightarrow 2MnCl_2(a) + MnO_2 + 2H_2O$ |
| 14 | Ispra Mark 6 | T | 850 | $2Cl_2(g) + 2H_2O(g) \rightarrow 4HCl(g) + O_2(g)$ |
| | | T | 170 | $2CrCl_2 + 2HCl \rightarrow 2CrCl_3 + H_2(g)$ |
| | | T | 700 | $2CrCl_3 + 2FeCl_2 \rightarrow 2CrCl_2 + 2FeCl_3$ |
| | | T | 420 | $2FeCl_3 \rightarrow Cl_2(g) + 2FeCl_2$ |
| 15 | Ispra Mark 4 | T | 850 | $2Cl_2(g) + 2H_2O(g) \rightarrow 4HCl(g) + O_2(g)$ |
| | | T | 100 | $2FeCl_2 + 2HCl + S \rightarrow 2FeCl_3 + H_2S$ |
| | | T | 420 | $2FeCl_3 \rightarrow Cl_2(g) + 2FeCl_2$ |
| | | T | 800 | $H_2S \rightarrow S + H_2(g)$ |
| 16 | Ispra Mark 3 | T | 850 | $2Cl_2(g) + 2H_2O(g) \rightarrow 4HCl(g) + O_2(g)$ |
| | | T | 170 | $2VOCl_2 + 2HCl \rightarrow 2VOCl_3 + H_2(g)$ |
| | | T | 200 | $2VOCl_3 \rightarrow Cl_2(g) + 2VOCl_2$ |
| 17 | Ispra Mark 2 (1972) | T | 100 | $Na_2O{\bullet}MnO_2 + H_2O \rightarrow 2NaOH(a) + MnO_2$ |
| | | T | 487 | $4MnO_2(s) \rightarrow 2Mn_2O_3(s) + O_2(g)$ |
| | | T | 800 | $Mn_2O_3 + 4NaOH \rightarrow 2Na_2O{\bullet}MnO_2 + H_2(g) + H_2O$ |
| 18 | Ispra CO/Mn3O4 | T | 977 | $6Mn_2O_3 \rightarrow 4Mn_3O_4 + O_2(g)$ |
| | | T | 700 | $C(s) + H_2O(g) \rightarrow CO(g) + H_2(g)$ |
| | | T | 700 | $CO(g) + 2Mn_3O_4 \rightarrow C + 3Mn_2O_3$ |
| 19 | Ispra Mark 7B | T | 1000 | $2Fe_2O_3 + 6Cl_2(g) \rightarrow 4FeCl_3 + 3O_2(g)$ |
| | | T | 420 | $2FeCl_3 \rightarrow Cl_2(g) + 2FeCl_2$ |
| | | T | 650 | $3FeCl_2 + 4H_2O \rightarrow Fe_3O_4 + 6HCl + H_2(g)$ |
| | | T | 350 | $4Fe_3O_4 + O_2(g) \rightarrow 6Fe_2O_3$ |
| | | T | 400 | $4HCl + O_2(g) \rightarrow 2Cl_2(g) + 2H_2O$ |
| 20 | Vanadium Chloride | T | 850 | $2Cl_2(g) + 2H_2O(g) \rightarrow 4HCl(g) + O_2(g)$ |
| | | T | 25 | $2HCl + 2VCl_2 \rightarrow 2VCl_3 + H_2(g)$ |
| | | T | 700 | $2VCl_3 \rightarrow VCl_4 + VCl_2$ |
| | | T | 25 | $2VCl_4 \rightarrow Cl_2(g) + 2VCl_3$ |
| 21 | Ispra Mark 7A | T | 420 | $2FeCl_3(l) \rightarrow Cl_2(g) + 2FeCl_2$ |
| | | T | 650 | $3FeCl_2 + 4H_2O(g) \rightarrow Fe_3O_4 + 6HCl(g) + H_2(g)$ |
| | | T | 350 | $4Fe_3O_4 + O_2(g) \rightarrow 6Fe_2O_3$ |
| | | T | 1000 | $6Cl_2(g) + 2Fe_2O_3 \rightarrow 4FeCl_3(g) + 3O_2(g)$ |
| | | T | 120 | $Fe_2O_3 + 6HCl(a) \rightarrow 2FeCl_3(a) + 3H_2O(l)$ |
| 22 | GA Cycle 23 | T | 800 | $H_2S(g) \rightarrow S(g) + H_2(g)$ |
| | | T | 850 | $2H_2SO_4(g) \rightarrow 2SO_2(g) + 2H_2O(g) + O_2(g)$ |
| | | T | 700 | $3S + 2H_2O(g) \rightarrow 2H_2S(g) + SO_2(g)$ |
| | | T | 25 | $3SO_2(g) + 2H_2O(l) \rightarrow 2H_2SO_4(a) + S$ |
| | | T | 25 | $S(g) + O_2(g) \rightarrow SO_2(g)$ |

TABLE 4-continued

Thermally reversible reaction cycles regarding $H_2O$ catalyst and $H_2$. [L. C. Brown, G. E. Besenbruch, K. R. Schultz, A. C. Marshall, S. K. Showalter, P. S. Pickard and J. F. Funk, Nuclear Production of Hydrogen Using Thermochemical Water-Splitting Cycles, a preprint of a paper to be presented at the International Congress on Advanced Nuclear Power Plants (ICAPP) in Hollywood, Florida, Jun. 19-13, 2002, and published in the *Proceedings*.]

| Cycle | Name | T/E* | T (° C.) | Reaction |
|---|---|---|---|---|
| 23 | US-Chlorine | T | 850 | $2Cl_2(g) + 2H_2O(g) \rightarrow 4HCl(g) + O_2(g)$ |
| | | T | 200 | $2CuCl + 2HCl \rightarrow 2CuCl_2 + H_2(g)$ |
| | | T | 500 | $2CuCl_2 \rightarrow 2CuCl + Cl_2(g)$ |
| 24 | Ispra Mark | T | 420 | $2FeCl_3 \rightarrow Cl_2(g) + 2FeCl_2$ |
| | | T | 150 | $3Cl_2(g) + 2Fe_3O_4 + 12HCl \rightarrow 6FeCl_3 + 6H_2O + O_2(g)$ |
| | | T | 650 | $3FeCl_2 + 4H_2O \rightarrow Fe_3O_4 + 6HCl + H_2(g)$ |
| 25 | Ispra Mark 6C | T | 850 | $2Cl_2(g) + 2H_2O(g) \rightarrow 4HCl(g) + O_2(g)$ |
| | | T | 170 | $2CrCl_2 + 2HCl \rightarrow 2CrCl_3 + H_2(g)$ |
| | | T | 700 | $2CrCl_3 + 2FeCl_2 \rightarrow 2CrCl_2 + 2FeCl_3$ |
| | | T | 500 | $2CuCl_2 \rightarrow 2CuCl + Cl_2(g)$ |
| | | T | 300 | $CuCl + FeCl_3 \rightarrow CuCl_2 + FeCl_2$ |

*T = thermochemical, E = electrochemical.

TABLE 5

Thermally reversible reaction cycles regarding $H_2O$ catalyst and $H_2$. [C. Perkins and A. W. Weimer, Solar-Thermal Production of Renewable Hydrogen, AIChE Journal, 55 (2), (2009), pp. 286-293.]

| Cycle | Reaction Steps |
|---|---|
| High Temperature Cycles | |
| Zn/ZnO | $ZnO \xrightarrow{1600\text{-}1800^\circ C.} Zn + \frac{1}{2}O_2$ |
| | $Zn + H_2O \xrightarrow{400^\circ C.} ZnO + H_2$ |
| FeO/$Fe_3O_4$ | $Fe_3O_4 \xrightarrow{2000\text{-}2300^\circ C.} 3FeO + \frac{1}{2}O_2$ |
| | $3FeO + H_2O \xrightarrow{400^\circ C.} Fe_3O_4 + H_2$ |
| Cadmium carbonate | $CdO \xrightarrow{1450\text{-}1500^\circ C.} Cd + \frac{1}{2}O_2$ |
| | $Cd + H_2O + CO_2 \xrightarrow{350^\circ C.} CdCO_3 + H_2$ |
| | $CdCO_3 \xrightarrow{500^\circ C.} CO_2 + CdO$ |
| Hybrid cadmium | $CdO \xrightarrow{1450\text{-}1500^\circ C.} Cd + \frac{1}{2}O_2$ |
| | $Cd + 2H_2O \xrightarrow{25^\circ C.,\ electrochemical} Cd(OH)_2 + H_2$ |
| | $Cd(OH)_2 \xrightarrow{375^\circ C.} CdO + H_2O$ |
| Sodium manganese | $Mn_2O_3 \xrightarrow{1400\text{-}1600^\circ C.} 2MnO + \frac{1}{2}O_2$ |
| | $2MnO + 2NaOH \xrightarrow{627^\circ C.} 2NaMnO_2 + H_2$ |
| | $2NaMnO_2 + H_2O \xrightarrow{25^\circ C.} Mn_2O_3 + 2NaOH$ |
| M-Ferrite (M = Co, Ni, Zn) | $Fe_{3-x}M_xO_4 \xrightarrow{1200\text{-}1400^\circ C.} Fe_{3-x}M_xO_{4-\delta} + \frac{\delta}{2}O_2$ |

TABLE 5-continued

Thermally reversible reaction cycles regarding $H_2O$ catalyst and $H_2$. [C. Perkins and A. W. Weimer, Solar-Thermal Production of Renewable Hydrogen, AIChE Journal, 55 (2), (2009), pp. 286-293.]

| Cycle | Reaction Steps |
|---|---|
| | $Fe_{3-x}M_xO_{4-\delta} + \delta H_2O \xrightarrow{1000\text{-}1200^\circ C.} Fe_{3-x}M_xO_4 + \delta H_2$ |
| Low Temperature Cycles | |
| Sulfur-Iodine | $H_2SO_4 \xrightarrow{850^\circ C.} SO_2 + H_2O + \frac{1}{2}O_2$ |
| | $I_2 + SO_4 + 2H_2O \xrightarrow{100^\circ C.} 2HI + H_2SO_4$ |
| | $2HI \xrightarrow{300^\circ C.} I_2 + H_2$ |
| Hybrid sulfur | $H_2SO_4 \xrightarrow{850^\circ C.} SO_2 + H_2O + \frac{1}{2}O_2$ |
| | $SO_2 + 2H_2O \xrightarrow{77^\circ C.,\ electrochemical} H_2SO_4 + H_2$ |
| Hybrid copper chloride | $Cu_2OCl_2 \xrightarrow{550^\circ C.} 2CuCl + \frac{1}{2}O_2$ |
| | $2Cu + 2HCl \xrightarrow{425^\circ C.} H_2 + 2CuCl$ |
| | $4CuCl \xrightarrow{25^\circ C.,\ electrochemical} 2Cu + 2CuCl_2$ |
| | $2CuCl_2 + H_2O \xrightarrow{325^\circ C.} Cu_2OCl_2 + 2HCl$ |

TABLE 6

Thermally reversible reaction cycles regarding $H_2O$ catalyst and $H_2$. [S. Abanades, P. Charvin, G. Flamant, P. Neveu, Screening of Water-Splitting Thermochemical Cycles Potentially Attractive for Hydrogen Production by Concentrated Solar Energy, Energy, 31, (2006), pp. 2805-2822.]

| No ID | Name of the cycle | List of elements | Number of chemical steps | Maximum temperature (° C.) | Reactions |
|---|---|---|---|---|---|
| 6 | ZnO/Zn | Zn | 2 | 2000 | $ZnO \rightarrow Zn + ½O_2$<br>$Zn + H_2O \rightarrow ZnO + H_2$ |
| 7 | $Fe_3O_4$/FeO | Fe | 2 | 2200 | $Fe_3O_4 \rightarrow 3FeO + ½O_2$<br>$3FeO + H_2O \rightarrow Fe_3O_4 + H_2$ |
| 194 | $In_2O_3$/$In_2O$ | In | 2 | 2200 | $In_2O_3 \rightarrow In_2O + O_2$<br>$In2O + 2H_2O \rightarrow In_2O_3 + 2H_2$<br>(800° C.) |
| 194 | $SnO_2$/Sn | Sn | 2 | 2650 | $SnO_2 \rightarrow Sn + O_2$<br>$Sn + 2H_2O \rightarrow SnO_2 + 2H_2$ |
| 83 | MnO/$MnSO_4$ | Mn, S | 2 | 1100 | $MnSO_4 \rightarrow MnO + SO_2 +$<br>$½O_2$ (1100° C.)<br>$MnO + H_2O +$<br>$SO_2 \rightarrow MnSO_4 + H_2$ (250° C.) |
| 84 | FeO/$FeSO_4$ | Fe, S | 2 | 1100 | $FeSO_4 \rightarrow FeO + SO_2 +$<br>$½O_2$ (1100° C.)<br>$FeO + H_2O + SO_2 \rightarrow FeSO_4 +$<br>$H_2$ (250° C.) |
| 86 | CoO/$CoSO_4$ | Co, S | 2 | 1100 | $CoSO_4 \rightarrow CoO + SO_2 +$<br>$½O_2$ (1100° C.)<br>$CoO + H_2O + SO_2 \rightarrow CoSO_4 +$<br>$H_2$ (200° C.) |
| 200 | $Fe_3O_4$/$FeCl_2$ | Fe, Cl | 2 | 1500 | $Fe_3O_4 + 6HCl \rightarrow 3FeCl_2 +$<br>$3H_2O + ½O_2$ (1500° C.)<br>$3FeCl_2 + 4H_2O \rightarrow Fe_3O_4 +$<br>$6HCl + H_2$ (700° C.) |
| 14 | $FeSO_4$ Julich | Fe, S | 3 | 1800 | $3FeO(s) + H_2O \rightarrow Fe_3O_4(s) +$<br>$H_2$ (200° C.)<br>$Fe_3O_4(s) +$<br>$FeSO_4 \rightarrow 3Fe_2O_3(s) + 3SO_2(g) + ½O_2$ (800° C.)<br>$3Fe_2O_3(s) + 3SO_2 \rightarrow 3FeSO_4 +$<br>$3FeO(s)$ (1800° C.) |
| 85 | $FeSO_4$ | Fe, S | 3 | 2300 | $3FeO(s) + H_2O \rightarrow Fe_3O_4(s) +$<br>$H_2$ (200° C.)<br>$Fe_3O_4(s) +$<br>$3SO_3(g) \rightarrow 3FeSO_4 + ½O_2$ (300° C.)<br>$FeSO_4 \rightarrow FeO + SO_3$ |
| 109 | C7 IGT | Fe, S | 3 | 1000 | $Fe_2O_3(s) + 2SO_2(g) +$<br>$H_2O \rightarrow 2FeSO_4(s) + H_2$ (125° C.)<br>$2FeSO4(s) \rightarrow Fe_2O_3(s) +$<br>$SO_2(g) + SO_3(g)$ (700° C.)<br>$SO_3(g) \rightarrow SO_2(g) + ½O_2(g)$<br>(1000° C.) |
| 21 | Shell Process | Cu, S | 3 | 1750 | $6Cu(s) + 3H_2O \rightarrow 3Cu_2O(s) +$<br>$3H_2$ (500° C.)<br>$Cu_2O(s) + 2SO_2 +$<br>$3/2O_2 \rightarrow 2CuSO_4$ (300° C.)<br>$2Cu_2O(s) + 2CuSO_4 \rightarrow 6Cu + 2SO_2 + 3O_2$ (1750° C.) |
| 87 | $CuSO_4$ | Cu, S | 3 | 1500 | $Cu_2O(s) + H_2O(g) \rightarrow Cu(s) + Cu(OH)_2$ (1500° C.)<br>$Cu(OH)_2 + SO_2(g) \rightarrow CuSO_4 + H_2$ (100° C.)<br>$CuSO_4 + Cu(s) \rightarrow Cu_2O(s) +$<br>$SO_2 + ½O_2$ (1500° C.) |
| 110 | LASL $BaSO_4$ | Ba, Mo, S | 3 | 1300 | $SO_2 + H_2O +$<br>$BaMoO_4 \rightarrow BaSO_3 + MoO_3 + H_2O$ (300° C.)<br>$BaSO_3 + H_2O \rightarrow BaSO_4 + H_2$<br>$BaSO_4(s) +$<br>$MoO_3(s) \rightarrow BaMoO_4(s) + SO_2(g) + ½O_2$ (1300° C.) |
| 4 | Mark 9 | Fe, Cl | 3 | 900 | $3FeCl_2 + 4H_2O \rightarrow Fe_3O_4 +$<br>$6HCl + H_2$ (680° C.)<br>$Fe_3O_4 + 3/2Cl_2 +$<br>$6HCl \rightarrow 3FeCl_3 + 3H_2O + ½O_2$ (900° C.)<br>$3FeCl_3 \rightarrow 3FeCl_2 + 3/2Cl_2$ |
| 16 | Euratom 1972 | Fe, Cl | 3 | 1000 | $H_2O + Cl_2 \rightarrow 2HCl + ½O_2$<br>$2HCl + 2FeCl_2 \rightarrow 2FeCl_3 +$<br>$H_2$ (600° C.)<br>$2FeCl_3 \rightarrow 2FeCl_2 + Cl_2$ |
| 20 | Cr, Cl Julich | Cr, Cl | 3 | 1600 | $2CrCl_2$(s, $T_f$ = 815° C.) +<br>$2HCl \rightarrow 2CrCl_3(s) + H_2$ (200° C.)<br>$2CrCl_3$ (s, $T_f$ = 1150° C.)<br>$\rightarrow 2CrCl_2(s) + Cl_2$ (1600° C.)<br>$H_2O + Cl_2 \rightarrow 2HCl + ½O_2$ |

TABLE 6-continued

Thermally reversible reaction cycles regarding $H_2O$ catalyst and $H_2$. [S. Abanades, P. Charvin, G. Flamant, P. Neveu, Screening of Water-Splitting Thermochemical Cycles Potentially Attractive for Hydrogen Production by Concentrated Solar Energy, Energy, 31, (2006), pp. 2805-2822.]

| No ID | Name of the cycle | List of elements | Number of chemical steps | Maximum temperature (° C.) | Reactions |
|---|---|---|---|---|---|
| 27 | Mark 8 | Mn, Cl | 3 | 1000 | $6MnCl_2(l)$ + $8H_2O \rightarrow 2Mn_3O_4 + 12HCl + 2H_2$ (700° C.) $3Mn_3O_4(s)$ + $12HCl \rightarrow 6MnCl_2(s) + 3MnO_2(s) + 6H_2O$ (100° C.) $3MnO_2(s) \rightarrow Mn_3O_4(s) + O_2$ |
| 37 | Ta Funk | Ta, Cl | 3 | 2200 | $H_2O + Cl_2 \rightarrow 2HCl + ½O_2$ $2TaCl_2 + 2HCl \rightarrow 2TaCl_3$ + $H_2$ (100° C.) $2TaCl_3 \rightarrow 2TaCl_2 + Cl_2$ |
| 78 | Mark 3 Euratom JRC | V, Cl | 3 | 1000 | $Cl_2(g) + H_2O(g) \rightarrow 2HCl(g)$ + $½O_2(g)$ (1000° C.) Ispra (Italy) $2VOCl_2(s)$ + $2HCl(g) \rightarrow 2VOCl_3(g) + H_2(g)$ (170° C.) $2VOCl_3(g) \rightarrow Cl_2(g)$ + $2VOCl_2(s)$ (200° C.) |
| 144 | Bi, Cl | Bi, Cl | 3 | 1700 | $H_2O + Cl_2 \rightarrow 2HCl + ½O_2$ $2BiCl_2 + 2HCl \rightarrow 2BiCl_3$ + $H_2$ (300° C.) $2BiCl_3(T_f = 233° C., T_{eb} = 441° C.)$ $\rightarrow 2BiCl_2 + Cl_2$ (1700° C.) |
| 146 | Fe, Cl Julich | Fe, Cl | 3 | 1800 | $3Fe(s) + 4H_2O \rightarrow Fe_3O4(s)$ + $4H_2$ (700° C.) $Fe_3O_4 + 6HCl \rightarrow 3FeCl_2(g)$ + $3H_2O + ½O_2$ (1800° C.) $3FeCl_2 + 3H_2 \rightarrow 3Fe(s) + 6HCl$ (1300° C.) |
| 147 | Fe, Cl Cologne | Fe, Cl | 3 | 1800 | $^3/_2FeO(s) + ^3/_2Fe(s)$ + $2.5H_2O \rightarrow Fe_3O_4(s) + 2.5H_2$ (1000° C.) $Fe_3O_4 + 6HCl \rightarrow 3FeCl_2(g)$ + $3H_2O + ½O_2$ (1800° C.) $3FeCl_2 + H_2O$ + $^3/_2H_2 \rightarrow {}^3/_2FeO(s) + ^3/_2Fe(s) + 6HCl$ (700° C.) |
| 25 | Mark 2 | Mn, Na | 3 | 900 | $Mn_2O_3(s) + 4NaOH \rightarrow 2Na_2O•MnO_2 + H_2O + H_2$ (900° C.) $2Na_2O•MnO_2$ + $2H_2O \rightarrow 4NaOH + 2MnO_2(s)$ (100° C.) $2MnO_2(s) \rightarrow Mn_2O_3(s)$ + $½O_2$ (600° C.) |
| 28 | Li, Mn LASL | Mn, Li | 3 | 1000 | $6LiOH$ + $2Mn_3O_4 \rightarrow 3Li_2O•Mn_2O_3 + 2H_2O + H_2$ (700° C.) $3Li_2O•Mn_2O_3$ + $3H_2O \rightarrow 6LiOH + 3Mn_2O_3$ (80° C.) $3Mn_2O_3 \rightarrow 2Mn_3O_4 + ½O_2$ |
| 199 | Mn PSI | Mn, Na | 3 | 1500 | $2MnO$ + $2NaOH \rightarrow 2NaMnO_2 + H_2$ (800° C.) $2NaMnO_2 + H_2O \rightarrow Mn_2O_3$ + $2NaOH$ (100° C.) $Mn_2O_3(l) \rightarrow 2MnO(s)$ + $½O_2$ (1500° C.) |
| 178 | Fe, M ORNL | Fe, (M = Li, K, Na) | 3 | 1300 | $2Fe_3O_4 + 6MOH \rightarrow 3MFeO_2$ + $2H_2O + H_2$ (500° C.) $3MFeO_2 + 3H_2O \rightarrow 6MOH$ + $3Fe_2O_3$ (100° C.) $3Fe_2O_3(s) \rightarrow 2Fe_3O_4(s)$ + $½O_2$ (1300° C.) |
| 33 | Sn Souriau | Sn | 3 | 1700 | $Sn(l) + 2H_2O \rightarrow SnO_2 + 2H_2$ $2SnO_2(s) \rightarrow 2SnO + O_2$ $2SnO(s) \rightarrow SnO_2 + Sn(l)$ |
| 177 | Co ORNL | Co, Ba | 3 | 1000 | $CoO(s) + xBa(OH)_2(s) \rightarrow$ $Ba_xCoO_y(s) + (y - x -$ $1)H_2 + (1 + 2x - y) H_2O$ (850° C.) $Ba_xCoO_y(s) + xH_2O \rightarrow xBa(OH)_2(s) + CoO(y - x)(s)$ (100° C.) $CoO(y - x)(s) \rightarrow CoO(s) + (y -$ $x - 1)/2O_2$ (1000° C.) |
| 183 | Ce, Ti ORNL | Ce, Ti, Na | 3 | 1300 | $2CeO_2(s)$ + $3TiO_2(s) \rightarrow Ce_2O_3•3TiO_2 + ½O_2$ (800-1300° C.) $Ce_2O_3•3TiO_2$ + $6NaOH \rightarrow 2CeO_2 + 3Na_2TiO_3 + 2H_2O + H_2$ (800° C.) $CeO_2 + 3NaTiO_3$ + $3H_2O \rightarrow CeO_2(s) + 3TiO_2(s) + 6NaOH$ (150° C.) |

TABLE 6-continued

Thermally reversible reaction cycles regarding $H_2O$ catalyst and $H_2$. [S. Abanades, P. Charvin, G. Flamant, P. Neveu, Screening of Water-Splitting Thermochemical Cycles Potentially Attractive for Hydrogen Production by Concentrated Solar Energy, Energy, 31, (2006), pp. 2805-2822.]

| No ID | Name of the cycle | List of elements | Number of chemical steps | Maximum temperature (° C.) | Reactions |
|---|---|---|---|---|---|
| 269 | Ce, Cl GA | Ce, Cl | 3 | 1000 | $H_2O + Cl_2 \rightarrow 2HCl + ½O_2$<br>$2CeO_2 + 8HCl \rightarrow 2CeCl_3 + 4H_2O + Cl_2$ (250° C.)<br>$2CeCl_3 + 4H_2O \rightarrow 2CeO_2 + 6HCl + H_2$ (800° C.) |

Reactants to form $H_2O$ catalyst may comprise a source of O such as an O species and a source of H. The source of the O species may comprise at least one of $O_2$, air, and a compound or admixture of compounds comprising O. The compound comprising oxygen may comprise an oxidant. The compound comprising oxygen may comprise at least one of an oxide, oxyhydroxide, hydroxide, peroxide, and a superoxide. Suitable exemplary metal oxides are alkali oxides such as $Li_2O$, $Na_2O$, and $K_2O$, alkaline earth oxides such as MgO, CaO, SrO, and BaO, transition oxides such as NiO, $Ni_2O_3$, FeO, $Fe_2O_3$, and CoO, and inner transition and rare earth metals oxides, and those of other metals and metalloids such as those of Al, Ga, In, Si, Ge, Sn, Pb, As, Sb, Bi, Se, and Te, and mixtures of these and other elements comprising oxygen. The oxides may comprise a oxide anion such as those of the present disclosure such as a metal oxide anion and a cation such as an alkali, alkaline earth, transition, inner transition and rare earth metal cation, and those of other metals and metalloids such as those of Al, Ga, In, Si, Ge, Sn, Pb, As, Sb, Bi, Se, and Te such as $MM'_{2x}(O_{3x+1}$ or $MM'_{2x}O_4$ (M=alkaline earth, M'=transition metal such as Fe or Ni or Mn, x=integer) and $M_2M'_{2x}O_{3x+1}$ or $M_2M'_{2x}O_4$ (M=alkali, M'=transition metal such as Fe or Ni or Mn, x=integer). Suitable exemplary metal oxyhydroxides are AlO(OH), ScO(OH), YO(OH), VO(OH), CrO(OH), MnO (OH) (α-MnO(OH) groutite and γ-MnO(OH) manganite), FeO(OH), CoO(OH), NiO(OH), RhO(OH), GaO(OH), InO (OH), $Ni_{1/2}Co_{1/2}O(OH)$, and $Ni_{1/3}Co_{1/3}Mn_{1/3}O(OH)$. Suitable exemplary hydroxides are those of metals such as alkali, alkaline earth, transition, inner transition, and rare earth metals and those of other metals and metalloids such as such as Al, Ga, In, Si, Ge, Sn, Pb, As, Sb, Bi, Se, and Te, and mixtures. Suitable complex ion hydroxides are $Li_2Zn(OH)_4$, $Na_2Zn(OH)_4$, $Li_2Sn(OH)_4$, $Na_2Sn(OH)_4$, $Li_2Pb(OH)_4$, $Na_2Pb(OH)_4$, $LiSb(OH)_4$, $NaSb(OH)_4$, $LiAl(OH)_4$, $NaAl(OH)_4$, $LiCr(OH)_4$, $NaCr(OH)_4$, $Li_2Sn(OH)_6$, and $Na_2Sn(OH)_6$. Additional exemplary suitable hydroxides are at least one from $Co(OH)_2$, $Zn(OH)_2$, $Ni(OH)_2$, other transition metal hydroxides, $Cd(OH)_2$, $Sn(OH)_2$, and Pb(OH). Suitable exemplary peroxides are $H_2O_2$, those of organic compounds, and those of metals such as $M_2O_2$ where M is an alkali metal such as $Li_2O_2$, $Na_2O_2$, $K_2O_2$, other ionic peroxides such as those of alkaline earth peroxides such as Ca, Sr, or Ba peroxides, those of other electropositive metals such as those of lanthanides, and covalent metal peroxides such as those of Zn, Cd, and Hg. Suitable exemplary superoxides are those of metals $MO_2$ where M is an alkali metal such as $NaO_2$, $KO_2$, $RbO_2$, and $CsO_2$, and alkaline earth metal superoxides. In an embodiment, the solid fuel comprises an alkali peroxide and hydrogen source such as a hydride, hydrocarbon, or hydrogen storage material such as $BH_3NH_3$. The reaction mixture may comprise a hydroxide such as those of alkaline, alkaline earth, transition, inner transition, and rare earth metals, and Al, Ga, In, Sn, Pb, and other elements that form hydroxides and a source of oxygen such as a compound comprising at least one an oxyanion such as a carbonate such as one comprising alkaline, alkaline earth, transition, inner transition, and rare earth metals, and Al, Ga, In, Sn, Pb, and others of the present disclosure. Other suitable compounds comprising oxygen are at least one of oxyanion compound of the group of aluminate, tungstate, zirconate, titanate, sulfate, phosphate, carbonate, nitrate, chromate, dichromate, and manganate, oxide, oxyhydroxide, peroxide, superoxide, silicate, titanate, tungstate, and others of the present disclosure. An exemplary reaction of a hydroxide and a carbonate is given by (87)

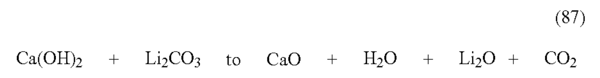

$$Ca(OH)_2 + Li_2CO_3 \text{ to } CaO + H_2O + Li_2O + CO_2$$

In other embodiments, the oxygen source is gaseous or readily forms a gas such as $NO_2$, NO, $N_2O$, $CO_2$, $P_2O_3$, $P_2O_5$, and $SO_2$. The reduced oxide product from the formation of $H_2O$ catalyst such as C, N, $NH_3$, P, or S may be converted back to the oxide again by combustion with oxygen or a source thereof as given in Mills Prior Applications. The cell may produce excess heat that may be used for heating applications, or the heat may be converted to electricity by means such as a Rankine or Brayton system. Alternatively, the cell may be used to synthesize lower-energy hydrogen species such as molecular hydrino and hydrino hydride ions and corresponding compounds.

In an embodiment, the reaction mixture to form hydrinos for at least one of production of lower-energy hydrogen species and compounds and production of energy comprises a source of atomic hydrogen and a source of catalyst comprising at least one of H and O such those of the present disclosure such as $H_2O$ catalyst. The reaction mixture may further comprise an acid such as $H_2SO_3$, $H_2SO_4$, $H_2CO_3$, $HNO_2$, $HNO_3$, $HClO_4$, $H_3PO_3$, and $H_3PO_4$ or a source of an acid such as an acid anhydride or anhydrous acid. The latter may comprise at least one of the group of $SO_2$, $SO_3$, $CO_2$, $NO_2$, $N_2O_3$, $N_2O_5$, $Cl_2O_7$, $PO_2$, $P_2O_3$, and $P_2O_5$. The reaction mixture may comprise at least one of a base and a basic anhydride such as $M_2O$ (M=alkali), M'O (M'=alkaline earth), ZnO or other transition metal oxide, CdO, CoO, SnO, AgO, HgO, or $Al_2O_3$. Further exemplary anhydrides comprise metals that are stable to $H_2O$ such as Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. The anhydride may be an alkali metal or alkaline earth metal oxide, and the hydrated compound may comprise a hydroxide. The reaction mixture may comprise an oxyhydroxide such as FeOOH, NiOOH, or CoOOH. The reaction mixture may comprise at least one of a source of $H_2O$ and $H_2O$. The $H_2O$ may be formed reversibly by hydration and dehydration reactions in the presence of atomic hydrogen. Exemplary reactions to form $H_2O$ catalyst are

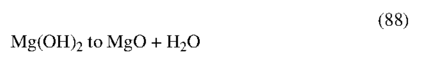

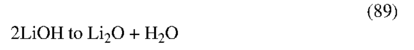

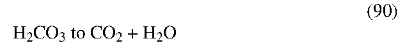

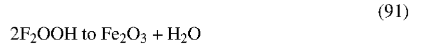

In an embodiment, $H_2O$ catalyst is formed by dehydration of at least one compound comprising phosphate such as salts of phosphate, hydrogen phosphate, and dihydrogen phosphate such as those of cations such as cations comprising metals such as alkali, alkaline earth, transition, inner transition, and rare earth metals, and those of other metals and metalloids such as those of Al, Ga, In, Si, Ge, Sn, Pb, As, Sb, Bi, Se, and Te, and mixtures to form a condensed phosphate such as at least one of polyphosphates such as $[P_nO_{3n+1}]^{(n+2)-}$, long chain metaphosphates such as $[(PO_3)_n]^{n-}$, cyclic metaphosphates such as $[(PO_3)_n]^-$ with $n \geq 3$, and ultraphosphates such as $P_4O_{10}$. Exemplary reactions are

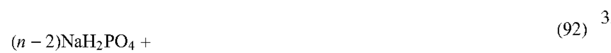

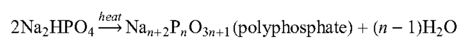

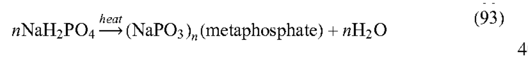

The reactants of the dehydration reaction may comprise R—Ni that may comprise at least one of $Al(OH)_3$, and $Al_2O_3$. The reactants may further comprise a metal M such as those of the present disclosure such as an alkali metal, a metal hydride MH, a metal hydroxide such as those of the present disclosure such as an alkali hydroxide and a source of hydrogen such as $H_2$ as well as intrinsic hydrogen. Exemplary reactions are

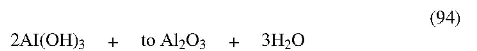

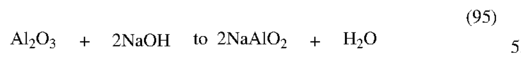

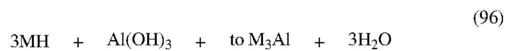

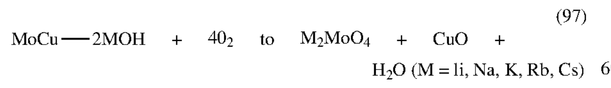

The reaction product may comprise an alloy. The R—Ni may be regenerated by rehydration. The reaction mixture and dehydration reaction to form $H_2O$ catalyst may comprise and involve an oxyhydroxide such as those of the present disclosure as given in the exemplary reaction:

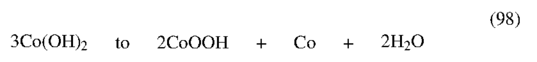

The atomic hydrogen may be formed from $H_2$ gas by dissociation. The hydrogen dissociator may be one of those of the present disclosure such as R—Ni or a noble metal or transition metal on a support such as Ni or Pt or Pd on carbon or $Al_2O_3$. Alternatively, the atomic H may be from H permeation through a membrane such as those of the present disclosure. In an embodiment, the cell comprises a membrane such as a ceramic membrane to allow $H_2$ to diffuse through selectively while preventing $H_2O$ diffusion. In an embodiment, at least one of $H_2$ and atomic H are supplied to the cell by electrolysis of an electrolyte comprising a source of hydrogen such as an aqueous or molten electrolyte comprising $H_2O$. In an embodiment, $H_2O$ catalyst is formed reversibly by dehydration of an acid or base to the anhydride form. In an embodiment, the reaction to form the catalyst $H_2O$ and hydrinos is propagated by changing at least one of the cell pH or activity, temperature, and pressure wherein the pressure may be changed by changing the temperature. The activity of a species such as the acid, base, or anhydride may be changed by adding a salt as known by those skilled in the art. In an embodiment, the reaction mixture may comprise a material such as carbon that may absorb or be a source of a gas such as $H_2$ or acid anhydride gas to the reaction to form hydrinos. The reactants may be in any desired concentrations and ratios. The reaction mixture may be molten or comprise an aqueous slurry.

In another embodiment, the source of the $H_2O$ catalyst is the reaction between an acid and a base such as the reaction between at least one of a hydrohalic acid, sulfuric, nitric, and nitrous, and a base. Other suitable acid reactants are aqueous solutions of $H_2SO_4$, HCl, HX (X-halide), $H_3PO_4$, $HClO_4$, $HNO_3$, HNO, $HNO_2$, $H_2S$, $H_2CO_3$, $H_2MoO_4$, $HNbO_3$, $H_2B_4O_7$ (M tetraborate), $HBO_2$, $H_2WO_4$, $H_2CrO_4$, $H_2Cr_2O_7$, $H_2TiO_3$, $HZrO_3$, $MAlO_2$, $HMn_2O_4$, $HIO_3$, $HIO_4$, $HClO_4$, or an organic acidic such as formic or acetic acid. Suitable exemplary bases are a hydroxide, oxyhydroxide, or oxide comprising an alkali, alkaline earth, transition, inner transition, or rare earth metal, or Al, Ga, In, Sn, or Pb.

In an embodiment, the reactants may comprise an acid or base that reacts with base or acid anhydride, respectively, to form $H_2O$ catalyst and the compound of the cation of the base and the anion of the acid anhydride or the cation of the basic anhydride and the anion of the acid, respectively. The exemplary reaction of the acidic anhydride $SiO_2$ with the base NaOH is

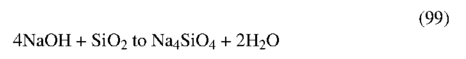

wherein the dehydration reaction of the corresponding acid is

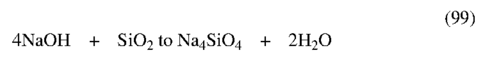

Other suitable exemplary anhydrides may comprise an element, metal, alloy, or mixture such as one from the group of Mo, Ti, Zr, Si, Al, Ni, Fe, Ta, V, B, Nb, Se, Te, W, Cr, Mn, Hf, Co, and Mg. The corresponding oxide may comprise at least one of $MoO_2$, $TiO_2$, $ZrO_2$, $SiO_2$, $Al_2O_3$, NiO, $Ni_2O_3$, FeO, $Fe_2O_3$, $TaO_2$, $Ta_2O_5$, VO, $VO_2$, $V_2O_3$, $V_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, MnO, $Mn_3O_4$, $Mn_2O_3$, $MnO_2$, $Mn_2O_7$, $HfO_2$, $Co_2O_3$, CoO, $Co_3O_4$, $Co_2O_3$, and MgO. In an exemplary embodiment, the base comprises a hydroxide such as an alkali hydroxide such as MOH (M=alkali) such as LiOH that may form the corresponding basic oxide such as $M_2O$ such as $Li_2O$, and H2O. The basic oxide may react with the anhydride oxide to form a product oxide. In an exemplary reaction of LiOH with the anhydride oxide with the release of $H_2O$, the product oxide compound may comprise $Li_2MoO_3$ or $Li_2MoO_4$, $Li_2TiO_3$, $Li_2ZrO_3$, $Li_2SiO_3$, $LiAlO_2$, $LiNiO_2$, $LiFeO_2$, $LiTaO_3$, $LiVO_3$, $Li_2B_4O_7$, $Li_2NbO_3$, $Li_2SeO_3$, $Li_3PO_4$, $Li_2SeO_4$, $Li_2TeO_3$, $Li_2TeO_4$, $Li_2WO_4$, $Li_2CrO_4$, $Li_2Cr_2O_7$, $Li_2MnO_4$, $Li_2HfO_3$, $LiCoO_2$, and MgO. Other suitable exemplary oxides are at least one of the group of $As_2O_3$, $As_2O_5$, $Sb_2O_3$, $Sb_2O_4$, $Sb_2O_5$, $Bi_2O_3$, $SO_2$, $SO_3$, $CO_2$, $NO_2$, $N_2O_3$, $N_2O_5$, $Cl_2O_7$, $PO_2$, $P_2O_3$, and $P_2O_5$, and other similar oxides known to those skilled in the art. Another example is given by Eq. (91). Suitable reactions of metal oxides are

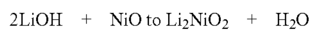

$$2LiOH + NiO \text{ to } Li_2NiO_2 + H_2O \quad (101)$$

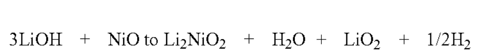

$$3LiOH + NiO \text{ to } Li_2NiO_2 + H_2O + LiO_2 + 1/2H_2 \quad (102)$$

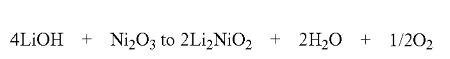

$$4LiOH + Ni_2O_3 \text{ to } 2Li_2NiO_2 + 2H_2O + 1/2O_2 \quad (103)$$

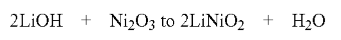

$$2LiOH + Ni_2O_3 \text{ to } 2LiNiO_2 + H_2O \quad (104)$$

Other transition metals such as Fe, Cr, and Ti, inner transition, and rare earth metals and other metals or metalloids such as Al, Ga, In, Si, Ge, Sn, Pb, As, Sb, Bi, Se, and Te may substitute for Ni, and other alkali metal such as Li, Na, Rb, and Cs may substitute for K. In an embodiment, the oxide may comprise Mo wherein during the reaction to form $H_2O$, nascent $H_2O$ catalyst and H may form that further react to form hydrinos. Exemplary solid fuel reactions and possible oxidation reduction pathways are

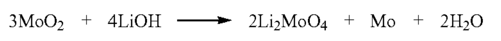

$$3MoO_2 + 4LiOH \longrightarrow 2Li_2MoO_4 + Mo + 2H_2O \quad (105)$$

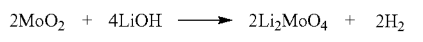

$$2MoO_2 + 4LiOH \longrightarrow 2Li_2MoO_4 + 2H_2 \quad (106)$$

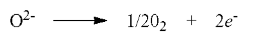

$$O^{2-} \longrightarrow 1/2O_2 + 2e^- \quad (107)$$

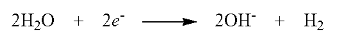

$$2H_2O + 2e^- \longrightarrow 2OH^- + H_2 \quad (108)$$

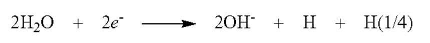

$$2H_2O + 2e^- \longrightarrow 2OH^- + H + H(1/4) \quad (109)$$

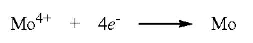

$$Mo^{4+} + 4e^- \longrightarrow Mo \quad (110)$$

The reaction may further comprise a source of hydrogen such as hydrogen gas and a dissociator such as $Pd/Al_2O_3$. The hydrogen may be any of proteium, deuterium, or tritium or combinations thereof. The reaction to form $H_2O$ catalyst may comprise the reaction of two hydroxides to form water. The cations of the hydroxides may have different oxidation states such as those of the reaction of an alkali metal hydroxide with a transition metal or alkaline earth hydroxide. The reaction mixture and reaction may further comprise and involve $H_2$ from a source as given in the exemplary reaction:

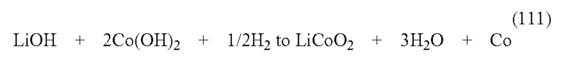

$$LiOH + 2Co(OH)_2 + 1/2H_2 \text{ to } LiCoO_2 + 3H_2O + Co \quad (111)$$

The reaction mixture and reaction may further comprise and involve a metal M such as an alkali or an alkaline earth metal as given in the exemplary reaction:

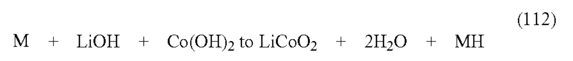

$$M + LiOH + Co(OH)_2 \text{ to } LiCoO_2 + 2H_2O + MH \quad (112)$$

In an embodiment, the reaction mixture comprises a metal oxide and a hydroxide that may serve as a source of H and optionally another source of H wherein the metal such as Fe of the metal oxide can have multiple oxidation states such that it undergoes an oxidation-reduction reaction during the reaction to form $H_2O$ to serve as the catalyst to react with H to form hydrinos. An example is FeO wherein $Fe^{2+}$ can undergo oxidation to $Fe^{3+}$ during the reaction to form the catalyst. An exemplary reaction is

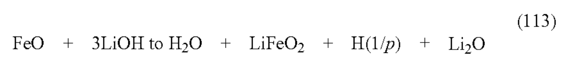

$$FeO + 3LiOH \text{ to } H_2O + LiFeO_2 + H(1/p) + Li_2O \quad (113)$$

In an embodiment, at least one reactant such as a metal oxide, hydroxide, or oxyhydroxide serves as an oxidant wherein the metal atom such as Fe, Ni, Mo, or Mn may be in an oxidation state that is higher than another possible oxidation state. The reaction to form the catalyst and hydrinos may cause the atom to undergo a reduction to at least one lower oxidation state. Exemplary reactions of metal oxides, hydroxides, and oxyhydroxides to form $H_2O$ catalyst are

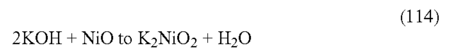

$$2KOH + NiO \text{ to } K_2NiO_2 + H_2O \quad (114)$$

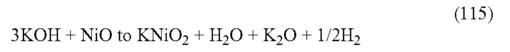

$$3KOH + NiO \text{ to } KNiO_2 + H_2O + K_2O + 1/2H_2 \quad (115)$$

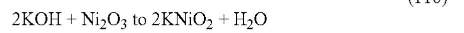

$$2KOH + Ni_2O_3 \text{ to } 2KNiO_2 + H_2O \quad (116)$$

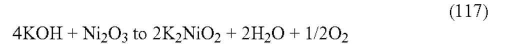

$$4KOH + Ni_2O_3 \text{ to } 2K_2NiO_2 + 2H_2O + 1/2O_2 \quad (117)$$

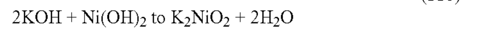

$$2KOH + Ni(OH)_2 \text{ to } K_2NiO_2 + 2H_2O \quad (118)$$

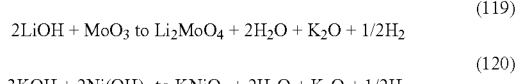

$$2LiOH + MoO_3 \text{ to } Li_2MoO_4 + 2H_2O + K_2O + 1/2H_2 \quad (119)$$

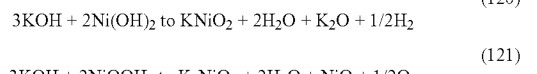

$$3KOH + 2Ni(OH)_2 \text{ to } KNiO_2 + 2H_2O + K_2O + 1/2H_2 \quad (120)$$

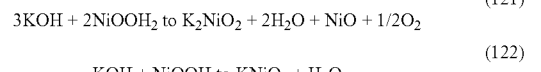

$$3KOH + 2NiOOH_2 \text{ to } K_2NiO_2 + 2H_2O + NiO + 1/2O_2 \quad (121)$$

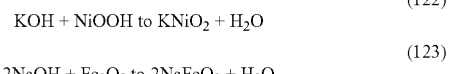

$$KOH + NiOOH \text{ to } KNiO_2 + H_2O \quad (122)$$

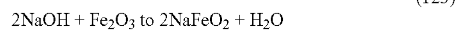

$$2NaOH + Fe_2O_3 \text{ to } 2NaFeO_2 + H_2O \quad (123)$$

Other transition metals such as Ni, Fe, Cr, and Ti, inner transition, and rare earth metals and other metals or metalloids such as Al, Ga, In, Si, Ge, Sn, Pb, As, Sb, Bi, Se, and Te may substitute for Ni or Fe, and other alkali metals such as Li, Na, K, Rb, and Cs may substitute for K or Na. In an embodiment, the reaction mixture comprises at least one of an oxide and a hydroxide of metals that are stable to $H_2O$ such as Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. Additionally, the reaction mixture comprises a source of hydrogen such as $H_2$ gas and optionally a dissociator such as a noble metal on a support. In an embodiment, the solid fuel or energetic material comprises mixture of at least one of a metal halide such as at least one of a transition metal halide such as a bromide such as $FeBr_2$ and a metal that forms a oxyhydroxide, hydroxide, or oxide and $H_2O$. In an embodiment, the solid fuel or energetic material comprises a mixture of at least one of a metal oxide, hydroxide, and an oxyhydroxide such as at least one of a transition metal oxide such as $Ni_2O_3$ and $H_2O$.

The exemplary reaction of the basic anhydride NiO with acid HCl is

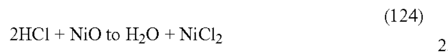

$$2HCl + NiO \text{ to } H_2O + NiCl_2 \quad (124)$$

wherein the dehydration reaction of the corresponding base is

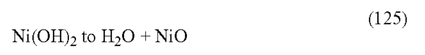

$$Ni(OH)_2 \text{ to } H_2O + NiO \quad (125)$$

The reactants may comprise at least one of a Lewis acid or base and a Bronsted-Lowry acid or base. The reaction mixture and reaction may further comprise and involve a compound comprising oxygen wherein the acid reacts with the compound comprising oxygen to form water as given in the exemplary reaction:

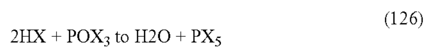

$$2HX + POX_3 \text{ to } H2O + PX_5 \quad (126)$$

(X=halide). Similar compounds as $PDX_3$ are suitable such as those with P replaced by S. Other suitable exemplary anhydrides may comprise an oxide of an element, metal, alloy, or mixture that is soluble in acid such as an a hydroxide, oxyhydroxide, or oxide comprising an alkali, alkaline earth, transition, inner transition, or rare earth metal, or Al, Ga, In, Sn, or Pb such as one from the group of Mo, Ti, Zr, Si, Al, Ni, Fe, Ta, V, B, Nb, Se, Te, W, Cr, Mn, Hf, Co, and Mg. The corresponding oxide may comprise $MoO_2$, $TiO_2$, $ZrO_2$, $SiO_2$, $Al_2O_3$, NiO, FeO or $Fe_2O_3$, $TaO_2$, $Ta_2O_5$, VO, $VO_2$, $V_2O_3$, $V_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, MnO, $Mn_3O_4$, $Mn_2O_3$, $MnO_2$, $Mn_2O_7$, $HfO_2$, $Co_2O_3$, CoO, $Co_3O_4$, $Co_2O_3$, and MgO. Other suitable exemplary oxides are of those of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In an exemplary embodiment, the acid comprises a hydrohalic acid and the product is $H_2O$ and the metal halide of the oxide. The reaction mixture further comprises a source of hydrogen such as $H_2$ gas and a dissociator such as Pt/C wherein the H and $H_2O$ catalyst react to form hydrinos.

In an embodiment, the solid fuel comprises a $H_2$ source such as a permeation membrane or $H_2$ gas and a dissociator such as Pt/C and a source of $H_2O$ catalyst comprising an oxide or hydroxide that is reduced to $H_2O$. The metal of the oxide or hydroxide may form metal hydride that serves as a source of H. Exemplary reactions of an alkali hydroxide and oxide such as LiOH and $Li_2O$ are

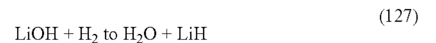

$$LiOH + H_2 \text{ to } H_2O + LiH \quad (127)$$

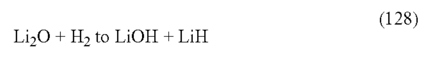

$$Li_2O + H_2 \text{ to } LiOH + LiH \quad (128)$$

The reaction mixture may comprise oxides or hydroxides of metals that undergo hydrogen reduction to $H_2O$ such as those of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In and a source of hydrogen such as $H_2$ gas and a dissociator such as Pt/C.

In another embodiment, the reaction mixture comprises a $H_2$ source such as $H_2$ gas and a dissociator such as Pt/C and a peroxide compound such as $H_2O_2$ that decomposes to $H_2O$ catalyst and other products comprising oxygen such as $O_2$. Some of the $H_2$ and decomposition product such as $O_2$ may react to also form $H_2O$ catalyst.

In an embodiment, the reaction to form $H_2O$ as the catalyst comprises an organic dehydration reaction such as that of an alcohol such as a polyalcohol such as a sugar to an aldehyde and $H_2O$. In an embodiment, the dehydration reaction involves the release of $H_2O$ from a terminal alcohol to form an aldehyde. The terminal alcohol may comprise a sugar or a derivative thereof that releases $H_2O$ that may serve as a catalyst. Suitable exemplary alcohols are meso-erythritol, galactitol or dulcitol, and polyvinyl alcohol (PVA). An exemplary reaction mixture comprises a sugar+hydrogen dissociator such as $Pd/Al_2O_3+H_2$. Alternatively, the reaction comprises a dehydration of a metal salt such as one having at least one water of hydration. In an embodiment, the dehydration comprises the loss of $H_2O$ to serve as the catalyst from hydrates such as aqua ions and salt hydrates such as $BaI_2$ $2H_2O$ and $EuBr_2$ $nH_2O$.

In an embodiment, the reaction to form $H_2O$ catalyst comprises the hydrogen reduction of a compound comprising oxygen such as CO, an oxyanion such as $MNO_3$ (M=alkali), a metal oxide such as NiO, $Ni_2O_3$, $Fe_2O_3$, or SnO, a hydroxide such as $Co(OH)_2$, oxyhydroxides such as FeOOH, CoOOH, and NiOOH, and compounds, oxyanions, oxides, hydroxides, oxyhydroxides, peroxides, superoxides, and other compositions of matter comprising oxygen such as those of the present disclosure that are hydrogen reducible to $H_2O$. Exemplary compounds comprising oxygen or an oxyanion are $SOCl_2$, $Na_2S_2O_3$, $NaMnO_4$, $POBr_3$, $K_2S_2O_8$, CO, $CO_2$, NO, $NO_2$, $P_2O_5$, $N_2O_5$, $N_2O$, $SO_2$, $I_2O_5$, $NaClO_2$, NaClO, $K_2SO_4$, and $KHSO_4$. The source of hydrogen for hydrogen reduction may be at least one of $H_2$ gas and a hydride such as a metal hydride such as those of the present disclosure. The reaction mixture may further comprise a reductant that may form a compound or ion comprising oxygen. The cation of the oxyanion may form a product compound comprising another anion such as a halide, other chalcogenide, phosphide, other oxyanion, nitride, silicide, arsenide, or other anion of the present disclosure. Exemplary reactions are

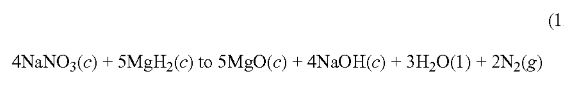
$$4NaNO_3(c) + 5MgH_2(c) \text{ to } 5MgO(c) + 4NaOH(c) + 3H_2O(1) + 2N_2(g) \quad (129)$$

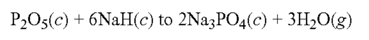
$$P_2O_5(c) + 6NaH(c) \text{ to } 2Na_3PO_4(c) + 3H_2O(g) \quad (130)$$

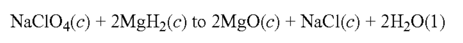
$$NaClO_4(c) + 2MgH_2(c) \text{ to } 2MgO(c) + NaCl(c) + 2H_2O(1) \quad (131)$$

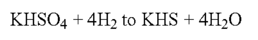
$$KHSO_4 + 4H_2 \text{ to } KHS + 4H_2O \quad (132)$$

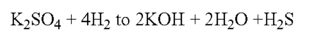
$$K_2SO_4 + 4H_2 \text{ to } 2KOH + 2H_2O + H_2S \quad (133)$$

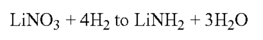
$$LiNO_3 + 4H_2 \text{ to } LiNH_2 + 3H_2O \quad (134)$$

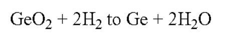
$$GeO_2 + 2H_2 \text{ to } Ge + 2H_2O \quad (135)$$

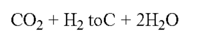
$$CO_2 + H_2 \text{ to} C + 2H_2O \quad (136)$$

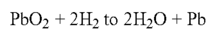
$$PbO_2 + 2H_2 \text{ to } 2H_2O + Pb \quad (137)$$

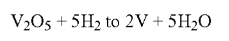
$$V_2O_5 + 5H_2 \text{ to } 2V + 5H_2O \quad (138)$$

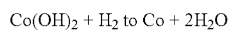
$$Co(OH)_2 + H_2 \text{ to } Co + 2H_2O \quad (139)$$

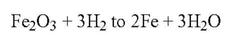
$$Fe_2O_3 + 3H_2 \text{ to } 2Fe + 3H_2O \quad (140)$$

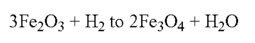
$$3Fe_2O_3 + H_2 \text{ to } 2Fe_3O_4 + H_2O \quad (141)$$

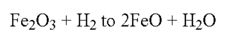
$$Fe_2O_3 + H_2 \text{ to } 2FeO + H_2O \quad (142)$$

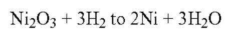
$$Ni_2O_3 + 3H_2 \text{ to } 2Ni + 3H_2O \quad (143)$$

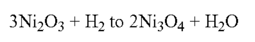
$$3Ni_2O_3 + H_2 \text{ to } 2Ni_3O_4 + H_2O \quad (144)$$

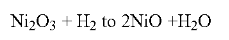
$$Ni_2O_3 + H_2 \text{ to } 2NiO + H_2O \quad (145)$$

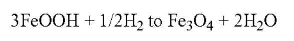
$$3FeOOH + 1/2H_2 \text{ to } Fe_3O_4 + 2H_2O \quad (146)$$

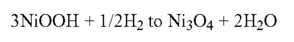
$$3NiOOH + 1/2H_2 \text{ to } Ni_3O_4 + 2H_2O \quad (147)$$

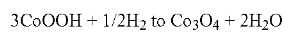
$$3CoOOH + 1/2H_2 \text{ to } Co_3O_4 + 2H_2O \quad (148)$$

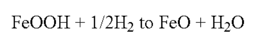
$$FeOOH + 1/2H_2 \text{ to } FeO + H_2O \quad (149)$$

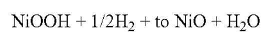
$$NiOOH + 1/2H_2 + \text{ to } NiO + H_2O \quad (150)$$

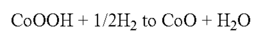
$$CoOOH + 1/2H_2 \text{ to } CoO + H_2O \quad (151)$$

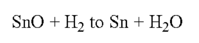
$$SnO + H_2 \text{ to } Sn + H_2O \quad (152)$$

The reaction mixture may comprise a source of an anion or an anion and a source of oxygen or oxygen such as a compound comprising oxygen wherein the reaction to form $H_2O$ catalyst comprises an anion-oxygen exchange reaction with optionally $H_2$ from a source reacting with the oxygen to form $H_2O$. Exemplary reactions are

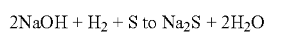
$$2NaOH + H_2 + S \text{ to } Na_2S + 2H_2O \quad (153)$$

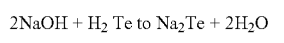
$$2NaOH + H_2 Te \text{ to } Na_2Te + 2H_2O \quad (154)$$

-continued

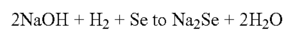
$$2NaOH + H_2 + Se \text{ to } Na_2Se + 2H_2O \quad (155)$$

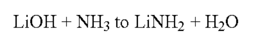
$$LiOH + NH_3 \text{ to } LiNH_2 + H_2O \quad (156)$$

In another embodiment, the reaction mixture comprises an exchange reaction between chalcogenides such as one between reactants comprising O and S. An exemplary chalcogenide reactant such as tetrahedral ammonium tetrathiomolybdate contains the ($[MoS_4]^{2-}$) anion. An exemplary reaction to form nascent $H_2O$ catalyst and optionally nascent H comprises the reaction of molybdate $[MoO]^{2-}$ with hydrogen sulfide in the presence of ammonia:

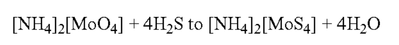
$$[NH_4]_2[MoO_4] + 4H_2S \text{ to } [NH_4]_2[MoS_4] + 4H_2O \quad (157)$$

In an embodiment, the reaction mixture comprises a source of hydrogen, a compound comprising oxygen, and at least one element capable of forming an alloy with at least one other element of the reaction mixture. The reaction to form $H_2O$ catalyst may comprise an exchange reaction of oxygen of the compound comprising oxygen and an element capable of forming an alloy with the cation of the oxygen compound wherein the oxygen reacts with hydrogen from the source to form $H_2O$. Exemplary reactions are

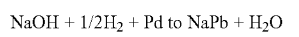
$$NaOH + 1/2H_2 + Pd \text{ to } NaPb + H_2O \quad (158)$$

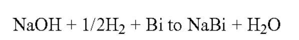
$$NaOH + 1/2H_2 + Bi \text{ to } NaBi + H_2O \quad (159)$$

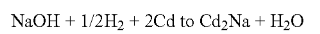
$$NaOH + 1/2H_2 + 2Cd \text{ to } Cd_2Na + H_2O \quad (160)$$

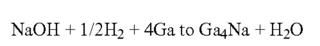
$$NaOH + 1/2H_2 + 4Ga \text{ to } Ga_4Na + H_2O \quad (161)$$

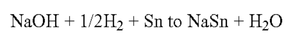
$$NaOH + 1/2H_2 + Sn \text{ to } NaSn + H_2O \quad (162)$$

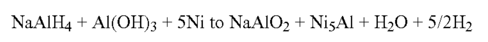
$$NaAlH_4 + Al(OH)_3 + 5Ni \text{ to } NaAlO_2 + Ni_5Al + H_2O + 5/2H_2 \quad (163)$$

In an embodiment, the reaction mixture comprises a compound comprising oxygen such as an oxyhydroxide and a reductant such as a metal that forms an oxide. The reaction to form $H_2O$ catalyst may comprise the reaction of an oxyhydroxide with a metal to from a metal oxide and $H_2O$. Exemplary reactions are

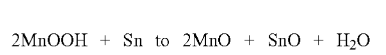
$$2MnOOH + Sn \text{ to } 2MnO + SnO + H_2O \quad (164)$$

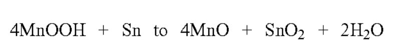
$$4MnOOH + Sn \text{ to } 4MnO + SnO_2 + 2H_2O \quad (165)$$

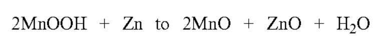
$$2MnOOH + Zn \text{ to } 2MnO + ZnO + H_2O \quad (166)$$

In an embodiment, the reaction mixture comprises a compound comprising oxygen such as a hydroxide, a source of hydrogen, and at least one other compound comprising a different anion such as halide or another element. The reaction to form $H_2O$ catalyst may comprise the reaction of the hydroxide with the other compound or element wherein the anion or element is exchanged with hydroxide to from another compound of the anion or element, and $H_2O$ is formed with the reaction of hydroxide with $H_2$. The anion may comprise halide. Exemplary reactions are

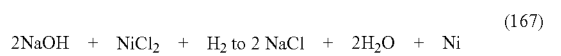

$$2NaOH + NiCl_2 + H_2 \text{ to } 2NaCl + 2H_2O + Ni \quad (167)$$

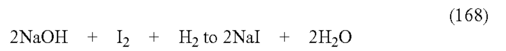

$$2NaOH + I_2 + H_2 \text{ to } 2NaI + 2H_2O \quad (168)$$

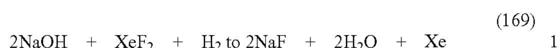

$$2NaOH + XeF_2 + H_2 \text{ to } 2NaF + 2H_2O + Xe \quad (169)$$

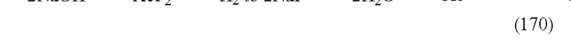

$$BiX_3 (X = \text{halide}) + 4Bi(OH)_3 \text{ to } 3BiOX + Bi_2O_3 + 6H_2O \quad (170)$$

The hydroxide and halide compounds may be selected such that the reaction to form $H_2O$ and another halide is thermally reversible. In an embodiment, the general exchange reaction is

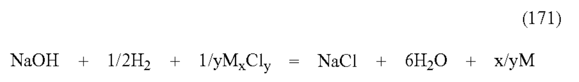

$$NaOH + 1/2H_2 + 1/yM_xCl_y = NaCl + 6H_2O + x/yM \quad (171)$$

wherein exemplary compounds $M_xCl_y$ are $AlCl_3$, $BeCl_2$, $HfCl_4$, $KAgCl_2$, $MnCl_2$, $NaAlCl_4$, $ScCl_3$, $TiCl_2$, $TiCl_3$, $UCl_3$, $UCl_4$, $ZrCl_4$, $EuCl_3$, $GdCl_3$, $MgCl_2$, $NdCl_3$, and $YCl_3$. At an elevated temperature the reaction of Eq. (171) such as in the range of about 100° C. to 2000° C. has at least one of an enthalpy and free energy of about 0 kJ and is reversible. The reversible temperature is calculated from the corresponding thermodynamic parameters of each reaction. Representative are temperature ranges are NaCl—$ScCl_3$ at about 800K-900K, NaCl—$TiCl_2$ at about 300K-400K, NaCl—$UCl_3$ at about 600K-800K, NaCl—$UCl_4$ at about 250K-300K, NaCl—$ZrCl_4$ at about 250K-300K, NaCl—$MgCl_2$ at about 900K-1300K, NaCl—$EuCl_3$ at about 900K-1000K, NaCl—$NdCl_3$ at about >1000K, and NaCl—$YCl_3$ at about >1000K.

In an embodiment, the reaction mixture comprises an oxide such as a metal oxide such a alkali, alkaline earth, transition, inner transition, and rare earth metal oxides and those of other metals and metalloids such as those of Al, Ga, In, Si, Ge, Sn, Pb, As, Sb, Bi, Se, and Te, a peroxide such as $M_2O_2$ where M is an alkali metal such as $Li_2O_2$, $Na_2O_2$, and $K_2O_2$, and a superoxide such as $MO_2$ where M is an alkali metal such as $NaO_2$, $KO_2$, $RbO_2$, and $CsO_2$, and alkaline earth metal superoxides, and a source of hydrogen. The ionic peroxides may further comprise those of Ca, Sr, or Ba. The reaction to form $H_2O$ catalyst may comprise the hydrogen reduction of the oxide, peroxide, or superoxide to form $H_2O$. Exemplary reactions are

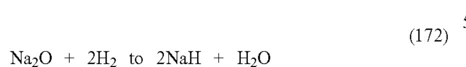

$$Na_2O + 2H_2 \text{ to } 2NaH + H_2O \quad (172)$$

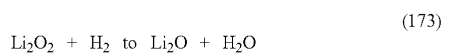

$$Li_2O_2 + H_2 \text{ to } Li_2O + H_2O \quad (173)$$

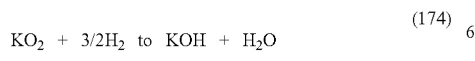

$$KO_2 + 3/2H_2 \text{ to } KOH + H_2O \quad (174)$$

In an embodiment, the reaction mixture comprises a source of hydrogen such as at least one of $H_2$, a hydride such as at least one of an alkali, alkaline earth, transition, inner transition, and rare earth metal hydride and those of the present disclosure and a source of hydrogen or other compound comprising combustible hydrogen such as a metal amide, and a source of oxygen such as $O_2$. The reaction to form $H_2O$ catalyst may comprise the oxidation of $H_2$, a hydride, or hydrogen compound such as metal amide to form $H_2O$. Exemplary reactions are

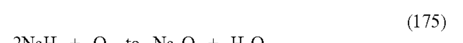

$$2NaH + O_2 \text{ to } Na_2O + H_2O \quad (175)$$

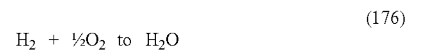

$$H_2 + ½O_2 \text{ to } H_2O \quad (176)$$

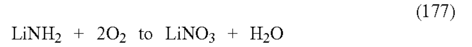

$$LiNH_2 + 2O_2 \text{ to } LiNO_3 + H_2O \quad (177)$$

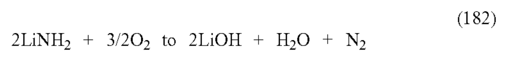

$$2LiNH_2 + 3/2O_2 \text{ to } 2LiOH + H_2O + N_2 \quad (182)$$

In an embodiment, the reaction mixture comprises a source of hydrogen and a source of oxygen. The reaction to form $H_2O$ catalyst may comprise the decomposition of at least one of source of hydrogen and the source of oxygen to form $H_2O$. Exemplary reactions are

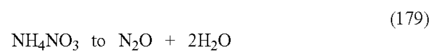

$$NH_4NO_3 \text{ to } N_2O + 2H_2O \quad (179)$$

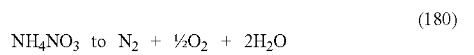

$$NH_4NO_3 \text{ to } N_2 + ½O_2 + 2H_2O \quad (180)$$

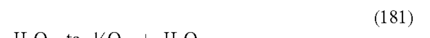

$$H_2O_2 \text{ to } ½O_2 + H_2O \quad (181)$$

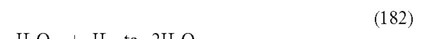

$$H_2O_2 + H_2 \text{ to } 2H_2O \quad (182)$$

The reaction mixtures disclosed herein this Chemical Reactor section further comprise a source of hydrogen to form hydrinos. The source may be a source of atomic hydrogen such as a hydrogen dissociator and $H_2$ gas or a metal hydride such as the dissociators and metal hydrides of the present disclosure. The source of hydrogen to provide atomic hydrogen may be a compound comprising hydrogen such as a hydroxide or oxyhydroxide. The H that reacts to form hydrinos may be nascent H formed by reaction of one or more reactants wherein at least one comprises a source of hydrogen such as the reaction of a hydroxide and an oxide. The reaction may also form $H_2O$ catalyst. The oxide and hydroxide may comprise the same compound. For example, an oxyhydroxide such as FeOOH could dehydrate to provide $H_2O$ catalyst and also provide nascent H for a hydrino reaction during dehydration:

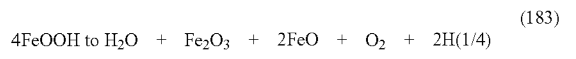

$$4FeOOH \text{ to } H_2O + Fe_2O_3 + 2FeO + O_2 + 2H(1/4) \quad (183)$$

wherein nascent H formed during the reaction reacts to hydrino. Other exemplary reactions are those of a hydroxide and an oxyhydroxide or an oxide such as NaOH+FeOOH or $Fe_2O_3$ to form an alkali metal oxide such as $NaFeO_2$+$H_2O$ wherein nascent H formed during the reaction may form hydrino wherein $H_2O$ serves as the catalyst. The oxide and hydroxide may comprise the same compound. For example, an oxyhydroxide such as FeOOH could dehydrate to provide $H_2O$ catalyst and also provide nascent H for a hydrino reaction during dehydration:

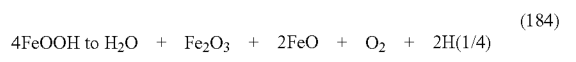

$$4FeOOH \text{ to } H_2O + Fe_2O_3 + 2FeO + O_2 + 2H(1/4) \quad (184)$$

wherein nascent H formed during the reaction reacts to hydrino. Other exemplary reactions are those of a hydroxide and an oxyhydroxide or an oxide such as NaOH+FeOOH or $Fe_2O_3$ to form an alkali metal oxide such as $NaFeO_2$+$H_2O$ wherein nascent H formed during the reaction may form hydrino wherein $H_2O$ serves as the catalyst. Hydroxide ion is both reduced and oxidized in forming $H_2O$ and oxide ion. Oxide ion may react with $H_2O$ to form $OH^-$. The same pathway may be obtained with a hydroxide-halide exchange reaction such as the following

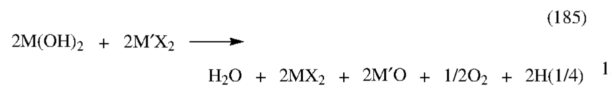

$$2M(OH)_2 + 2M'X_2 \longrightarrow H_2O + 2MX_2 + 2M'O + 1/2O_2 + 2H(1/4) \quad (185)$$

wherein exemplary M and M' metals are alkaline earth and transition metals, respectively, such as $Cu(OH)_2$+$FeBr_2$, $Cu(OH)_2$+$CuBr_2$, or $Co(OH)_2$+$CuBr_2$. In an embodiment, the solid fuel may comprise a metal hydroxide and a metal halide wherein at least one metal is Fe. At least one of $H_2O$ and $H_2$ may be added to regenerate the reactants. In an embodiment, M and M' may be selected from the group of alkali, alkaline earth, transition, inner transition, and rare earth metals, Al, Ga, In, Si, Ge, Sn, Pb, Group 13, 14, 15, and 16 elements, and other cations of hydroxides or halides such as those of the present disclosure. An exemplary reaction to form at least one of HOH catalyst, nascent H, and hydrino is

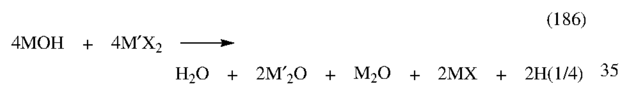

$$4MOH + 4M'X_2 \longrightarrow H_2O + 2M'_2O + M_2O + 2MX + 2H(1/4) \quad (186)$$

In an embodiment, the reaction mixture comprises at least one of a hydroxide and a halide compound such as those of the present disclosure. In an embodiment, the halide may serve to facilitate at least one of the formation and maintenance of at least one of nascent HOH catalyst and H. In an embodiment, the mixture may serve to lower the melting point of the reaction mixture.

In an embodiment, the solid fuel comprises a mixture of $Mg(OH)_2$+$CuBr_2$. The product CuBr may be sublimed to form a CuBr condensation product that is separated from the nonvolatile MgO. $Br_2$ may be trapped with a cold trap. CuBr may be reacted with $Br_2$ to form $CuBr_2$, and MgO may be reacted with $H_2O$ to form $Mg(OH)_2$. $Mg(OH)_2$ may be combined with $CuBr_2$ to form the regenerated solid fuel.

An acid-base reaction is another approach to $H_2O$ catalyst. Thus, the thermal chemical reaction is similar to the electrochemical reaction to form hydrinos. Exemplary halides and hydroxides mixtures are those of Bi, Cd, Cu, Co, Mo, and Cd and mixtures of hydroxides and halides of metals having low water reactivity of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, and Zn. In an embodiment, the reaction mixture further comprises $H_2O$ that may serves as a source of at least one of H and catalyst such as nascent $H_2O$. The water may be in the form of a hydrate that decomposes or otherwise reacts during the reaction.

In an embodiment, the solid fuel comprises a reaction mixture of $H_2O$ and an inorganic compound that forms nascent H and nascent $H_2O$. The inorganic compound may comprise a halide such as a metal halide that reacts with the $H_2O$. The reaction product may be at least one of a hydroxide, oxyhydroxide, oxide, oxyhalide, hydroxyhalide, and hydrate. Other products may comprise anions comprising oxygen and halogen such as

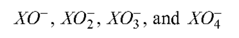

$$XO^-, XO_2^-, XO_3^-, \text{and } XO_4^-$$

(X=halogen). The product may also be at least one of a reduced cation and a halogen gas. The halide may be a metal halide such as one of an alkaline, alkaline earth, transition, inner transition, and rare earth metal, and Al, Ga, In, Sn, Pb, S, Te, Se, N, P, As, Sb, Bi, C, Si, Ge, and B, and other elements that form halides. The metal or element may additionally be one that forms at least one of a hydroxide, oxyhydroxide, oxide, oxyhalide, hydroxyhalide, hydrate, and one that forms a compound having an anion comprising oxygen and halogen such as

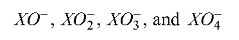

$$XO^-, XO_2^-, XO_3^-, \text{and } XO_4^-$$

(X=halogen). Suitable exemplary metals and elements are at least one of an alkaline, alkaline earth, transition, inner transition, and rare earth metal, and Al, Ga, In, Sn, Pb, S, Te, Se, N, P, As, Sb, Bi, C, Si, Ge, and B. An exemplary reaction is

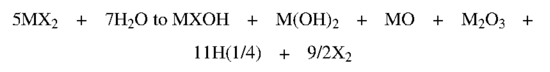

$$5MX_2 + 7H_2O \text{ to } MXOH + M(OH)_2 + MO + M_2O_3 + 11H(1/4) + 9/2X_2 \quad (187)$$

wherein M is a metal such as a transition metal such as Cu and X is halogen such as Cl.

In an embodiment, $H_2O$ serves as the catalyst that is maintained at low concentration to provide nascent $H_2O$. In an embodiment, the low concentration is achieved by dispersion of the $H_2O$ molecules in another material such as a solid, liquid, or gas. The $H_2O$ molecules may be diluted to the limit of isolated of nascent molecules. The material also comprises a source of H. The material may comprise an ionic compound such as an alkali halide such as a potassium halide such as KCl or a transition metal halide such as $CuBr_2$. The low concentration to form nascent H may also be achieved dynamically wherein $H_2O$ is formed by a reaction. The product $H_2O$ may be removed at a rate relative to the rate of formation that results in a steady state low concentration to provide at least one of nascent H and nascent HOH. The reaction to form $H_2O$ may comprise dehydration, combustion, acid-base reactions and others such as those of the present disclosure. The $H_2O$ may be removed by means such as evaporation and condensation. Exemplary reactants are FeOOH to form iron oxide and $H_2O$ wherein nascent H is also formed with the further reaction to from hydrinos. Other exemplary reaction mixtures are $Fe_2O_3$+at least one of NaOH and $H_2$, and FeOOH+at least one of NaOH and $H_2$. The reaction mixture may be maintained at an elevated temperature such as in the range of about 100° C. to 600° C. $H_2O$ product may be removed by condensation of steam in a cold spot of the reactor such as a gas line maintained below 100° C. In another embodiment, a material comprising $H_2O$ as an inclusion or part of a mixture or a compound such as $H_2O$ dispersed or absorbed in a lattice such as that of an ionic compound such as an alkali halide such as a potassium halide such as KCl may be incident with the bombardment of energetic particles. The particles may comprise at least one of photons, ions, and electrons. The particles may comprise a beam such as an electron beam. The bombardment may provide at least one of $H_2O$ catalyst, H, and activation of the reaction to form hydrinos. In embodiments of the SF-CIHT cell, the $H_2O$ content may be high. The $H_2O$ may be ignited to form hydrinos at a high rate by a high current.

The reaction mixture may further comprise a support such as an electrically conductive, high surface area support. Suitable exemplary supports are those of the present disclosure such as a metal powder such as Ni or R—Ni, metal screen such as Ni, Ni celmet, Ni mesh, carbon, carbides such as TiC and WC, and borides. The support may comprise a dissociator such as Pd/C or Pd/C. The reactants may be in any desired molar ratio. In an embodiment, the stoichiometry is such to favor reaction completion to form $H_2O$ catalyst and to provide H to form hydrinos. The reaction temperature may be in any desired range such as in the range of about ambient to 1500° C. The pressure range may be any desired such as in the range of about 0.01 Torr to 500 atm. The reactions are at least one of regenerative and reversible by the methods disclosed herein and in Mills Prior Applications such as Hydrogen Catalyst Reactor, PCT/US08/61455, filed PCT Apr. 24, 2008; Heterogeneous Hydrogen Catalyst Reactor, PCT/US09/052072, filed PCT Jul. 29, 2009; Heterogeneous Hydrogen Catalyst Power System, PCT/US10/27828, PCT filed Mar. 18, 2010; Electrochemical Hydrogen Catalyst Power System, PCT/US11/28889, filed PCT Mar. 17, 2011; $H_2O$-Based Electrochemical Hydrogen-Catalyst Power System, PCT/US12/31369 filed Mar. 30, 2012, and CIHT Power System, PCT/US13/041938 filed May 21, 2013 herein incorporated by reference in their entirety. Reactions that form $H_2O$ may be reversible by changing the reaction conditions such as temperature and pressure to allow the reverse reaction that consumes $H_2O$ to occur as known by those skilled in the art. For example, the $H_2O$ pressure may be increased in the backward reaction to reform the reactants from the products by rehydration. In other cases, the hydrogen-reduced product may be regenerated by oxidation such as by reaction with at least one of oxygen and $H_2O$. In an embodiment, a reverse reaction product may be removed from the reaction such that the reverse or regeneration reaction proceeds. The reverse reaction may become favorable even in the absence of being favorable based on equilibrium thermodynamics by removing at least one reverse reaction product. In an exemplary embodiment, the regenerated reactant (reverse or regeneration reaction product) comprises a hydroxide such as an alkali hydroxide. The hydroxide may be removed by methods such as solvation or sublimation. In the latter case, alkali hydroxide sublime unchanged at a temperature in the range of about 350° C. to 400° C. The reactions may be maintained in the power plants systems of Mills Prior Applications. Thermal energy from a cell producing power may provide heat to at least one other cell undergoing regeneration as disclosed previously. Alternatively, the equilibrium of the reactions to form $H_2O$ catalyst and the reverse regeneration reaction can be shifted by changing the temperature of the water wall of the system design having a temperature gradient due to coolant at selected region of the cell as previously disclosed.

In an embodiment, the halide and oxide may undergo an exchange reaction. The products of the exchange reaction may be separated from each other. The exchange reaction may be performed by heating the product mixture. The separation may be by sublimation that may be driven by at least one of heating and applying a vacuum. In an exemplary embodiment, $CaBr_2$ and CuO may undergo an exchange reaction due to heating to a high temperature such as in the range of about 700° C. to 900° C. to form $CuBr_2$ and CaO. Any other suitable temperature range may be used such as in the range of about 100° C. to 2000° C. The $CuBr_2$ may be separated and collected by sublimation that may be achieved by applying heat and low pressure. The $CuBr_2$ may form a separate band. The CaO may be reacted with $H_2O$ to form $Ca(OH)_2$.

In an embodiment, the solid fuel or energetic material comprises a source of singlet oxygen. An exemplary reaction to generate singlet oxygen is

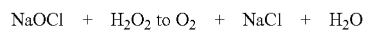

$$NaOCl + H_2O_2 \text{ to } O_2 + NaCl + H_2O \quad (188)$$

In another embodiment, the solid fuel or energetic material comprises a source of or reagents of the Fenton reaction such as $H_2O_2$.

In an embodiment, lower energy hydrogen species and compounds are synthesized using a catalyst comprising at least one of H and O such as $H_2O$. The reaction mixture to synthesize the exemplary lower energy hydrogen compound MHX wherein M is alkali and may be another metal such as alkaline earth wherein the compound has the corresponding stoichiometry, H is hydrino such as hydrino hydride, and X is an anion such as halide, comprises a source of M and X such as an alkali halide such as KCl, and metal reductant such as an alkali metal, a hydrogen dissociator such as Ni such as Ni screen or R—Ni and optionally a support such as carbon, a source of hydrogen such as at least one of a metal hydride such as MH that may substitute for M and $H_2$ gas, and a source of oxygen such as a metal oxide or a compound comprising oxygen. Suitable exemplary metal oxides are $Fe_2O_3$, $Cr_2O_3$, and NiO. The reaction temperature may be maintained in the range of about 200° C. to 1500° C. or about 400° C. to 800° C. The reactants may be in any desired ratios. The reaction mixture to form KHCl may comprise K, Ni screen, KCl, hydrogen gas, and at least one of $Fe_2O_3$, $Cr_2O_3$, and NiO. Exemplary weights and conditions are 1.6 g K, 20 g KCl, 40 g Ni screen, equal moles of oxygen as K from the metal oxides such as 1.5 g $Fe_2O_3$ and 1.5 g NiO, 1 atm $H_2$, and a reaction temperature of about 550-600° C. The reaction forms $H_2O$ catalyst by reaction of H with O from the metal oxide and H reacts with the catalyst to form hydrinos and hydrino hydride ions that form the product KHCl. The reaction mixture to form KHI may comprise K, R—Ni, KI, hydrogen gas, and at least one of $Fe_2O_3$, $Cr_2O_3$, and NiO. Exemplary weights and conditions are 1 g K, 20 g KI, 15 g R—Ni 2800, equal moles of oxygen as K from the metal oxides such as 1 g $Fe_2O_3$ and 1 g NiO, 1 atm $H_2$, and a reaction temperature of about 450-500° C. The reaction forms $H_2O$ catalyst by reaction of H with O from the metal oxide and H reacts with the catalyst to form hydrinos and hydrino hydride ions that form the product KHI. In an embodiment, the product of at least one of the CIHT cell, SF-CIHT cell, solid fuel, or chemical cell is $H_2(1/4)$ that causes an upfield H NMR matrix shift. In an embodiment, the presence of a hydrino species such as a hydrino atom or molecule in a solid matrix such as a matrix of a hydroxide such as NaOH or KOH causes the matrix protons to shift upfield. The matrix protons such as those of NaOH or KOH may exchange. In an embodiment, the shift may cause the matrix peak to be in the range of about −0.1 to −5 ppm relative to TMS.

In an embodiment, the regeneration reaction of a hydroxide and halide compound mixture such as $Cu(OH)_2$+$CuBr_2$ may by addition of at least one $H_2$ and $H_2O$. Products such as halides and oxides may be separated by sublimation of the halide. In an embodiment, $H_2O$ may be added to the reaction mixture under heating conditions to cause the hydroxide and halide such as $CuBr_2$ and $Cu(OH)_2$ to form from the reaction products. In an embodiment, the regeneration may be achieved by the step of thermal cycling. In an embodiment, the halide such as $CuBr_2$ is $H_2O$ soluble whereas the hydroxide such as $Cu(OH)_2$ is insoluble. The regenerated compounds may be separated by filtering or precipitation. The chemicals may be dried with wherein the thermal energy may be from the reaction. Heat may be recuperated from the driven off water vapor. The recuperation may be by a heat exchanger or by using the steam directly for heating or to generate electricity using a turbine and generator for example. In an embodiment, the regeneration of $Cu(OH)_2$ from CuO is achieved by using a $H_2O$ splitting catalyst. Suitable catalysts are noble metals on a support such as $Pt/Al_2O_3$, and $CuAlO_2$ formed by sintering CuO and $Al_2O_3$, cobalt-phosphate, cobalt borate, cobalt methyl borate, nickel borate, $RuO_2$, $LaMnO_3$, $SrTiO_3$, $TiO_2$, and $WO_3$. An exemplary method to form an $H_2O$-splitting catalyst is the controlled electrolysis of $Co^{2+}$ and $Ni^{2+}$ solution in about 0.1 M potassium phosphate borate electrolyte, pH 9.2, at a potential of 0.92 and 1.15 V (vs., the normal hydrogen electrode), respectively. Exemplary, thermally reversible solid fuel cycles are (189)

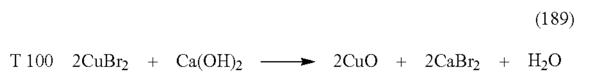

(190)

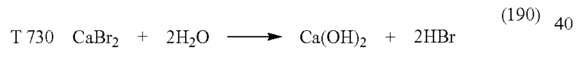

(191)

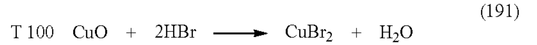

(192)

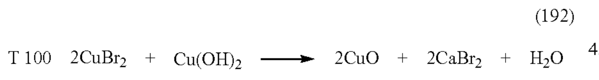

(193)

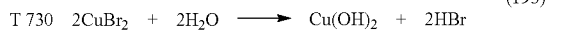

(194)

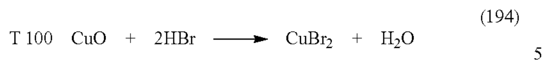

In an embodiment, the reaction mixture of a solid fuel having at least one of $H_2$ as a reactant and $H_2O$ as a product and one or more of $H_2$ or $H_2O$ as at least one of a reactant and a product is selected such that the maximum theoretical free energy of the any conventional reaction is about zero within the range of −500 to +500 kJ/mole of the limiting reagent or preferably within the range of −100 to +100 kJ/mole of the limiting reagent. A mixture of reactants and products may be maintained at one or more of about the optimum temperature at which the free energy is about zero and about the optimum temperature at which the reaction is reversible to obtain regeneration or steady power for at least a duration longer than reaction time in the absence of maintaining the mixture and temperature. The temperature may be within a range of about +/−500° C. or about +/−100° C. of the optimum. Exemplary mixtures and reaction temperatures are a stoichiometric mixture of Fe, $Fe_2O_3$, $H_2$ and $H_2O$ at 800 K and a stoichiometric Sn, SnO, $H_2$ and $H_2O$ at 800 K.

In an embodiment, wherein at least one of an alkali metal M such as K or Li, and nH (n=integer), OH, O, 2O, $O_2$, and $H_2O$ serve as the catalyst, the source of H is at least one of a metal hydride such as MH and the reaction of at least one of a metal M and a metal hydride MH with a source of H to form H. One product may be an oxidized M such as an oxide or hydroxide. The reaction to create at least one of atomic hydrogen and catalyst may be an electron transfer reaction or an oxidation-reduction reaction. The reaction mixture may further comprise at least one of $H_2$, a $H_2$ dissociator such as those of the present disclosure such as Ni screen or R—Ni and an electrically conductive support such as these dissociators and others as well as supports of the present disclosure such as carbon, and carbide, a boride, and a carbonitride. An exemplary oxidation reaction of M or MH is (195)

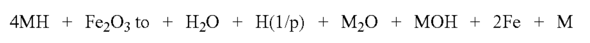

wherein at least one of $H_2O$ and M may serve as the catalyst to form H(1/p). The reaction mixture may further comprise a getter for hydrino such as a compound such as a salt such as a halide salt such as an alkali halide salt such as KCl or KI. The product may be MHX (M=metal such as an alkali; X is counter ion such as halide; H is hydrino species). Other hydrino catalysts may substitute for M such as those of the present disclosure such as those of TABLE 1.

In an embodiment, the source of oxygen is a compound that has a heat of formation that is similar to that of water such that the exchange of oxygen between the reduced product of the oxygen source compound and hydrogen occurs with minimum energy release. Suitable exemplary oxygen source compounds are CdO, CuO, ZnO, $SO_2$, $SeO_2$, and $TeO_2$. Others such as metal oxides may also be anhydrides of acids or bases that may undergo dehydration reactions as the source of $H_2O$ catalyst are $MnO_x$, $AlO_x$, and $SiO_x$. In an embodiment, an oxide layer oxygen source may cover a source of hydrogen such as a metal hydride such as palladium hydride. The reaction to form $H_2O$ catalyst and atomic H that further react to form hydrino may be initiated by heating the oxide coated hydrogen source such as metal oxide coated palladium hydride. The palladium hydride may be coated on the opposite side as that of the oxygen source by a hydrogen impermeable layer such as a layer of gold film to cause the released hydrogen to selectively migrate to the source of oxygen such the oxide layer such as a metal oxide. In an embodiment, the reaction to form the hydrino catalyst and the regeneration reaction comprise an oxygen exchange between the oxygen source compound and hydrogen and between water and the reduced oxygen source compound, respectively. Suitable reduced oxygen sources are Cd, Cu, Zn, S, Se, and Te. In an embodiment, the oxygen exchange reaction may comprise those used to form hydrogen gas thermally. Exemplary thermal methods are the iron oxide cycle, cerium(IV) oxide-cerium(III) oxide cycle, zinc zinc-oxide cycle, sulfur-iodine cycle, copper-chlorine cycle and hybrid sulfur cycle and others known to those skilled in the art. In an embodiment, the reaction to form hydrino catalyst and the regeneration reaction such as an oxygen exchange reaction occurs simultaneously in the same reaction vessel. The conditions such a temperature and pressure may be controlled to achieve the simultaneity of reaction. Alternately, the products may be removed and regenerated in at least one other separate vessel that may occur under conditions different than those of the power forming reaction as given in the present disclosure and Mills Prior Applications.

In an embodiment, the $NH_2$ group of an amide such as $LiNH_2$ serves as the catalyst wherein the potential energy is about 81.6 eV corresponding to m=3 in Eq. (5). Similarly to the reversible $H_2O$ elimination or addition reaction of between acid or base to the anhydride and vice versa, the reversible reaction between the amide and imide or nitride results in the formation of the $NH_2$ catalyst that further reacts with atomic H to form hydrinos. The reversible reaction between amide, and at least one of imide and nitride may also serve as a source of hydrogen such as atomic H.

In an embodiment, a hydrino species such as molecular hydrino or hydrino hydride ion is synthesized by the reaction of H and at least one of OH and $H_2O$ catalyst. The hydrino species may be produced by at least two of the group of a metal such as an alkali, alkaline earth, transition, inner transition, and rare earth metal, Al, Ga, In, Ge, Sn, Pb, As, Sb, and Te, a metal hydride such as $LaNi_5H_6$ and others of the present disclosure, an aqueous hydroxide such as an alkaline hydroxide such as KOH at 0.1 M up to saturated concentration, a support such as carbon, Pt/C, steam carbon, carbon black, a carbide, a boride, or a nitrile, and oxygen. Suitable exemplary reaction mixtures to form hydrino species such as molecular hydrino are (1) Co PtC KOH (sat) with and without $O_2$; (2) Zn or Sn+$LaNi_5H_6$+KOH (sat), (3) Co, Sn, Sb, or Zn+$O_2$+CB+KOH (sat), (4) Al CB KOH (sat), (5) Sn Ni-coated graphite KOH (sat) with and without $O_2$, (6) Sn+SC or CB+KOH (sat)+$O_2$, (7) Zn PVC KOH (sat) $O_2$, (8) Zn R—Ni KOH (sat) $O_2$, (9) Sn $LaNi_5H_6$ KOH (sat) $O_2$, (10) Sb $LaNi_5H_6$ KOH (sat) $O_2$, (11) Co, Sn, Zn, Pb, or Sb+KOH (Sat aq)+$K_2CO_3$+CB-SA, and (12) $LiNH_2$ LiBr and LiH or Li and $H_2$ or a source thereof and optionally a hydrogen dissociator such as Ni or R—Ni. Additional reaction mixtures comprise a molten hydroxide, a source of hydrogen, a source of oxygen, and a hydrogen dissociator. Suitable exemplary reaction mixtures to form hydrino species such as molecular hydrino are (1) Ni($H_2$) LiOH—LiBr air or $O_2$, (2) Ni($H_2$) NaOH—NaBr air or $O_2$, and (3) Ni($H_2$) KOH—NaBr air or $O_2$.

In an embodiment, the product of at least one of the chemical, SF-CIHT, and CIHT cell reactions to form hydrinos is a compound comprising hydrino or lower-energy hydrogen species such as $H_2(1/p)$ complexed with an inorganic compound. The compound may comprise an oxyanion compound such as an alkali or alkaline earth carbonate or hydroxide or other such compounds of the present disclosure. In an embodiment, the product comprises at least one of $M_2CO_3 \cdot H_2(1/4)$ and $MOH \cdot H_2(1/4)$ (M=alkali or other cation of the present disclosure) complex. The product may be identified by ToF-SIMS as a series of ions in the positive spectrum comprising

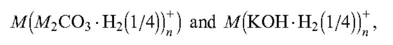

$$M(M_2CO_3 \cdot H_2(1/4))_n^+) \text{ and } M(KOH \cdot H_2(1/4))_n^+,$$

respectively, wherein n is an integer and an integer and integer p>1 may be substituted for 4. In an embodiment, a compound comprising silicon and oxygen such as $SiO_2$ or quartz may serve as a getter for $H_2(1/4)$. The getter for $H_2(1/4)$ may comprise a transition metal, alkali metal, alkaline earth metal, inner transition metal, rare earth metal, combinations of metals, alloys such as a Mo alloy such as MoCu, and hydrogen storage materials such as those of the present disclosure.

The lower-energy hydrogen compounds synthesized by the methods of the present disclosure may have the formula MH, $MH_2$, or $M_2H_2$, wherein M is an alkali cation and H is an increased binding energy hydride ion or an increased binding energy hydrogen atom. The compound may have the formula $MH_n$ wherein n is 1 or 2, M is an alkaline earth cation and H is an increased binding energy hydride ion or an increased binding energy hydrogen atom. The compound may have the formula MHX wherein M is an alkali cation, X is one of a neutral atom such as halogen atom, a molecule, or a singly negatively charged anion such as halogen anion, and H is an increased binding energy hydride ion or an increased binding energy hydrogen atom. The compound may have the formula MHX wherein M is an alkaline earth cation, X is a singly negatively charged anion, and H is an increased binding energy hydride ion or an increased binding energy hydrogen atom. The compound may have the formula MHX wherein M is an alkaline earth cation, X is a double negatively charged anion, and H is an increased binding energy hydrogen atom. The compound may have the formula $M_2HX$ wherein M is an alkali cation, X is a singly negatively charged anion, and H is an increased binding energy hydride ion or an increased binding energy hydrogen atom. The compound may have the formula $MH_n$ wherein n is an integer, M is an alkaline cation and the hydrogen content $H_n$ of the compound comprises at least one increased binding energy hydrogen species. The compound may have the formula $M_2H_n$ wherein n is an integer, M is an alkaline earth cation and the hydrogen content $H_n$ of the compound comprises at least one increased binding energy hydrogen species. The compound may have the formula $M_2XH_n$ wherein n is an integer, M is an alkaline earth cation, X is a singly negatively charged anion, and the hydrogen content $H_n$ of the compound comprises at least one increased binding energy hydrogen species. The compound may have the formula $M_2X_2H_n$ wherein n is 1 or 2, M is an alkaline earth cation, X is a singly negatively charged anion, and the hydrogen content $H_n$ of the compound comprises at least one increased binding energy hydrogen species. The compound may have the formula $M_2X_3H$ wherein M is an alkaline earth cation, X is a singly negatively charged anion, and H is an increased binding energy hydride ion or an increased binding energy hydrogen atom. The compound may have the formula $M_2XH_n$ wherein n is 1 or 2, M is an alkaline earth cation, X is a double negatively charged anion, and the hydrogen content $H_n$ of the compound comprises at least one increased binding energy hydrogen species. The compound may have the formula $M_2XX'H$ wherein M is an alkaline earth cation, X is a singly negatively charged anion, X' is a double negatively charged anion, and H is an increased binding energy hydride ion or an increased binding energy hydrogen atom. The compound may have the formula $MM'H_n$ wherein n is an integer from 1 to 3, M is an alkaline earth cation, M' is an alkali metal cation and the hydrogen content $H_n$ of the compound comprises at least one increased binding energy hydrogen species. The compound may have the formula $MM'XH_n$ wherein n is 1 or 2, M is an alkaline earth cation, M' is an alkali metal cation, X is a singly negatively charged anion and the hydrogen content $H_n$ of the compound comprises at least one increased binding energy hydrogen species. The compound may have the formula MM'XH wherein M is an alkaline earth cation, M' is an alkali metal cation, X is a double negatively charged anion and H is an increased binding energy hydride ion or an increased binding energy hydrogen atom. The compound may have the formula MM'XX'H wherein M is an alkaline earth cation, M' is an alkali metal cation, X and X' are singly negatively charged anion and H is an increased binding energy hydride ion or an increased binding energy hydrogen atom. The compound may have the formula $MXX'H_n$ wherein n is an integer from 1 to 5, M is an alkali or alkaline earth cation, X is a singly or double negatively charged anion, X' is a metal or metalloid, a transition element, an inner transition element, or a rare earth element, and the hydrogen content $H_n$ of the compound comprises at least one increased binding energy hydrogen species. The compound may have the formula $MH_n$ wherein n is an integer, M is a cation such as a transition element, an inner transition element, or a rare earth element, and the hydrogen content $H_n$ of the compound comprises at least one increased binding energy hydrogen species. The compound may have the formula $MXH_n$ wherein n is an integer, M is an cation such as an alkali cation, alkaline earth cation, X is another cation such as a transition element, inner transition element, or a rare earth element cation, and the hydrogen content $H_n$ of the compound comprises at least one increased binding energy hydrogen species. The compound may have the formula $[KH_mKCO_3]_n$ wherein m and n are each an integer and the hydrogen content $H_m$ of the compound comprises at least one increased binding energy hydrogen species. The compound may have the formula

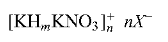

wherein m and n are each an integer, X is a singly negatively charged anion, and the hydrogen content $H_m$ of the compound comprises at least one increased binding energy hydrogen species. The compound may have the formula $[KHKNO_3]_n$ wherein n is an integer and the hydrogen content H of the compound comprises at least one increased binding energy hydrogen species. The compound may have the formula $[KHKNO_3]_n$ wherein n is an integer and the hydrogen content H of the compound comprises at least one increased binding energy hydrogen species. The compound including an anion or cation may have the formula $[MH_mM'X]_n$ wherein m and n are each an integer, M and M' are each an alkali or alkaline earth cation, X is a singly or double negatively charged anion, and the hydrogen content $H_m$ of the compound comprises at least one increased binding energy hydrogen species. The compound including an anion or cation may have the formula

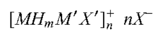

wherein m and n are each an integer, M and M' are each an alkali or alkaline earth cation, X and X' are a singly or double negatively charged anion, and the hydrogen content $H_m$ of the compound comprises at least one increased binding energy hydrogen species. The anion may comprise one of those of the disclosure. Suitable exemplary singly negatively charged anions are halide ion, hydroxide ion, hydrogen carbonate ion, or nitrate ion. Suitable exemplary double negatively charged anions are carbonate ion, oxide, or sulfate ion.

In an embodiment, the increased binding energy hydrogen compound or mixture comprises at least one lower energy hydrogen species such as a hydrino atom, hydrino hydride ion, and dihydrino molecule embedded in a lattice such as a crystalline lattice such as in a metallic or ionic lattice. In an embodiment, the lattice is non-reactive with the lower energy hydrogen species. The matrix may be aprotic such as in the case of embedded hydrino hydride ions. The compound or mixture may comprise at least one of H(1/p), $H_2(1/p)$, and $H^-(1/p)$ embedded in a salt lattice such as an alkali or alkaline earth salt such as a halide. Exemplary alkali halides are KCl and KI. The salt may be absent any $H_2O$ in the case of embedded $H^-(1/p)$. Other suitable salt lattices comprise those of the present disclosure. The lower energy hydrogen species may be formed by catalysis of hydrogen with an aprotic catalyst such as those of TABLE 1.

The compounds of the present invention are preferably greater than 0.1 atomic percent pure. More preferably, the compounds are greater than 1 atomic percent pure. Even more preferably, the compounds are greater than 10 atomic percent pure. Most preferably, the compounds are greater than 50 atomic percent pure. In another embodiment, the compounds are greater than 90 atomic percent pure. In another embodiment, the compounds are greater than 95 atomic percent pure.

In another embodiment of the chemical reactor to form hydrinos, the cell to form hydrinos and release power such as thermal power comprises the combustion chamber of an internal combustion engine, rocket engine, or gas turbine. The reaction mixture comprises a source of hydrogen and a source of oxygen to generate the catalyst and hydrinos. The source of the catalyst may be at least one of a species comprising hydrogen and one comprising oxygen. The species or a further reaction product may be at least one of species comprising at least one of O and H such as $H_2$, H, $H^+$, $O_2$, $O_3$,

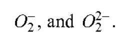

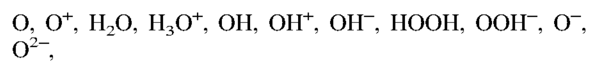

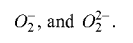

The catalyst may comprise an oxygen or hydrogen species such as $H_2O$. In another embodiment, the catalyst comprises at least one of nH, nO (n=integer), $O_2$, OH, and $H_2O$ catalyst. The source of hydrogen such as a source of hydrogen atoms may comprise a hydrogen-containing fuel such as $H_2$ gas or a hydrocarbon. Hydrogen atoms may be produced by pyrolysis of a hydrocarbon during hydrocarbon combustion. The reaction mixture may further comprise a hydrogen dissociator such as those of the present disclosure. H atoms may also be formed by the dissociation of hydrogen. The source of O may further comprise $O_2$ from air. The reactants may further comprise $H_2O$ that may serve as a source of at least one of H and O. In an embodiment, water serves as a further source of at least one of hydrogen and oxygen that may be supplied by pyrolysis of $H_2O$ in the cell. The water can be dissociated into hydrogen atoms thermally or catalytically on a surface, such as the cylinder or piston head. The surface may comprise material for dissociating water to hydrogen and oxygen. The water dissociating material may comprise an element, compound, alloy, or mixture of transition elements or inner transition elements, iron, platinum, palladium, zirconium, vanadium, nickel, titanium, Sc, Cr, Mn, Co, Cu, Zn, Y, Nb, Mo, Tc, Ru, Rh, Ag, Cd, La, Hf, Ta, W, Re, Os, Ir, Au, Hg, Ce, Pr, Nd, Pm, Sm, Eu, Gd, Tb, Dy, Ho, Er, Tm, Vb, Lu, Th, Pa, U, activated charcoal (carbon), or Cs intercalated carbon (graphite). The H an O may react to form the catalyst and H to form hydrinos. The source of hydrogen and oxygen may be drawn in through corresponding ports or intakes such as intake valves or manifolds. The products may be exhausted through exhaust ports or outlets. The flow may be controlled by controlling the inlet and outlet rates through the respective ports.

In an embodiment, hydrinos are formed by heating a source of catalyst and a source of hydrogen such as a solid fuel of the present disclosure. The heating may be at least one of thermal heating and percussion heating. Experimentally, Raman spectroscopy confirms that hydrinos are formed by ball milling a solid fuel such as a mixture of a hydroxide and a halide such as a mixture comprising alkali metals such as Li. For example, an inverse Raman effect peak is observed from ball milled LiOH+LiI and LiOH+LiF at 2308 $cm^{-1}$. Thus, a suitable exemplary mixture is LiOH+LiI or LiF. In an embodiment, at least one of thermal and percussion heating is achieved by a rapid reaction. In this case, an additional energetic reaction is provided by forming hydrinos.

VII. Solid Fuel Catalyst Induced Hydrino Transition (SF-CIHT) Cell and Power Converter In an embodiment, a power system that generates at least one of direct electrical energy and thermal energy comprises at least one vessel, reactants comprising: (a) at least one source of catalyst or a catalyst comprising nascent $H_2O$; (b) at least one source of atomic hydrogen or atomic hydrogen; and (c) at least one of a conductor and a conductive matrix, and at least one set of electrodes to confine the hydrino reactants, a source of electrical power to deliver a short burst of high-current electrical energy, a reloading system, at least one system to regenerate the initial reactants from the reaction products, and at least one direct converter such as at least one of a plasma to electricity converter such as PDC, a photovoltaic converter, and at least one thermal to electric power converter. In a further embodiment, the vessel is capable of a pressure of at least one of atmospheric, above atmospheric, and below atmospheric. In an embodiment, the regeneration system can comprise at least one of a hydration, thermal, chemical, and electrochemical system. In another embodiment, the at least one direct plasma to electricity converter can comprise at least one of the group of plasmadynamic power converter, $\vec{E}\times\vec{B}$ direct converter, magnetohydrodynamic power converter, magnetic mirror magnetohydrodynamic power converter, charge drift converter, Post or Venetian Blind power converter, gyrotron, photon bunching microwave power converter, and photoelectric converter. In a further embodiment, the at least one thermal to electricity converter can comprise at least one of the group of a heat engine, a steam engine, a steam turbine and generator, a gas turbine and generator, a Rankine-cycle engine, a Brayton-cycle engine, a Stirling engine, a thermionic power converter, and a thermoelectric power converter.

In an embodiment, $H_2O$ is ignited to form hydrinos with a high release of energy in the form of at least one of thermal, plasma, and electromagnetic (light) power. ("Ignition" in the present disclosure denotes a very high reaction rate of H to hydrinos that may be manifest as a burst, pulse or other form of high power release.) $H_2O$ may comprise the fuel that may be ignited with the application a high current such as one in the range of about 2000 A to 100,000 A. This may be achieved by the application of a high voltage such as 5,000 to 100,000 V to first form highly conducive plasma such as an arc. Alternatively, a high current may be passed through a compound or mixture comprising $H_2O$ wherein the conductivity of the resulting fuel such as a solid fuel is high. (In the present disclosure a solid fuel or energetic material is used to denote a reaction mixture that forms a catalyst such as HOH and H that further reacts to form hydrinos. However, the reaction mixture may comprise other physical states than solid. In embodiments, the reaction mixture may be at least one state of gaseous, liquid, solid, slurry, sol gel, solution, mixture, gaseous suspension, pneumatic flow, and other states known to those skilled in the art.) In an embodiment, the solid fuel having a very low resistance comprises a reaction mixture comprising $H_2O$. The low resistance may be due to a conductor component of the reaction mixture. In embodiments, the resistance of the solid fuel is at least one of in the range of about 10 ohm to $10^{-9}$ ohms, $10^{-8}$ ohm to 10 ohms, $10^{-3}$ ohm to 1 ohm, $10^{-4}$ ohm to $10^{-1}$ ohm, and $10^{-4}$ ohm to $10^{-2}$ ohm. In another embodiment, the fuel having a high resistance comprises $H_2O$ comprising a trace or minor mole percentage of an added compound or material. In the latter case, high current may be flowed through the fuel to achieve ignition by causing breakdown to form a highly conducting state such as an arc or arc plasma.

In an embodiment, the reactants can comprise a source of $H_2O$ and a conductive matrix to form at least one of the source of catalyst, the catalyst, the source of atomic hydrogen, and the atomic hydrogen. In a further embodiment, the reactants comprising a source of $H_2O$ can comprise at least one of bulk $H_2O$, a state other than bulk $H_2O$, a compound or compounds that undergo at least one of react to form $H_2O$ and release bound $H_2O$. Additionally, the bound $H_2O$ can comprise a compound that interacts with $H_2O$ wherein the $H_2O$ is in a state of at least one of absorbed $H_2O$, bound $H_2O$, physisorbed $H_2O$, and waters of hydration. In embodiments, the reactants can comprise a conductor and one or more compounds or materials that undergo at least one of release of bulk $H_2O$, absorbed $H_2O$, bound $H_2O$, physisorbed $H_2O$, and waters of hydration, and have $H_2O$ as a reaction product. In other embodiments, the at least one of the source of nascent $H_2O$ catalyst and the source of atomic hydrogen can comprise at least one of: (a) at least one source of $H_2O$; (b) at least one source of oxygen, and (c) at least one source of hydrogen.

In additional embodiments, the reactants to form at least one of the source of catalyst, the catalyst, the source of atomic hydrogen, and the atomic hydrogen comprise at least one of $H_2O$ and the source of $H_2O$; $O_2$, $H_2O$, HOOH, $OOH^-$, peroxide ion, superoxide ion, hydride, $H_2$, a halide, an oxide, an oxyhydroxide, a hydroxide, a compound that comprises oxygen, a hydrated compound, a hydrated compound selected from the group of at least one of a halide, an oxide, an oxyhydroxide, a hydroxide, a compound that comprises oxygen; and a conductive matrix. In certain embodiments, the oxyhydroxide can comprise at least one from the group of TiOOH, GdOOH, CoOOH, InOOH, FeOOH, GaOOH, NiOOH, AlOOH, CrOOH, MoOOH, CuOOH, MnOOH, ZnOOH, and SmOOH; the oxide can comprise at least one from the group of CuO, $Cu_2O$, CoO, $Co_2O_3$, $Co_3O_4$, FeO, $Fe_2O_3$, NiO, and $Ni_2O_3$; the hydroxide can comprise at least one from the group of $Cu(OH)_2$, $Co(OH)_2$, $Co(OH)_3$, $Fe(OH)_2$, $Fe(OH)_3$, and $Ni(OH)_2$; the compound that comprises oxygen can comprise at least one from the group of a sulfate, phosphate, nitrate, carbonate, hydrogen carbonate, chromate, pyrophosphate, persulfate, perchlorate, perbromate, and periodate, $MXO_3$, $MXO_4$ (M=metal such as alkali metal such as Li, Na, K, Rb, Cs; X=F, Br, Cl, I), cobalt magnesium oxide, nickel magnesium oxide, copper magnesium oxide, $Li_2O$, alkali metal oxide, alkaline earth metal oxide, CuO, $CrO_4$, ZnO, MgO, CaO, $MoO_2$, $TiO_2$, $ZrO_2$, $SiO_2$, $Al_2O_3$, NiO, FeO, $Fe_2O_3$, $TaO_2$, $Ta_2O_5$, VO, $VO_2$, $V_2O_3$, $V_2O_5$, $P_2O_3$, $P_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, CoO, $Co_2O_3$, $Co_3O_4$, FeO, $Fe_2O_3$, NiO, $Ni_2O_3$, rare earth oxide, $CeO_2$, $La_2O_3$, an oxyhydroxide, TiOOH, GdOOH, CoOOH, InOOH, FeOOH, GaOOH, NiOOH, AlOOH, CrOOH, MoOOH, CuOOH, MnOOH, ZnOOH, and SmOOH, and the conductive matrix can comprise at least one from the group of a metal powder, carbon, carbide, boride, nitride, carbonitrile such as TiCN, or nitrile.

In embodiments, the reactants can comprise a mixture of a metal, its metal oxide, and $H_2O$ wherein the reaction of the metal with $H_2O$ is not thermodynamically favorable. In other embodiments, the reactants can comprise a mixture of a metal, a metal halide, and $H_2O$ wherein the reaction of the metal with $H_2O$ is not thermodynamically favorable. In additional embodiments, reactants can comprise a mixture of a transition metal, an alkaline earth metal halide, and $H_2O$ wherein the reaction of the metal with $H_2O$ is not thermodynamically favorable. And in further embodiments, the reactants can comprise a mixture of a conductor, a hydroscopic material, and $H_2O$. In embodiments, the conductor can comprise a metal powder or carbon powder wherein the reaction of the metal or carbon with $H_2O$ is not thermodynamically favorable. In embodiments, the hydroscopic material can comprise at least one of the group of lithium bromide, calcium chloride, magnesium chloride, zinc chloride, potassium carbonate, potassium phosphate, carnallite such as $KMgCl_3.6(H_2O)$, ferric ammonium citrate, potassium hydroxide and sodium hydroxide and concentrated sulfuric and phosphoric acids, cellulose fibers, sugar, caramel, honey, glycerol, ethanol, methanol, diesel fuel, methamphetamine, a fertilizer chemical, a salt, a desiccant, silica, activated charcoal, calcium sulfate, calcium chloride, a molecular sieves, a zeolite, a deliquescent material, zinc chloride, calcium chloride, potassium hydroxide, sodium hydroxide and a deliquescent salt. In certain embodiments, the power system can comprise a mixture of a conductor, hydroscopic materials, and $H_2O$ wherein the ranges of relative molar amounts of (metal/conductor), (hydroscopic material), ($H_2O$) are at least one of about (0.000001 to 100000), (0.000001 to 100000), (0.000001 to 100000); (0.00001 to 10000), (0.00001 to 10000), (0.00001 to 10000); (0.0001 to 1000), (0.0001 to 1000), (0.0001 to 1000); (0.001 to 100), (0.001 to 100), (0.001 to 100); (0.01 to 100), (0.01 to 100), (0.01 to 100); (0.1 to 10), (0.1 to 10), (0.1 to 10); and (0.5 to 1), (0.5 to 1), (0.5 to 1). In certain embodiments, the metal having a thermodynamically unfavorable reaction with $H_2O$ can be at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In additional embodiments, the reactants can be regenerated by addition of $H_2O$.

In further embodiments, the reactants can comprise a mixture of a metal, its metal oxide, and $H_2O$ wherein the metal oxide is capable of $H_2$ reduction at a temperature less than 1000° C. In other embodiments, the reactants can comprise a mixture of an oxide that is not easily reduced with $H_2$ and mild heat, a metal having an oxide capable of being reduced to the metal with $H_2$ at a temperature less than 1000° C., and $H_2O$. In embodiments, the metal having an oxide capable of being reduced to the metal with $H_2$ at a temperature less than 1000° C. can be at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In embodiments, the metal oxide that is not easily reduced with $H_2$, and mild heat comprises at least one of alumina, an alkaline earth oxide, and a rare earth oxide.

In embodiments, the solid fuel can comprise carbon or activated carbon and $H_2O$ wherein the mixture is regenerated by rehydration comprising addition of $H_2O$. In further embodiments, the reactants can comprise at least one of a slurry, solution, emulsion, composite, and a compound. In embodiments, the current of the source of electrical power to deliver a short burst of high-current electrical energy is sufficient enough to cause the hydrino reactants to undergo the reaction to form hydrinos at a very high rate. In embodiments, the source of electrical power to deliver a short burst of high-current electrical energy comprises at least one of the following: a voltage selected to cause a high AC, DC, or an AC-DC mixture of current that is in the range of at least one of 100 A to 1,000,000 A, 1 kA to 100,000 A, 10 kA to 50 kA; a DC or peak AC current density in the range of at least one of 100 $A/cm^2$ to 1,000,000 $A/cm^2$, 1000 $A/cm^2$ to 100,000 $A/cm^2$, and 2000 $A/cm^2$ to 50,000 $A/cm^2$; the voltage is determined by the conductivity of the solid fuel or energetic material wherein the voltage is given by the desired current times the resistance of the solid fuel or energetic material sample; the DC or peak AC voltage may be in at least one range chosen from about 0.1 V to 500 kV, 0.1 V to 100 kV, and 1 V to 50 kV, and the AC frequency may be in the range of about 0.1 Hz to 10 GHz, 1 Hz to 1 MHz, 10 Hz to 100 kHz, and 100 Hz to 10 kHz. In embodiments, the resistance of the solid fuel or energetic material sample is in at least one range chosen from about 0.001 milliohm to 100 Mohm, 0.1 ohm to 1 Mohm, and 10 ohm to 1 kohm, and the conductivity of a suitable load per electrode area active to form hydrinos is in at least one range chosen from about $10^{-10}$ $ohm^{-1}$ $cm^{-2}$ to $10^6$ $ohm^{-1}$ $cm^{-2}$, $10^{-5}$ $ohm^{-1}$ $cm^{-2}$ to $10^6$ $ohm^{-1}$ $cm^{-2}$, $10^{-4}$ $ohm^{-1}$ $cm^{-2}$ to $10^5$ $ohm^{-1}$ $cm^{-2}$, $10^{-3}$ $ohm^{-1}$ $cm^{-2}$ to $10^4$ $ohm^{-1}$ $cm^{-2}$, $10^{-2}$ $ohm^{-1}$ $cm^{-2}$ to $10^3$ $ohm^{-1}$ $cm^{-2}$, $10^{-1}$ $ohm^{-1}$ $cm^{-2}$ to $10^2$ $ohm^{-1}$ $cm^{-2}$, and 1 $ohm^{-1}$ $cm^{-2}$ to 10 $ohm^{-1}$ $cm^{-2}$.

In an embodiment, the solid fuel is conductive. In embodiments, the resistance of a portion, pellet, or aliquot of solid fuel is at least one of in the range of about $10^{-9}$ ohm to 100 ohms, $10^{-8}$ ohm to 10 ohms, $10^{-3}$ ohm to 1 ohm, $10^{-3}$ ohm to $10^{-1}$ ohm, and $10^{-3}$ ohm to $10^{-2}$ ohm. In an embodiment, the hydrino reaction rate is dependent on the application or development of a high current. The hydrino catalysis reaction such as an energetic hydrino catalysis reaction may be initiated by a low-voltage, high-current flow through the conductive fuel. The energy release may be very high, and shock wave may form. In an embodiment, the voltage is selected to cause a high AC, DC, or an AC-DC mixture of current that causes ignition such as a high current in the range of at least one of 100 A to 1,000,000 A, 1 kA to 100,000 A, 10 kA to 50 kA. The current density may be in the range of at least one of 100 $A/cm^2$ to 1,000,000 $A/cm^2$, 1000 $A/cm^2$ to 100,000 $A/cm^2$, and 2000 $A/cm^2$ to 50,000 $A/cm^2$ of fuel that may comprise a pellet such as a pressed pellet. The DC or peak AC voltage may be in at least one range chosen from about 0.1 V to 100 kV V, 0.1 V to 1 k V, 0.1 V to 100 V, and 0.1 V to 15 V. The AC frequency may be in the range of about 0.1 Hz to 10 GHz, 1 Hz to 1 MHz, 10 Hz to 100 kHz, and 100 Hz to 10 kHz. The pulse time may be in at least one range chosen from about $10^{-6}$ s to 10 s, $10^{-5}$ s to 1 s, $10^{-4}$ s to 0.1 s, and $10^{-3}$ s to 0.01 s.

In an embodiment, the solid fuel or energetic material may comprise a source of $H_2O$ or $H_2O$. The $H_2O$ mole % content may be in the range of at least one of about 0.000001% to 100%, 0.00001% to 100%, 0.0001% to 100%, 0.001% to 100%, 0.01% to 100%, 0.1% to 100%, 1% to 100%, 10% to 100%, 0.1% to 50%, 1% to 25%, and 1% to 10%. In an embodiment, the hydrino reaction rate is dependent on the application or development of a high current. In an embodiment, the voltage is selected to cause a high AC, DC, or an AC-DC mixture of current that is in the range of at least one of 100 A to 1,000,000 A, 1 kA to 100,000 A, 10 kA to 50 kA. The DC or peak AC current density may be in the range of at least one of 100 A/cm$^2$ to 1,000,000 A/cm$^2$, 1000 A/cm$^2$ to 100,000 A/cm$^2$, and 2000 A/cm$^2$ to 50,000 A/cm$^2$. In an embodiment, the voltage is determined by the conductivity of the solid fuel or energetic material. The resistance of the solid fuel or energetic material sample is in at least one range chosen from about 0.001 milliohm to 100 Mohm, 0.1 ohm to 1 Mohm, and 10 ohm to 1 kohm. The conductivity of a suitable load per electrode area active to form hydrinos is in at least one range chosen from about $10^{-10}$ ohm$^{-1}$ cm$^{-2}$ to $10^6$ ohm$^{-1}$ cm$^{-2}$, $10^{-5}$ ohm$^{-1}$ cm$^{-2}$ to $10^6$ ohm$^{-1}$ cm$^{-2}$, $10^{-4}$ ohm$^{-1}$ cm$^{-2}$ to $10^5$ ohm$^{-1}$ cm$^{-2}$, $10^{-3}$ ohm$^{-1}$ cm$^{-2}$ to $10^4$ ohm$^{-1}$ cm$^{-2}$, $10^{-2}$ ohm$^{-1}$ cm$^{-2}$ to $10^3$ ohm$^{-1}$ cm$^{-2}$, $10^{-1}$ ohm$^{-1}$ cm$^{-2}$ to $10^2$ ohm$^{-1}$ cm$^{-2}$, and 1 ohm$^{-1}$ cm$^{-2}$ to 10 ohm$^{-1}$ cm$^{-2}$. In an embodiment, the voltage is given by the desired current times the resistance of the solid fuel or energetic material sample. In the exemplary case that the resistance is of the order of 1 mohm, the voltage is low such as <10 V. In an exemplary case of essentially pure $H_2O$ wherein the resistance is essentially infinite, the applied voltage to achieve a high current for ignition is high, such as above the breakdown voltage of the $H_2O$ such as about 5 kV or higher. In embodiments, the DC or peak AC voltage may be in at least one range chosen from about 0.1 V to 500 kV, 0.1 V to 100 kV, and 1 V to 50 kV. The AC frequency may be in the range of about 0.1 Hz to 10 GHz, 1 Hz to 1 MHz, 10 Hz to 100 kHz, and 100 Hz to 10 kHz. In an embodiment, a DC voltage is discharged to create plasma comprising ionized $H_2O$ wherein the current is underdamped and oscillates as it decays.

In an embodiment, the high-current pulse is achieved with the discharge of capacitors such as supercapacitors that may be connected in at least one of series and parallel to achieve the desired voltage and current wherein the current may be DC or conditioned with circuit elements such a transformer such as a low voltage transformer known to those skilled in the art. The capacitor may be charged by an electrical source such as grid power, a generator, a fuel cell, or a battery. In an embodiment, a battery supplies the current. In an embodiment, a suitable frequency, voltage, and current waveform may be achieved by power conditioning the output of the capacitors or battery.

The solid fuel or energetic material may comprise a conductor or conductive matrix or support such as a metal, carbon, or carbide, and $H_2O$ or a source of $H_2O$ such as a compound or compounds that can react to form $H_2O$ or that can release bound $H_2O$ such as those of the present disclosure. The solid fuel may comprise $H_2O$, a compound or material that interacts with the $H_2O$, and a conductor. The $H_2O$ may be present in a state other than bulk $H_2O$ such as absorbed or bound $H_2O$ such as physisorbed $H_2O$ or waters of hydration. Alternatively, the $H_2O$ may be present as bulk $H_2O$ in a mixture that is highly conductive or made highly conductive by the application of a suitable voltage. The solid fuel may comprise $H_2O$ and a material or compound such as a metal powder or carbon that provides high conductivity and a material or compound such as an oxide such as a metal oxide to facilitate forming H and possibility HOH catalyst. An exemplary solid fuel may comprise R—Ni alone and with additives such as those of transition metals and Al wherein R—Ni releases H and HOH by the decomposition of hydrated $Al_2O_3$ and $Al(OH)_3$. A suitable exemplary solid fuel comprises at least one oxyhydroxide such as TiOOH, GdOOH, CoOOH, InOOH, FeOOH, GaOOH, NiOOH, AlOOH, CrOOH, MoOOH, CuOOH, MnOOH, ZnOOH, and SmOOH and a conductive matrix such as at least one of a metal powder and carbon powder, and optionally $H_2O$. The solid fuel may comprise at least one hydroxide such as a transition metal hydroxide such as at least one of $Cu(OH)_2$, $Co(OH)_2$, $Fe(OH)_2$ and $Ni(OH)_2$, an aluminum hydroxide such as $Al(OH)_3$, a conductor such as at least one of carbon powder and a metal powder, and optionally $H_2O$. The solid fuel may comprise at least one oxide such as at least one of a transition metal oxide such as at least one of CuO, $Cu_2O$, NiO, $Ni_2O_3$, FeO and $Fe_2O_3$, a conductor such as at least one of carbon powder and a metal powder, and $H_2O$. The solid fuel may comprise at least one halide such as a metal halide such as an alkaline earth metal halide such as $MgCl_2$, a conductor such as at least one of carbon powder and a metal powder such as Co or Fe, and $H_2O$. The solid fuel may comprise a mixture of solid fuels such as one comprising at least two of a hydroxide, an oxyhydroxide, an oxide, and a halide such as a metal halide, and at least one conductor or conductive matrix, and $H_2O$. The conductor may comprise at least one of a metal screen coated with one or more of the other components of the reaction mixture that comprises the solid fuel, R—Ni, a metal powder such as a transition metal powder, Ni or Co celmet, carbon, or a carbide or other conductor, or conducing support or conducting matrix known to those skilled in the art. In an embodiment, at least one conductor of the $H_2O$-based solid fuel comprises a metal such as a metal power such as at least one of a transition metal such as Cu, Al, and Ag.

In an embodiment, the solid fuel comprises carbon such as activated carbon and $H_2O$. In the case that the ignition to form plasma occurs under vacuum or an inert atmosphere, following plasma-to-electricity generation, the carbon condensed from the plasma may be rehydrated to reform the solid in a regenerative cycle. The solid fuel may comprise at least one of a mixture of acidic, basic, or neutral $H_2O$ and activated carbon, charcoal, soft charcoal, at least one of steam and hydrogen treated carbon, and a metal powder. In an embodiment, the metal of the carbon-metal mixture is at least partially unreactive with $H_2O$. Suitable metals that are at least partially stable toward reaction with $H_2O$ are at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. The mixture may be regenerated by rehydration comprising addition of $H_2O$.

In an embodiment, the basic required reactants are a source of H, a source of O, and a good conductor matrix to allow a high current to permeate the material during ignition. The solid fuel or energetic material may be contained in a sealed vessel such as a sealed metal vessel such as a sealed aluminum vessel. The solid fuel or energetic material may be reacted by a low-voltage, high-current pulse such as one created by a spot welder such as that achieved by confinement between the two copper electrodes of a Taylor-Winfield model ND-24-75 spot welder and subjected to a short burst of low-voltage, high-current electrical energy. The 60

Hz voltage may be about 5 to 20 V RMS and the current may be about 10,000 to 40,000 A/$cm^2$.

Exemplary energetic materials and conditions are at least one of TiOOH, GdOOH, CoOOH, InOOH, FeOOH, GaOOH, NiOOH, AlOOH, CrOOH, MoOOH, CuOOH, MnOOH, ZnOOH, SmOOH, $Ni_2O_3H_2O$, $La_2O_3H_2O$, and $Na_2SO_4H_2O$ coated onto a Ni mesh screen as a slurry and dried and then subjected to an electrical pulse of about 60 Hz, 8 V RMS, and to 40,000 A/$cm^2$.

In an embodiment, the solid fuel or energetic material comprises $H_2O$ and a dispersant and dissociator to form nascent $H_2O$ and H. Suitable exemplary dispersants and dissociators are a halide compound such as a metal halide such as a transition metal halide such as a bromide such as $FeBr_2$, a compound that forms a hydrate such as $CuBr_2$, and compounds such as oxides and halides having a metal capable of multiple oxidation states. Others comprise oxides, oxyhydroxides, or hydroxides such as those of transition elements such as CoO, $Co_2O_3$, $Co_3O_4$, CoOOH, $Co(OH)_2$, $Co(OH)_3$, NiO, $Ni_2O_3$, NiOOH, $Ni(OH)_2$, FeO, $Fe_2O_3$, FeOOH, $Fe(OH)_3$, CuO, $Cu_2O$, CuOOH, and $Cu(OH)_2$. In other embodiments, the transition metal is replaced by another such as alkali, alkaline earth, inner transition, and rare earth metal, and Group 13 and 14 metals. Suitable examples are $La_2O_3$, $CeO_2$, and $LaX_3$ (X=halide). In another embodiment, the solid fuel or energetic material comprises $H_2O$ as a hydrate of an inorganic compound such as an oxide, oxyhydroxides, hydroxide, or halide. Other suitable hydrates are metal compounds of the present disclosure such as at least one of the group of sulfate, phosphate, nitrate, carbonate, hydrogen carbonate, chromate, pyrophosphate, persulfate, hypochlorite, chlorite, chlorate, perchlorate, hypobromite, bromite, bromate, perchlorate, hypoiodite, iodite, iodate, periodate, hydrogen sulfate, hydrogen or dihydrogen phosphate, other metal compounds with an oxyanion, and metal halides. The moles ratios of dispersant and dissociator such as a metal oxide or halide compound is any desired that gives rise to an ignition event. Suitable the moles of at the at least one compound to the moles $H_2O$ are in at least one range of about 0.000001 to 100000, 0.00001 to 10000, 0.0001 to 1000, 0.01 to 100, 0.1 to 10, and 0.5 to 1 wherein the ratio is defined as (moles compound/moles $H_2O$). The solid fuel or energetic material may further comprise a conductor or conducing matrix such as at least one of a metal powder such as a transition metal powder, Ni or Co celmet, carbon powder, or a carbide or other conductor, or conducing support or conducting matrix known to those skilled in the art. Suitable ratios of moles of the hydrated compound comprising at the least one compound and $H_2O$ to the moles of the conductor are in at least one range of about 0.000001 to 100000, 0.00001 to 10000, 0.0001 to 1000, 0.01 to 100, 0.1 to 10, and 0.5 to 1 wherein the ratio is defined as (moles hydrated compound/moles conductor).

In an embodiment, the reactant is regenerated from the product by the addition of $H_2O$. In an embodiment, the solid fuel or energetic material comprises $H_2O$ and a conductive matrix suitable for the low-voltage, high-current of the present disclosure to flow through the hydrated material to result in ignition. The conductive matrix material may be at least one of a metal surface, metal powder, carbon, carbon powder, carbide, boride, nitride, carbonitrile such as TiCN, nitrile, another of the present disclosure, or known to those skilled in the art. The addition of $H_2O$ to form the solid fuel or energetic material or regenerate it from the products may be continuous or intermittent.

The solid fuel or energetic material may comprise a mixture of conductive matrix, an oxide such as a mixture of a metal and the corresponding metal oxide such as a transition metal and at least one of its oxides such as ones selected from Fe, Cu, Ni, or Co, and $H_2O$. The $H_2O$ may be in the form of hydrated oxide. In other embodiments, the metal/metal oxide reactant comprises a metal that has a low reactivity with $H_2O$ corresponding to the oxide being readily capable of being reduced to the metal, or the metal not oxidizing during the hydrino reaction. A suitable exemplary metal having low $H_2O$ reactivity is one chosen from Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr. The metal may be converted to the oxide during the reaction. The oxide product corresponding to the metal reactant may be regenerated to the initial metal by hydrogen reduction by systems and methods known by those skilled in the art. The hydrogen reduction may be at elevated temperature. The hydrogen may be supplied by the electrolysis of $H_2O$. In another embodiment, the metal is regenerated form the oxide by carbo-reduction, reduction with a reductant such as a more oxygen active metal, or by electrolysis such as electrolysis in a molten salt. The formation of the metal from the oxide may be achieved by systems and methods known by those skilled in the art. The molar amount of metal to metal oxide to $H_2O$ are any desirable that results in ignition when subjected to a low-voltage, high current pulse of electricity as given in the present disclosure. Suitable ranges of relative molar amounts of (metal), (metal oxide), ($H_2O$) are at least one of about (0.000001 to 100000), (0.000001 to 100000), (0.000001 to 100000); (0.00001 to 10000), (0.00001 to 10000), (0.00001 to 10000); (0.0001 to 1000), (0.0001 to 1000), (0.0001 to 1000); (0.001 to 100), (0.001 to 100), (0.001 to 100); (0.01 to 100), (0.01 to 100), (0.01 to 100); (0.1 to 10), (0.1 to 10), (0.1 to 10); and (0.5 to 1), (0.5 to 1), (0.5 to 1). The solid fuel or energetic material may comprise at least one of a slurry, solution, emulsion, composite, and a compound.

The solid fuel or energetic material may comprise a mixture of conductive matrix, a halide such as a mixture of a first metal and the corresponding first metal halide or a second metal halide, and $H_2O$. The $H_2O$ may be in the form of hydrated halide. The second metal halide may be more stable than the first metal halide. In an embodiment, the first metal has a low reactivity with $H_2O$ corresponding to the oxide being readily capable of being reduced to the metal, or the metal not oxidizing during the hydrino reaction. A suitable exemplary metal having low $H_2O$ reactivity is one chosen from Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr. The molar amount of metal to metal halide to $H_2O$ are any desirable that results in ignition when subjected to a low-voltage, high current pulse of electricity as given in the present disclosure. Suitable ranges of relative molar amounts of (metal), (metal halide), ($H_2O$) are at least one of about (0.000001 to 100000), (0.000001 to 100000), (0.000001 to 100000); (0.00001 to 10000), (0.00001 to 10000), (0.00001 to 10000); (0.0001 to 1000), (0.0001 to 1000), (0.0001 to 1000); (0.001 to 100), (0.001 to 100), (0.001 to 100); (0.01 to 100), (0.01 to 100), (0.01 to 100); (0.1 to 10), (0.1 to 10), (0.1 to 10); and (0.5 to 1), (0.5 to 1), (0.5 to 1). The solid fuel or energetic material may comprise at least one of a slurry, solution, emulsion, composite, and a compound.

In an embodiment, the solid fuel or energetic material may comprise a conductor such as one of the present disclosure such as a metal or carbon, a hydroscopic material, and $H_2O$. Suitable exemplary hydroscopic materials are lithium bromide, calcium chloride, magnesium chloride, zinc chloride, potassium carbonate, potassium phosphate, carnallite such as $KMgCl_3.6(H_2O)$, ferric ammonium citrate, potassium hydroxide and sodium hydroxide and concentrated sulfuric and phosphoric acids, cellulose fibers (such as cotton and paper), sugar, caramel, honey, glycerol, ethanol, methanol, diesel fuel, methamphetamine, many fertilizer chemicals, salts (including table salt) and a wide variety of other substances know to those skilled in the art as well as a desiccant such as silica, activated charcoal, calcium sulfate, calcium chloride, and molecular sieves (typically, zeolites) or a deliquescent material such as zinc chloride, calcium chloride, potassium hydroxide, sodium hydroxide and many different deliquescent salts known to those skilled in the art. Suitable ranges of relative molar amounts of (metal), (hydroscopic material), ($H_2O$) are at least one of about (0.000001 to 100000), (0.000001 to 100000), (0.000001 to 100000); (0.00001 to 10000), (0.00001 to 10000), (0.00001 to 10000); (0.0001 to 1000), (0.0001 to 1000), (0.0001 to 1000); (0.001 to 100), (0.001 to 100), (0.001 to 100); (0.01 to 100), (0.01 to 100), (0.01 to 100); (0.1 to 10), (0.1 to 10), (0.1 to 10); and (0.5 to 1), (0.5 to 1), (0.5 to 1). The solid fuel or energetic material may comprise at least one of a slurry, solution, emulsion, composite, and a compound.

In an exemplary energetic material, 0.05 ml (50 mg) of $H_2O$ was added to 20 mg or either $Co_3O_4$ or CuO that was sealed in an aluminum DSC pan (Aluminum crucible 30 µl, D:6.7×3 (Setaram, S08/HBB37408) and Aluminum cover D: 6,7, stamped, non-tight (Setaram, S08/HBB37409)) and ignited with a current of between 15,000 to 25,000 A at about 8 V RMS using a Taylor-Winfield model ND-24-75 spot welder. A large energy burst was observed that vaporized the samples, each as an energetic, highly-ionized, expanding plasma. Another exemplary solid fuel ignited in the same manner with a similar result comprises Cu (42.6 mg)+CuO (14.2 mg)+$H_2O$ (16.3 mg) that was sealed in an aluminum DSC pan (71.1 mg) (Aluminum crucible 30 µl, D:6.7×3 (Setaram, S08/HBB37408) and Aluminum cover D: 6,7, stamped, tight (Setaram, S08/HBB37409)).

In an embodiment, the solid fuel or energetic material comprises a source of nascent $H_2O$ catalyst and a source of H. In an embodiment, the solid fuel or energetic material is conductive or comprises a conductive matrix material to cause the mixture of the source of nascent $H_2O$ catalyst and a source of H to be conductive. The source of at least one of a source of nascent $H_2O$ catalyst and a source of H is a compound or mixture of compounds and a material that comprises at least O and H. The compound or material that comprises O may be at least one of an oxide, a hydroxide, and an oxyhydroxide such as alkali, alkaline earth, transition metal, inner transition metal, rare earth metal, and group 13 and 14 metal oxide, hydroxide and oxyhydroxide. The compound or material that comprises O may be a sulfate, phosphate, nitrate, carbonate, hydrogen carbonate, chromate, pyrophosphate, persulfate, perchlorate, perbromate, and periodate, $MXO_3$, $MXO_4$ (M=metal such as alkali metal such as Li, Na, K, Rb, Cs; X=F, Br, Cl, I), cobalt magnesium oxide, nickel magnesium oxide, copper magnesium oxide, $Li_2O$, alkali metal oxide, alkaline earth metal oxide, CuO, $CrO_4$, ZnO, MgO, CaO, $MoO_2$, $TiO_2$, $ZrO_2$, $SiO_2$, $Al_2O_3$, NiO, FeO, $Fe_2O_3$, $TaO_2$, $Ta_2O_5$, VO, $VO_2$, $V_2O_3$, $V_2O_5$, $P_2O_3$, $P_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, rare earth oxide such as $CeO_2$ or $La_2O_3$, an oxyhydroxide such as TiOOH, GdOOH, CoOOH, InOOH, FeOOH, GaOOH, NiOOH, AlOOH, CrOOH, MoOOH, CuOOH, MnOOH, ZnOOH, and SmOOH. Exemplary sources of H are $H_2O$, a compound that has bound or absorbed $H_2O$ such as a hydrate, a hydroxide, oxyhydroxide, or hydrogen sulfate, hydrogen or dihydrogen phosphate, and a hydrocarbon. The conductive matrix material may be at least one of a metal powder, carbon, carbon powder, carbide, boride, nitride, carbonitrile such as TiCN, or nitrile. The conductors of the present disclosure may be in different physical forms in different embodiments, such as bulk, particulate, power, nanopowder, and other forms know to those skilled in the art that cause the solid fuel or energetic material comprising a mixture with the conductor to be conductive.

Exemplary solid fuels or energetic materials comprise at least one of $H_2O$ and a conductive matrix. In an exemplary embodiment, the solid fuel comprises $H_2O$ and a metal conductor such as a transition metal such as Fe in a form such as a Fe metal powder conductor and a Fe compound such as iron hydroxide, iron oxide, iron oxyhydroxide, and iron halide wherein the latter may substitute for $H_2O$ as the hydrate that serves as the source of $H_2O$. Other metals may substitute for Fe in any of their physical forms such as metals and compounds as well as state such as bulk, sheet, screen, mesh, wire, particulate, powder, nanopowder and solid, liquid, and gaseous. The conductor may comprise carbon in one or more physical forms such as at least one of bulk carbon, particulate carbon, carbon powder, carbon aerogel, carbon nanotubes, activated carbon, graphene, KOH activated carbon or nanotubes, carbide derived carbon, carbon fiber cloth, and fullerene. Suitable exemplary solid fuels or energetic materials are $CuBr_2$+$H_2O$+conductive matrix; $Cu(OH)_2$+$FeBr_2$+conductive matrix material such as carbon or a metal powder; FeOOH+conductive matrix material such as carbon or a metal powder; Cu(OH)Br+conductive matrix material such as carbon or a metal powder; AlOOH or $Al(OH)_3$+Al powder wherein addition $H_2$ is supplied to the reactions to form hydrinos by reaction of Al with $H_2O$ formed from the decomposition of AlOOH or $Al(OH)_3$; $H_2O$ in conducting nanoparticles such as carbon nanotubes and fullerene that may be steam activated and $H_2O$ in metalized zeolites wherein a dispersant may be used to wet hydrophobic material such as carbon; $NH_4NO_3$+$H_2O$+NiAl alloy powder; $LiNH_2$+$LiNO_3$+Ti powder; $LiNH_2$+$LiNO_3$+Pt/Ti; $LiNH_2$+$NH_4NO_3$+Ti powder; $BH_3NH_3$+$NH_4NO_3$; $BH_3NH_3$+$CO_2$, $SO_2$, $NO_2$, as well as nitrates, carbonates, sulfates; LiH+$NH_4NO_3$+transition metal, rare earth metal, Al or other oxidizable metal; $NH_4NO_3$+transition metal, rare earth metal, Al or other oxidizable metal; $NH_4NO_3$+R—Ni; $P_2O_5$ with each of a hydroxide of the present disclosure, $LiNO_3$, $LiClO_4$ and $S_2O_8$+conductive matrix; and a source of H such as a hydroxide, oxyhydroxide, hydrogen storage material such as one or more of the present disclosure, diesel fuel and a source of oxygen that may also be an electron acceptor such as $P_2O_5$ and other acid anhydrides such as $CO_2$, $SO_2$, or $NO_2$.

The solid fuel or energetic material to form hydrinos may comprise at least one highly reactive or energetic material, such as $NH_4NO_3$, tritonal, RDX, PETN, and others of the present disclosure. The solid fuel or energetic material may additionally comprise at least one of a conductor, a conducting matrix, or a conducting material such as a metal powder, carbon, carbon powder, carbide, boride, nitride, carbonitrile such as TiCN, or nitrile, a hydrocarbon such as diesel fuel, an oxyhydroxide, a hydroxide, an oxide, and $H_2O$. In an exemplary embodiment, the solid fuel or energetic material comprises a highly reactive or energetic material such as $NH_4NO_3$, tritonal, RDX, and PETN and a conductive matrix such as at least one of a metal powder such as Al or a transition metal powder and carbon powder. The solid fuel or energetic material may be reacted with a high current as given in the present disclosure. In an embodiment, the solid fuel or energetic material further comprises a sensitizer such as glass micro-spheres.

A. Plasmadynamic Converter (PDC)

The mass of a positively charge ion of a plasma is at least 1800 times that of the electron; thus, the cyclotron orbit is 1800 times larger. This result allows electrons to be magnetically trapped on magnetic field lines while ions may drift. Charge separation may occur to provide a voltage to a plasmadynamic converter.

B. Magnetohydrodynamic (MHD) Converter

Charge separation based on the formation of a mass flow of ions in a crossed magnetic field is well known art as magnetohydrodynamic (MHD) power conversion. The positive and negative ions undergo Lorentzian direction in opposite directions and are received at corresponding MHD electrode to affect a voltage between them. The typical MHD method to form a mass flow of ions is to expand a high-pressure gas seeded with ions through a nozzle to create a high speed flow through the crossed magnetic field with a set of MHD electrodes crossed with respect to the deflecting field to receive the deflected ions. In the present disclosure, the pressure is typically greater than atmospheric, but not necessarily so, and the directional mass flow may be achieved by reaction of a solid fuel to form a highly ionize radially expanding plasma.

C. Electromagnetic Direct (Crossed Field or Drift) Converter, $\vec{E}\times\vec{B}$ Direct Converter The guiding center drift of charged particles in magnetic and crossed electric fields may be exploited to separate and collect charge at spatially separated $\vec{E}\times\vec{B}$ electrodes. As the device extracts particle energy perpendicular to a guide field, plasma expansion may not be necessary. The performance of an idealized $\vec{E}\times\vec{B}$ converter relies on the inertial difference between ions and electrons that is the source of charge separation and the production of a voltage at opposing $\vec{E}\times\vec{B}$ electrodes relative to the crossed field directions. $\nabla\vec{B}$ drift collection may also be used independently or in combination with $\vec{E}\times\vec{B}$ collection.

D. Charge Drift Converter

The direct power converter described by Timofeev and Glagolev [A. V. Timofeev, "A scheme for direct conversion of plasma thermal energy into electrical energy," Sov. J. Plasma Phys., Vol. 4, No. 4, July-August, (1978), pp. 464-468; V. M. Glagolev, and A. V. Timofeev, "Direct Conversion of thermonuclear into electrical energy a drakon system," Plasma Phys. Rep., Vol. 19, No. 12, December (1993), pp. 745-749] relies on charge injection to drifting separated positive ions in order to extract power from a plasma. This charge drift converter comprises a magnetic field gradient in a direction transverse to the direction of a source of a magnetic flux B and a source of magnetic flux B having a curvature of the field lines. In both cases, drifting negatively and positively charged ions move in opposite directions perpendicular to plane formed by B and the direction of the magnetic field gradient or the plane in which B has curvature. In each case, the separated ions generate a voltage at opposing capacitors that are parallel to the plane with a concomitant decrease of the thermal energy of the ions. The electrons are received at one charge drift converter electrode and the positive ions are received at another. Since the mobility of ions is much less than that of electrons, electron injection may be performed directly or by boiling them off from a heated charge drift converter electrode. The power loss is small without much cost in power balance.

E. Magnetic Confinement

Consider that the blast or ignition event is when the catalysis of H to form hydrinos accelerates to a very high rate. In an embodiment, the plasma produced from the blast or ignition event is expanding plasma. In this case, magnetohydrodynamics (MHD) is a suitable conversion system and method. Alternatively, in an embodiment, the plasma is confined. In this case, the conversion may be achieved with at least one of a plasmadynamic converter, magnetohydrodynamic converter, electromagnetic direct (crossed field or drift) converter, $\vec{E}\times\vec{B}$ direct converter, and charge drift converter. In this case, in addition to a SF-CIHT cell and balance of plant comprising ignition, reloading, regeneration, fuel handling, and plasma to electric power conversion systems, the power generation system further comprises a plasma confinement system. The confinement may be achieved with magnetic fields such as solenoidal fields. The magnets may comprise at least one of permanent magnets and electromagnets such as at least one of uncooled, water cooled, and superconducting magnets with the corresponding cryogenic management system that comprises at least one of a liquid helium dewar, a liquid nitrogen dewar, radiation baffles that may be comprise copper, high vacuum insulation, radiation shields, and a cyropump and compressor that may be powered by the power output of a hydrino-based power generator. The magnets may be open coils such as Helmholtz coils. The plasma may further be confined in a magnetic bottle and by other systems and methods known to those skilled in the art.

Two magnetic mirrors or more may form a magnetic bottle to confine plasma formed by the catalysis of H to form hydrinos. The theory of the confinement is given in my prior applications such as Microwave Power Cell, Chemical Reactor, And Power Converter, PCT/US02/06955, filed Mar. 7, 2002 (short version), PCT/US02/06945 filed Mar. 7, 2002 (long version), U.S. Ser. No. 10/469,913 filed Sep. 5, 2003 herein incorporated by reference in their entirety. Ions created in the bottle in the center region will spiral along the axis, but will be reflected by the magnetic mirrors at each end. The more energetic ions with high components of velocity parallel to a desired axis will escape at the ends of the bottle. Thus, in an embodiment, the bottle may produce an essentially linear flow of ions from the ends of the magnetic bottle to a magnetohydrodynamic converter. Since electrons may be preferentially confined due to their lower mass relative to positive ions, and a voltage is developed in a plasmadynamic embodiment of the present disclosure. Power flows between an anode in contact with the confined electrons and a cathode such as the confinement vessel wall which collects the positive ions. The power may be dissipated in an external load.

F. Solid Fuel Catalyst Induced Hydrino Transition (SF-CIHT) Cell

Chemical reactants of the present invention may be referred to as solid fuel or energetic materials or both. A solid fuel may perform as and thereby comprise an energetic material when conditions are created and maintained to cause very high reaction kinetics to form hydrinos. In an embodiment, the hydrino reaction rate is dependent on the application or development of a high current. In an embodiment of an SF-CIHT cell, the reactants to form hydrinos are subject to a low voltage, high current, high power pulse that causes a very rapid reaction rate and energy release. The rate may be sufficient to create a shock wave. In an exemplary embodiment, a 60 Hz voltage is less than 15 V peak, the current is between 10,000 A/cm$^2$ and 50,000 A/cm$^2$ peak, and the power is between 150,000 W/cm$^2$ and 750,000 W/cm$^2$. Other frequencies, voltages, currents, and powers in ranges of about 1/100 times to 100 times these parameters are suitable. In an embodiment, the hydrino reaction rate is dependent on the application or development of a high current. In an embodiment, the voltage is selected to cause a high AC, DC, or an AC-DC mixture of current that is in the range of at least one of 100 A to 1,000,000 A, 1 kA to 100,000 A, 10 kA to 50 kA. The DC or peak AC current density may be in the range of at least one of 100 A/cm$^2$ to 1,000,000 A/cm$^2$, 1000 A/cm$^2$ to 100,000 A/cm$^2$, and 2000 A/cm$^2$ to 50,000 A/cm$^2$. The DC or peak AC voltage may be in at least one range chosen from about 0.1 V to 1000 V, 0.1 V to 100 V, 0.1 V to 15 V, and 1 V to 15 V. The AC frequency may be in the range of about 0.1 Hz to 10 GHz, 1 Hz to 1 MHz, 10 Hz to 100 kHz, and 100 Hz to 10 kHz. The pulse time may be in at least one range chosen from about $10^{-6}$ s to 10 s, $10^{-5}$ s to 1 s, $10^{-4}$ s to 0.1 s, and $10^{-3}$ s to 0.01 s.

During H catalysis to hydrinos, electrons are ionized from the HOH catalyst by the energy transferred from the H being catalyzed to the HOH. The steps of catalysis are (1) Atomic hydrogen reacts with an energy acceptor called a catalyst wherein energy is transferred from atomic hydrogen to the catalyst that forms positive ions and ionized electrons due to accepting the energy; (2) Then, the negative electron of H drops to a lower shell closer to the positive proton to form a smaller hydrogen atom, hydrino, releasing energy to produce electricity or heat depending on the design of the system; (3) The catalyst positive ions regain their lost electrons to reform the catalyst for another cycle with the release of the initial energy accepted from H (atomic hydrogen). The high current of the SF-CIHT cell counters the limiting effect of the charge accumulation from the catalyst losing its electrons to result in a catastrophically high reaction rate. These electrons (Step 2) may be conducted in the applied high circuit current to prevent the catalysis reaction from being self-limiting by charge buildup. The high current may further give rise to an electron stimulated transitions or electron stimulated cascade wherein one or more current electrons increase the rate that a hydrogen (H) atom electron undergoes a transition to form hydrino. The high current may give rise to catastrophic decay or a catastrophic hydrino reaction rate. Plasma power formed by the hydrino may be directly converted into electricity.

A blast is produced by the fast kinetics that in turn causes massive electron ionization. In embodiments, the plasma power from the ignition of solid fuel in converted to electric power using at least one dedicated plasma to electric converter such as at least one of a MHD, PDC, and $\vec{E}\times\vec{B}$ direct converter. The details of these and other plasma to electric power converters are given in my prior publications such as R. M. Mayo, R. L. Mills, M. Nansteel, "Direct Plasmadynamic Conversion of Plasma Thermal Power to Electricity," IEEE Transactions on Plasma Science, October, (2002), Vol. 30, No. 5, pp. 2066-2073; R. M. Mayo, R. L. Mills, M. Nansteel, "On the Potential of Direct and MHD Conversion of Power from a Novel Plasma Source to Electricity for Microdistributed Power Applications," IEEE Transactions on Plasma Science, August, (2002), Vol. 30, No. 4, pp. 1568-1578; R. M. Mayo, R. L. Mills, "Direct Plasmadynamic Conversion of Plasma Thermal Power to Electricity for Microdistributed Power Applications," 40th Annual Power Sources Conference, Cherry Hill, NJ, Jun. 10-13, (2002), pp. 1-4 ("Mills Prior Plasma Power Conversion Publications") which are herein incorporated by reference in their entirety and my prior applications such as Microwave Power Cell, Chemical Reactor, And Power Converter, PCT/US02/06955, filed Mar. 7, 2002 (short version), PCT/US02/06945 filed Mar. 7, 2002 (long version), U.S. Ser. No. 10/469,913 filed Sep. 5, 2003; Plasma Reactor And Process For Producing Lower-Energy Hydrogen Species, PCT/US04/010608 filed Apr. 8, 2004, U.S. Ser. No. 10/552,585 filed Oct. 12, 2015; and Hydrogen Power, Plasma, and Reactor for Lasing, and Power Conversion, PCT/US02/35872 filed Nov. 8, 2002, U.S. Ser. No. 10/494,571 filed May 6, 2004 ("Mills Prior Plasma Power Conversion Publications") herein incorporated by reference in their entirety.

The plasma energy converted to electricity is dissipated in an external circuit. As demonstrated by calculations and experimentally in Mills Prior Plasma Power Conversion Publications greater than 50% conversion of plasma energy to electricity can be achieved. Heat as well as plasma is produced by each SF-CIHT cell. The heat may be used directly or converted to mechanical or electrical power using converters known by those skilled in the art such as a heat engine such as a steam engine or steam or gas turbine and generator, a Rankine or Brayton-cycle engine, or a Stirling engine. For power conversion, each SF CIHT cell may be interfaced with any of the converters of thermal energy or plasma to mechanical or electrical power described in Mills Prior Publications as well as converters known to those skilled in the art such as a heat engine, steam or gas turbine system, Stirling engine, or thermionic or thermoelectric converter. Further plasma converters comprise at least one of plasmadynamic power converter, $\vec{E}\times\vec{B}$ direct converter, magnetohydrodynamic power converter, magnetic mirror magnetohydrodynamic power converter, charge drift converter, Post or Venetian Blind power converter, gyrotron, photon bunching microwave power converter, and photoelectric converter disclosed in Mills Prior Publications. In an embodiment, the cell comprises at least one cylinder of an internal combustion engine as given in Mills Prior Thermal Power Conversion Publications, Mills Prior Plasma Power Conversion Publications, and Mills Prior Applications.

A solid fuel catalyst induced hydrino transition (SF-CIHT) cell power generator shown in FIG. 1 comprises at least one SF-CIHT cell 1 having a structural support frame 1*a*, each having at least two electrodes 2 that confine a sample, pellet, portion, or aliquot of solid fuel 3 and a source of electrical power 4 to deliver a short burst of low-voltage, high-current electrical energy through the fuel 3. The current ignites the fuel to release energy from forming hydrinos. The power is in the form of thermal power and highly ionized plasma of the fuel 3 capable of being converted directly into electricity. (Herein "ignites or forms blast" refers to the establishment of high hydrino reaction kinetics due to a high current applied to the fuel.) The plasma may be seeded to increase the conductivity or duration of the conductivity. In an embodiment, a composition of matter such as an element or compound such as an alkali metal or alkali metal compound such as $K_2CO_3$ may be added to at least one of the solid fuel and the plasma to seed it with charged ions. In an embodiment, the plasma comprises a source of ion seeding such as an alkali metal or alkali metal compound that maintains the conductivity when the plasma cools. Exemplary sources of electrical power to achieve ignition of the solid fuel to form plasma are those of a Taylor-Winfield model ND-24-75 spot welder and an EM Test Model CSS 500N10 CURRENT SURGE GENERATOR, 8/20US UP TO 10KA. In an embodiment, the source of electrical power 4 is DC, and the plasma to electric power converter is suited for a DC magnetic field. Suitable converters that operate with a DC magnetic field are magnetohydrodynamic, plasmadynamic, and $\vec{E}\times\vec{B}$ power converters.

In an embodiment, an exemplary solid fuel mixture comprises a transition metal powder, its oxide, and $H_2O$. The fine powder may be pneumatically sprayed into the gap formed between the electrodes 2 when they open. In another embodiment, the fuel comprises at least one of a powder and slurry. The fuel may be injected into a desired region to be confined between the electrodes 2 to be ignited by a high current. To better confine the powder, the electrodes 2 may have male-female halves that form a chamber to hold the fuel. In an embodiment, the fuel and the electrodes 2 may be oppositely electrostatically charged such that the fuel flows into the inter-electrode region and electrostatically sticks to a desired region of each electrode 2 where the fuel is ignited.

In an embodiment of the power generator shown in FIG. 1, the electrodes surfaces 2 may be parallel with the gravitational axis, and solid fuel powder 3 may be gravity flowed from an overhead hopper 5 as intermittent stream wherein the timing of the intermittent flow streams matches the dimensions of the electrodes 2 as they open to receive the flowing powdered fuel 3 and close to ignite the fuel stream. In another embodiment, the electrodes 2 further comprise rollers 2*a* on their ends that are separated by a small gap filled with fuel flow. The electrically conductive fuel 3 completes the circuit between the electrodes 2, and the high current flow through the fuel ignites it. The fuel stream 3 may be intermittent to prevent the expanding plasma from disrupting the fuel stream flow.

In another embodiment, the electrodes 2 comprise a set of gears 2*a* supported by structural element 2*b*. The set of gears may be rotated by drive gear 2*c* powered by drive gear motor 2*d*. The drive gear 2*c* may further serve as a heat sink for each gear 2*a* wherein the heat may be removed by an electrode heat exchanger such as 10 that receives heat from the drive gear 2*c*. The gears 2*a* such herringbone gears each comprise an integer n teeth wherein the fuel flows into the $n^{th}$ inter-tooth gap or bottom land as the fuel in the $n-1^{th}$ inter-tooth gap is compressed by tooth n−1 of the mating gear. Other geometries for the gears or the function of the gears are within the scope of the present disclosure such as interdigitated polygonal or triangular-toothed gears, spiral gears, and augers as known to those skilled in the art. In an embodiment, the fuel and a desired region of the gear teeth of the electrodes 2*a* such as the bottom land may be oppositely electrostatically charged such that the fuel flows into and electrostatically sticks to the desired region of one or both electrodes 2*a* where the fuel is ignited when the teeth mesh. In an embodiment, the fuel 3 such as a fine powder is pneumatically sprayed into a desired region of the gears 2*a*. In another embodiment, the fuel 3 is injected into a desired region to be confined between the electrodes 2*a* such as the interdigitation region of the teeth of the gears 2*a* to be ignited by a high current. In an embodiment, the rollers or gears 2*a* maintain tension towards each other by means such as by being spring loaded or by pneumatic or hydraulic actuation. The meshing of teeth and compression causes electrical contact between the mating teeth through the conductive fuel. In an embodiment, the gears are conducting in the interdigitation region that contacts the fuel during meshing and are insulating in other regions such that the current selectively flows through the fuel. In an embodiment, the gears 2*a* comprise ceramic gears that are metal coated to be conductive in the interdigitation region or electrically isolated without a ground path. Also, the drive gear 2*c* may be nonconductive or electrically isolated without a ground path. The electrical contact and supply from the electrodes 2 to the interdigitating sections of the teeth may be provided by brushes. An exemplary brush comprises a carbon bar or rod that is pushed into contact with the gear by a spring, for example.

In another embodiment, electrical contact and supply from the electrodes 2 to the interdigitating sections of the teeth may be provided directly through a corresponding gear hub and bearings. Structural element 2*b* may comprise the electrodes 2. As shown in FIG. 1, each electrode 2 of the pair of electrodes may be centered on each gear and connected to the center of each gear to serve as both the structural element 2*b* and the electrode 2 wherein the gear bearings connecting each gear 2*a* to its shaft or hub serves as an electrical contact, and the only ground path is between contacting teeth of opposing gears. In an embodiment, the outer part of each gear turns around its central hub to have more electrical contact through the additional bearings at the larger radius. The hub may also serve as a large heat sink. An electrode heat exchanger 10 may also attach to the hub to remove heat from the gears. The heat exchanger 10 may be electrically isolated from the hub with a thin layer of insulator such as an electrical insulator having high heat conductivity such as diamond or diamond-like carbon film. The electrification of the gears can be timed using a computer and switching transistors such as those used in brushless DC electric motors. In an embodiment, the gears are energized intermittently such that the high current flows through the fuel when the gears are meshed. The flow of the fuel may be timed to match the delivery of fuel to the gears as they mesh and the current is caused to flow through the fuel. The consequent high current flow causes the fuel to ignite. The fuel may be continuously flowed through the gears or rollers 2*a* that rotate to propel the fuel through the gap. The fuel may be continuously ignited as it is rotated to fill the space between the electrodes 2 comprising meshing regions of a set of gears or opposing sides of a set of rollers. In this case, the output power may be steady. The resulting plasma expands out the sides of the gears and flows to the plasma to electric converter 6, in an embodiment. The plasma expansion flow may be along the axis that is parallel with the shaft of each gear and transverse to the direction of the flow of the fuel stream 3. The axial flow may be to a PDC converter 6 as shown in FIG. 1 or an MHD converter. Further directional flow may be achieved with confining magnets such as those of Helmholtz coils or a magnetic bottle 6*d*.

The electrodes may be at least one of continuously or intermittently regenerated with metal from a component of the solid fuel 3. The solid fuel may comprise metal in a form that is melted during ignition such that some adheres, fuses, weld, or alloys to the surface to replace electrode 2*a* material such as metal that was eroded way or worn away during operation. The SF-CIHT cell power generator may further comprise a means to repair the shape of the electrodes such as the teeth of gears 2*a*. The means may comprise at least one of a cast mold, a grinder, and a milling machine. Gear erosion may be continuously repaired during operation. The gear electrodes of the SF-CIHT cell may be continuous repaired by electrical discharge machining (EDM) or by electroplating by means such as EDM electroplating. Systems and methods of continuous refurbishing of the gears during operation in vacuum such as cold spray, thermal spray, or sputtering are known to those skilled in the art.

In an embodiment, the interdigitating gears are designed to trap excess solid fuel such as a solid fuel powder that is highly conductive. Gear regions such as each tooth and corresponding mating gear bottom-land have at least one of a geometric design and selective electrification such that only a portion of the excess amount fuel detonates. The selected portion may be separated from contact with the gears surfaces by non-selected, un-detonating fuel. The volumetric shape of the fuel in the interdigitation region may be such that a selected smaller volume has sufficiently high current to be permissive of detonation; whereas, the surrounding larger volume through which the current may pass has a current density below that required for detonation. In an embodiment, excess, trapped fuel conducts current that flows through a larger area or volume of fuel and is concentrated into a smaller area or volume wherein the current threshold for detonation is exceeded, and detonation occurs in the selected portion of the fuel having higher current density. In an embodiment, the selective fuel portion has a lower resistance relative to the non-selected portion due to the geometric design and selective electrification that determines the length of the current path through the portions of fuel. In an embodiment, the geometry of the gear causes a selected region to have a higher compression of the fuel than the non-selected area such that the resistance is lower in the selected region. Consequently, the current density is higher in the selected region and is above the detonation threshold. In contrast, the resistance is higher in the non-selected area. Consequently, the current density is lower in the non-selected area and is below the detonation threshold. In an exemplary embodiment, the selected region comprises the pinch of an hour-glass shaped aliquot of fuel.

The surrounding excess, non-detonated fuel absorbs at least some of the conditions that would otherwise cause erosion to the gears if they were directly exposed to the conditions being absent the intervening solid fuel that does not detonate. The conditions may comprise bombardment or exposure to at least one of high heat, high pressure such as that due to a shock wave or blast over pressure, projectiles, plasma, electrons, and ions. The un-detonated fuel may be connected by the fuel recovery system and recirculated. Regarding FIGS. 1 and 2, the fuel recovery and recirculation systems may comprise vapor condensor 15, chute 6*a*, product remover/fuel loader 13, regeneration system 14, and hopper 5.

In another embodiment, the gears are movable by a fastened mechanism such as a reciprocating connecting rod attacked an actuated by a crankshaft similar to system and method of the piston system of an internal combustion engine. As the opposing electrode portions of gears rotate into the opposing mated position, the opposing electrodes are driven together in compression and moves apart following ignition by the fastened mechanism. The opposing electrodes may be any desired shape and may be selectively electrified to cause at least one of the fuel to undergo greater compression in the selected region and the current density to be greater in the selected region. The opposing electrodes may form a semispherical shell that compresses the fuel with the greatest compression in the center. The highest current density may also be at the center to selectively achieve the threshold for denotation in the center region. The expanding plasma may flow out the open portion of the semispherical shell. In another embodiment, the opposing electrodes may form the hour-glass shape wherein the selected region may comprise the waist or neck of the hour-glass.

In an embodiment, the gear can be comprised of at least two materials wherein in at least one material is a conductor. At least one hardened material may serve the purpose of being resistant to corrosion when exposed to the conditions of the blast wherein the blast may occur in contact with or close proximity to the hardened material. The highly conductive material may be separated from the blast by undetonated solid fuel. The arrangement of the at least two types of materials provides for at least one of the selective compression and selective electrification of the selected region over the non-selected region. In an exemplary embodiment, the interdigitation of the gears forms an hour-glass or pinched shape. The neck or waist of the hour-glass may be formed by a highly stable or hardened material that may be an insulator such as a ceramic. The non-waist or bulb portions of the gears may comprise a conductor such as a metal such as at least one of a transition, inner transition, rare earth, Group 13, Group 14, and Group 15 metal or an alloy of at least two such metals or a carbide such as TiC and WC. The waist portion may compress the selected region and the current may pass between the non-waist or bulb regions to be concentrated in the waist region. Thereby, the current density is increased in the selected region comprising the waist such that the detonation threshold is achieved. The waist is protected from damage from the blast by the resistance to erosion of the waist material comprising the hardened material. The non-waist or bulb regions comprised of a conductor are in contact with a non-selected fuel region wherein the fuel intervening between the blast and these corresponding gear surfaces protects these surfaces from erosion by the blast.

The ignition power source 4 that may also serve as a startup power source comprises at least one capacitor such as a bank of low voltage, high capacitance capacitors that supply the low voltage, high current necessary to achieve ignition. The capacitor circuit may be designed to avoid ripple or ringing during discharge to increase the lifetime of the capacitors. The lifetime may be long, such as in the range of about 1 to 20 years. The capacitor bank power supply may comprise a circuit that avoids the skin effect during discharge that would prevent the current from penetrating into the bulk of the solid fuel. The power circuit may comprise an LRC circuit for the capacitor discharge to ignite the solid fuel wherein the time constant is long enough to prevent high frequency oscillations or a pulse discharge comprising of high frequency components that prevent the current from flowing through the sample to ignite it.

To dampen any intermittence, some power may be stored in a capacitor and optionally a high-current transformer, battery, or other energy storage device. In another embodiment, the electrical output from one cell can deliver a short burst of low-voltage, high-current electrical energy that ignites the fuel of another cell. The output electrical power can further be conditioned by output power conditioner 7 connected by power connectors 8 and 8*a*. The output power conditioner 7 may comprise elements such as power storage such as a battery or supercapacitor, DC to AC (DC/AC) converter or inverter, and a transformer. DC power may be converted to another form of DC power such as one with a higher voltage; the power may be converted to AC, or mixtures of DC and AC. The output power may be power conditioned to a desired waveform such as 60 Hz AC power and supplied to a load through output terminals 9. In an embodiment, the output power conditioner 7 converts the power from the photovoltaic converter or the thermal to electric converter to a desired frequency and wave form such as an AC frequency other than 60 or 50 HZ that are standard in the United States and Europe, respectively. The different frequency may be applied to matching loads designed for the different frequency such as motors such as those for motive, aviation, marine, appliances, tools, and machinery, electric heating and space conditioning, telecommunications, and electronics applications. A portion of the output power at power output terminals 9 may used to power the source of electrical power 4 such as about 5-10 V, 10,000-40,000 A DC power. PDC power converters may output low-voltage, high current DC power that is well suited for re-powering the electrodes 2 to cause ignition of subsequently supplied fuel. The output of low voltage, high current may be supplied to DC loads. The DC may be conditioned with a DC/DC converter. Exemplary DC loads comprise DC motors such as electrically commutated motors such as those for motive, aviation, marine, appliances, tools, and machinery, DC electric heating and space conditioning, DC telecommunications, and DC electronics applications.

The ignition generates an output plasma and thermal power. The plasma power may be directly converted to electricity by photovoltaic power converter 6. The cell may be operated open to atmosphere. In an embodiment, the cell 1 is capable of maintaining a vacuum or a pressure less than atmospheric. The vacuum or a pressure less than atmospheric may be maintained by vacuum pump 13*a* to permit ions for the expanding plasma of the ignition of the solid fuel 3 to be free of collisions with atmospheric gases. In an embodiment, a vacuum or a pressure less than atmospheric is maintained in the system comprising the plasma-generating cell 1 and the connected photovoltaic converter 6.

The thermal power may be extracted by at least one of an electrode heat exchanger 10 with coolant flowing through its electrode coolant inlet line 11 and electrode coolant outlet line 12 and a PDC heat exchanger 18 with coolant flowing through its PDC coolant inlet line 19 and PDC coolant outlet line 20. Other heat exchangers may be used to receive the thermal power from the hydrino reaction such as a water-wall type of design that may further be applied on at least one wall of the vessel 1, at least one other wall of the PDC converter, and the back of the electrodes 17 of the PDC converter. In an embodiment, at least one of the heat exchanger and a component of the heat exchanger may comprise a heat pipe. The heat pipe fluid may comprise a molten salt or metal. Exemplary metals are cesium, NaK, potassium, sodium, lithium, and silver. These and other heat exchanger designs to efficiently and cost effectively remove the heat form the reaction are known to those skilled in the art. The heat may be transferred to a heat load. Thus, the power system may comprise a heater with the heat supplied by the at least one of the coolant outlet lines 12 and 20 going to the thermal load or a heat exchanger that transfers heat to a thermal load. The cooled coolant may return by at least one of the coolant inlet lines 11 and 19. The heat supplied by at least one of the coolant outlet lines 12 and 20 may flow to a heat engine, a steam engine, a steam turbine, a gas turbine, a Rankine-cycle engine, a Brayton-cycle engine, and a Stirling engine to be converted to mechanical power such as that of spinning at least one of a shaft, wheels, a generator, an aviation turbofan or turbopropeller, a marine propeller, an impeller, and rotating shaft machinery. Alternatively, the thermal power may flow from at lest one of the coolant outlet lines 12 and 20 to a thermal to electric power converter such as those of the present disclosure. Suitable exemplary thermal to electricity converters comprise at least one of the group of a heat engine, a steam engine, a steam turbine and generator, a gas turbine and generator, a Rankine-cycle engine, a Brayton-cycle engine, a Stirling engine, a thermionic power converter, and a thermoelectric power converter. The output power from the thermal to electric converter may be used to power a load, and a portion may power components of the SF-CIHT cell power generator such as the source of electrical power 4.

Ignition of the reactants of the fuel 3 yields power and products wherein the power may be in the form of plasma of the products. In an embodiment, the fuel 3 is partially to substantially vaporized to a gaseous physical state such as a plasma during the hydrino reaction blast event. The plasma passes through the plasma to electric power converter 6. Alternatively, the plasma emits light to the photovoltaic converter 6, and the recombined plasma forms gaseous atoms and compounds. These are condensed by a vapor condensor 15 and collected and conveyed to the regeneration system 14 by product remover-fuel loader 13 comprising a conveyor connection to the regeneration system 14 and further comprising a conveyor connection to the hopper 5. The vapor condensor 15 and product remover-fuel loader 13 may comprise systems such as at least one of an electrostatic collection system and at least one auger, conveyor or pneumatic system such as a vacuum or suction system to collect and move material. The plasma product and regenerated fuel from regeneration system 14 may be transported on an electrostatically charged conveyor belt 13 wherein the fuel and product particles stick and are transported. The regenerated fuel particles may be drawn from the regeneration chamber 14 into a pipe 13 over the regeneration chamber due to the strong electrostatic attraction of the particles to the conveyor belt. Suitable systems are known by those skilled in the art.

The regeneration system 14 may comprise a closed vessel or chamber capable of a pressure greater than atmospheric and a heat exchanger in the regeneration chamber. The regeneration heat exchange may be in connection with a source of heat such as at least one of the electrode heat exchanger 10 and the PDC heat exchanger 18. In an embodiment, water from tank source 14*a* drips onto the regeneration heat exchanger to form steam that steam treats the plasma product to hydrate it. The steam may be refluxed with a water condensor 22 having a line 21 from the regeneration chamber 14 to the water tank 14*a*. The hydration may be conducted as batch regeneration followed by the steps of cool steam and condense, recirculate $H_2O$ to water tank 14*a*, move regenerated solid fuel to the hopper 5 via product remover/fuel loader 13, and refill regeneration chamber 14 with plasma product via product remover/fuel loader 13 to start another cycle.

In an embodiment, plasma to electric converter 6 such as a plasmadynamic converter or generator system comprising a photovoltaic converter 6 comprises a chute or channel 6*a* for the product to be conveyed into the product remover-fuel loader 13. At least one of the floor of the PDC converter 6, the chute 6*a*, and PDC electrode 17 may be sloped such that the product flow may be at least partially due to gravity flow. At least one floor of the PDC converter 6, the chute 6*a*, and PDC electrode 17 may be mechanically agitated or vibrated to assist the flow. The flow may be assisted by a shock wave formed by the ignition of the solid fuel. In an embodiment, at least one of the floor of the PDC converter 6, the chute 6*a*, and PDC electrode 17 comprises a mechanical scraper or conveyor to move product from the corresponding surface to the product remover-fuel loader 13.

The hopper 5 may be refilled with regenerated fuel from the regeneration system 14 by product remover-fuel loader 13. Any H or $H_2O$ consumed such as in the formation of hydrino may be made up with $H_2O$ from $H_2O$ source 14*a*.

Herein, the spent fuel is regenerated into the original reactants or fuel with any H or $H_2O$ consumed such as in the formation of hydrino made up with $H_2O$ from $H_2O$ source 14*a*. The water source may comprise a tank, cell, or vessel 14*a* that may contain at least one of bulk or gaseous $H_2O$, or a material or compound comprising $H_2O$ or one or more reactants that forms $H_2O$ such as $H_2+O_2$. Alternatively, the source may comprise atmospheric water vapor, or a means to extract $H_2O$ from the atmosphere such as a hydroscopic material such as lithium bromide, calcium chloride, magnesium chloride, zinc chloride, potassium carbonate, potassium phosphate, carnallite such as $KMgCl_3.6(H_2O)$, ferric ammonium citrate, potassium hydroxide and sodium hydroxide and concentrated sulfuric and phosphoric acids, cellulose fibers (such as cotton and paper), sugar, caramel, honey, glycerol, ethanol, methanol, diesel fuel, methamphetamine, many fertilizer chemicals, salts (including table salt) and a wide variety of other substances know to those skilled in the art as well as a desiccant such as silica, activated charcoal, calcium sulfate, calcium chloride, and molecular sieves (typically, zeolites) or a deliquescent material such as zinc chloride, calcium chloride, potassium hydroxide, sodium hydroxide and many different deliquescent salts known to those skilled in the art.

In an embodiment, the SF-CIHT cell power generator further comprises a vacuum pump 13*a* that may remove any product oxygen and molecular hydrino gas. In an embodiment, at least one of oxygen and molecular hydrino are collected in a tank as a commercial product. The pump may further comprise selective membranes, valves, sieves, cryofilters, or other means known by those skilled in the art for separation of oxygen and hydrino gas and may additionally collect $H_2O$ vapor, and may supply $H_2O$ to the regeneration system 14 to be recycled in the regenerated solid fuel. $H_2$ gas may be added to the vessel chamber in order to suppress any oxidation of the generator components such as the gears or PDC or MHD electrodes.

In an embodiment, the fuel 3 comprises a fine powder that may be formed by ball milling regenerated or reprocessed solid fuel wherein the regeneration system 14 may further comprise a ball mill, grinder, or other means of forming smaller particles from larger particles such as those grinding or milling means known in the art. An exemplary solid fuel mixture comprises a conductor such as conducting metal powder such as a powder of a transition metal, silver, or aluminum, its oxide, and $H_2O$. In another embodiment, the fuel 3 may comprise pellets of the solid fuel that may be pressed in the regeneration system 14. The solid fuel pellet may further comprise a thin foil of the powdered metal or another metal that encapsulates the metal oxide and $H_2O$, and optionally the metal powder. In this case, the regeneration system 14 regenerates the metal foil by means such as at least one of heating in vacuum, heating under a reducing hydrogen atmosphere, and electrolysis from an electrolyte such as a molten salt electrolyte. The regeneration system 14 further comprises metal processing systems such as rolling or milling machinery to form the foil from regenerated foil metal stock. The jacket may be formed by a stamping machine or a press wherein the encapsulated solid fuel may be stamped or pressed inside.

In an exemplary embodiment, the solid fuel is regenerated by means such as given in the present disclosure such as at least one of addition of $H_2$, addition of $H_2O$, thermal regeneration, and electrolytic regeneration. Due to the very large energy gain of the hydrino reaction relative to the input energy to initiate the reaction, such as 100 times in the case of NiOOH (3.22 kJ out compared to 46 J input as given in the Exemplary SF-CIHT Cell Test Results section), the products such as $Ni_2O_3$ and NiO can be converted to the hydroxide and then the oxyhydroxide by electrochemical reactions as well as chemical reactions as given in the present disclosure and also by ones known to those skilled in the art. In other embodiments, other metals such as Ti, Gd, Co, In, Fe, Ga, Al, Cr, Mo, Cu, Mn, Zn, and Sm, and the corresponding oxides, hydroxides, and oxyhydroxides such as those of the present disclosure may substitute for Ni. In another embodiment, the solid fuel comprises a metal oxide and $H_2O$ and the corresponding metal as a conductive matrix. The product may be metal oxide. The solid fuel may be regenerated by hydrogen reduction of a portion of the metal oxide to the metal that is then mixed with the oxide that has been rehydrated. Suitable metals having oxides that can readily be reduced to the metals with mild heat such as less than 1000° C. and hydrogen are Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In another embodiment, the solid fuel comprises (1) an oxide that is not easily reduced with $H_2$ and mild heat such as at least one of alumina, an alkaline earth oxide, and a rare earth oxide, (2) a metal having an oxide capable of being reduced to the metal with $H_2$ at moderate temperatures such as less than 1000° C., and (3) $H_2O$. An exemplary fuel is $MgO+Cu+H_2O$. Then, the product mixture of the $H_2$ reducible and nonreducible oxide may be treated with $H_2$ and heated at mild conditions such that only the reducible metal oxide is converted to metal. This mixture may be hydrated to comprise regenerated solid fuel. An exemplary fuel is $MgO+Cu+H_2O$; wherein the product MgO+CuO undergoes $H_2$ reduction treatment to yield MgO+Cu that is hydrated to the solid fuel.

In another embodiment, the oxide product such as CuO or AgO is regenerated by heating under at least one of vacuum and an inert gas stream. The temperature may be in the range of at least one of about 100° C. to 3000° C., 300° C. to 2000° C., 500° C. 10 1200° C., and 500° C. to 1000° C. In an embodiment, the regeneration system 14 may further comprise a mill such as at least one of a ball mill and a shredding/grinding mill to mill at least one of bulk oxide and metal to powders such as fine powders such as one with particle sizes in the range of at least one of about 10 nm to 1 cm, 100 nm to 10 mm, 0.1 um to 1 mm, and 1 um to 100 um (u=micro).

In another embodiment, the regeneration system may comprises an electrolysis cell such as a molten salt electrolysis cell comprising metal ions wherein the metal of a metal oxide product may be plated onto the electrolysis cell cathode by electrodeposition using systems and methods that are well known in the art. The system may further comprise a mill or grinder to form metal particles of a desired size from the electroplated metal. The metal may be added to the other components of the reaction mixture such as $H_2O$ to form regenerated solid fuel.

In an embodiment the cell 1 of FIG. 1 is capable of maintaining a vacuum or a pressure less than atmospheric. A vacuum or a pressure less than atmospheric is maintained in the cell 1 by pump 13*a* and may also be maintained in the connecting plasma to electric converter 6 that receives the energetic plasma ions from the plasma source, cell 1. In an embodiment, the solid fuel comprises a metal that is substantially thermodynamically stable towards reaction with $H_2O$ to become oxidized metal. In this case, the metal of the solid fuel is not oxidized during the reaction to form products. An exemplary solid fuel comprises a mixture of the metal, the oxidized metal, and $H_2O$. Then, the product such as a mixture of the initial metal and metal oxide may be removed by product remover-fuel loader 13 and regenerated by addition of $H_2O$. Suitable metals having a substantially thermodynamically unfavorable reaction with $H_2O$ may be chosen for the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In other embodiments, the solid fuel comprises the $H_2O$ unreactive metal and at least one of $H_2O$, a metal oxide, hydroxide, and oxyhydroxide that may comprise the same or at least one different metal.

In an embodiment, the methods of $H_2$ reduction, reduction under vacuum, and rehydration are conducted in order to regenerate the solid fuel expeditiously, efficiently, and cost effectively as possible.

In an embodiment, the solid fuel comprises a mixture of hydroscopic material comprising $H_2O$ and a conductor. An exemplary fuel is a hydrated alkaline earth metal halide such as $MgX_2$ (X=F, Cl, Br, I) and a conductor such as a transition metal such as Co, Ni, Fe, or Cu.

The solid fuel may comprise a composition of matter such as an element or compound such as a metal with at least one of a low melting point, a high conductivity, and a low work function wherein the work function may be very low at high temperature, and further comprises at least one of a source of $H_2O$ and $H_2O$. In an embodiment, the solid fuel comprises a conductor such as a metal that melts; the high current from the source of electrical power 4 melts the conductor such as a metal to give rise to thermionic emission to form low voltage arc plasma, and the arc plasma causes ignition of the $H_2O$. In an embodiment, the solid fuel is a highly conductive and comprises at least one low-melting point metal that has a low work function at high temperature to give rise to a low-voltage arc plasma in the presence of $H_2O$ of the fuel wherein the fuel consequently ignites.

In an embodiment, the solid fuel comprises a source of H such as hydrocarbon that may be a source of mH catalyst according to Eqs. (6-9) to form hydrinos. The solid fuel may comprise a conductor, a material to bind the source of hydrogen such as carbon or other hydrophobic matrix, and a source of hydrogen such as a hydrocarbon. The solid fuel may be denoted by a high current that results in the formation of a high concentration of H that serves and a catalyst and reactant to form hydrinos.

The power generator further comprises means and methods for variable power output. In an embodiment, the power output of the power generator is controlled by controlling the variable or interruptible flow rate of the fuel 3 into the electrodes 2 or rollers or gears 2*a*, and the variable or interruptible fuel ignition rate by the power source 4. The rate of rotation of the rollers or gears may also be controlled to control the fuel ignition rate. In an embodiment, the output power conditioner 7 comprises a power controller 7 to control the output that may be DC. The power controller may control the fuel flow rate, the rotation speed of the gears by controlling the gear drive motor 2*d* that rotates the drive gear 2*c* and turns the gears 2*a*. The response time based on the mechanical or electrical control of at least one of the fuel consumption rate or firing rate may be very fast such as in the range of 10 ms to 1 us. The power may also be controlled by controlling the connectivity of the converter electrodes of the plasma to electric converter. For example, connecting PDC electrodes in series increases the voltage, and connecting converter electrodes in parallel increases the current. Changing the angle of the PDC electrodes or selectively connecting to sets of PDC electrodes 17 at different angles relative to at least one of the magnetic field direction changes the power collected by changing at least one of the voltage and current.

Figure 2A:
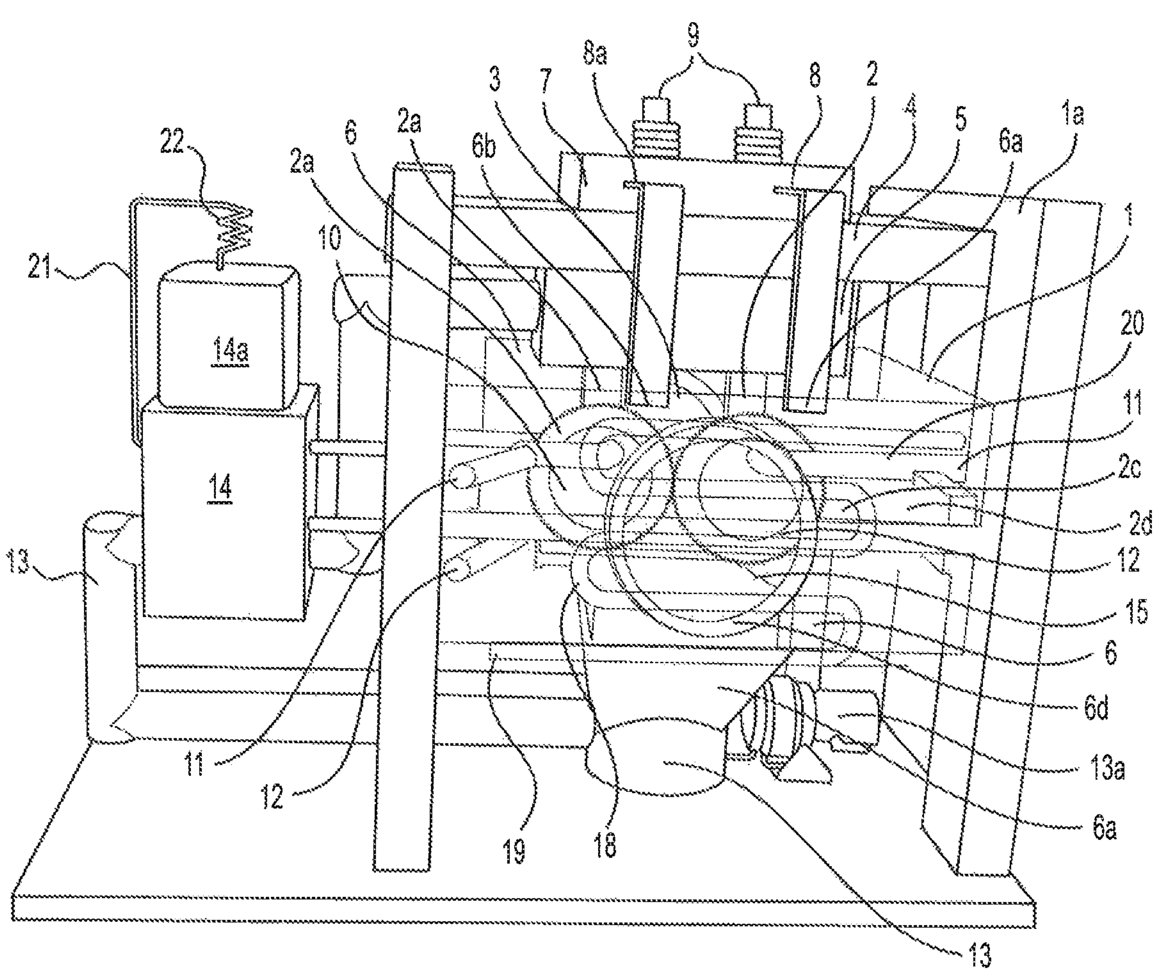
FIG. 2A is a schematic drawing of a SF-CIHT cell power generator showing a photovoltaic converter in accordance with an embodiment of the present disclosure.

In an embodiment shown in FIG. 2A, the power converter 6 comprises a photovoltaic or solar cell system. In an embodiment, the output power controller/conditioner 7 receives power from the photovoltaic power converter 6 and delivers some of the power to the source of electrical power 4 in a form suitable to power the source 4 to cause ignition of the solid fuel 3 at a desired repetition rate. Additional power received and conditioned by output power controller/conditioner 7 may be output to deliver to an electrical load. Suitable integration of the photovoltaic output with power requirement of the fuel ignition electrical system, source of electrical power 4, and that of the load may be achieved with an output power controller/conditioner 7 used in the solar industry known to those skilled in the art. Suitable solar power conditioners output AC power at a range of voltages suitable for the grid such as 120 V and multiples there of.

The power controller 7 further comprises sensors of input and output parameters such as voltages, currents, and powers. The signals from the sensors may be fed into a processor that controls the power generator. At least one of the ramp-up time, ramp-down time, voltage, current, power, waveform, and frequency may be controlled. The power generator may comprise a resistor such as a shunt resistor through which power in excess of that required or desired for a power load may be dissipated. The shunt resistor may be connected to output power conditioner or power controller 7. The power generator may comprise an embedded processor and system to provide remote monitoring that may further have the capacity to disable the power generator.

In an embodiment, a portion of the electrical power output at terminals 9 is supplied to at least one of the source of electrical power 4, the gear (roller) drive motor 2*d*, product remover-fuel loader 13, pump 13*a*, and regeneration system 14 to provide electrical power and energy to propagate the chemical reactions to regenerate the original solid fuel from the reaction products. In an embodiment, a portion of the heat from at least one of the electrode heat exchanger 10 and PDC heat exchanger 18 is input to the solid fuel regeneration system by at least one of the coolant outlet lines 12 and 20 with coolant return circulation by at least one of the coolant input lines 11 and 19 to provide thermal power and energy to propagate the chemical reactions to regenerate the original solid fuel from the reaction products. A portion of the output power from the thermal to electric converter 6 may also be used to power the regeneration system as well as other systems of the SF-CIHT cell generator.

G. Plasmadynamic Plasma to Electric Power Converter

The plasma power may be converted to electricity using plasmadynamic power converter 6 that is based on magnetic space charge separation. Due to their lower mass relative to positive ions, electrons are preferentially confined to magnetic flux lines of a magnetized PDC electrode such as a cylindrical PDC electrode or a PDC electrode in a magnetic field. Thus, electrons are restricted in mobility; whereas, positive ions are relatively free to be collisional with the intrinsically or extrinsically magnetized PDC electrode. Both electrons and positive ions are fully collisional with an unmagnetized PDC electrode. Plasmadynamic conversion extracts power directly from the thermal and potential energy of the plasma and does not rely on plasma flow. Instead, power extraction by PDC exploits the potential difference between a magnetized and unmagnetized PDC electrode immersed in the plasma to drive current in an external load and, thereby, extract electrical power directly from stored plasma thermal energy. Plasmadynamic conversion (PDC) of thermal plasma energy to electricity is achieved by inserting at least two floating conductors directly into the body of high temperature plasma. One of these conductors is magnetized by an external electromagnetic field or permanent magnet, or it is intrinsically magnetic. The other is unmagnetized. A potential difference arises due to the vast difference in charge mobility of heavy positive ions versus light electrons. This voltage is applied across an electrical load.

In embodiments, the power system shown in FIG. 1 comprises additional internal or external electromagnets or permanent magnets or comprises multiple intrinsically magnetized and unmagnetized PDC electrodes such as cylindrical PDC electrodes such as pin PDC electrodes. The source of uniform magnetic field B parallel to each PDC pin electrode 6*b* may be provided by an electromagnet such as by Helmholtz coils 6*d*. The magnets may be at least one of permanent magnets such as Halbach array magnets, and uncooled, water cooled, and superconducting electromagnets. The exemplary superconducting magnets may comprise NbTi, NbSn, or high temperature superconducting materials. The negative voltage from a plurality of anode pin electrodes 6*b* is collected by anode or negative PDC electrode 17. In an embodiment, at least one magnetized PDC pin electrode 6*b* is parallel to the applied magnetic field B; whereas, the at least one corresponding counter PDC pin electrode 6*c* is perpendicular to magnetic field B such that it is unmagnetized due to its orientation relative to the direction of B. The positive voltage from a plurality of cathode pin electrodes 6*c* is collected by cathode or positive PDC electrode 17*a*. The power can be delivered to the power conditioner/controller through negative electrode power connector 8 and positive electrode power connector 8*a*. In an embodiment, the cell wall may serve as a PDC electrode. In an embodiment, the PDC electrodes comprise a refractory metal that is stable in a high temperature atmospheric environment such high-temperature stainless steels and other materials known to those skilled in the art. In an embodiment, the plasmadynamic converter further comprises a plasma confinement structure such as a magnetic bottle or source of solenoidal field such as Helmholtz coils 6*d* to confine the plasma and extract more of the power of the energetic ions as electricity.

In a further embodiment of the power converter, the flow of ions along the z-axis with $v_{\parallel} >> v_{\perp}$ may then enter a compression section comprising an increasing axial magnetic field gradient wherein the component of electron motion parallel to the direction of the z-axis $v_{\parallel}$ is at least partially converted into to perpendicular motion $v_{\perp}$ due to the adiabatic invariant $$\frac{v_{\perp}^2}{B} = \text{constant.}$$

An azimuthal current due to $v_{\perp}$ is formed around the z-axis. The current is deflected radially in the plane of motion by the axial magnetic field to produce a Hall voltage between an inner ring and an outer ring MHD electrode of a disk generator magnetohydrodynamic power converter. The voltage may drive a current through an electrical load. The plasma power may also be converted to electricity using $\vec{E} \times \vec{B}$ direct converter or other plasma to electricity devices of the present disclosure. In another embodiment, the magnetic field such as that of the Helmholtz coils 6*d* confine the plasma such that it can be converted to electricity by plasma to electric converter 6 which may be a plasmadynamic power converter. In an embodiment the Helmholtz coils comprise a magnetic bottle. The PDC converter 6 may be proximal to the plasma source relative to the Helmholtz coils as shown in FIG. 1. For plasma to electric converter components comprising magnet located outside of the cell vessel, the separating walls may comprise a nonferrous material such as stainless steel. For example, a wall separating the Helmholtz coils 6 from the vessel 1 containing the plasma or the sidewalls of a PDC converter or an MHD converter may comprise a material such as stainless steel that the magnetic flux readily penetrates. In this embodiment, the magnets are positioned externally to provide a magnetic flux that is transverse to magnetize transverse-oriented PDC pin anodes or transverse to the plasma expansion direction of a MHD converter.

Each cell also outputs thermal power that may be extracted from the electrode heat exchanger 10 by inlet and out coolant lines 11 and 12, respectively, and the PDC heat exchanger 18 by inlet and outlet coolant lines 19 and 20, respectively. The thermal power may be used as heat directly or converted to electricity. In embodiments, the power system further comprises a thermal to electric converter. The conversion may be achieved using a conventional Rankine or Brayton power plant such as a steam plant comprising a boiler, steam turbine, and a generator or one comprising a gas turbine such as an externally heated gas turbine and a generator. Suitable reactants, regeneration reaction and systems, and power plants may comprise those of the present disclosure, in my prior US patent applications such as Hydrogen Catalyst Reactor, PCT/US08/61455, filed PCT Apr. 24, 2008; Heterogeneous Hydrogen Catalyst Reactor, PCT/US09/052072, filed PCT Jul. 29, 2009; Heterogeneous Hydrogen Catalyst Power System, PCT/US10/27828, PCT filed Mar. 18, 2010; Electrochemical Hydrogen Catalyst Power System, PCT/US11/28889, filed PCT Mar. 17, 2011; $H_2O$-Based Electrochemical Hydrogen-Catalyst Power System, PCT/US12/31369 filed Mar. 30, 2012, and CIHT Power System, PCT/US13/041938 filed May 21, 2013 ("Mills Prior Applications") and in my prior publications such as R. L. Mills, M. Nansteel, W. Good, G. Zhao, "Design for a BlackLight Power Multi-Cell Thermally Coupled Reactor Based on Hydrogen Catalyst Systems," Int. J. Energy Research, Vol. 36, (2012), 778-788; doi: 10.1002/er.1834; R. L. Mills, G. Zhao, W. Good, "Continuous Thermal Power System," Applied Energy, Vol. 88, (2011) 789-798, doi: 10.1016/j.apenergy.2010.08.024, and R. L. Mills, G. Zhao, K. Akhtar, Z. Chang, J. He, X. Hu, G. Wu, J. Lotoski, G. Chu, "Thermally Reversible Hydrino Catalyst Systems as a New Power Source," Int. J. Green Energy, Vol. 8, (2011), 429-473 ("Mills Prior Thermal Power Conversion Publications") herein incorporated by reference in their entirety. In other embodiments, the power system comprises one of other thermal to electric power converters known to those skilled in the art such as direct power converters such as thermionic and thermoelectric power converters and other heat engines such as Stirling engines.

In an embodiment, a 10 MW power generator undergoes the following steps:

1. Fuel flows from the hopper into a pair of gears and/or support members that confines about 0.5 g aliquots of highly conducting solid fuel in the interdigitating regions wherein a low voltage, high current is flowed through the fuel to cause it to ignite. The ignition releases about 10 kJ of energy per aliquot. The gears comprise 60 teeth and rotate at 1000 RPM such that the firing rate is 1 k Hz corresponding to 10 MW of power. In an embodiment, the gears are designed such that a fuel powder layer in direct contact with the gears does not carry the critical current density for detonation whereas bulk region does such that the gears are protected from erosion by the blast from the ignition of the fuel.

2. An essentially, fully ionized plasma expands out from the gears on the axis perpendicular to the gears and enters the magnetohydrodynamic or plasmadynamic converter wherein the plasma flow is converted to electricity. Alternatively, brilliant light is emitted from the plasma that is converted to electricity using a photovoltaic power converter.
3. A portion of the electricity powers the source of electrical power to the electrodes and the rest can be supplied to an external load following power conditioning by the corresponding unit. Heat that is removed from the gear hub by an electrode heat exchanger flows to a regeneration system heat exchanger, and the rest flows to an external heat load.
4. The plasma gas condenses to product comprising the solid fuel without $H_2O$.
5. An auger such as one used in the pharmaceutical or food industries transports the product powder to a regeneration system wherein it is rehydrated with steam wherein the steam is formed by flowing $H_2O$ from a $H_2O$ reservoir over the hot coils of the regeneration system heat exchanger.
6. The regenerated solid fuel is transported to the hopper by an auger to permit the continuous use of the fuel with $H_2O$ add back only.

Assume 0.5 gram of solid fuel yields 1 kJ of energy. Assuming that the density of the fuel is the density of Cu, 8.96 g/cm$^3$, then the volume of fuel per tooth in the interdigitating area is 0.056 cm$^3$. If the conduction depth is 2 mm to achieve high conductivity through the fuel, then the fuel base defined by the interdigitation gap of the triangular teeth of each gear is 4 mm, and the gear width is 0.11 cm$^3$/(0.2)(0.4)=1.39 cm. In another embodiment, the $H_2O$ consumption of an exemplary 10 MW generators is given as follows:

$H_2O$ to $H_2(1/4)+1/2O_2$ (50 MJ/mole $H_2O$); 10 MJ/s/50 MJ/mole $H_2O$=0.2 moles (3.6 g) $H_2O$/s or 13 kg/h=13 liter/hr. Considering an exemplary case wherein the solid fuel recirculated with ignition and regeneration in 1 minute and 0.5 g produces 10 kJ, the inventory of solid fuel is given as follows: 10 MJ/s×0.5 g/10 kJ=500 g/s (30 kg/minute), and the solid fuel inventory is 30 kg or about 3 liters.

H. Arc and High-DC, AC, and DC-AC Mixture Current Hydrino Plasma Cells Having Photovoltaic Conversion of Optical Power In exemplary embodiments of the present disclosure, the power system having photovoltaic conversion of optical power may include any of the components disclosed herein with respect to the SF-CIHT cells. For example, certain embodiments include one or more of the following: the vessel may be capable of a pressure of at least one of atmospheric, above atmospheric, and below atmospheric; the reactants may comprise a source of $H_2O$ and a conductive matrix to form at least one of the source of catalyst, the catalyst, the source of atomic hydrogen, and the atomic hydrogen; the reactants may comprise a source of $H_2O$ comprising at least one of bulk $H_2O$, a state other than bulk $H_2O$, a compound or compounds that undergo at least one of react to form $H_2O$ and release bound $H_2O$; the bound $H_2O$ may comprise a compound that interacts with $H_2O$ wherein the $H_2O$ is in a state of at least one of absorbed $H_2O$, bound $H_2O$, physisorbed $H_2O$, and waters of hydration; the reactants may comprise a conductor and one or more compounds or materials that undergo at least one of release of bulk $H_2O$, absorbed $H_2O$, bound $H_2O$, physisorbed $H_2O$, and waters of hydration, and have $H_2O$ as a reaction product; at least one of the source of nascent $H_2O$ catalyst and the source of atomic hydrogen may comprise at least one of a) at least one source of $H_2O$, b) at least one source of oxygen, and c) at least one source of hydrogen; the reactants may form at least one of the source of catalyst, the catalyst, the source of atomic hydrogen, and the atomic hydrogen may comprise at least one of a) $H_2O$ and the source of $H_2O$, b) $O_2$, $H_2O$, HOOH, $OOH^-$, peroxide ion, superoxide ion, hydride, $H_2$, a halide, an oxide, an oxyhydroxide, a hydroxide, a compound that comprises oxygen, a hydrated compound, a hydrated compound selected from the group of at least one of a halide, an oxide, an oxyhydroxide, a hydroxide, a compound that comprises oxygen, and c) a conductive matrix; the oxyhydroxide may comprise at least one from the group of TiOOH, GdOOH, CoOOH, InOOH, FeOOH, GaOOH, NiOOH, AlOOH, CrOOH, MoOOH, CuOOH, MnOOH, ZnOOH, and SmOOH, the oxide may comprise at least one from the group of CuO, $Cu_2O$, CoO, $Co_2O_3$, $Co_3O_4$, FeO, $Fe_2O_3$, NiO, and $Ni_2O_3$, the hydroxide may comprise at least one from the group of $Cu(OH)_2$, $Co(OH)_2$, $Co(OH)_3$, $Fe(OH)_2$, $Fe(OH)_3$, and $Ni(OH)_2$, the compound that comprises oxygen comprises at least one from the group of a sulfate, phosphate, nitrate, carbonate, hydrogen carbonate, chromate, pyrophosphate, persulfate, perchlorate, perbromate, and periodate, $MXO_3$, $MXO_4$ (M=metal such as alkali metal such as Li, Na, K, Rb, Cs; X=F, Br, Cl, I), cobalt magnesium oxide, nickel magnesium oxide, copper magnesium oxide, $Li_2O$, alkali metal oxide, alkaline earth metal oxide, CuO, $CrO_4$, ZnO, MgO, CaO, $MoO_2$, $TiO_2$, $ZrO_2$, $SiO_2$, $Al_2O_3$, NiO, FeO, $Fe_2O_3$, $TaO_2$, $Ta_2O_5$, VO, $VO_2$, $V_2O_3$, $V_2O_5$, $P_2O_3$, $P_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, CoO, $Co_2O_3$, $Co_3O_4$, FeO, $Fe_2O_3$, NiO, $Ni_2O_3$, rare earth oxide, $CeO_2$, $La_2O_3$, an oxyhydroxide, TiOOH, GdOOH, CoOOH, InOOH, FeOOH, GaOOH, NiOOH, AlOOH, CrOOH, MoOOH, CuOOH, MnOOH, ZnOOH, and SmOOH, and the conductive matrix may comprise at least one from the group of a metal powder, carbon, carbide, boride, nitride, carbonitrile such as TiCN, or nitrile.

In still further embodiments of the present disclosure, the power system may include one or more of the following: the reactants may comprise a mixture of a metal, its metal oxide, and $H_2O$ wherein the reaction of the metal with $H_2O$ is not thermodynamically favorable; the reactants may comprise a mixture of a transition metal, an alkaline earth metal halide, and $H_2O$ wherein the reaction of the metal with $H_2O$ is not thermodynamically favorable; the reactants may comprise a mixture of a conductor, a hydroscopic material, and $H_2O$; the conductor may comprise a metal powder or carbon powder wherein the reaction of the metal or carbon with $H_2O$ is not thermodynamically favorable; the hydroscopic material may comprise at least one of the group of lithium bromide, calcium chloride, magnesium chloride, zinc chloride, potassium carbonate, potassium phosphate, carnallite such as $KMgCl_3.6(H_2O)$, ferric ammonium citrate, potassium hydroxide and sodium hydroxide and concentrated sulfuric and phosphoric acids, cellulose fibers, sugar, caramel, honey, glycerol, ethanol, methanol, diesel fuel, methamphetamine, a fertilizer chemical, a salt, a desiccant, silica, activated charcoal, calcium sulfate, calcium chloride, a molecular sieves, a zeolite, a deliquescent material, zinc chloride, calcium chloride, potassium hydroxide, sodium hydroxide and a deliquescent salt; the power system may include a mixture of a conductor, hydroscopic materials, and $H_2O$ wherein the ranges of relative molar amounts of (metal), (hydroscopic material), ($H_2O$) are at least one of about (0.000001 to 100000), (0.000001 to 100000), (0.000001 to 100000); (0.00001 to 10000), (0.00001 to 10000), (0.00001 to 10000); (0.0001 to 1000), (0.0001 to 1000), (0.0001 to 1000); (0.001 to 100), (0.001 to 100), (0.001 to 100); (0.01 to 100), (0.01 to 100), (0.01 to 100); (0.1 to 10), (0.1 to 10), (0.1 to 10); and (0.5 to 1), (0.5 to 1), (0.5 to 1); the metal having a thermodynamically unfavorable reaction with $H_2O$ may be at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In; the reactants may be regenerated by addition of $H_2O$; the reactants may comprise a mixture of a metal, its metal oxide, and $H_2O$ wherein the metal oxide is capable of $H_2$ reduction at a temperature less than 1000° C.; the reactants may comprise a mixture of an oxide that is not easily reduced with $H_2$ and mild heat, a metal having an oxide capable of being reduced to the metal with $H_2$ at a temperature less than 1000° C., and $H_2O$; the metal may have an oxide capable of being reduced to the metal with $H_2$ at a temperature less than 1000° C. is at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In; the metal oxide that may not easily be reduced with $H_2$, and mild heat comprises at least one of alumina, an alkaline earth oxide, and a rare earth oxide; the solid fuel may comprise carbon or activated carbon and $H_2O$ wherein the mixture is regenerated by rehydration comprising addition of $H_2O$; and the reactants may comprise at least one of a slurry, solution, emulsion, composite, and a compound; the $H_2O$ mole % content may be in the range of at least one of about 0.000001% to 100%, 0.00001% to 100%, 0.0001% to 100%, 0.001% to 100%, 0.01% to 100%, 0.1% to 100%, 1% to 100%, 10% to 100%, 0.1% to 50%, 1% to 25%, and 1% to 10%; the current of the source of electrical power may deliver a short burst of high-current electrical energy is sufficient enough to cause the hydrino reactants to undergo the reaction to form hydrinos at a very high rate.

In some embodiments of the present disclosure, the power system may include one or more of the following: the source of electrical power may deliver a short burst of high-current electrical energy comprises at least one of a voltage selected to cause a high AC, DC, or an AC-DC mixture of current that is in the range of at least one of 100 A to 1,000,000 A, 1 kA to 100,000 A, 10 kA to 50 kA, a DC or peak AC current density in the range of at least one of 100 A/cm$^2$ to 1,000,000 A/cm$^2$, 1000 A/cm$^2$ to 100,000 A/cm$^2$, and 2000 A/cm$^2$ to 50,000 A/cm$^2$, the voltage is determined by the conductivity of the solid fuel or energetic material wherein the voltage is given by the desired current times the resistance of the solid fuel or energetic material sample, the DC or peak AC voltage may be in at least one range chosen from about 0.1 V to 500 kV, 0.1 V to 100 kV, and 1 V to 50 kV, and the AC frequency may be in the range of about 0.1 Hz to 10 GHz, 1 Hz to 1 MHz, 10 Hz to 100 kHz, and 100 Hz to 10 kHz; the resistance of the solid fuel or energetic material sample may be in at least one range chosen from about 0.001 milliohm to 100 Mohm, 0.1 ohm to 1 Mohm, and 10 ohm to 1 kohm, and the conductivity of a suitable load per electrode area active to form hydrinos may be in at least one range chosen from about $10^{-10}$ ohm$^{-1}$ cm$^{-2}$ to $10^{6}$ ohm$^{-1}$ cm$^{-2}$, $10^{-5}$ ohm$^{-1}$ cm$^{-2}$ to $10^{6}$ ohm$^{-1}$ cm$^{-2}$, $10^{-4}$ ohm$^{-1}$ cm$^{-2}$ to $10^{5}$ ohm$^{-1}$ cm$^{-2}$, $10^{-3}$ ohm$^{-1}$ cm$^{-2}$ to $10^{4}$ ohm$^{-1}$ cm$^{-2}$, $10^{-2}$ ohm$^{-1}$ cm$^{-2}$ to $10^{3}$ ohm$^{-1}$ cm$^{-2}$, $10^{-1}$ ohm$^{-1}$ cm$^{-2}$ to $10^{2}$ ohm$^{-1}$ cm$^{-2}$, and 1 ohm$^{-1}$ cm$^{-2}$ to 10 ohm$^{-1}$ cm$^{-2}$; the regeneration system may comprise at least one of a hydration, thermal, chemical, and electrochemical system; the photovoltaic power converter may include a photon-to-electric power converter; the power system may include a light distribution system or a concentrated photovoltaic device; the photovoltaic power converter may include a photon-to-thermal power converter; the power system may include a thermal-to-electric power converter, a concentrated solar power device, a tracker, or an energy storage device; the power system may be operably connected to a power grid; the power system may be a stand-alone system; the photovoltaic power converter may include a plurality of multi-junction photovoltaic cells; the multi-junction photovoltaic cells may be triple junction photovoltaic cells; he photovoltaic power converter may be located within a vacuum cell; the photovoltaic power converter may include at least one of an antireflection coating, an optical impedance matching coating, or a protective coating; the photovoltaic power converter may be operably coupled to a cleaning system configured to clean at least a portion of the photovoltaic power converter; the power system may include an optical filter; the photovoltaic power converter may comprise at least one of a monocrystalline cell, a polycrystalline cell, an amorphous cell, a string/ribbon silicon cell, a multi-junction cell, a homojunction cell, a heterojunction cell, a p-i-n device, a thin-film cell, a dye-sensitized cell, and an organic photovoltaic cell; the photovoltaic power converter may comprise at multi-junction cell, wherein the multi-junction cell comprises at least one of an inverted cell, an upright cell, a lattice-mismatched cell, a lattice-matched cell, and a cell comprising Group III-V semiconductor materials; the power system may include an output power conditioner operably coupled to the photovoltaic power converter and an output power terminal operably coupled to the output power conditioner; the power system may include an inverter or an energy storage device; a portion of power output from the output power terminal may be directed to the energy storage device or to a component of the power generation system or to the plurality of electrodes or to an external load or to a power grid.

In an embodiment, the CIHT cell comprises a hydrino-forming plasma cell called a hydrino plasma cell wherein at least a portion of the optic power is converted to electricity by a photovoltaic converter. The high current may be DC, AC, or combinations thereof. The plasma gas may comprise at least one of a source of H and a source of HOH catalyst such as $H_2O$. Additional suitable plasma gases are a mixture of at least one of $H_2O$, a source of H, $H_2$, a source of oxygen, $O_2$, and an inert gas such as a noble gas. The gas pressure may be in the range of at least one of about 0.001 Torr to 100 atm, 1 Torr to 50 atm, and 100 Torr to 10 atm. The voltage may be high such as in the range of at least one of about 50 V to 100 kV, 1 kV to 50 kV, and 1 kV to 30 kV. The current may be in the range of at least one of about 0.1 mA to 100 A, 1 mA to 50 A, and 1 mA to 10 A. The plasma may comprise arcs that have much higher current such as ones in the range of at least one of about 1 A to 100 kA, 100 A to 50 kA, and 1 kA to 20 kA. In an embodiment, the high current accelerates the hydrino reaction rate. In an embodiment, the voltage and current are AC. The driving frequency may be an audio frequency such as in the range of 3 kHz to 15 kHz. In an embodiment, the frequency is in the range of at least one of about 0.1 Hz to 100 GHz, 100 Hz to 10 GHz, 1 kHz to 10 GHz, 1 MHz to 1 GHz, and 10 MHz to 1 GHz.

The conductor of at least one electrode exposed to the plasma gas may provide electron thermionic and field emission to support the arc plasma.

In an embodiment, the cell comprises a high voltage power source that is applied to achieve a breakdown in a plasma gas comprising a source of H and a source of HOH catalyst. The plasma gas may comprise at least one of water vapor, hydrogen, a source of oxygen, and an inert gas such as a noble as such as argon. The high voltage power may comprise direct current (DC), alternating current (AC), and mixtures thereof. The breakdown in the plasma gas causes the conductivity to significantly increase. The power source is capable of high current. A high current at a lower voltage than the breakdown voltage is applied to cause the catalysis of H to hydrino by HOH catalyst to occur at a high rate. The high current may comprise direct current (DC), alternating current (AC), and mixtures thereof.

An embodiment, of a high current plasma cell comprises a plasma gas capable of forming HOH catalyst and H. The plasma gas comprises a source of HOH and a source of H such as $H_2O$ and $H_2$ gases. The plasma gas may further comprise additional gases that permit, enhance, or maintain the HOH catalyst and H. Other suitable gases are noble gases. The cell comprises at least one of, at least one set of electrodes, at least one antennae, at least one RF coil, and at least one microwave cavity that may comprise an antenna and further comprising at least one breakdown power source such as one capable of producing a voltage or electron or ion energy sufficient to cause electrical breakdown of the plasma gas. The voltage maybe in the range of at least one of about 10 V to 100 kV, 100 V to 50 kV, and 1 kV to 20 kV. The plasma gas may initially be in a liquid state as well as be in a gaseous state. The plasma may be formed in a medium that is liquid $H_2O$ or comprises liquid $H_2O$. The gas pressure may be in the range of at least one of about 0.001 Torr to 100 atm, 0.01 Torr to 760 Torr, and 0.1 Torr to 100 Torr. The cell may comprise at least one secondary source of power that provides high current once breakdown is achieved. The high current may also be provided by the breakdown power source. Each of the power sources may be DC or AC. The frequency range of either may be in the range of at least one of about 0.1 Hz to 100 GHz, 100 Hz to 10 GHz, 1 kHz to 10 GHz, 1 MHz to 1 GHz, and 10 MHz to 1 GHz. The high current may be in the range of at least one of about 1 A to 100 kA, 10 A to 100 kA, 1000 A to 100 kA, 10 kA to 50 kA. The high discharge current density may be in the range of at least one of 0.1 $A/cm^2$ to 1,000,000 $A/cm^2$, 1 $A/cm^2$ to 1,000,000 $A/cm^2$, 10 $A/cm^2$ to 1,000,000 $A/cm^2$, 100 $A/cm^2$ to 1,000,000 $A/cm^2$, and 1 $kA/cm^2$ to 1,000,000 $A/cm^2$. In an embodiment, at least one of the breakdown and secondary high current power sources may be applied intermittently. The intermittent frequency may be in the range of at least one of about 0.001 Hz to 1 GHz, 0.01 Hz to 100 MHz, 0.1 Hz to 10 MHz, 1 Hz to 1 MHz, and 10 Hz to 100 kHz. The duty cycle may be in the range of at least one of about 0.001% to 99.9%, 1% to 99%, and 10% to 90%. In an embodiment, comprising an AC such as RF power source and a DC power source, the DC power source is isolated from the AC power source by at least one capacitor. In an embodiment, the source of H to form hydrinos such as at least one of $H_2$ and $H_2O$ is supplied to the cell at a rate that maintains a hydrino component to the output power that is gives a desired cell gain such as one wherein the hydrino power component exceeds the input electrical power.

In an embodiment, the plasma gas is replaced by liquid $H_2O$ that may be pure or comprise an aqueous salt solution such as brine. The solution may be incident with AC excitation such high frequency radiation such as RF or microwave excitation. The excited medium comprising $H_2O$ such as brine may be placed between a RF transmitter and receiver. The RF transmitter or antenna receives RF power from a RF generator capable of generating a RF signal of frequency and power capable of being absorbed by the medium comprising $H_2O$. The cell and excitation parameters may be one of those of the disclosure. In an embodiment, the RF frequency may be in the range of about 1 MHz to 20 MHz. The RF excitation source may further comprise a tuning circuit or matching network to match the impedance of the load to the transmitter. Metal particles may be suspended in the $H_2O$ or salt solution. The incident power may be high such as in the range of at least one of about 0.1 $W/cm^2$ to 100 $kW/cm^2$, 0.5 $W/cm^2$ to 10 $kW/cm^2$, and 0.5 $W/cm^2$ to 1 $kW/cm^2$ to cause arcs in the plasma due to interaction of the incident radiation with the metal particles. The size of the metal particles may be adjusted to optimize the arc formation. Suitable particle sizes are in the range of about 0.1 um to 10 mm. The arcs carry high current that causes the hydrino reaction to occur with high kinetics. In another embodiment, the plasma gas comprises $H_2O$ such as $H_2O$ vapor, and the cell comprises metal objects that are also incident with high frequency radiation such as RF or microwave. The field concentration on sharp points on the metal objects causes arcs in the plasma gas comprising $H_2O$ with a great enhancement of the hydrino reaction rate.

In an embodiment, the high-current plasma comprises an arc. The arc plasma may have a distinguishing characteristic over glow discharge plasma. In the former case, the electron and ion temperatures may be similar, and in the latter case, the electron thermal energy may be much greater than the ion thermal energy. In an embodiment, the arc plasma cell comprises a pinch plasma. The plasma gas such as one comprising $H_2O$ is maintained at a pressure sufficient to form arc plasma. The pressure may be high such as in the range of about 100 Torr to 100 atm. In an embodiment, the breakdown and high current power supplies may be the same. The arc may be formed in high pressure $H_2O$ including liquid $H_2O$ by a power supply comprising a plurality of capacitors comprising a bank of capacitors capable of supplying high voltage such as a voltage in the range of about 1 kV to 50 kV and a high current such as one that may increase as the resistance and voltage decreases with arc formation and maintenance wherein the current may be in the range of about 0.1 mA to 100,000 A. The voltage may be increased by connecting the capacitors in series, and the capacitance may be increased by connecting the capacitors in parallel to achieve the desired high voltage and current. The capacitance may be sufficient to maintain the plasma for a long duration such as 0.1 s to greater than 24 hours. The power circuit may have additional elements to maintain the arc once formed such as a secondary high current power source. In an embodiment, the power supply comprises a plurality of banks of capacitors that may sequentially supply power to the arc wherein each discharged bank of capacitors may be recharged by a charging power source as a given charged bank of capacitors is discharged. The plurality of banks may be sufficient to maintain steady state arc plasma. In another embodiment, the power supply to provide at least one of plasma breakdown and high current to the arc plasma comprises at least one transformer. In an embodiment, the arc is established at a high DC repetition rate such as in the range of about 0.01 Hz to 1 MHz. In an embodiment, the role of the cathode and anode may reverse cyclically. The rate of the reversal may be low to maintain arc plasma. The cycle rate of the alternating current may be at least one of about 0 Hz to 1000 Hz, 0 Hz to 500 Hz, and 0 Hz to 100 Hz. The power supply may have a maximum current limit that maintains the hydrino reaction rate at a desired rate. In an embodiment, the high current is variable to control the hydrino-produced power to provide variable power output. The high current limit controlled by the power supply may be in the range of at least one of about 1 kA to 100 kA, 2 kA to 50 kA, and 10 kA to 30 kA. The arc plasma may have a negative resistance comprising a decreasing voltage behavior with increasing current. The plasma arc cell power circuit may comprise a form of positive impedance such as an electrical ballast to establish a stable current at a desired level. The electrodes may be in a desired geometry to provide and electric field between the two. Suitable geometries are at least one of a center cylindrical electrode and an outer concentric electrode, parallel-plate electrodes, and opposing pins or cylinders. The electrodes may provide at least one of electron thermionic and field emission at the cathode to support the arc plasma. High current densities such as ones as high as about $10^6$ A/$cm^2$ may be formed. The electrode may be comprised of at least one of a material that has a high melting point such as one from the group of a refractory metal such as W or Mo and carbon and a material that has a low reactivity with water such as one from the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In an embodiment, the electrodes may be movable. The electrodes may be placed in close or direct contact with each other and then mechanically separated to initiate and maintain the arc plasma. In this case, the breakdown voltage may be much less than the case wherein the electrodes are permanently separated with a fixed gap. The voltage applied to form the arc with movable or gap adjustable electrodes may be in the range of at least one of about 0.1 V to 20 kV, 1 V to 10 kV, and 10 V to 1 kV. The electrode separation may be adjusted to maintain a steady arc at a desire current or current density.

Figure 2B:
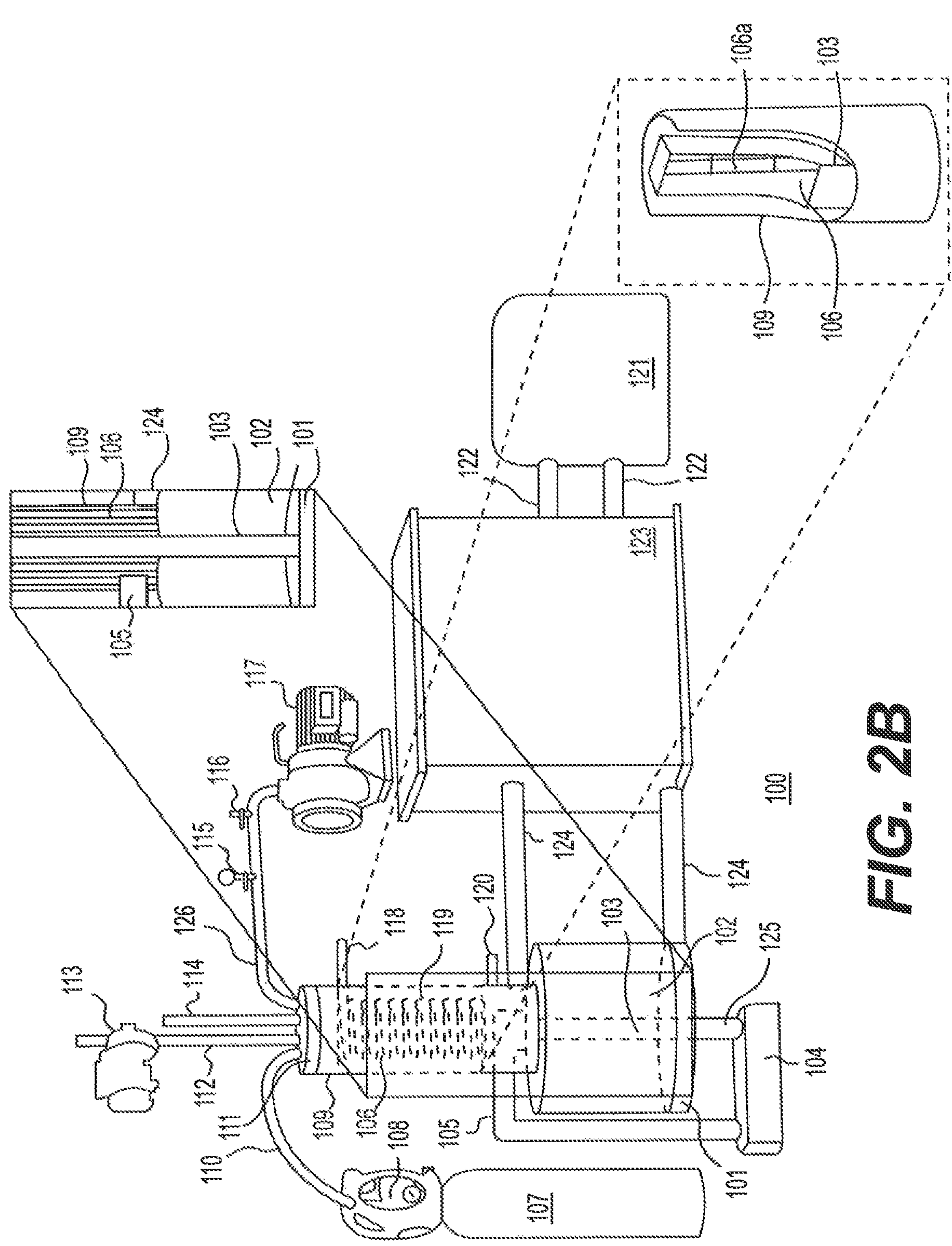
FIG. 2B is a schematic drawing of an arc $H_2O$ plasma cell power generator showing a photovoltaic converter in accordance with an embodiment of the present disclosure.

In an embodiment, the catalyst comprising at least one of OH, HOH, $O_2$, nO, and nH (n is an integer) is generated in a water-arc plasma. A schematic drawing of a $H_2O$ arc plasma cell power generator 100 is shown in FIG. 2B. The arc plasma cell 109 comprises two electrodes such as an outer cylindrical electrode 106 and a center axial electrode 103 such as a center rod that with a cell cap 111 and an insulator base 102 that can define an arc plasma chamber of cell 109 capable of at least one of a vacuum, atmospheric pressure, and a pressure greater than atmospheric. The cell 109 is supplied with an arc plasma gas or liquid such as $H_2O$. Alternatively, the electrodes 103 and 106 are immersed in the arc plasma gas or liquid such as $H_2O$ contained in a vessel 109. The $H_2O$ may be made more conductive to achieve arc breakdown at a lower voltage by the addition of a source of ions such as an ionic compound that may dissolve such as a salt. The salt may comprise a hydroxide or halide such as an alkali hydroxide or halide or others of the disclosure. The supply may be from a source such as a tank 107 having a valve 108 and a line 110 through which the gas or liquid flows into the cell 109, and exhaust gases flow out of the cell through outlet line 126 having at least one pressure gauge 115 and valve 116 where in a pump 117 removes gases from the cell 109 to maintain at least one of a desired flow and pressure. In an embodiment, the plasma gas is maintained at a high flow condition such as supersonic flow at high pressure such as atmospheric pressure and higher to provide adequate mass flow of the reactants to the hydrino reaction to produce hydrino-based power a desired level. A suitable exemplary flow rate achieves a hydrino-based power that exceeds the input power. Alternatively, liquid water may be in the cell 109 such as in the reservoir having the electrodes as the boundaries. The electrodes 103 and 106 are connected to a high voltage-high current power supply 123 through cell power connectors 124. The connection to the center electrode 103 may be through a base plate 101. In an embodiment, the power supply 123 may be supplied by another power supply such as a charging power supply 121 through connectors 122. The high voltage-high current power supply 123 may comprise a bank of capacitors that may be in series to provide high voltage and parallel to provide high capacitance and a high current, and the power supply 123 may comprise a plurality of such capacitor banks wherein each may be temporally discharged and charged to provide a power output that may approach a continuous output. The capacitor bank or banks may be charged by the charging power supply 121.

In an embodiment, an electrode such as 103 may be powered by an AC power source 123 that may be high frequency and may be high power such as that provided by an RF generator such as a Tesla coil. In another embodiment, the electrodes 103 comprises an antennae of a microwave plasma torch. The power and frequency may be one of the disclosure such as in the range of about 100 kHz to 100 MHz or 100 MHz to 10 GHz and 100 W to 500 kW per liter, respectively. In an embodiment, the cylindrical electrode may comprise only the cell wall and may be comprised of an insulator such as quartz, ceramic, or alumina. The cell cap 111 may further comprise an electrode such as a grounded or ungrounded electrode. The cell may be operated to form plasma arcs or streamers of the $H_2O$ that at least partially covers the electrode 103 inside of the arc plasma cell 109. The arcs or steamers greatly enhance the hydrino reaction rate.

In an embodiment, the arc plasma cell 109 is closed to confine the thermal energy release. The water inside of the then sealed cell is in the standard conditions of a liquid and gaseous mixture according to the $H_2O$ phase diagram for the desired operating temperature and pressure as known by those skilled in the art. The operating temperature may be in the range of about 25° C. to 1000° C. The operating pressure may be in the range of at least one of about 0.001 atm to 200 atm, 0.01 atm to 200 atm, and 0.1 atm to 100 atm. The cell 109 may comprise a boiler wherein at least one phase comprising heated water, super heated water, steam, and super heated steam flow out steam outlet 114 and supply a thermal or mechanical load such as a steam turbine to generate electricity. At least one the processes of cooling of the outlet flow and condensation of steam occurs with thermal power transfer to the load, and the cooled steam or water is returned to the cell through a return 112. Alternatively, makeup steam or water is returned. The system make be closed and may further comprise a pump 113 such as a $H_2O$ recirculation or return pump to circulate the $H_2O$ in its physical phase that serves as a coolant. The cell may further comprise a heat exchanger 119 that may be internal or on the external cell wall to remove the thermal energy into a coolant that enters cold at coolant inlet 118 and exists hot at coolant outlet 120. Thereafter, the hot coolant flows to a thermal load such as a pure thermal load or a thermal to mechanical power converter or a thermal to electrical power converter such as a steam or gas turbine or a heat engine such as a steam engine and optionally a generator. Further exemplary converters from thermal to mechanical or electrical power are Rankine or Brayton-cycle engines, Stirling engines, thermionic and thermoelectric converters and other systems known in the art. System and methods of thermal to at least one of mechanical and electrical conversion are also disclosed in Mills Prior Applications that are herein incorporated by reference in their entirety.

In an embodiment, the electrodes 103 and 106 such as carbon or metal electrodes such as tungsten or copper electrodes may be fed into the cell 109 as they erode due to the plasma. The electrodes may be replaced when sufficiently eroded or replaced continuously. The corrosion product may be collected from the cell in a form such as sediment and recycled into new electrodes. Thus, the arc plasma cell power generator further comprises an electrode corrosion product recovery system 105, an electrode regeneration system 104, and a regenerated electrode continuous feed 125. In an embodiment, at least one electrode prone to the majority of the corrosion such as the cathode such as the center electrode 103 may be regenerated by the systems and methods of the disclosure. For example, an electrode may comprise one metal chosen from Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In having a corresponding oxide that may be reduced by at least one of $H_2$ treatment, heating, and heating under vacuum. The regeneration system 104 may comprise a furnace to melt at least one of the oxide and metal and cast or extrude the electrode from the regenerated metal. The systems and methods for metal smelting and shaping or milling are well known to those skilled in the art. In another embodiment, the regeneration system 104 may comprise an electrolysis cell such as a molten salt electrolysis cell comprising metal ions wherein the electrode metal may be plated onto the electrode by electrodeposition using systems and methods that are well known in the art.

In an embodiment of the plasma cell such as the arc plasma cell 109 shown in FIG. 2B, the $H_2O$ arc plasma cell outputs high optical power, and the light is converted into electricity by a photovoltaic power converter. In an embodiment, the cell cap 111 comprises a photovoltaic power converter to receive the high optical power and convert it to electricity. In another embodiment, at least one of the electrodes 103 and 106 comprises a grid electrode that is at least partially transparent to light. The transparency may be due to gaps between conduction sections of the electrode. A photovoltaic converter is positioned behind the grid electrode to convert the optical power to electricity. In another embodiment, the electrodes 103 and 106 comprise parallel plates. The parallel plate electrodes may be confined in the cell 109 that may be sealed. The high optical power may be received by a photovoltaic converter 106*a* that is transverse to the planes formed by the electrodes. The photovoltaic converter may comprise photovoltaic cells and may further comprise a window transparent to the optical power to protect the cells from damage from the pressure wave of the arc plasma. Other embodiments of electrodes and electrode configurations and designs that support at least one of a plasma and arc plasma such as a plasma comprising $H_2O$ and comprise at least one region for light penetration to a photovoltaic converter such as those known by one skilled in the art are within the scope of the present disclosure.

In an embodiment, the hydrino cell comprises a pinched plasma source to form hydrino continuum emission. The cell comprises and cathode, an anode, a power supply, and at least one of a source of hydrogen and a source of HOH catalyst to form a pinched plasma. The plasma system may comprise a dense plasma focus source such as those known in the art. The plasma current may be very high such as greater than 1 kA. The plasma may be arc plasma. The distinguishing features are that the plasma gas comprises at least one of H and HOH or H catalyst and the plasma conditions may be optimized to give hydrogen continuum emission. In an embodiment, the optical power is converted to electricity with photoelectric converter 106*a* or 111.

I. Photovoltaic Optical to Electric Power Converter

In an alternative plasma power converter 6 of the SF-CIHT cell power generator shown in FIG. 2A, the plasma produced by the ignition of the solid fuel 3 is highly ionized. The hydrino catalysis reaction such as that given by Eqs. (6-9) and (44-47) as well as the energy released in forming hydrinos results in the ionization of the fuel. The ions recombine with free electrons to emit light. Additional light is emitted by decaying excited-state atoms, ions, molecules, compounds, and materials. The light is incident on the photovoltaic converter 6. The photovoltaic power converter 6 comprises a cathode 6*c* and an anode 6*b* that are each connected to the output power controller/conditioner 7 by cathode and anode output power connector 8*a* and 8, respectively. The light may be received by a photon-to-electric converter 6 such as photovoltaic tiling of the inside of the vacuum vessel 1. The photovoltaic power converter may be cooled by at least one heat exchanger 18 that receives cool coolant through the photovoltaic coolant inlet line 19 and reject hot coolant through photovoltaic coolant outlet line 20. The disclosure regarding photovoltaic conversion of the optical power of the SF-CIHT cell to electricity given herein also applies to the arc and high-DC, AC, and DC-AC mixture current hydrino plasma cells having photovoltaic conversion of the optical power.

The photovoltaic converter 6 may comprise a coating for at least one of antireflection layer or coating such as silicon monoxide, optical impedance matching, and protection from plasma or kinetic material erosion or damage. The film may comprise a window. The window may further comprise a system for cleaning detonation products that cover the window and at least partially block the transmission of light to the photovoltaic converter. In an embodiment, the optical window is cleaned. The cleaning may comprise at least one system and method of chemical cleaning or etching and plasma cleaning or etching. The window may comprise multiple windows that are each removable such that one replaces another and serves to transmit light to the converter while the at least one other is cleaned of detonation products. In an embodiment, the optical window is cleaned. The cleaning may comprise at least one system and method of chemical cleaning or etching and plasma cleaning or etching. In an embodiment, a stream of gas such as an inert gas is flowed in the direction opposite to the expanding ignited plasma in order to prevent products from coating at least one of the protective window, the light collections system such as at least one of fiber optic cables and mirrors, and the photovoltaic converter.

The photovoltaic power converter of the SF-CIHT power generator (FIG. 2A) may further comprise a light distribution system to provide optical power of the SF-CIHT cell at a plurality of photovoltaic cells that may be arranged in a compact design. In an embodiment of the photovoltaic converter 6, the light output (optical power) is directed to a plurality of photovoltaic converters 6. The light output can be distributed by optical distribution systems such one comprising at least one of mirrors and lenses. In one embodiment, light is formed into a beam with a lens at the focal point of a parabolic mirror, and is directed to a lens at the focal point of another parabolic mirror that outputs parallel rays of light that are made incident on a photovoltaic cell 6. The system comprises a plurality of such parabolic mirrors, lenses, and photovoltaic cells. The light may also be directed and distributed using beams splitter, prisms, gratings, diffusers and other optical elements known to those skilled in the art. Elements such as a prism and a grating may separate a plurality of wavelength ranges or bands of the light output such that is can be directed to photovoltaic cells that have a maximum efficiency of optical to electrical conversion within the wavelength range of each band. In another embodiment, the optical power is collected in a bundle of fiber optic cables. The collection may be achieved with at least one or more lenses and one or more optical impedance matching plates such as a quarter wave plate. The light distribution system may further comprise at least one mirror to reflect any light reflected from the fiber optic cable back to at least one of the cable inlet, the light collection system, and the impedance matching plate to the cable. The mirror may be at the center of the ignition wherein the light acts as a point source from the center of the mirror. The mirror may be at the plane of the gear electrodes of FIGS. 1 and 2. The mirror may comprise a pair of mirrors that reflect light in opposite directions to opposing matched photovoltaic converters as shown in FIG. 2A. The opposed mirrors may reflect light back into the light distribution systems such as ones comprising fiber optic cables. The mirror may have the shape that optimizes the reflection of the back-reflected light to the light distribution systems. Fiber optic cable elements of the fiber optic cable may be selective for a band of wavelengths that may selectively conduct light to a matched photovoltaic cell of a plurality that has a maximum efficiency of optical to electrical conversion within the wavelength range of the band. In another embodiment, the light distribution system and photovoltaic power converter comprises a plurality of transparent or semitransparent photovoltaic cells arranged in a stack such that the optical power from the ignition is converted to electricity at members of the stack as the light penetrates into the stack. In an embodiment, the light from the ignition is collected before the blackbody radiation cools by a mechanism such as expansion. The plasma may be maintained in a magnetic bottle such as that produced by Helmholtz coils 6*d* to prevent expansion or collisional losses such that the maximum power may be extracted by radiation.

In an embodiment, the photovoltaic converter may comprise a thermophotovoltaic converter. The cell 1 may comprise at least one wall that absorbs heat from the ignition of the fuel and the heated wall emits light to a photovoltaic converter 6. The photovoltaic converter 6 may be outside of the sealed cell 1. The heat exchangers such as the photovoltaic heat exchanger 18 have a coolant capable of high thermal power transfer. The coolant may comprise water or other liquid such as solvent or liquid metals or salts known to those skilled in the art. In an embodiment, at least one of the heat exchanger and a component of the heat exchanger may comprise a heat pipe. The heat pipe fluid may comprise a molten salt or metal. Exemplary metals are cesium, NaK, potassium, sodium, lithium, and silver.

In another embodiment, the plasma is confined by at least one of magnetic or electric field confinement to minimize the contact of the plasma with the photon-to-electric converter. The magnetic confinement may comprise a magnetic bottle. The magnetic confinement may be provided by Helmholtz coils 6*d*. In a further embodiment, the converter converts kinetic energy from charged or neutral species in the plasma such as energetic electrons, ions, and hydrogen atoms into electricity. This converter may be in contact with the plasma to receive the energetic species.

In an embodiment, the SF-CIHT generator comprises a hydrogen catalysis cell that produces atoms having binding energies given by Eq. (1) and at least one of a high population of electronically excited state atoms and ions such as those of the materials of the fuel. The power is emitted as photons with spontaneous emission or stimulated emission. The light is converted to electricity using a photon-to-electric converter of the present disclosure such as a photoelectric or photovoltaic cell. In an embodiment, the power cell further comprises a hydrogen laser of the present disclosure.

In an embodiment, the photons perform at least one action of propagating to and becoming incident on the photovoltaic cell and exiting a semitransparent mirror of a laser cavity and irradiating the photovoltaic cell. The incoherent power and laser power may be converted to electricity using photovoltaic cells as described in the following references of photovoltaic cells to convert laser power to electric power which are incorporated by reference in their entirety: L. C. Olsen, D. A. Huber, G. Dunham, F. W. Addis, "High efficiency monochromatic GaAs solar cells", in *Conf. Rec. 22nd IEEE Photovoltaic Specialists Conf.*, Las Vegas, NV, Vol. I, October (1991), pp. 419-424; R. A. Lowe, G. A. Landis, P. Jenkins, "Response of photovoltaic cells to pulsed laser illumination", IEEE Transactions on Electron Devices, Vol. 42, No. 4, (1995), pp. 744-751; R. K. Jain, G. A. Landis, "Transient response of gallium arsenide and silicon solar cells under laser pulse", Solid-State Electronics, Vol. 4, No. 11, (1998), pp. 1981-1983; P. A. Iles, "Non-solar photovoltaic cells", in *Conf. Rec. 21st IEEE Photovoltaic Specialists Conf.*, Kissimmee, FL, Vol. I, May, (1990), pp. 420-423.

In an embodiment of the at least one of optical and laser power converter, using beam forming optics, the at least one of a light beam and laser beam is reduced and spread over a larger area as described in L. C. Olsen, D. A. Huber, G. Dunham, F. W. Addis, "High efficiency monochromatic GaAs solar cells", in *Conf. Rec. 22nd IEEE Photovoltaic Specialists Conf.*, Las Vegas, NV, Vol. I, October (1991), pp. 419-424 which is herein incorporated by reference in its entirety. The beam forming optics may be a lens or a diffuser. The cell 1 may further comprise mirrors or lenses to direct the light onto the photovoltaic. Mirrors may also be present at the cell wall to increase the path length of light such as hydrogen Lyman series emission to maintain excited states that may be further excited by collisions or photons.

In another embodiment, the spontaneous or stimulated emission from the water-based fuel plasma is converted to electrical power using a photovoltaic. Conversion of at least one of spontaneous and stimulated emission to electricity may be achieved at significant power densities and efficiencies using existing photovoltaic (PV) cells with a band gap that is matched to the wavelengths. Photocells of the power converter of the present disclosure that respond to ultraviolet and extreme ultraviolet light comprise radiation hardened conventional cells. Due to the higher energy of the photons potentially higher efficiency is achievable compared to those that convert lower energy photons. The hardening may be achieved by a protective coating such as an atomic layer of platinum or other noble metal. In an embodiment, the photovoltaic has a high band-gap such as a photovoltaic comprised of gallium nitride.

In an embodiment that uses a photovoltaic for power conversion, high-energy light may be converted to lower-energy light by a phosphor. In an embodiment, the phosphor is a gas that efficiently converts short wavelength light of the cell to long wavelength light to which the photovoltaic is more responsive. Percentage phosphor gas may be in any desired range such as in at least one range of about 0.1% to 99.9%, 0.1 to 50%, 1% to 25%, and 1% to 5%. The phosphor gas may be an inert gas such as a noble gas or a gas of an element or compound that is made gaseous by the detonation such as a metal such as an alkali, alkaline earth, or transition metal. In an embodiment, argon comprises an argon candle as used in explosives to emit bright light in the visible range suitable for photovoltaic conversion to electricity. In an embodiment, the phosphor is coated on transparent walls of the cell 1 so that the photons emitted by the excited phosphor more closely match the peak wavelength efficiency of the photovoltaic that may surround the phosphor-coated walls. In an embodiment, species that form excimers are added to the plasma to absorb the power from the formation of hydrinos and contribute to the formation of least one of a large population of excited states and an inverted population. In an embodiment, the solid fuel or an added gas may comprise a halogen. At least one noble gas such as helium, neon, and argon may be added such that excimers form. The power may be extracted by the excimer spontaneous or laser emission. The optical power is incident the photovoltaic converter 6 and is converted to electricity.

In this exemplary embodiment, the SF-CIHT cell power generation system includes a photovoltaic power converter configured to capture plasma photons generated by the fuel ignition reaction and convert them into useable energy. In some embodiments, high conversion efficiency may be desired. The reactor may expel plasma in multiple directions, e.g., at least two directions, and the radius of the reaction may be on the scale of approximately several millimeter to several meters, for example, from about 1 mm to about 25 cm in radius. Additionally, the spectrum of plasma generated by the ignition of fuel may resemble the spectrum of plasma generated by the sun and/or may include additional short wavelength radiation.

From Wien's displacement law [A. Beiser, *Concepts of Modern Physics*, Fourth Edition, McGraw-Hill Book Company, New York, (1978), pp. 329-340], the wavelength $\lambda_{max}$ having the greatest energy density of a blackbody at T=6000K is $$\lambda_{max} = \frac{hc}{4.965kT} = 483 \text{ nm} \tag{196}$$

The Stefan-Boltzmann law [A. Beiser, *Concepts of Modern Physics*, Fourth Edition, McGraw-Hill Book Company, New York, (1978), pp. 329-340] equates the power radiated by an object per unit area, R, to the emissivity, e, times the Stefan-Boltzmann constant, σ, times the fourth power of the temperature, $T^4$.

$$R = e\sigma T^4 \tag{197}$$

The emissivity e=1 for an optically thick plasma comprising a blackbody, $\sigma=5.67\times10^{-8}$ $Wm^{-2}$ $K^{-4}$, and measured blackbody temperature is 6000K. Thus, the power radiated per unit area by the ignited solid fuel is $$R = (1)(\sigma = 5.67X10^{-8} Wm^{-2}K^{-4})(6000K)^4 = 7.34X\,10^7 Wm^{-2} \tag{198}$$

The radius r, of the plasma sphere of 6000K can be calculated from R and the typical power of the blast $P_{blast}$ given by the quotient of the energy $E_{blast}$ of the blast of 1000 J and the time of the blast σ of $20\times10^{-6}$ s $$r_{ps} = \sqrt{\frac{P_{blast}}{R4\pi}} = \sqrt{\frac{\frac{1000 \text{ J}}{20\times10^{-6} \text{ s}}}{(7.34\times10^7 \text{ Wm}^{-2})4\pi}} = 0.23 \text{ m} = 23 \text{ cm} \tag{199}$$

Thus, the average radius of the expanding plasma sphere is 23 cm at an average blackbody temperature of 6000K. From Beiser [A. Beiser, *Concepts of Modern Physics*, Fourth Edition, McGraw-Hill Book Company, New York, (1978), pp. 329-340], the total number of photons N in the volume with a radius of 23 cm is $$N = 8\pi\left(\frac{4}{3}\pi r_{ps}^3\right)\left(\frac{kT}{hc}\right)^3(2.405) = 2.23\times10^{17} \text{ photons} \tag{200}$$

From Beiser [1], the average energy of the photons $\bar{\epsilon}$is $$\bar{\varepsilon} = \frac{\frac{4\sigma T^4}{cN}}{\frac{4}{3}\pi r_{ps}^3} = \frac{\sigma c^2 h^3 T}{2.405(2\pi k^3)} = 2.24\times10^{-19} \tag{201}$$

$$J = 1.40 \text{ eV}$$

Additional plasma temperatures, plasma emissivity, power radiated per unit area, plasma radii, total number of photons, and average energy of the photons are within the scope of the present disclosure. In an embodiment, the plasma temperature is in at least one range of about 500 K to 100,000K, 1000 K to 10,000 K, and 5000 K to 10,000 K. In an embodiment, the plasma emissivity is in at least one range of about 0.01 to 1, 0.1 to 1, and 0.5 to 1. In an embodiment, the power radiated per unit area according to Eq. (198) is in at least one range of about $10^3$ $Wm^{-2}$ to $10^{10}$ $Wm^{-2}$, $10^4$ $Wm^{-2}$ to $10^9$ $Wm^{-2}$, and $10^5$ $Wm^{-2}$ to $10^8$ $Wm^{-2}$. In an embodiment, the radius and total number of photons are given by Eqs. (199) and (200), respectively, according to the power radiated per unit area R and the power of the blast $P_{blast}$ given by the quotient of the energy $E_{blast}$ of the blast and the time of the blast τ. In an embodiment, the energy is in at least one range of about 10 J to 1 GJ, 100 J to 100 MJ, 200 J to 10 MJ, 300 J to 1 MJ, 400 J to 100 kJ, 500 J to 10 kJ, and 1 kJ to 5 kJ. In an embodiment, the time is in at least one range of about 100 ns to 100 s, 1 us to 10 s, 10 us to 1 s, 100 us to 100 ms, 100 us to 10 ms, and 100 us J to 1 ms. In an embodiment, the power is in at least one range of about 100 W to 100 GW, 1 kW to 10 GW, 10 kW to 1 GW, 10 kW to 100 MW, and 100 kW to 100 MW. In an embodiment, the radius is in at least one range of about 100 nm to 10 m, 1 mm to 1 m, 10 mm to 100 cm, and 10 cm to 50 cm. In an embodiment, the total number of photons according to Eq. (200) is in at least one range of about $10^7$ to $10^{25}$, $10^{10}$ to $10^{22}$, $10^{13}$ to $10^{21}$, and $10^{14}$ to $10^{18}$. In an embodiment, the average energy of the photons according to Eq. (201) is in at least one range of about 0.1 eV to 100 eV, 0.5 eV to 10 eV, and 0.5 eV and 3 eV.

As is shown in FIG. 2A, one or more photovoltaic power converters 6 may be may be oriented (e.g., angled or spaced) relative to the plasma reaction to receive the photons generated by the reaction. For example, photovoltaic power converter 6 may be placed in the flow path to receive the plasma photons. In embodiments in which two or more streams of plasma are ejected in different axial directions, a photovoltaic power converter 6 may be placed in the flow path of each photon stream so as to increase the number of photons captured. In some embodiments, photovoltaic power converter 6 may directly convert the photons into electrical energy, while in other embodiments, photovoltaic power converter 6 may convert the photons into thermal energy and then a thermal-to-electric power converter may convert the thermal energy into electrical energy.

Photovoltaic power converter 6 includes a plurality of photovoltaic cells configured to receive, capture, and convert photons generated during the plasma reaction. The plurality of photovoltaic cells may be arranged into one or more modules. Multiple modules may be packaged and interconnected with one another, for example, in series, in parallel, or in any combination thereof. In some embodiments, multiple photovoltaic modules may be interconnected to form arrays of photovoltaic modules (i.e., photovoltaic arrays). For example, a photovoltaic array may include a plurality of photovoltaic modules connected into photovoltaic module strings, which can be further grouped as photovoltaic module sub-arrays. While individual photovoltaic cells may produce only a few watts of power or less than a watt of power, connecting the individual cells into modules may produce more power, and forming even larger units, like arrays, may allow for even more power production.

Photovoltaic arrays and/or modules may be mounted on a support structure for orienting the cells in the direction of the expelled plasma photons. Exemplary photovoltaic power converters 6 may also include a tracker to adjust the arrays to reduce the angle of incidence between the expelled plasma and the photovoltaic cells to optimize photon capture. Such trackers may be responsive to any shifts in the paths of expelled plasma photons in order to maintain efficiency. In some embodiments, photovoltaic power converter 6 may include one or more maximum power point tracking (MPPT) devices to sample the output of the photovoltaic cells and apply the proper resistance in order to maximum power based on varying plasma emission conditions.

Crystalline silicon photovoltaic cells are one common type of photovoltaic cell. Crystalline silicon cells may include, e.g., monocrystalline (single crystalline) cells, polycrystalline cells, and Edge-Defined, Film-Fed ribbon silicon and silicon sheet-defined film growth cells. They include silicon atoms bonded to each other to form a crystal lattice. Photovoltaic semiconductors include an n-layer and a p-layer, with a junction in between (referred to as the p/n junction). The n-type silicon layer has excess electrons, while the p-type silicon layer has excess holes, and the p/n junction at their interface creates an electric field. When photons are absorbed by the photovoltaic cell, electrons may be freed within the crystal lattice structure. Excess electrons may move from the n-type side to the p-type side, creating a positive charge along the n-layer and a negative charge along the p-layer. It is the separation of these free electrons that generates an electrical field at the p/n junction.

In a crystalline silicon photovoltaic cell, doping is used to introduce an atom of another element into the silicon crystal to alter its electrical properties and create the p-layer and the n-layer. The introduced element ("dopant") typically has either one more valence electron than the substrate material (to create the n-layer) or one less valence electron than the substrate material (to create the p-layer). For example, in silicon-based cells, the dopant typically has either three or five valance electrons (one more or one less that the four valence electrons that silicon has). The dopant is normally applied to a thin layer on a top region and a bottom region of a substrate, producing a p/n junction with a particular band gap energy. For example, a silicon substrate may be doped with phosphorus (having five valence electrons) on a top side to form the n-layer, and boron (having three valence electrons) on a bottom side to form the p-layer.

Plasma photons that strike the photovoltaic cell may be reflected, may be absorbed, or may pass through. Only absorbed photons generate electricity. Band gap energy is the amount of energy required to free an electron from the crystal lattice. If the photon has less energy than the band gap, it may not be collected. Alternatively, if the photon has more energy than the band gap, the extra energy may be lost through relaxation, which may turn the extra energy into heat, increasing blackbody losses. Crystalline silicon has a band gap energy of approximately 1.1 eV, and common photovoltaic materials may have band gap energies ranging from approximately 1.0 eV to approximately 2.0 eV. For example, gallium arsenide has a band gap of approximately 1.43 eV, and aluminum gallium arsenide has a band gap of approximately 1.7 eV.

Accordingly, some photovoltaic cells may be formed of multiple types of materials. Cells made from multiple materials may have multiple band gaps and thus may respond to multiple light wavelengths. Consequently, cells composed of multiple different materials (i.e., multi-junction cells) may be more efficient because they are capable of producing electric current at multiple wavelengths, capturing and converting energy that would otherwise be lost. Photovoltaic cells may be formed of a number of different materials or combinations of materials, which may be selected and/or combined based on the properties of the materials and/or the efficiency requirements of a given application. Different materials may have different crystallinities, absorption properties, minority carrier lifetimes, mobilities, and/or manufacturing considerations. For example, strong absorption coefficients, high minority carrier lifetimes, and/or high mobilities may provide better performance characteristics.

Exemplary materials may include, e.g., silicon, including single-crystalline (monocrystalline) silicon, multicrystalline (polycrystalline) silicon, or amorphous silicon. Multicrystalline thin films may be used, including, e.g., copper indium diselenide, cadmium telluride, or thin-film silicon. Single-crystalline thin films may also be used, including, e.g., gallium arsenide, germanium, or indium phosphide wafers, silicon, or alloys thereof. Crystallinity indicates how ordered the atoms of the crystal structure are, and materials may come in multiple types of crystallinities, including, e.g., single-crystalline, multi-crystalline, and amorphous crystalline.

As discussed above, photovoltaic cells may be composed of a single material, or may be composed of multiple materials. A homojunction device includes a single material or materials having similar properties. If different materials with similar properties are used, the materials may have substantially equal band gaps. Because of potential differences in the number of valence electrons of the different materials, different dopants may be used for the n-layer and p-layer of each material, for the reasons described above. The crystalline silicon embodiment discussed above is an example of a homojunction device. To increase efficiency of a homojunction photovoltaic cell, the depth of the p/n junction, the amount of dopant, the distribution of dopant, the crystallinity, and/or the purity of the material(s) used may be varied.

A heterojunction device includes different materials having unequal band gaps, for example, two layers of dissimilar crystalline semiconductors. In a heterojunction device, the top layer is a window, i.e., a transparent material having a high band gap, while the lower layer has a low band gap that absorbs light. Because different materials may be used for the p-layers and the n-layers of the different materials, a wider variety of dopants may be used to create heterojunction devices, potentially providing increased ability to optimize the photovoltaic cell. An exemplary heterojunction device includes a copper indium diselenide cell in which the p/n junction is formed by contacting cadmium sulfide and copper indium diselenide.

A p-i-n device or a n-i-p device includes a middle undoped (intrinsic or i-type) layer sandwiched between the p-layer and the n-layer, and the electrical field created along the p/n junction may extend over a wider region. An exemplary p-i-n device includes an amorphous silicon photovoltaic cell, which consists of a silicon p-layer, an intrinsic silicon middle layer, and a silicon n-layer.

A multi-junction device includes multiple p/n junctions made of different semiconductor materials. These may include tandem, triple-junction, four-junction, five-junction, six-junction, or n-junction cells. Multi-junction devices are formed of individual cells having different band gaps stacked on top of one another. Each band gap produces electric current in response to a different wavelength of light. The top layer struck first by the photons has the largest band gap. Photons not absorbed by the top layer are transmitted the next layer, and so on, until the remaining photons reach the bottom layer, which has the smallest band gap. Multi-junction devices may include one or more p/n junctions, window layers (to reduce surface recombination velocity), tunnel junctions (to provide low electrical resistance and optically low-loss connections between subcells), back surface field layers (to reduce scattering of carriers towards the tunnel junction), antireflective coatings, metal contacts (e.g., aluminum), or any combination thereof.

To form a multi-junction photovoltaic cell, individual cells may be manufactured independently and then mechanically stacked one on top of the other. Alternatively, one cell may be manufactured first, and the layers for the second cell may be grown (via epitaxy, e.g., liquid-phase, organometallic vapor phase, molecular-beam, metalorganic molecular beam, atomic layer, hydride vapor phase, chemical vapor deposition) or deposited on the first layer. Multi-junction photovoltaic cells generally use Group III-V semiconductor materials. Group III-V materials include, e.g., aluminium gallium arsenide, indium gallium arsenide, indium gallium phosphide, aluminium indium arsenide, aluminium indium antimonide, gallium arsenide nitride, gallium arsenide phosphide, gallium arsenide antimonide, aluminum gallium nitride, aluminium gallium phosphide, indium gallium nitride, indium arsenide antimonide, indium gallium antimonide, aluminium gallium indium phosphide, aluminium gallium arsenide phosphide, indium gallium arsenide phosphide, indium gallium arsenide antimonide, indium arsenide antimonide phosphide, aluminium indium arsenide phosphide, aluminium gallium arsenide nitride, indium gallium arsenide nitride, indium aluminium arsenide nitride, gallium arsenide antimonide nitride, gallium indium nitride arsenide antimonide, and gallium indium arsenide antimonide phosphide. Alternatively or additionally, Group II-IV alloys, polycrystalline combinations of Group-IV, II-IV, and/or III-V crystalline, microcrystalline, or amorphous semiconductors may be used. Multi-junction device materials may include, e.g., amorphous silicon, copper indium diselenide, copper indium gallium diselenide, gallium arsenide, gallium indium phosphide, cadmium sulfide, cadmium telluride, or zinc telluride, for example. An exemplary multi-junction cell is a cadmium telluride cell, having a cadmium sulfide p-layer, a cadmium telluride i-layer, and a zinc telluride n-layer. Another exemplary multi-junction cell may include a stack of GaInP, GaInAs, and Ge. Suitable multi-junction devices may include lattice-matched, upright metamorphic, and inverted metamorphic multi-junction devices, for example.

In multi-junction photovoltaic cells, materials may also be chosen based on lattice-matching and/or current matching. For optimal growth and crystal quality, the crystal lattice constant of different materials may be the same or may be closely matched. The more mismatched crystal lattice structures are, the more grown imperfections and crystal defects may occur, causing a reduction of efficiency due to degradation of electrical properties. Because materials are layered according to decreasing band gaps, suitable band gaps (and thus suitable materials) may be chosen so that the design spectrum balances the current generation in each sub-cell to achieve current matching. Suitable manufacturing techniques to achieve lattice matching may include, e.g., metal-organic chemical vapor deposition or molecular beam epitaxy. Lattice-matched structures are often formed of ultra-thin layers of single crystal semiconductors, for example, Group III-V semiconductors. In some embodiments, however, lattice mismatched devices may also achieve high efficiencies. For example, some mismatched photovoltaic cells may include step-graded layers and buffer layers that yield III-V photovoltaic devices that display similar efficiencies, or higher efficiencies, compared to lattice-matched devices. Exemplary mismatched photovoltaic cells include an InGaP/GaAs PV cell mechanically stacked on top of an electrically independent silicon cell and a Ga/InP/CaInAs/Ge cell.

Triple junction photovoltaic cells have been shown to provide current-matching of all three subcells, resulting in an arrangement with a more-efficient band gap combination. Efficiency may also be increased, for example, by improvement of material quality of the lattice-mismatched layers, and/or development of a highly relaxed buffer structure between the substrate and the middle cell, such as a $Ga_{1-y}In_yAs$ buffer structure. Exemplary multi-junction photovoltaic cells include: three junction photovoltaic cells such as those having the structure GaInP/GaInAs/Ge; four junction photovoltaic cells such as those having the structure GaInP/AlGaInAs/GaInAs/Ge, five-junction photovoltaic cells such as those having the structure AlGaInP/GaInP/AlGaInAs/GaInAs/Ge or AlGaInP/AlGaInAs/GaInAs/GaInAs/Ge; and six-junction photovoltaic cells such as those having the structure GaInP/GaInP/AlGaInAs/GaInAs/GaInAs/Ge. Any suitable number and/or type of materials may be used to produce exemplary photovoltaic cells of the present disclosure.

Inverted metamorphic multi-junction cells (IMM cells or inverted, lattice mismatched cells) are formed by growing the junctions in increasing order of lattice mismatch with respect to the substrate. This reduces the propagation of strain-induced defects through the device structure. Accordingly, the highest band gap material is grown first, leaving a substantially strain- and defect-free surface on which the next highest band gap material can be grown. The lowest band gap material is grown last, so that its strain-induced defects have less of an effect on the other junctions. Growing the junctions from highest to lowest band gap is the inverse order of standard multi-junction cells (or upright cells). To grow the junctions in this inverse order, the substrate must be removed in order to permit photons to enter the highest band gap layer. Step-graded buffer layers may also be included between mismatched junctions to relieve strain and confine dislocations.

Suitable photovoltaic cells may include thin-film cells made by depositing one or more thin layers (e.g., a few nanometers to tens of micrometers) of photovoltaic material on a substrate. Suitable substrates may include, e.g., glass, polymers, metal, or combinations thereof. These materials may not be crystalline in structure. Some common thin-film cells may include amorphous and micromorph silicon, protocrystalline silicon, nanocrystalline silicon, black silicon, cadmium telluride, copper indium selenide, copper indium gallium selenide, dye-sensitized, or other organic photovoltaic cells. An exemplary amorphous silicon solar cell is a multi-junction thin-film silicon cell, which may include a silicon cell with layers of silicon and microcrystalline silicon applied to the substrate. Dye-sensitized cells use photo-electrochemical solar cells formed of semiconductor structures sandwiched between a photo-sensitized anode and an electrolyte. Organic photovoltaic cells may include organic or polymer materials, e.g., organic polymers or small organic molecules. Exemplary photovoltaic cells may also include string/ribbon silicon, comprising similar materials as the crystalline silicon cells discussed above. These cells may be drawn out of molten silicon, which may produce higher conversion efficiency than cast silicon in some embodiments.

In some embodiments, the power generation system may include one or more prisms or optical filters between the plasma reaction and the photovoltaic cells in order to alter the wavelengths of light to more closely match the band gaps of the photovoltaic material(s). Types of filters may include longpass, shortpass, or bandpass filters. Exemplary optical filters may include absorptive filters, dichroic filters, notch filters, monochromatic filters, infrared filters, guide-mode resonance filters, or metal mesh filters, or any suitable combination thereof.

Exemplary photovoltaic power generation systems of the present disclosure may include a number of other suitable components, e.g., one or more of an AC to DC power converter (such as an inverter or micro-inverter), power conditioning unit, temperature sensor, battery, charger, system and/or battery controller, heat sink, heat exchanger, busbar, smart meter for measuring energy production, unidirectional and/or bidirectional meter, monitor (e.g., for frequency or voltage), concentrator (e.g., refractive lenses like Fresnel lenses, reflective dishes like parabolic or cassegrain, or light guide optics), or any suitable combination thereof. Photovoltaic systems may also include balance of system (BOS) hardware, including, e.g., wiring, fuses, overcurrent, surge protection and disconnect devices, and/or other suitable power processing equipment.

Power generated by photovoltaic power converter 6 may be stored and/or buffered with a storage device, such as a battery. Other storage devices may include, e.g., a capacitor, a high-current transformer, a battery, a flywheel, or any other suitable power storage device or combination thereof. The power generation system may further include a charge controller, for example, to avoid battery damage by excessive charging or discharging, or to optimize the production of the cells or modules by MPPT. Batteries may be included in the power generation system in order to store electrical energy produced by photovoltaic power converter 6 and/or to supply energy to electrical loads as needed. One or more batteries may also be included in order to operate the photovoltaic array near its maximum power point, to power electrical loads at stable voltages, and/or to supply surge currents to electrical loads and inverters. A battery charge controller may also be used to protect the battery from overcharge and/or overdischarge.

In some embodiments, photovoltaic power converter 6 may include monitoring systems. Such systems may detect photovoltaic cell breakdown and/or optimize operation of the photovoltaic cells. Monitoring systems may also be configured to detect anomalies in the system or mismatches between the power produced and the requirements of a load. Monitoring systems may provide an alert signal to indicate a potential problem and/or may be operably coupled to a controller, which may be configured to reduce power generation or shut down photovoltaic power converter 6, or the entire plasma power generation system, if detected conditions fall above or below a certain threshold level. Such monitoring systems may include one or more sensors to detect one or more parameters of photovoltaic power converter 6. Exemplary parameters detected may include temperature, pressure, current, frequency, wattage output, luminance, efficiency, or any suitable combination thereof.

The power generation system may also include one or more concentrators in order to focus expelled photons onto a smaller area of the photovoltaic cells. By focusing the photons on a smaller area, systems incorporating concentrated photovoltaic (CPV) technology may be able to reduce the size of the photovoltaic cells. The concentrator may include one or more optical components (e.g., mirrors and/or lenses) oriented for concentrating the photons and may also include one or more trackers to achieve a desired level of concentration. In some embodiments, active or passive cooling systems may be used with CPV devices, while in other embodiments, no cooling systems may be needed. Photovoltaic systems incorporating CPV technology may be capable of achieving higher efficiencies than standard photovoltaic systems. In some embodiments, CPV systems may be used in conjunction with multi-junction photovoltaic cells.

In other embodiments, concentrated solar power (CSP) technology may be used to focus photons onto a smaller area of the photovoltaic cells to convert the concentrated photons into heat. The concentrator may include one or more optical components (e.g., mirrors and/or lenses) oriented in a suitable arrangement relative to one another (e.g., parabolic trough or dish) and a central receiver to produce heat. The heat, often in the form of steam, may be used directly or may be converted to mechanical or electrical power using any suitable converter or combination of converters, including, e.g., a heat engine, such as a steam engine or steam or gas turbine and generator, a Rankine or Brayton-cycle engine, a Stirling engine, which may be connected to an electrical power generator. Alternatively of additionally, the heat may be used to power a thermochemical reaction. In some exemplary embodiments, parabolic troughs may focus photons using long, rectangular, curved mirrors to focus the photons on a pipe running down the center of the trough. The pipe may contain an easily heated fluid that turns into steam when heated. Embodiments utilizing CSP technology may also include one or more trackers to achieve a desired level of concentration.

It should be noted that heat, as well as plasma, may be produced by the ignition of fuel to generate plasma. In embodiments utilizing CSP technology, this heat, in addition to the heat generated by photovoltaic cells, may be used directly or may be converted to mechanical or electrical power using any suitable converter or combination of converters, including, e.g., a heat engine, such as a steam engine or steam or gas turbine and generator, a Rankine or Brayton-cycle engine, or a Stirling engine. In embodiments in which photon energy is directly converted to electrical energy, this heat may be dissipated, e.g., through use of a cooling system, or may be converted into electrical energy in parallel with the photon-to-electric conversions taking place. For example, the power generation system may include photon-to-electric power converters and thermal-to-electric converters. For power conversion, each cell may be interfaced with any converter of thermal energy or plasma-to-mechanical or electrical power such as, e.g., a heat engine, steam or gas turbine system, Stirling engine, or thermionic or thermoelectric converter.

As discussed above, the power generation system may also include a temperature regulation system. For example, a cooling system may remove heat produced by the photovoltaic system and/or by the ignition of fuel to form the plasma. Exemplary cooling systems may include a heat exchanger or a heat sink. In some embodiments, a portion of the heat may be transferred to other components in the power generation system, such as, e.g., regeneration system 14, a removal system, components configured to propagate the chemical reactions needed to regenerate fuel from the plasma reaction products, and/or electrodes to power the fuel ignition for the creation of plasma.

Once electrical power is generated, either directly from the photovoltaic cells or first into heat energy and then into electrical energy, the electrical power may be conditioned. The power generation system may include one or more output power controller/conditioners 7 operably coupled to photovoltaic power converter 6 to alter the quality of the generated power so that it is compatible with the internal or external electrical load equipment and/or storage device to which the power is being delivered. The quality of the generated power may include, e.g., current, voltage, frequency, noise/coherence, or any other suitable quality. Output power controller/conditioner 7 may be adjustable in order to vary the conditioning of the power, for example, to reflect changes in the electrical load equipment or the power generated by the system. The conditioners may perform one or more functions, including, e.g., voltage regulation, power factor correction, noise suppression, or transient impulse protection. In an exemplary embodiment, the output power conditioner may condition the power generated by the power generation system to a desired waveform, e.g., 60 Hz AC power, to maintain a more constant voltage over varying loads.

Once conditioned, the generated power may be passed from controller/conditioner 7 to a load and/or storage device through output terminals 9. Any suitable number and arrangement of controller/conditioners and output power terminals may be incorporated into the power generation system.

In some embodiments, as discussed above, a portion of the power output at the power output terminals 9 may be used to power an electrical power source, for example, providing about 5-10 V, 10,000-40,000 A DC power. The photovoltaic power converters may output low-voltage, high-current DC power. In some embodiments, a supercapacitor or a battery may be used to start the ignition of fuel to generate plasma by supplying the power for the initial ignition so that power for subsequent ignitions is provided by the output power conditioner, which may in turn be powered by photovoltaic power converter 6. The specific components and arrangement of the photovoltaic system will depend, at least in part, on how the energy will be used, once converted.

A photovoltaic power converter 6 and power generation system may be stand-alone, utility-interactive, or may be connected to a grid. The photovoltaic system may operate interconnected with or independent of a utility grid, and may be connected with other energy sources and/or energy storage systems. For example, in some embodiments, photovoltaic power converter 6 may be connected to a grid or other load but may also be capable of storing energy or actively supplying energy to the plasma reaction system. Photovoltaic systems of the present disclosure may be designed to provide DC and/or AC power service.

Figure 3:
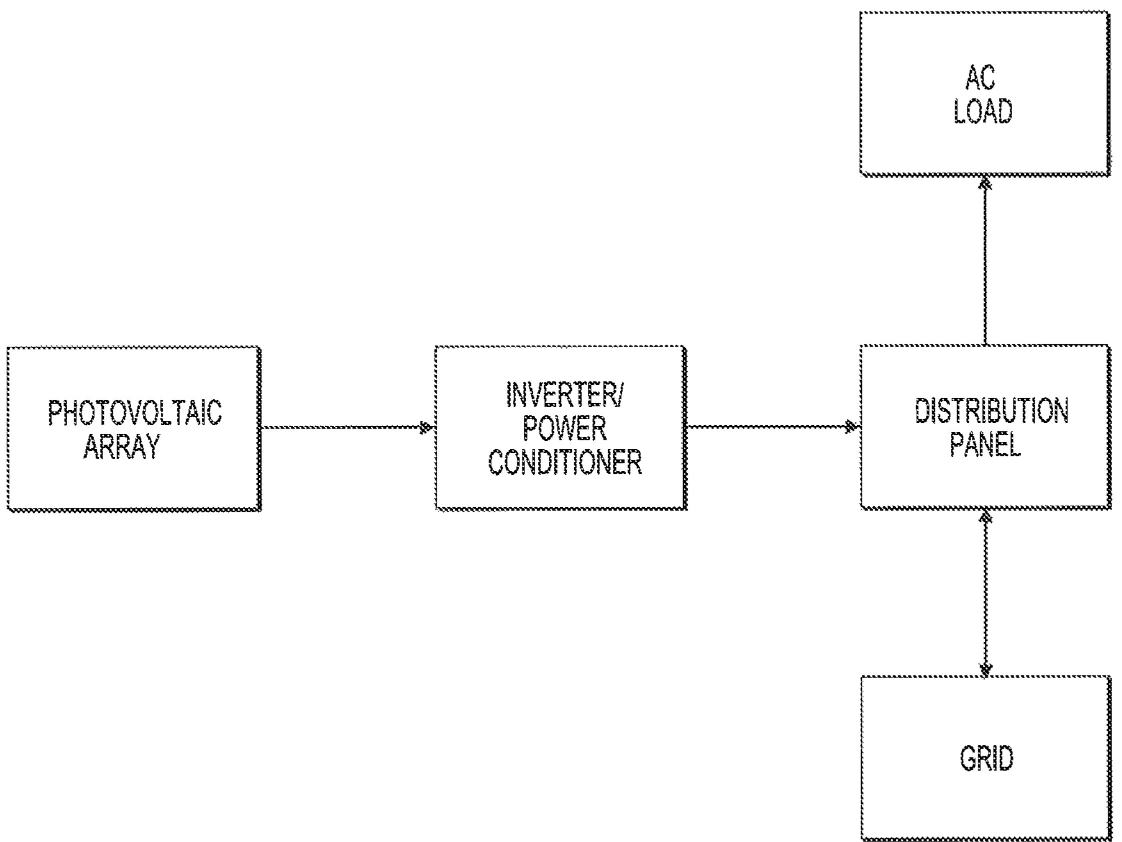
FIG. 3 is a schematic view of a grid-connected photovoltaic power generation system, according to an exemplary embodiment.

Grid-connected photovoltaic systems typically include an inverter to convert and condition DC power produced by the photovoltaic array into AC power consistent with the voltage and power quality requirements of the grid. Positive and negative terminals of the photovoltaic modules and/or arrays may be electrically connected to an inverter for integration into a power grid. The inverter may also be configured to automatically stop the flow of power to the grid when the utility grid is not energized. In this arrangement, a bidirectional interface may exist between the AC output circuits of the photovoltaic system and the electric utility network, for example, at a distribution panel, as is shown in FIG. 3. This may allow the AC power produced by the photovoltaic system to either supply on-site electrical loads or to back-feed the grid, e.g., when the photovoltaic system output is greater than the on-site load demand. When the electrical loads are greater than the photovoltaic system output, the balance of power required by the loads may be received from the grid. This safety feature is required in many grid-connected photovoltaic systems to prevent the photovoltaic system from continuing to operate and feed back into the grid when the grid is down, e.g., for service or repair.

In grid-connected embodiments, photons may be converted to electrical energy, as discussed above. Either all of the electrical power generated may be supplied to the grid, or the power may be supplied to the grid and to one or more of an external load, a storage device within the power generation system, or to other active components within the power generation system, or any suitable combination thereof. Additionally, the electrical power may be supplied to different places depending on a number of factors, e.g., operating conditions, power demands, environmental conditions, etc.

Figure 4:
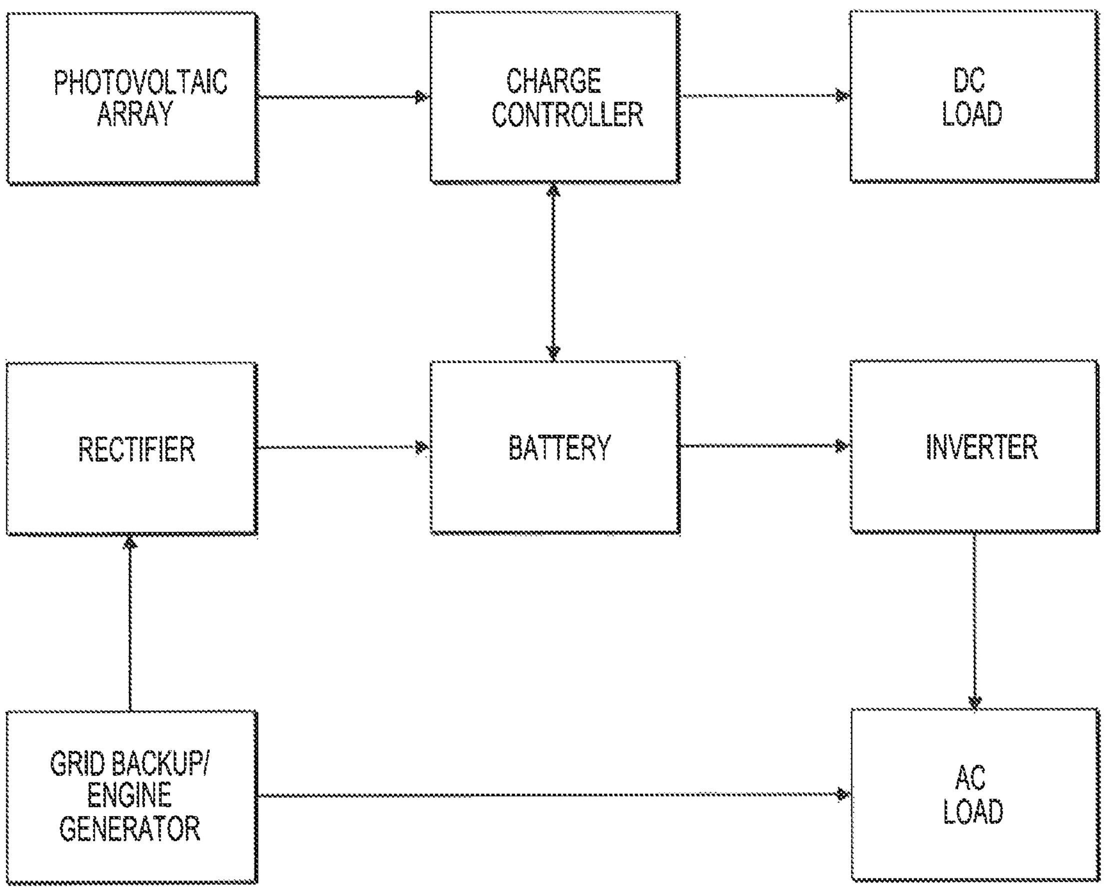
FIG. 4 is a schematic view of a hybrid photovoltaic power generation system, according to an exemplary embodiment.

In some embodiments, a grid-connected system may include an energy storage device, and in other embodiments, a grid-connected system may not include an energy storage device. If included in a grid system, a storage device may be, e.g., a capacitor, a high-current transformer, a battery, a flywheel, or any other suitable power storage device or combination thereof. The storage device may be included in the power generation system, for example, to store power generated by photovoltaic power converter 6 for later use by the system, for later use by another device (e.g., an external load), or to dampen any intermittence. The power generation system and photovoltaic power converter 6 may be configured to re-charge or fill the storage device, which may then be removed once filled and connected to a separate device to supply power. The power generation system may optionally include a storage device configured to accept and store some of the power generated for later use by the power generation system, for example, as a back-up power supply. Additionally, in grid-connected embodiments, the power generation system may receive power from the grid in addition to, or instead of, supplying power to the grid, as is shown in FIG. 4.

Figure 5:
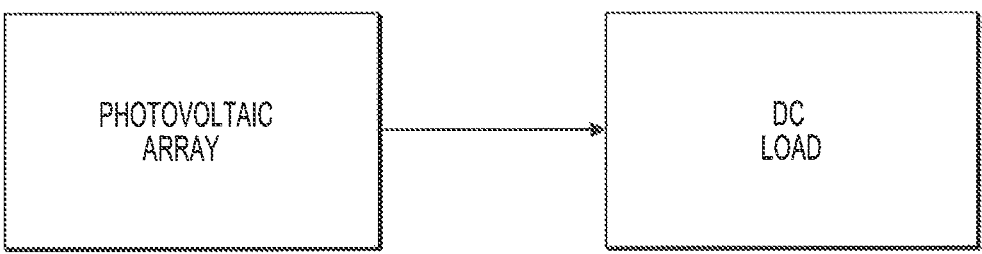
FIG. 5 is a schematic view of a direct-coupled photovoltaic power generation system, according to an exemplary embodiment.
Figure 6A:
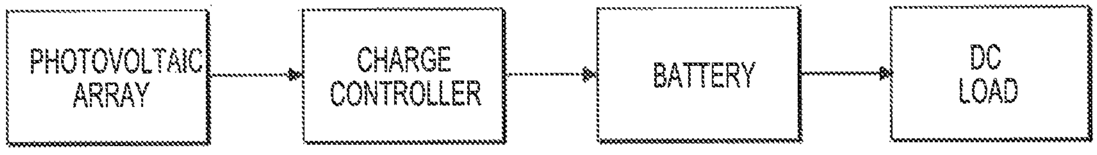
FIG. 6A is a schematic view of a DC photovoltaic power generation system, according to an exemplary embodiment.
Figure 6B:
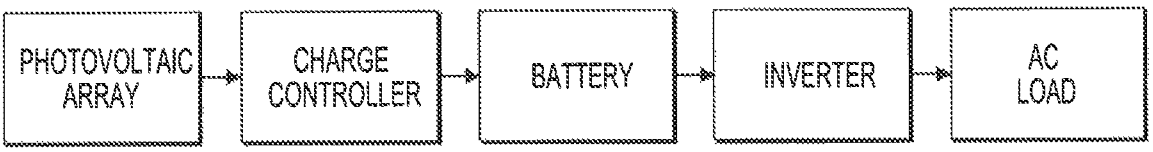
FIG. 6B is a schematic view of an AC photovoltaic power generation system, according to an exemplary embodiment.

In stand-alone embodiments, the photovoltaic power generation system may be designed to operate independent of an electrical grid. Such systems may be designed and configured to supply AC, DC, or both AC and DC power to electrical loads. Stand-alone embodiments may be powered by a photovoltaic array only, or may be supplemented by an auxiliary power source to create a photovoltaic-hybrid system, as shown in FIG. 4. For a stand-alone system, instead of connecting to the grid, a hybrid system may include a power generator, e.g., an engine generator, as an auxiliary power source. In a direct-coupled system, the DC output of a photovoltaic module or array may be directly connected to a DC load. Accordingly, some direct-coupled systems may include no electrical energy storage device (e.g., battery), as is shown in FIG. 5. Alternatively, as is shown in FIG. 6A, direct-coupled systems may include an electrical energy storage device, e.g., to store power generated by photovoltaic power converter 6 for later use by the system, by an external load, or to dampen any intermittence. In direct-coupled systems, the impedance of the electrical load may need to be matched to the maximum power output of the photovoltaic array for optimum performance and may include suitable conditioning components. In some embodiments, a MPPT may be used between the array and the load to promote better utilization of the available array maximum power output. In other embodiments in which DC and AC loads are powered, or in which only AC loads are powered, stand-alone systems may include energy storage devices (e.g., batteries), as shown in FIGS. 6A and 6B.

Figure 7:
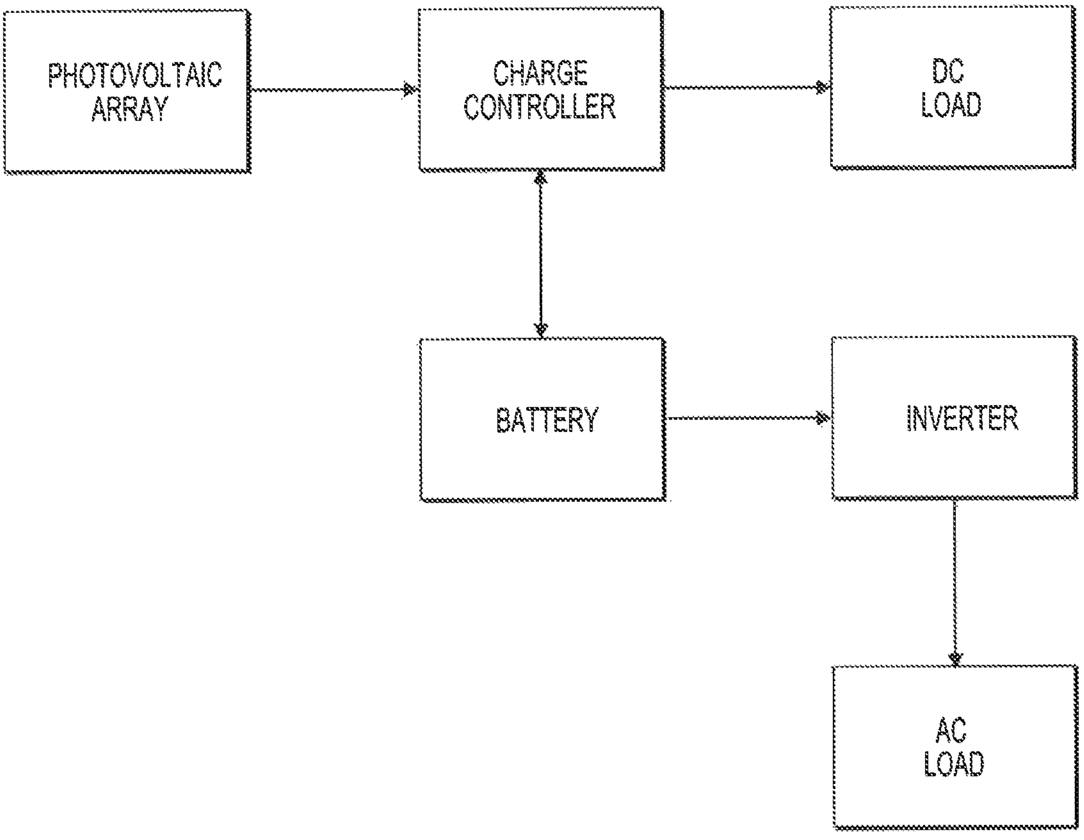
FIG. 7 is a schematic view of an AC/DC photovoltaic power generation system, according to an exemplary embodiment.
Figure 8:
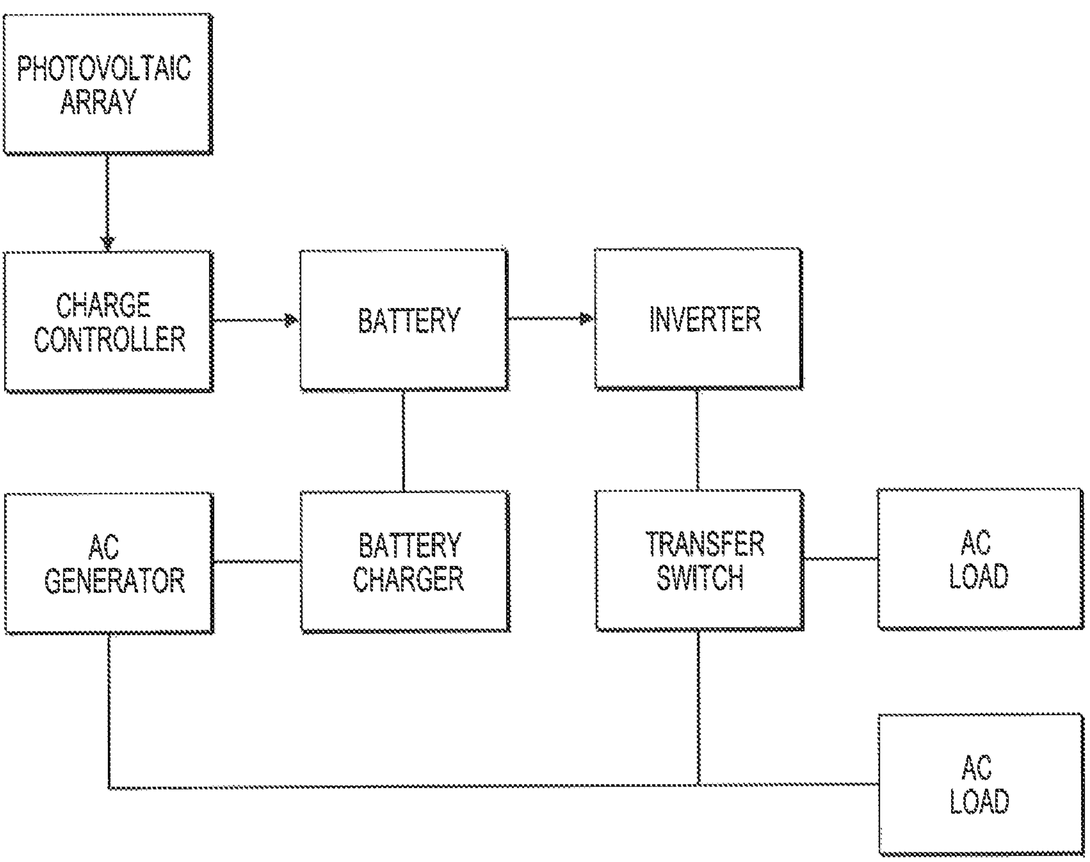
FIG. 8 is a schematic view of an AC photovoltaic power generation system, according to an exemplary embodiment.

In stand-alone embodiments, plasma photons may be converted to electrical energy, as discussed above. All of the electrical power generated may be supplied to one or more of a storage device, an external load, or other components within the power generation system, or any suitable combination thereof, exemplary embodiments of which are depicted in FIGS. 7 and 8.

Exemplary storage devices may include, e.g., a capacitor, a high-current transformer, a battery, a flywheel, or any other suitable power storage device or combination thereof. The storage device may be included in the power generation system, for example, to store power generated by photovoltaic power converter 6 for later use by the system, for later use by another device (e.g., an external load), or to dampen any intermittence. The power generation system and photovoltaic power converter 6 may be configured to re-charge or fill the storage device, which may then be removed once filled and connected to a separate device to supply power. The power generation system may optionally include a storage device configured to accept and store some of the power generated by system for later use by the power generation system, for example, as a back-up power supply.

Any suitable photovoltaic power converter for converting photons into either electrical or thermal energy, such as those described above, may be used in conjunction with any of the suitable plasma-generating power generation systems described herein. For example, any suitable monocrystalline, polycrystalline, amorphous, string/ribbon silicon, multi-junction (including, e.g., inverted, upright, lattice mismatched, lattice matched, Group III-V), homojunction, heterojunction, p-i-n, thin-film, dye-sensitized, or organic photovoltaic cell, or combination of photovoltaic cells, may be included in exemplary plasma power generation systems of the present disclosure.

Figure 9:
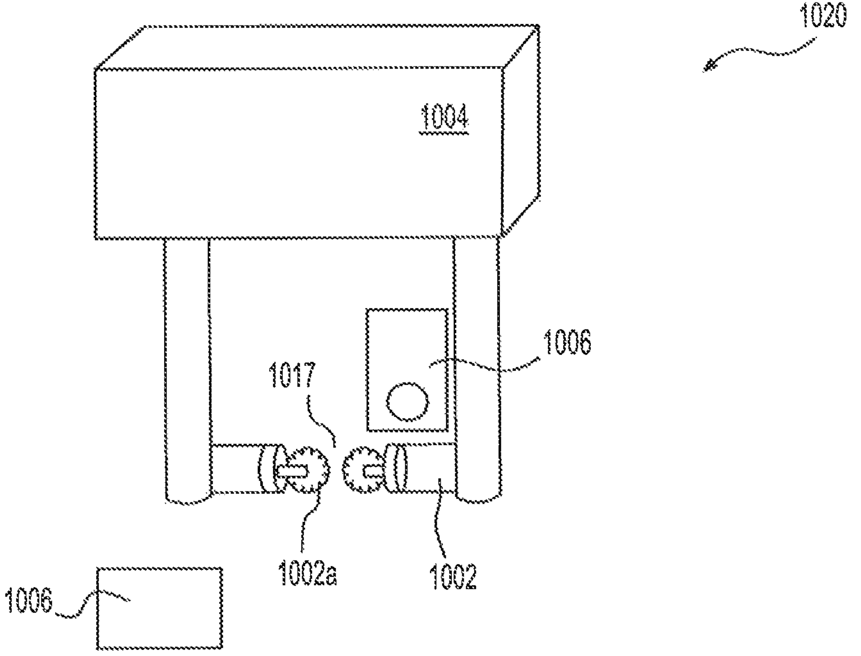
FIG. 9 is a schematic drawing of a photovoltaic power generation system, according to an exemplary embodiment.
Figure 10:
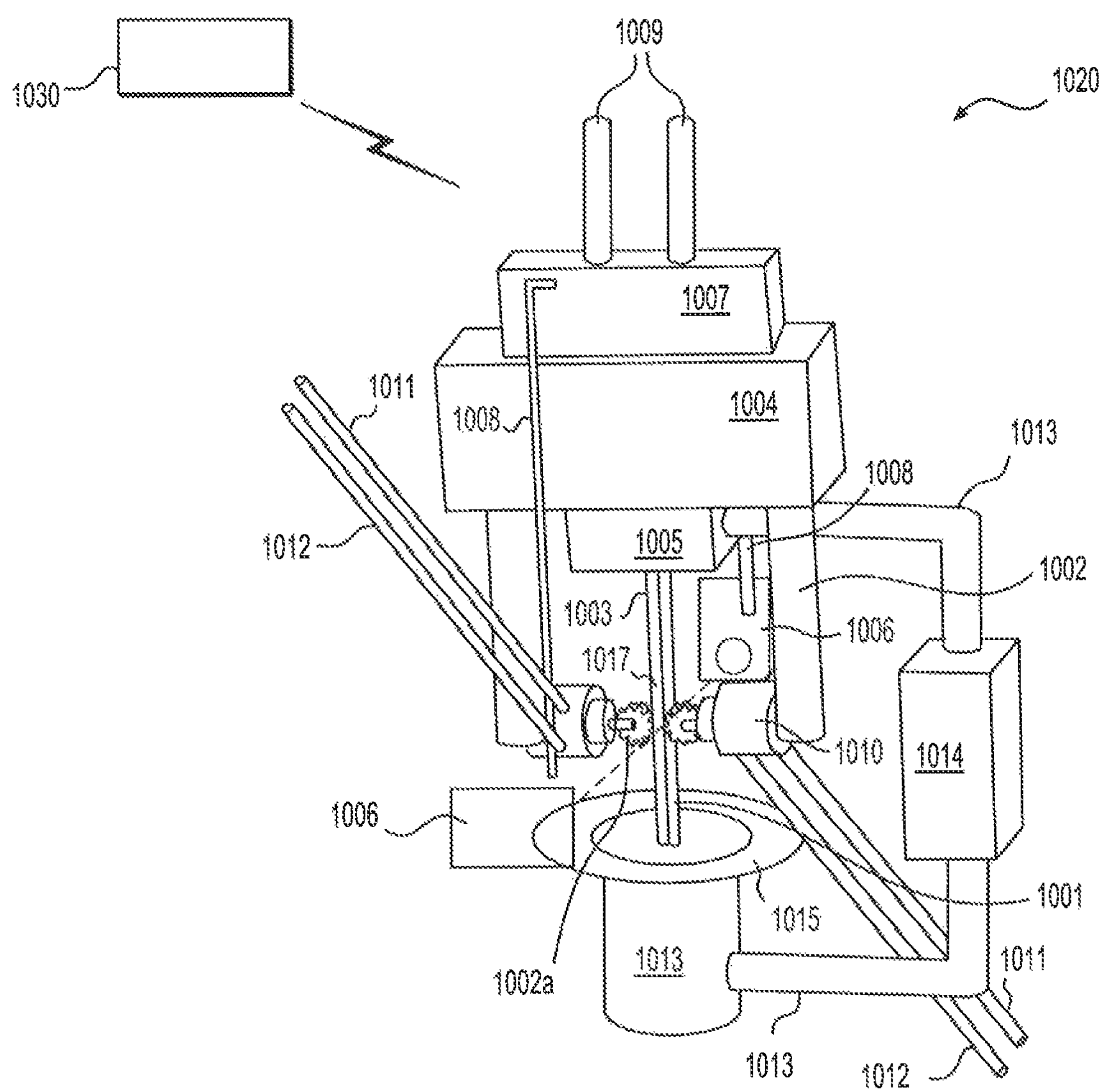
FIG. 10 is a schematic drawing of a photovoltaic power generation system, according to an exemplary embodiment.

For example, a power generation system may include a plurality of electrodes 1002 configured to deliver power to a fuel 1003 to ignite the fuel and produce a plasma, a source of electrical power 1004 configured to deliver electrical energy to the plurality of electrodes 1002, and at least one photovoltaic power converter 1006 positioned to receive at least a plurality of plasma photons, as is shown in the embodiment of FIG. 9. This system may also include an output power conditioner 1007 operably coupled to the photovoltaic power converter 1006 (via power connector 1008 of FIG. 12) and an output power terminal 1009 operably coupled to the output power conditioner 1007, as is shown in the embodiment of FIG. 10.

Another exemplary power generation system may include an electrical power source 1004 of at least about 2,000 A/cm$^2$ or of at least about 5,000 kW and a plurality of electrodes 1002 electrically coupled to the electrical power source 1004. The system may also include a fuel loading region 1017 configured to receive a solid fuel 1003, and the plurality of electrodes 1002 may be configured to deliver electrical power to the solid fuel 1003 to produce a plasma. The system may also include a photovoltaic power converter 1006 positioned to receive a plurality of plasma photons.

In one embodiment, a power generation system 1020 may include an electrical power source 1004 configured to deliver power of at least about 5,000 kW or of at least about 2,000 A/cm$^2$. A plurality of electrodes 1002 may be configured to at least partially surround a fuel 1003, and the electrodes 1002 may be electrically connected to the electrical power source 1004 and configured to receive a current to ignite the fuel 1003. At least one of the plurality of electrodes may be moveable. The power generation system may also include a delivery mechanism 1005 for moving the fuel and a photovoltaic power converter 1006 configured to convert photons generated from the ignition of the fuel into a different form of power, as is shown in the exemplary embodiments of FIGS. 11 and 12.

In another exemplary embodiment, a power generation system 1020 may include an electrical power source 1004 configured to deliver power of at least about 5,000 kW or of at least about 2,000 A/cm$^2$. The power source may be electrically connected to a plurality of electrodes 1002, and at least one of the plurality of electrodes 1002 may include a compression mechanism 1002*a*, as is shown in the embodiments of FIGS. 9 and 10. The plurality of electrodes 1002 may surround a fuel loading region 1017 configured to receive a fuel so that the compression mechanism of the at least one electrode is oriented towards the fuel loading region. The electrodes 1002*a* may be configured to supply power to the fuel 1003 received in the fuel loading region 1017 to ignite the fuel. The power generation system 1020 may also include a delivery mechanism 1005 (FIG. 10) for moving the fuel 1003 into the fuel loading region 1017 and a photovoltaic power converter 1006 configured to convert photons generated from the ignition of the fuel into a non-photon form of power.

Figure 11:
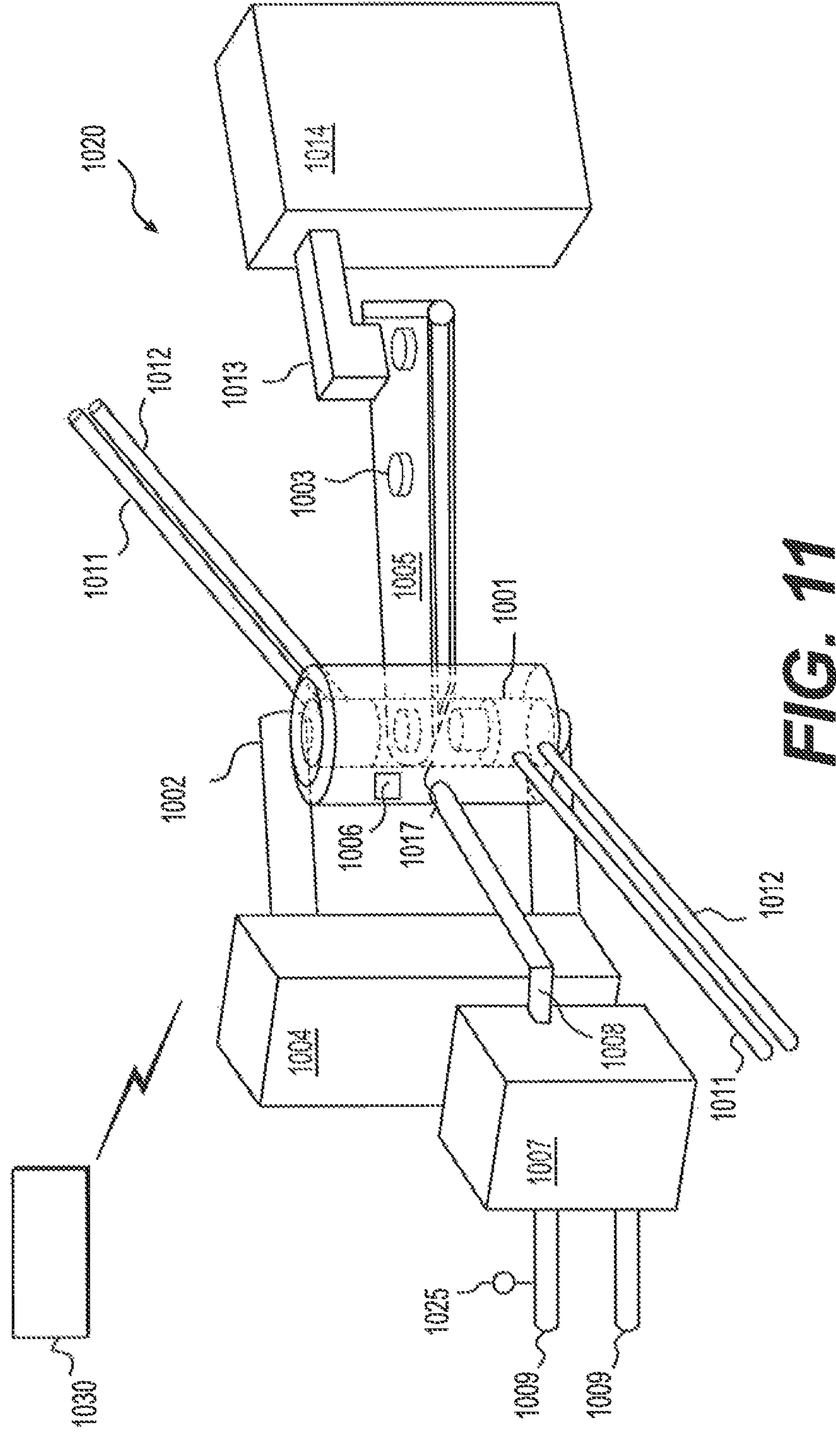
FIG. 11 is a schematic drawing of a photovoltaic power generation system, according to an exemplary embodiment.
Figure 12:
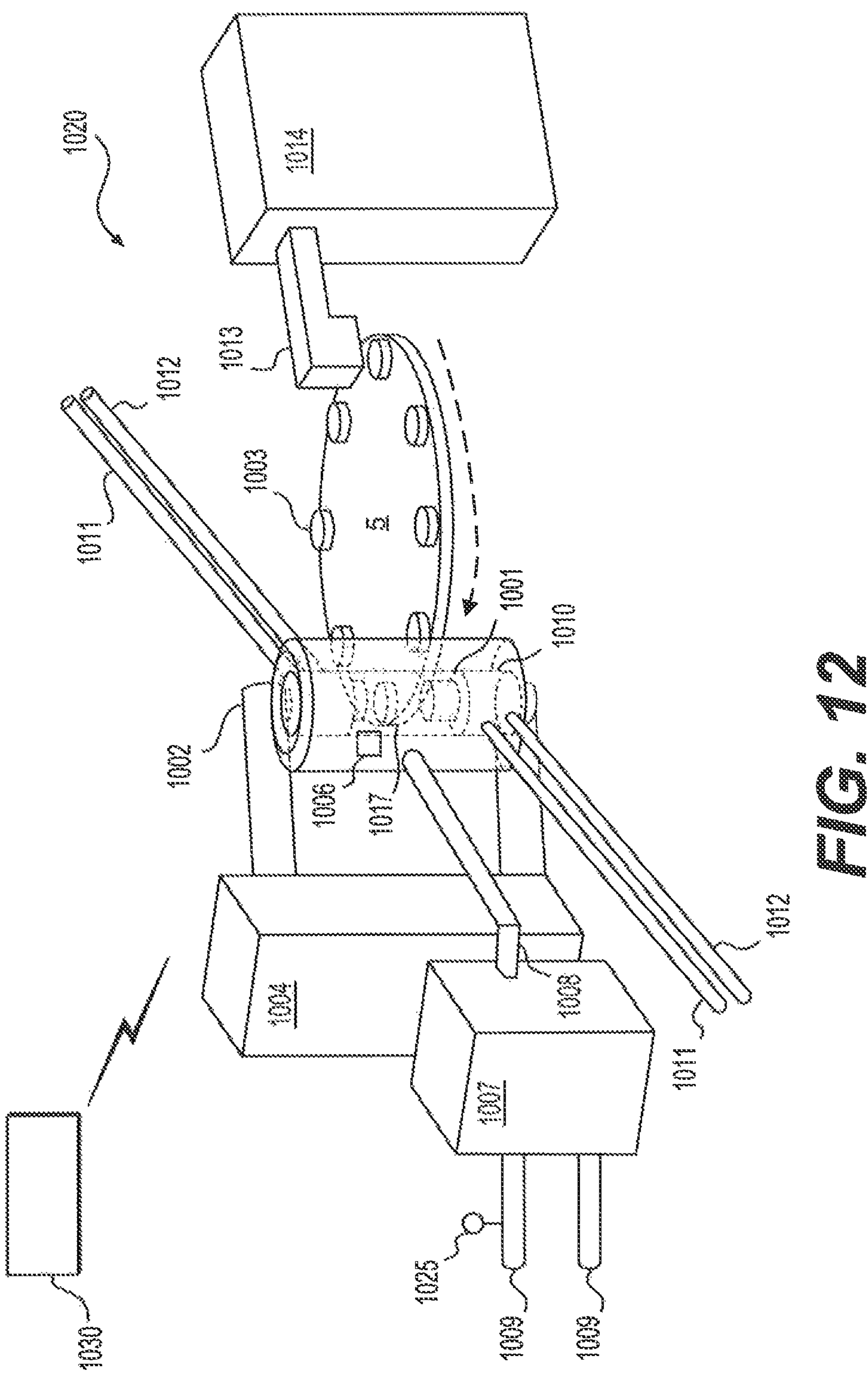
FIG. 12 is a schematic drawing of a photovoltaic power generation system, according to an exemplary embodiment.

In one embodiment, a power generation system 1020 may include a plurality of electrodes 1002 surrounding a fuel loading region 1017. The electrodes 1002 may be configured to ignite fuel 1003 located in the fuel loading region 1017. The power generation system may also include a delivery mechanism 1005 for moving the fuel 1003 into the fuel loading region 1017, a photovoltaic power converter 1006 configured to convert photons generated from the ignition of the fuel into a non-photon form of power, a removal system 1013 for removing a byproduct of the ignited fuel, and a regeneration system 1014 operably coupled to the removal system 1013 for recycling the removed byproduct of the ignited fuel into recycled fuel, as is shown in the embodiments of FIGS. 11 and 12.

Other exemplary power generation systems according to the present disclosure may include an electrical power source 1004 configured to deliver power of at least about 5,000 kW or of at least about 2,000 A/cm$^2$. A plurality of spaced apart electrodes 1002 may be electrically connected to the electrical power source 1004 and may surround a fuel loading region 1017. The fuel loading region 1017 may be configured to receive a fuel 1003, and the plurality of electrodes 1002 may be configured to supply power to the fuel to ignite the fuel 1003 when received in the fuel loading region 1017. The power generation system may also include a delivery mechanism 1005 for moving the fuel into the fuel loading region 1017, a photovoltaic power converter 1006 configured to convert a plurality of photons generated from the ignition of the fuel into a non-photon form of power, a sensor 1025 configured to measure at least one parameter associated with the power generation system, and a controller 1030 configured to control at least a process associated with the power generation system, as is shown in FIGS. 11 and 12.

In another embodiment, a power generation system may include an electrical power source 1004 configured to deliver power of at least about 5,000 kW or of at least about 2,000 A/cm$^2$ and a plurality of spaced apart electrodes 1002 electrically connected to the electrical power source 1004. The plurality of electrodes 1002 may surround a fuel loading region 1017 and may be configured to supply power to the fuel 1003 to ignite the fuel when received in the fuel loading region 1017. The pressure in the fuel loading region 1017 may be a partial vacuum. The power generation system may also include a delivery mechanism 1005 for moving the fuel 1003 into the fuel loading region 1017 and a photovoltaic power converter 1006 configured to convert a plurality of photons generated from the ignition of the fuel into a non-photon form of power.

The exemplary photovoltaic power generation systems described herein may operate interconnected with or independent of a utility grid, and may be connected with other energy sources and/or energy storage systems. They may also include any suitable components, including, e.g., one or more of an AC to DC power converter (such as an inverter or micro-inverter), power conditioning unit, temperature sensor, battery, charger, system and/or battery controller, condenser, cooling system 1011/1012 (e.g., heat sink, heat exchanger 1010), busbar, smart meter for measuring energy production, unidirectional and/or bidirectional meter, monitor (e.g., for frequency or voltage), concentrator (e.g., refractive lenses like Fresnel lenses, reflective dishes like parabolic or cassegrain, or light guide optics), or any suitable combination thereof. Photovoltaic systems may also include balance of system (BOS) hardware, including, e.g., wiring, fuses, overcurrent, surge protection and disconnect devices, and/or other suitable power processing equipment.

Further, photovoltaic power generation systems place photovoltaic cells in proximity to plasma-generating ignition reactions. Accordingly, exemplary power generation systems may include any suitable cleaning system, as described above, in order to remove any debris or residue that may accumulate on the photovoltaic cells and/or other components that may block some of the photons from being absorbed by the photovoltaics or may damage the photovoltaics.

Figure 13B:
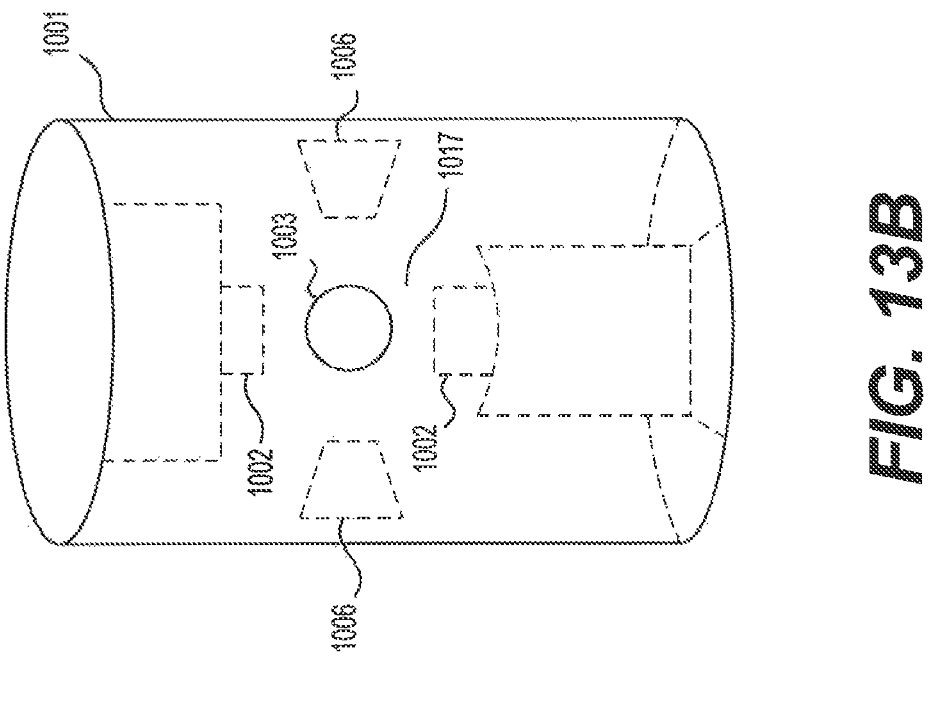
FIG. 13B is a schematic drawing of a photovoltaic power generation system in which the photovoltaic power converters are located in the same region as a reaction site, according to an exemplary embodiment.
Figure 13A:
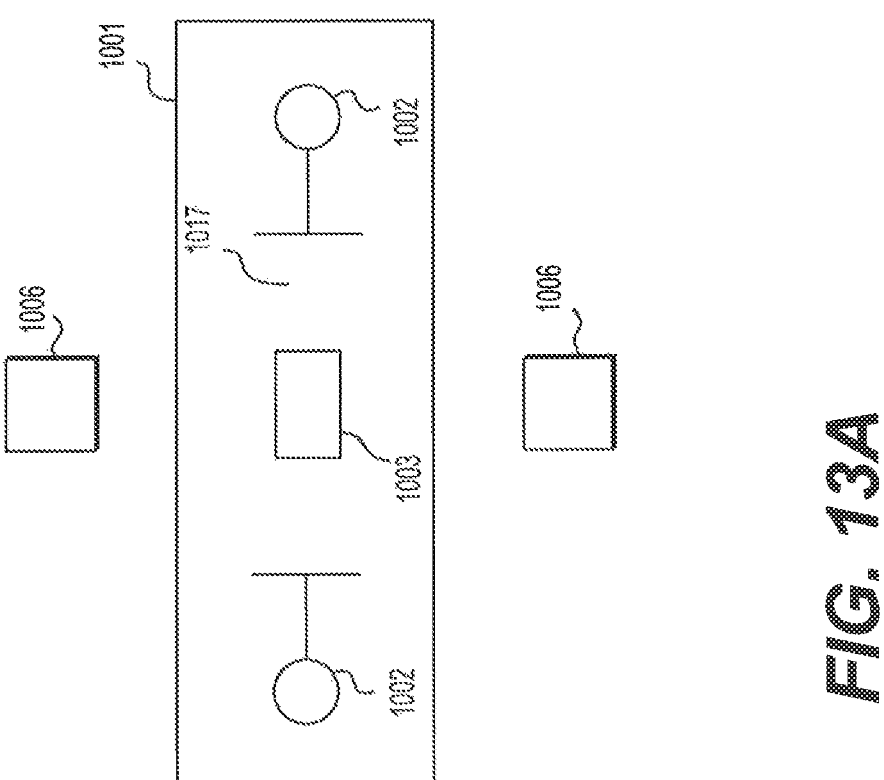
FIG. 13A is a schematic drawing of a photovoltaic power generation system in which the photovoltaic power converters are located in a different region from a reaction site, according to an exemplary embodiment.

Additionally, the photovoltaic power converters may be mounted so as to capture emitted photons while decreasing the effects of any shock waves or particles that may be expelled during the plasma-generating explosion. For example, photovoltaics may be spaced on or around baffles configured to break up shock waves. Thin-film photovoltaic cells may be applied to more resilient substrates, e.g, glass, polymer, metal, or combinations thereof. In some embodiments, photovoltaic power converters may be moveably mounted and trackers or other sensors may adjust the angle and/or positioning of the photovoltaics according to explosion parameters in order to decrease damage caused by the reaction. In some embodiments, transparent panels or mesh screens may be placed in front of the photovoltaics in order to act as a buffer and/or baffle. The photovoltaics may include protective coatings. Cooling systems may dissipate and/or redirect heat generated during the reactions. Accordingly, photovoltaic power converters may be arranged within power generation systems in order to promote photon capture while protecting the photovoltaic cells from fuel ignition and plasma reactions. Alternatively, in some embodiments, the reactions may be contained so that the explosion does not negatively effect the photovoltaic cells. For example, the reaction may occur in a separate, transparent vessel 1001 (either at, above, or below atmospheric pressure, such as in a vacuum vessel), and the photovoltaic cells 1006 may be applied to an outer wall of the vessel and/or may be mounted just outside of the vessel 1001. Photovoltaic power converters 1006 may be arranged in any suitable manner in any of the suitable power generation systems disclosed and may be incorporated with any suitable components and configurations of components. FIG. 13A depicts an embodiment in which the fuel loading region 1017 is set apart from the photovoltaic power converters 1006 and the reactions occur in a separate region from the photovoltaic power converters 1006, while the embodiment of FIG. 13B shows the reactions occurring in the same region as the reactions (e.g., inside or outside of vessel 1001).

In an embodiment of the power converter, plasma photons are incident on a photoelectric material that is responsive to the wavelength of the spontaneous emission or laser light such that electrons are ejected and collected at a grid or electrode. The photoelectric material such as barium, tungsten, pure metals (e.g. Cu, Sm), Ba, $Cs_2Te$, $K_2CsSb$, $LaB_6$, Sb-alkali, GaAs serves as a photocathode (positive electrode) as given in the following references which are incorporated by reference in their entirety: M. D. Van Loy, "Measurements of barium photocathode quantum yields at four excimer wavelengths", Appl. Phys. Letts., Vol. 63, No. 4, (1993), pp. 476-478; S. D. Moustaizis, C. Fotakis, J. P. Girardeau-Montaut, "Laser photocathode development for high-current electron source", Proc. SPIE, Vol. 1552, pp. 50-56, Short-wavelength radiation sources, Phillip Sprangle, Ed.; D. H. Dowell, S. Z. Bethel, K. D. Friddell, "Results from the average power laser experiment photocathode injector test", Nuclear Instruments and Methods in Physics Research A, Vol. 356, (1995), pp. 167-176; A. T. Young, B. D'Etat, G. C. Stutzin, K. N. Leung, W. B. Kunkel, "Nanosecond-length electron pulses from a laser-excited photocathode", Rev. Sci. Instrum., Vol. 61, No. 1, (1990), pp. 650-652; Q. Minquan, et al., "Investigation of photocathode driven by a laser", Qiangjiguang Yu Lizishu/High Power Laser and Particle Beams", Nucl. Soc. China, Vol. 9, No. 2, May (1997), pp. 185-191. The electron collector may serve as an anode (negative electrode). The electrical circuit completed between these electrodes through a load is such that the voltage developed between the electrodes drives a current. Thus, electrical power is delivered to and dissipated in the load.

Another application of the current disclosure is a light source. The optical power is from the ignition of the solid fuel of the disclosure. The light source comprises at least one transparent or semitransparent wall of the cell 1 shown in FIGS. 1 and 2. The transparent or semitransparent wall may be coated with a phosphor to convert the energy including light to a desired wavelength band. The ignition may occur at sufficient frequency such that the light appears as constant. In an embodiment, the plasma formed from the ignition of solid fuel produces a high output at short wavelengths. Significant optical power may be in the EUV and soft X-ray region. The short wavelength light source may be used for photolithography.

J. Gear Section

Referring to the SF-CIHT cell shown in FIG. 2A, traditional gear sets are typically designed to transfer mechanical energy from one gear to another. While these gears include a range of configurations, they are generally not designed to absorb shock waves or heat. Some applications, such as, for example, as described above require gears that move and also sustain high impacts and heat transfers. The gears and methods described below overcome at least some of the limitations of the prior art and are suitable for use with the systems and methods described above.

The gears of the present disclosure are configured for use with processes involving electrical conduction, pressure waves, or heat transfer. For example, currents ranging from about 2,000 to about 100,000 amps and voltages ranging from about 1 to about 100,000 volts may be applied to one or more gears, as described above. Pressure waves, heat transfer, and ion and/or plasma production may be produced. In some embodiments, the gears of the present disclosure may be configured to operate with a solid fuel, such as a solid fuel powder.

Figure 14:
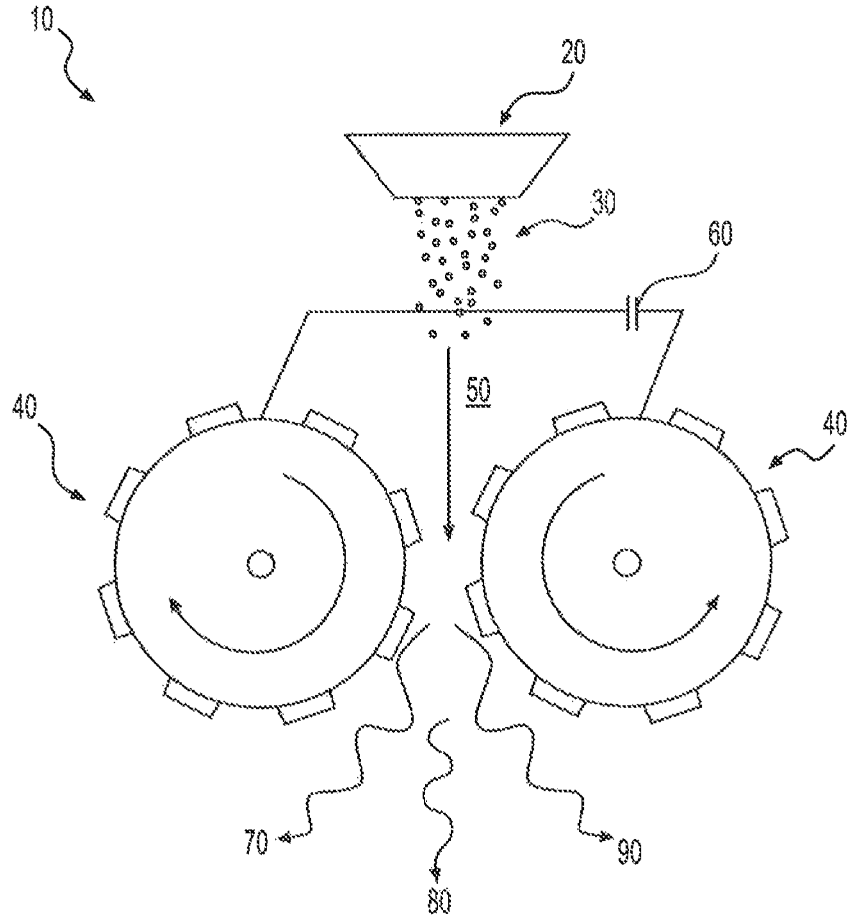
FIG. 14 is a schematic view of a system, according to an exemplary embodiment.

As shown in FIG. 14, a system 10 can be configured to produce energy as described above. System 10 can include a fuel supply 20 configured to supply a fuel 30 to one or more gears 40, as indicated by the arrow representing a fuel flow 50. One or more gears 40 may also be coupled to one or more power supplies 60 configured to provide power to one or more gears 40.

As explained above, fuel 30 may be supplied to one or more gears 40 in conjunction with a supply of electrical power to one or more gears 40. A reaction may occur whereby quantities of at least photons comprising heat and light 70, pressure 80, or ions 90 are produced. While some of the products of the reaction can be subsequently converted into electrical energy, gears 40 must be configured to conduct electricity supplied by power supply 60 and withstand heat and light 70, pressure 80, or ions 90 produced by the reaction. Gears 40 and the methods described herein can operate with system 10.

As shown in FIG. 14, system 10 can include two gears 40. In other embodiments, one or more than two gears 40 may be used. Gears 40 are also shown as both rotating. In other embodiments, a rack and pinion configuration could be used. Moreover, gear 40 can include a spur, helical, bevel, worm, or other type of gear.

Gear 40 can operate with a range of fuels 30 and with a range of fuel flows 50. For example, fuel 30 can include a solid, liquid, or gaseous form. As explained above, these fuels can include water or water-based fuel source.

Gears 40 can also be formed from one or more suitable materials, including conducting and non-conducting components. For example, at least part of gear 40 could include a pure metal, a metal alloy, or a ceramic material. Various materials and configurations can permit gear 40 to operate with fluctuations in pressure, heat, and surrounding environment.

Figure 15:
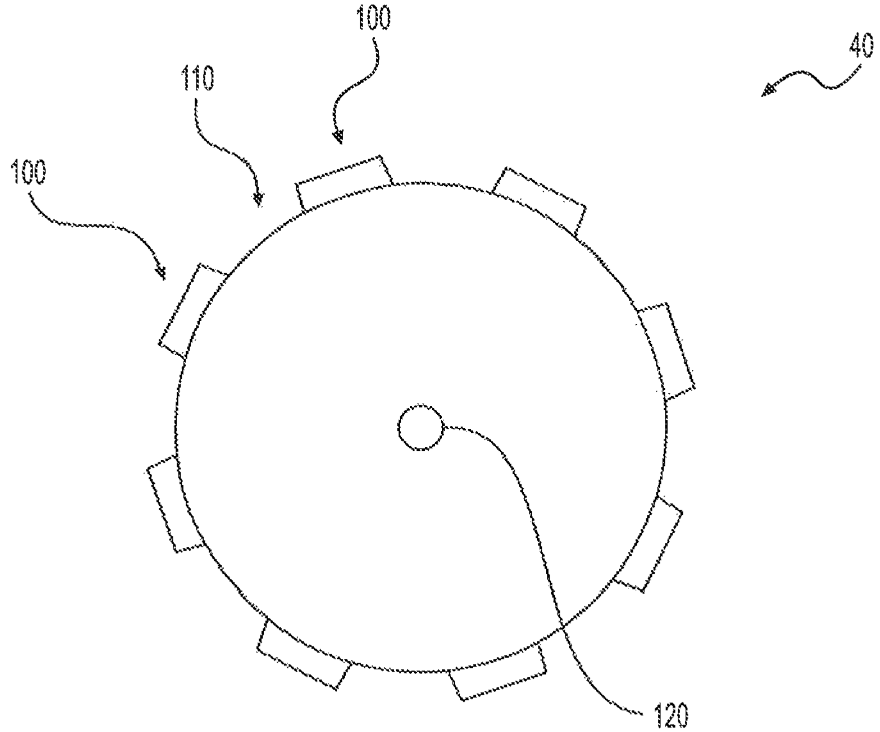
FIG. 15 is a schematic view of a gear, according to an exemplary embodiment.

As shown in FIG. 15, gear 40 can include one or more teeth 100. A gap 110 can exist between two adjacent teeth 100. Teeth 100 and gap 110 can be any suitable shape or dimension, as explained below in more detail. Gear 40 can also include one or more apertures 120 configured to receive a shaft (not shown) configured to provide or output rotational movement. In addition, gear 40 may include one or more other elements (not shown) to provide, monitor, or control rotational movement. For example, gear 40 can include various bearings, bushings, or other mechanical elements.

Figure 16:
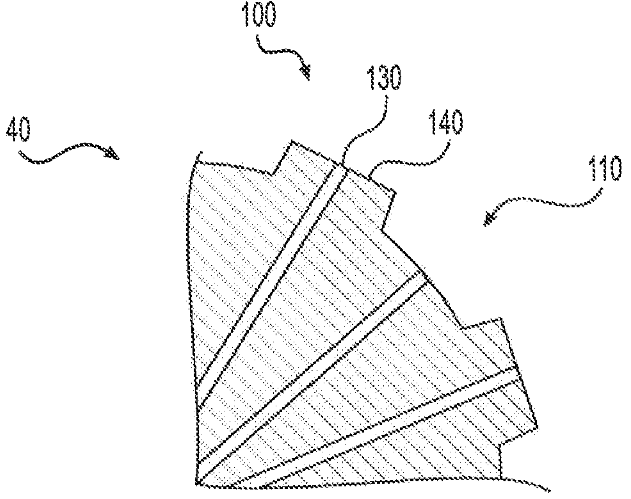
FIG. 16 is an enlarged view of a gear, according to an exemplary embodiment.

As shown in FIG. 16, gear 40 can include one or more materials. Although both teeth 100 and gap 110 are shown with a first material 130 and a second material 140, one or more teeth 100 or gap 110 may or may not include two or more materials. Various materials that may be used at least in part to form gear 40 include, Cu, Ag, Ti, W, Mo, TiC, WC, and other suitable elements have appropriate conductivity, hardness, ductility, or other desirable properties.

In some embodiments, first material 130 may be more electrically conductive than second material 140. For example, first material 130 may have a lower resistance value than second material 140. First material 130 may include a material different to second material 140 or may be formed using a different process than second material 140. First material 130 can be conductive while second material 140 can be insulating. Other configurations of materials 130, 140 are possible.

Figure 17:
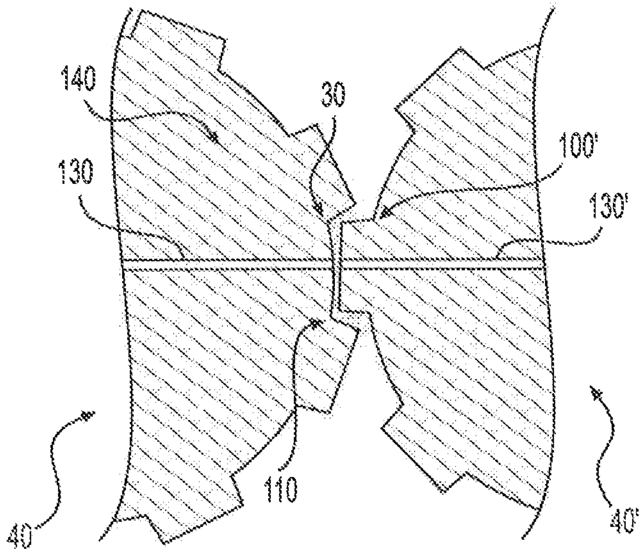
FIG. 17 is an enlarged view of two gears, according to an exemplary embodiment.

In operation, it will be appreciated that gears 40, 40' shown in FIG. 17 can each rotate relative to each other. Such rotation may trap fuel 30 between gap 110 of gear 40 and teeth 100' of gear 40'. Electrical power applied to gears 40, 40' may pass through first material 130 of gap 110, through fuel 30, and through first material 130' of teeth 100'. Because of the difference in conductivity first material 130 and the surrounding second material 140, current will preferentially flow through a small portion of fuel 30. Such preferential flow will cause a localized reaction, where any products released will originate from the region defined by a surface of first material 130, 130'.

In other embodiments, materials 130, 140 may have different properties. For example, one material may be harder, more resistant to a pressure pulse, more resistant to corrosion, etc., compared with the other material.

In some aspects, the geometry of teeth 100, gap 110, or both may be configured to provide a localized reaction. For example, as shown in FIGS. 18A-21B, teeth 100 may have various configurations. It is also appreciated that gap 110 could be similarly configured to provide a geometry specific for a localized reaction.

Figure 18A:
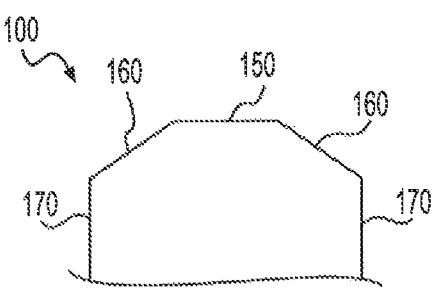
FIGS. 18A and 18B are side and lateral views of a gear tooth, according to an exemplary embodiment.
Figure 18B:
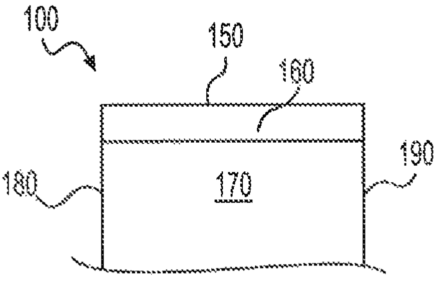

FIGS. 18A, 19A, 20A, and 21A illustrate side-profile views of teeth 100, according to various embodiments. FIGS. 18B, 19B, 20B, and 21B illustrate lateral views of the corresponding teeth 100 shown in FIGS. 18A, 19A, 20A, and 21A. In particular, FIG. 18A shows teeth 100 with an upper surface 150, two side surfaces 170, and two sloping surfaces 160 located between upper surface 150 and side surface 170. FIG. 18B shows that surfaces 150, 160, 170 extend entirely from a first side 180 of teeth 100 to a second side 190 of teeth 100.

Figure 19A:
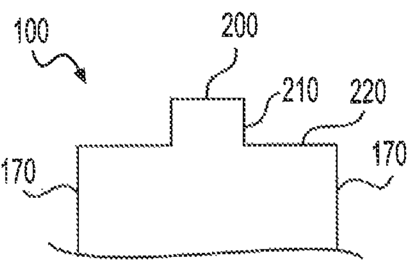
FIGS. 19A and 19B are side and lateral views of a gear tooth, according to an exemplary embodiment.

FIG. 19A illustrates teeth 100 with an upper surface 200 and a side surface 210 extending from a medium surface 220. Similar to upper surface 150, upper surface 200 provides a reduced contact area with an adjacent surface (not shown). Upper surface 200 extends along part of the region between side walls 170 in one dimension and extends entirely between first surface 180 and second surface 190.

Figure 19B:
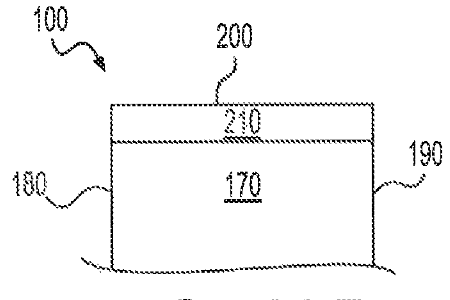

This configuration is shown in FIG. 19B, similar to the lateral view shown in FIG. 18B.

Figure 20A:
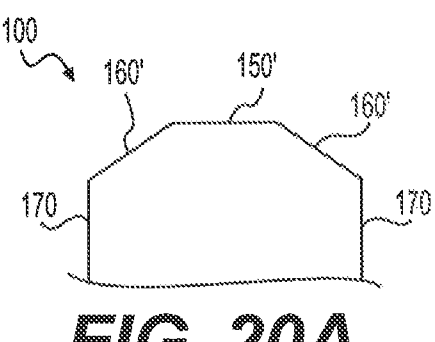
FIGS. 20A and 20B are side and lateral views of a gear tooth, according to an exemplary embodiment.
Figure 20B:
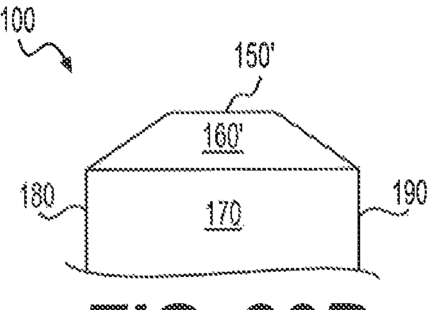
Figure 21A:
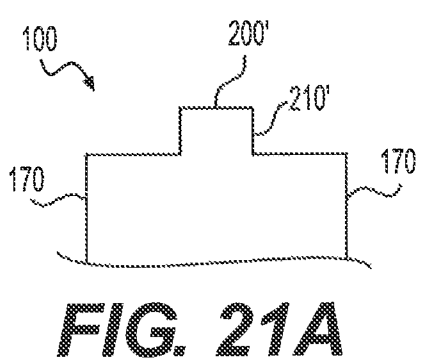
FIGS. 21A and 21B are side and lateral views of a gear tooth, according to an exemplary embodiment.
Figure 21B:
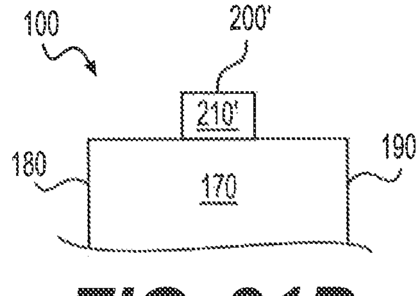

While FIG. 20A is similar to FIG. 18A, the lateral view shown in FIG. 20B is different to that shown in FIG. 18B. Specifically, surface 150' does not extend completely from first surface 180 to second surface 190, part of sloping surfaces 160' extend from first surface 180 to second surface 190, and side surfaces 170' extend completely from first surface 180 to second surface 190. Likewise, FIG. 21A shows an embodiment, wherein upper surface 200' extends only partially from first side 180 to second side 190.

The surfaces shown in FIGS. 18A-21B are flat and linear, but may be arcuate and include other surface features. These surfaces may also be coated, and may contain projections, indentations, or deviations.

Figure 22A:
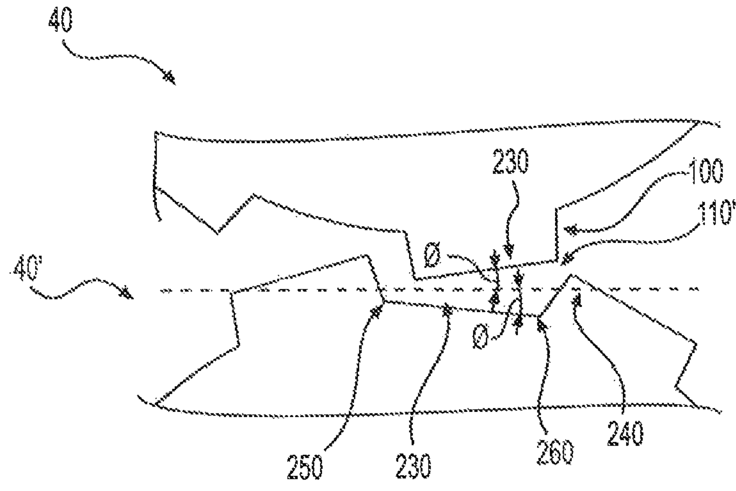
FIG. 22A is an enlarged view of a gear tooth and gap, according to an exemplary embodiment.

In the embodiment shown in FIG. 22A, teeth 100 includes an angled surface 220 located at an angle theta relative to a normal plane 240. Gap 110' may also include an angled surface 230 located at an angle phi relative to normal plane 240. Although shown with both surfaces 220, 230, one surface may be substantially parallel to normal plane 240.

Figure 22B:
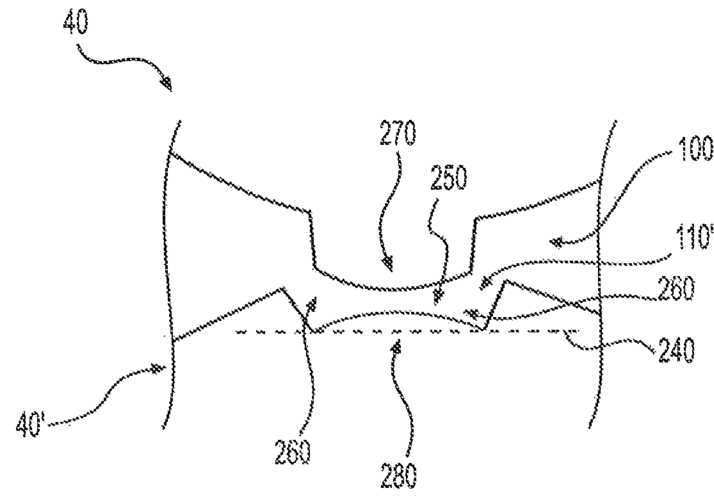
FIG. 22B is an enlarged view of a gear tooth and gap, according to an exemplary embodiment.

Surfaces 220, 230 may operate by providing additional compression or concentration of fuel 30 (not shown) at a specific location between teeth 100 and gap 110'. As shown in FIG. 22A, a first or select region 250 on the left side of gap 110' may have a higher concentration of fuel or fuel may experience greater compression compared with a second region 260 on the right side of gap 110'. In other embodiments, first region 250 may be variously located about teeth 100, gap 110', or a combination of both teeth 100 and gap 110'. For example, as shown in FIG. 22B, teeth 100 can include an arcuate surface 270 and gap 110' can include an arcuate surface 280. Arcuate surfaces 270, 280 can be configured to provide select region 250 approximately centered within gap 110', with second regions 260 located on either side. Moreover, at least one of surfaces 270, 280 may extend across teeth 100 and gap 110', as shown with different surfaces in FIGS. 18A-19B. In other embodiments, at least one of surfaces 270, 280 may extend partially across teeth 100 and gap 110', as shown with different surfaces in FIGS. 20A-21B.

As shown in FIG. 22B, the inter-digitation of the gears 40, 40' can form an hour-glass or pinched shape. Material immediately adjacent to the neck or waist of the hour-glass (region 280) may be formed by a highly stable or hardened material that may be an insulator such as a ceramic. For example, the central regions of surfaces 270, 280 may be stabilized or hardened. Material adjacent to the non-waist or bulb portions of gears 40, 40' may comprise materials that have more conductive properties, such as a metal such of a transition, inner transition, rare earth, Group 13, Group 14, and Group 15 metal or an alloy of at least two such metals. The waist portion of surfaces 270, 280 may compress select region 280 and the current may pass between the non-waist or bulb regions to be concentrated in the waist region. Thereby, the current density can be increased in select region 280 comprising the waist such that the detonation threshold is achieved. The waist can be protected from damage from the reaction by the resistance to erosion of the waist material comprising the hardened material. The non-waist or bulb regions comprised of a conductor are in contact with a non-selected fuel region wherein the fuel intervening between the reaction products and these corresponding gear surfaces can protect these surfaces from erosion by the reaction and its products.

Figure 22C:
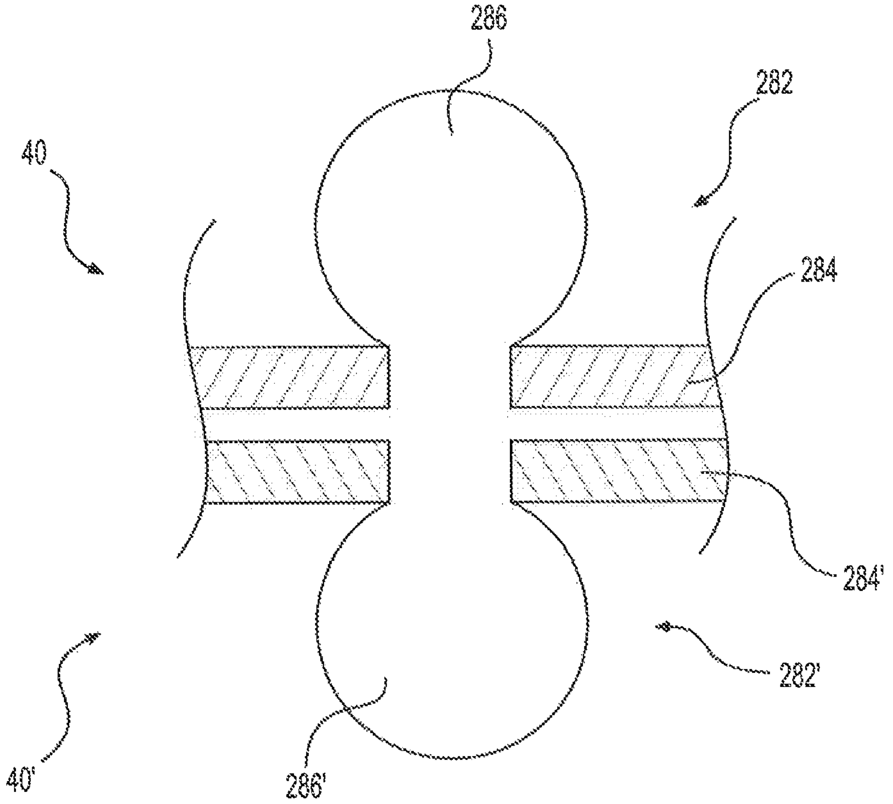
FIG. 22C is an enlarged view of a gear tooth and gap, according to an exemplary embodiment.

Other variants on the hour-glass configuration include the embodiment shown in FIG. 22C. As shown, gear 40 includes a chamber 286 surrounded by a conductive material 282, such as a metal. Gear 40 also includes a surface material 284 configured to withstand the plasma formation. In some embodiments, material 284 can include a ceramic. Likewise, gear 40' can include a chamber 286' surrounded by material conductive 282' and including surface material 284'.

In operation, gears 40, 40' in FIG. 22C may move to substantially align as shown. Then, with fuel (not shown) compressed within chambers 286, 286', a current may be applied longitudinally through chambers 286, 286' from gear 40 to gear 40'. In particular, the current may flow through the fuel in chamber 286, past surface material 284, past surface material 284', and into chamber 286'. Unreacted fuel may remain within chambers 286, 286' in order to at least partially protect conductive materials 282, 282' from the reaction products. In addition, surface materials 284, 284' may be configured to withstand the reaction products more effectively than materials 282, 282'. Consequently, gears 40, 40' shown in FIG. 22C may have a longer working life than gears 40, 40' formed of only materials 282, 282'.

Figure 23A:
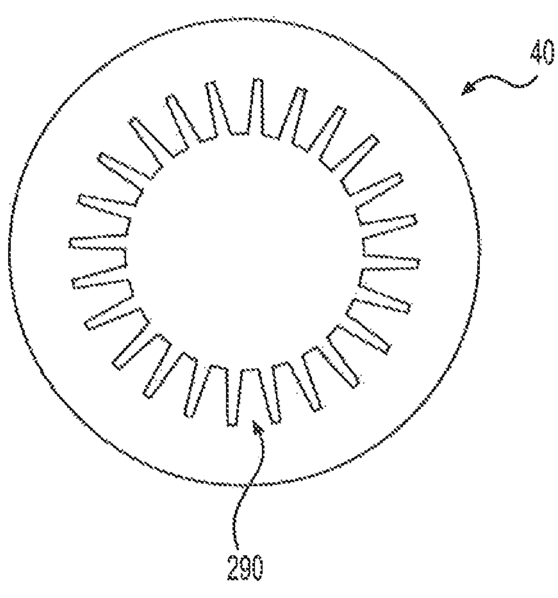
FIGS. 23A and 23B are cut-away views of gears, according to exemplary embodiments.
Figure 23B:
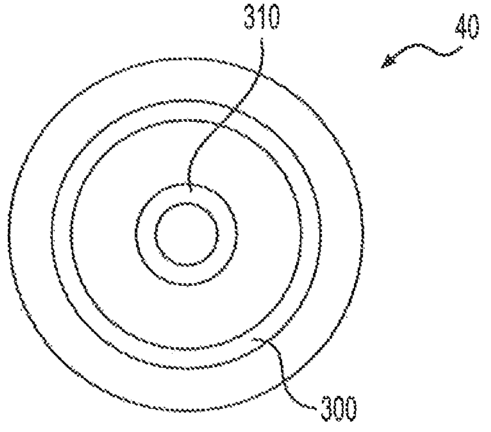

In some embodiments, gear 40 may require cooling to dissipate heat generated by a reaction. Accordingly, gear 40 may include one or more conduits configured to receive a coolant. The coolant may comprise water or other liquid such as solvent or liquid metals known to those skilled in the art. These conduits may be configured for high heat transfer. For example, a conduit 290 may include a large surface area to aid heat transfer, as shown in FIG. 23A. In other embodiments, multiple conduits 300, 310 may be formed within an internal structure of gear 40, as shown in FIG. 23B.

Figure 24:
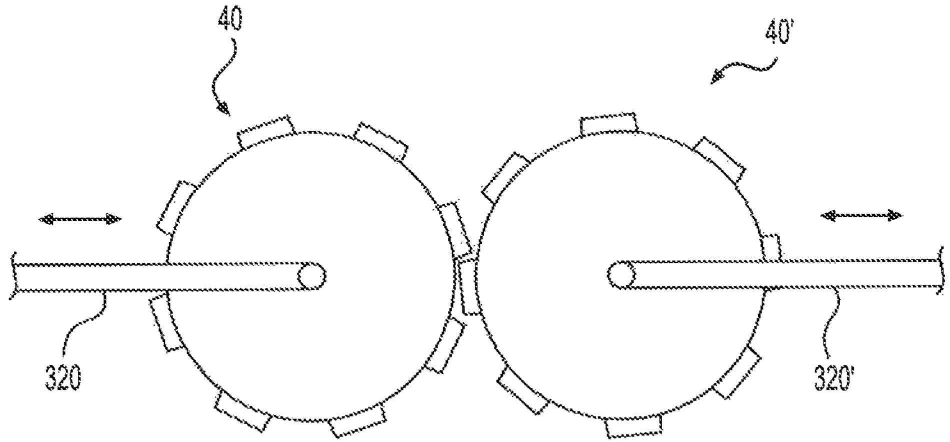
FIG. 24 is a schematic view of a motion system, according to an exemplary embodiment.

One or more gears 40, 40' may also include a motion system 320, 320', as shown in FIG. 24. Motion system 320, 320' can be configured to move one or more gears 40, 40'. For example, motion system 320 could move gear 40 left or right as shown in FIG. 24. Such movement towards or away from gear 40' may compress or concentrate fuel 30 (not shown) located between gear 40 and gear 40'. It is also contemplated that motion system 320 may include a dampener, such as a spring, configured to absorb some of the shock produced by the reaction. Other devices and systems could also be configured to improve gear functioning or lifetime.

In another embodiment, one or more gears 40 are movable by a fastened mechanism, such as, for example, a reciprocating connecting rod attached and actuated by a crankshaft. This may be similar to a system and method of a piston system of an internal combustion engine. For example, as the opposing electrode portions of gears 40, 40' rotate into the opposing mated position, the opposing electrodes are driven together in compression. They may move apart following ignition by the fastened mechanism. The opposing electrodes may be any desired shape and may be selectively electrified to cause at least some of fuel 30 to undergo greater compression in the selected region or the current density to be greater in the selected region. The opposing electrodes may form a semispherical shell that compresses the fuel with the greatest compression in the center (see FIG. 22B). The highest current density may also be at the center to selectively achieve the threshold for denotation in the center region. The expanding plasma may flow out the open portion of the semispherical shell. In another embodiment, the opposing electrodes may form the hour-glass shape wherein the selected region may comprise the waist or neck of the hour-glass (see FIG. 22C).

Figure 25:
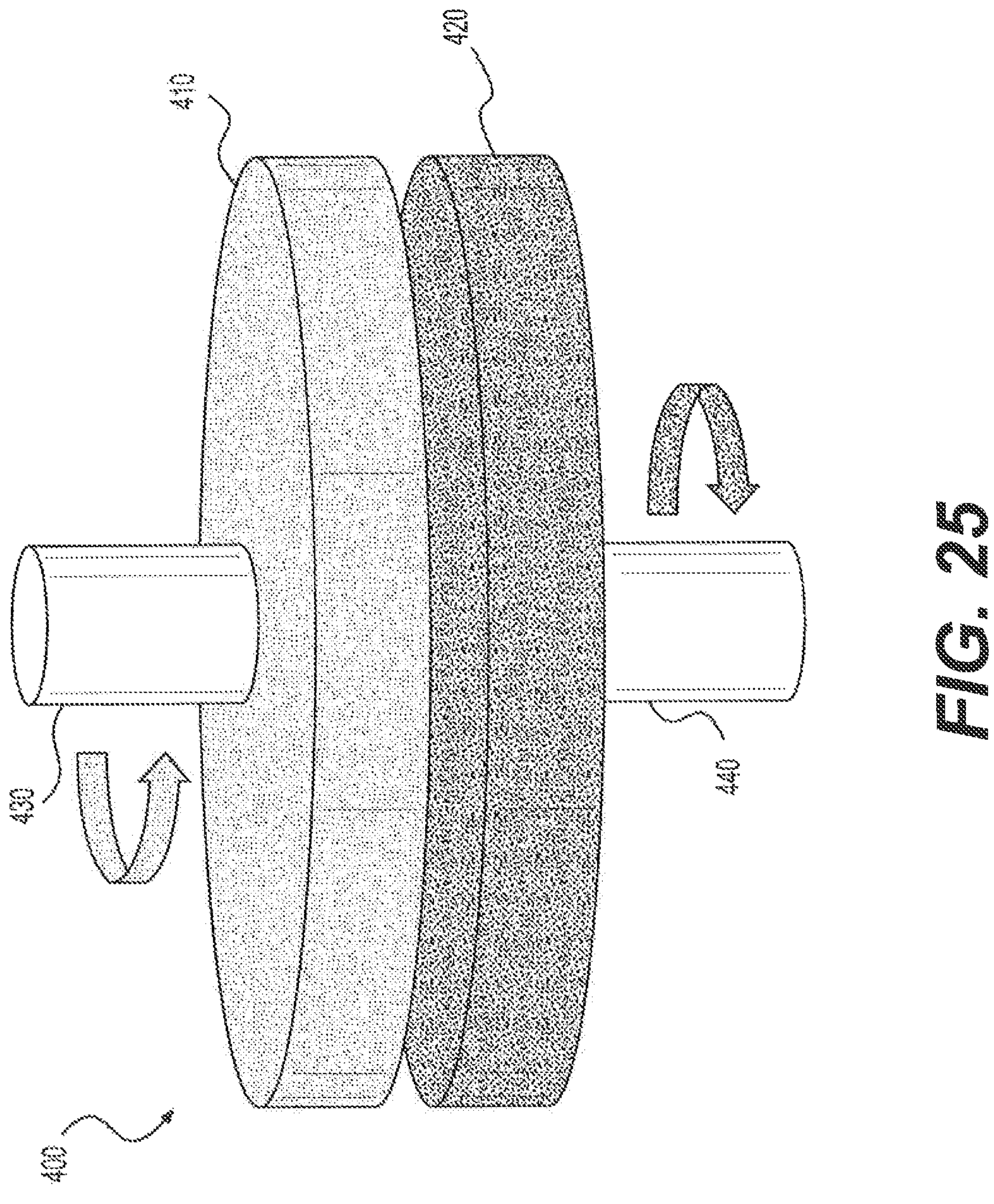
FIG. 25 is a schematic view of support members, according to an exemplary embodiment.

It is also contemplated that system 10 can include other components to function in a similar manner to gears 40. For example, in some embodiments system 10 could include one or more support members 400 (FIG. 25). It also contemplated that one or more gears 40, members 400, or similar components could be used in combination in a single system, or parts of each component used within a system.

As shown in FIG. 25, a first support member 410 can be located generally adjacent to a second support member 420, with shaft 430 co-axially aligned with shaft 440. Also shown by the arrows in FIG. 25, when viewed from above, first support member 410 can rotate in an anti-clockwise direction and second support member 420 can rotate in a clockwise direction. In addition, first support member 410 can be coupled to a first shaft 430 and second support member 420 can be coupled to a second shaft 440. One or more support members 400 can be variously coupled to permit rotational movement. For example, one support member 400 may rotate while another may remain stationary. One or more support members 400 may also move on a periodic basis, continuously, or be controlled to move at one or more different speeds.

Similar to gears 40 described above, support members 400 may be configured to permit a reaction to occur as provided herein. Support members 400 may include one or more contact elements, described below, configured to permit a reaction to occur. The reaction can be initiated via application of a high electrical current. For example, an electrical current could be applied across two contact elements in close proximity to each other. Such "contact" may not include physical contact between elements, but should be close enough to permit a flow of electrical current from one contact element to another. This current can flow through a fuel described herein, such as, for example, a powder comprising a metal and a metal oxide. Similar to gears 40 described above, at least part of support member 400 may be conductive.

Figure 26:
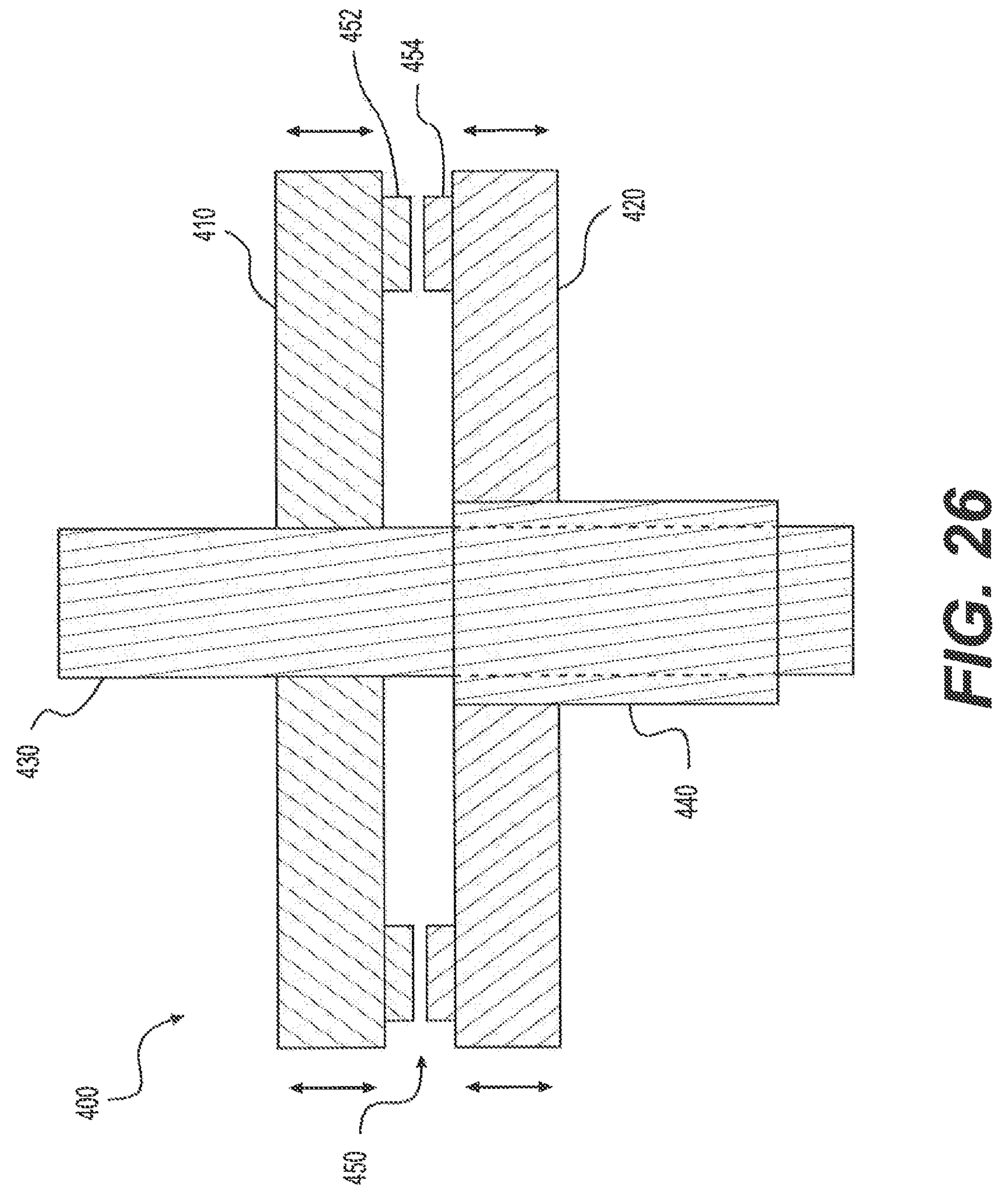
FIG. 26 is a cut-away view of support members, according to an exemplary embodiment.

FIG. 26 shown shafts 430, 440, according to an exemplary embodiment. In this embodiment, shaft 430 is co-axially aligned with and extends through at least part of shaft 440. Such a configuration could permit relative rotation between support members 410, 420. FIG. 26 also shows support members 410, 420 with one or more contact elements 450. As described above, contact elements 450 may be configured to interact each other, or another structure, to provide a region where a reaction described herein can occur. Interaction may include physical contact, close contact, or one element being located from the other by a distance configured to permit a current flow from one element to the other. For example, a first contact element 452 may be in the vicinity of a second contact element 454, and a voltage may be applied across elements 452, 454 sufficient to pass a current through fuel to create an energetic reaction. Release of energy from such a reaction may deflect support member 410 and/or support member 420, as shown by the arrows in FIG. 26. Such deflection may provide an energy absorption mechanism to absorb some of the energy released by the reaction.

Figure 27:
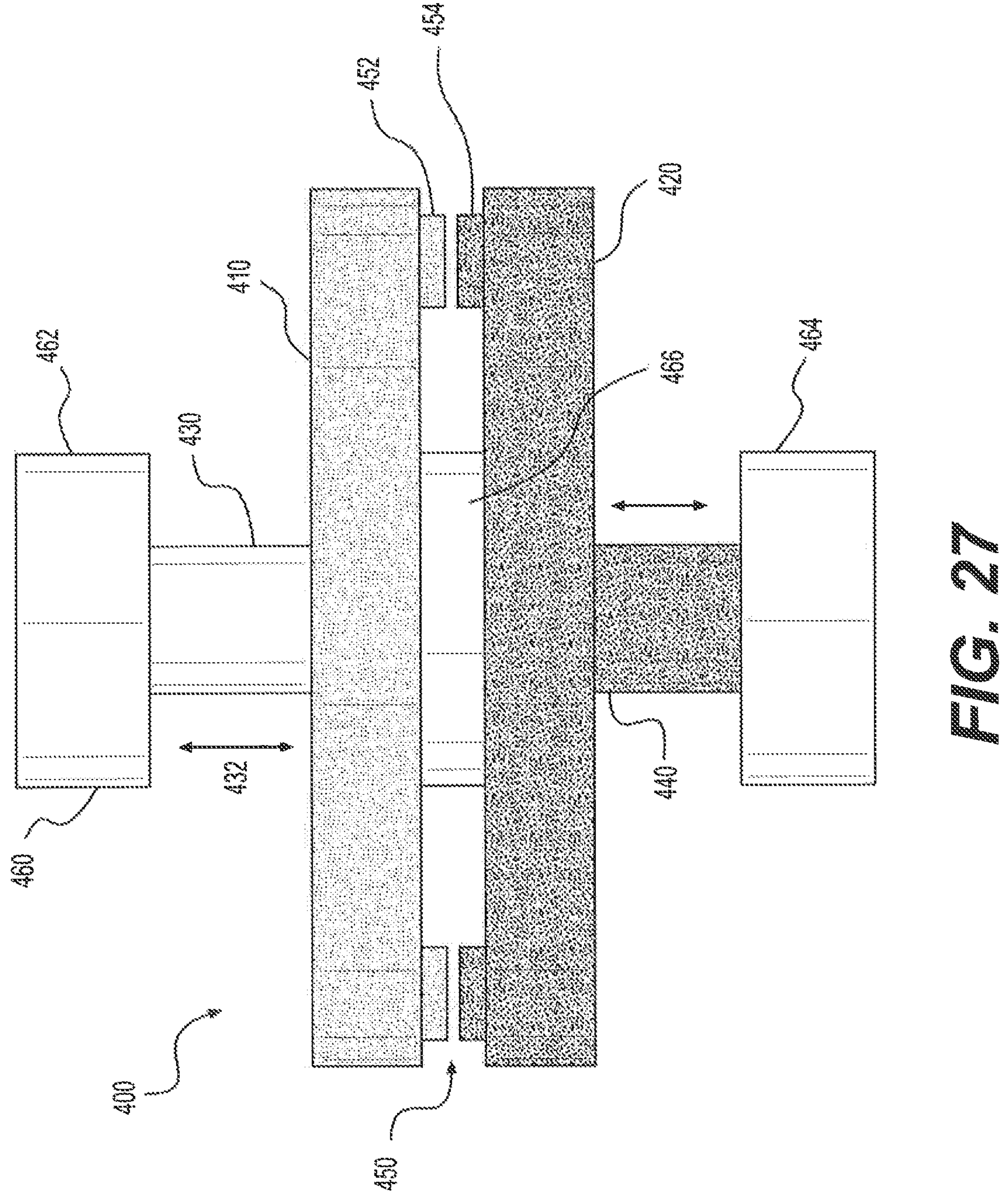
FIG. 27 is a cut-away view of support members, according to an exemplary embodiment.

FIG. 27 shows support members 400, according to another exemplary embodiment that includes one or more couplers 460. Coupler 460 may include a range of devices or systems configured to permit movement of one or more support members 400. For example, coupler 460 could include a gear, pulley, or other device configured to transmit rotational movement to shaft 430. In particular, coupler 460 may be coupled to a motor (not shown), such as an electric, mechanical, or other type of motor configured to produce movement. Coupler 460 may also include a clutch, break, or similar mechanism to control rotational movement of support member 400. Coupler 462 may also include an active or passive dampener to absorb at least some of the forces applied to support member 410, shaft 430, or first contact element 452. Forces applied to first support member 410 or first shaft 430 can result in the movement of either component as shown by arrow 432. Such vertical movement could occur if energetic reactions between contact elements 450 apply significant forces to support member 410. An active dampening system can include a processor (not shown) configured to permit such movement or provide a counteracting force to partially reduce such movement. A passive dampening system could include a spring, elastomer, or other device configured to absorb some of the forces applied.

As shown, a first coupler 462 is mechanically coupled to first shaft 430 and a second coupler 464 is mechanically coupled to second shaft 440. One or more than two couplers 460 may be used with support members 400. It is also contemplated that one or more couplers 460 may be positioned between shafts 430, 440 and corresponding support members 410, 420. In addition, a third coupler 466 may be located between support members 400. Third coupler 466 may include a thrust bearing or similar device configured to allow rotational movement of one or more support members 400 under high compressive loads. If highly energetic reactions occur, support members 400 may be placed under high compressive loads in order to counter the effects of the large forces applied to support members 400. Consequently, couplers 462, 464 may transmit compressive loads to shafts 430, 440, and support members 410, 420.

Figure 28:
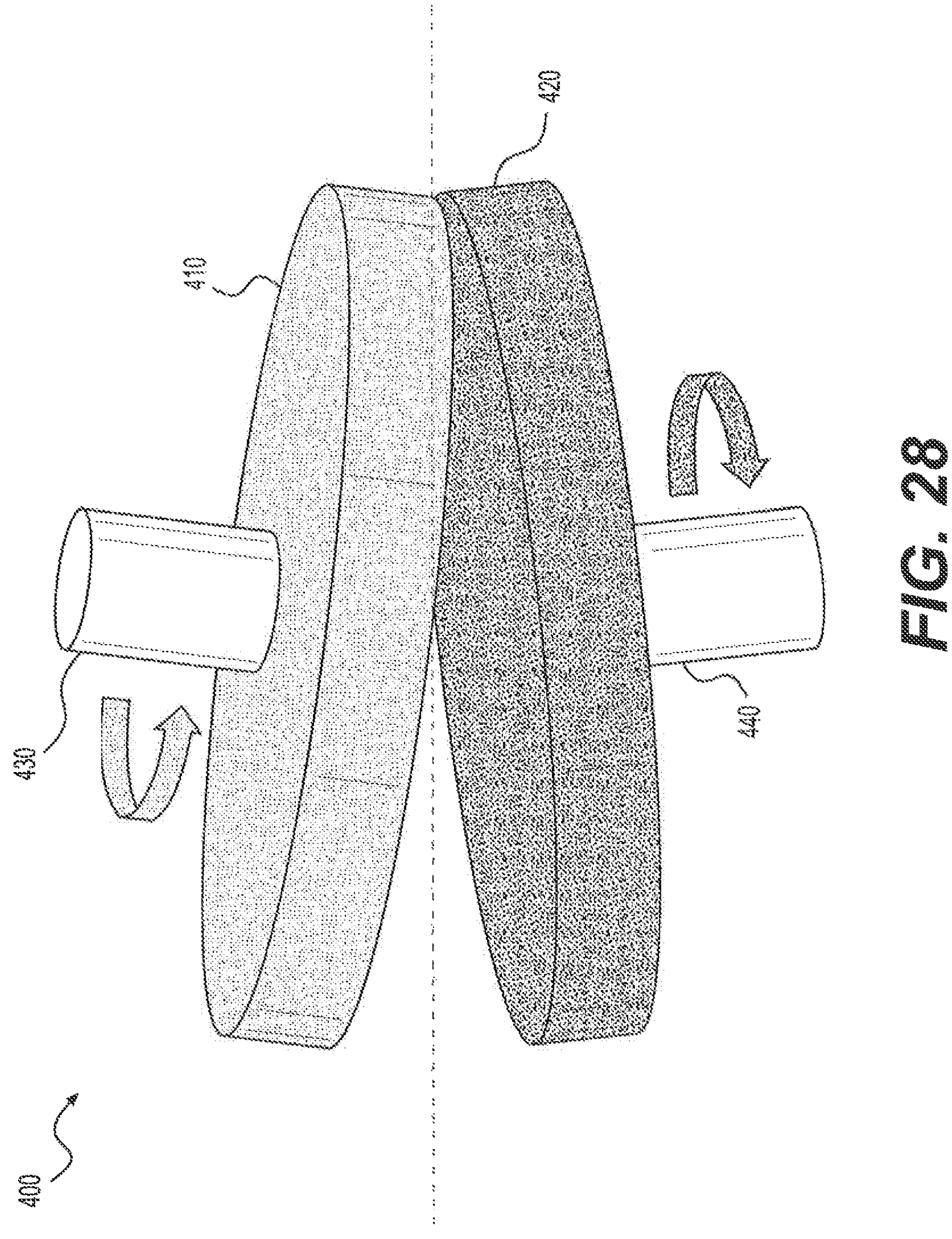
FIG. 28 is a schematic view of support members, according to an exemplary embodiment.

FIG. 28 illustrates another embodiment of support members 400, whereby shafts 430, 440 are off-axis. As shown, support members 410, 420 are not parallel to each other, but are positioned at an angle such that the distance between contact elements is less on the right side and greater on the left side. Such asymmetry allows contact elements (not shown) to interact more readily with each other for purposes of creating a reaction on the right side while allowing the left side region to be generally free of any similar reaction.

Figure 29:
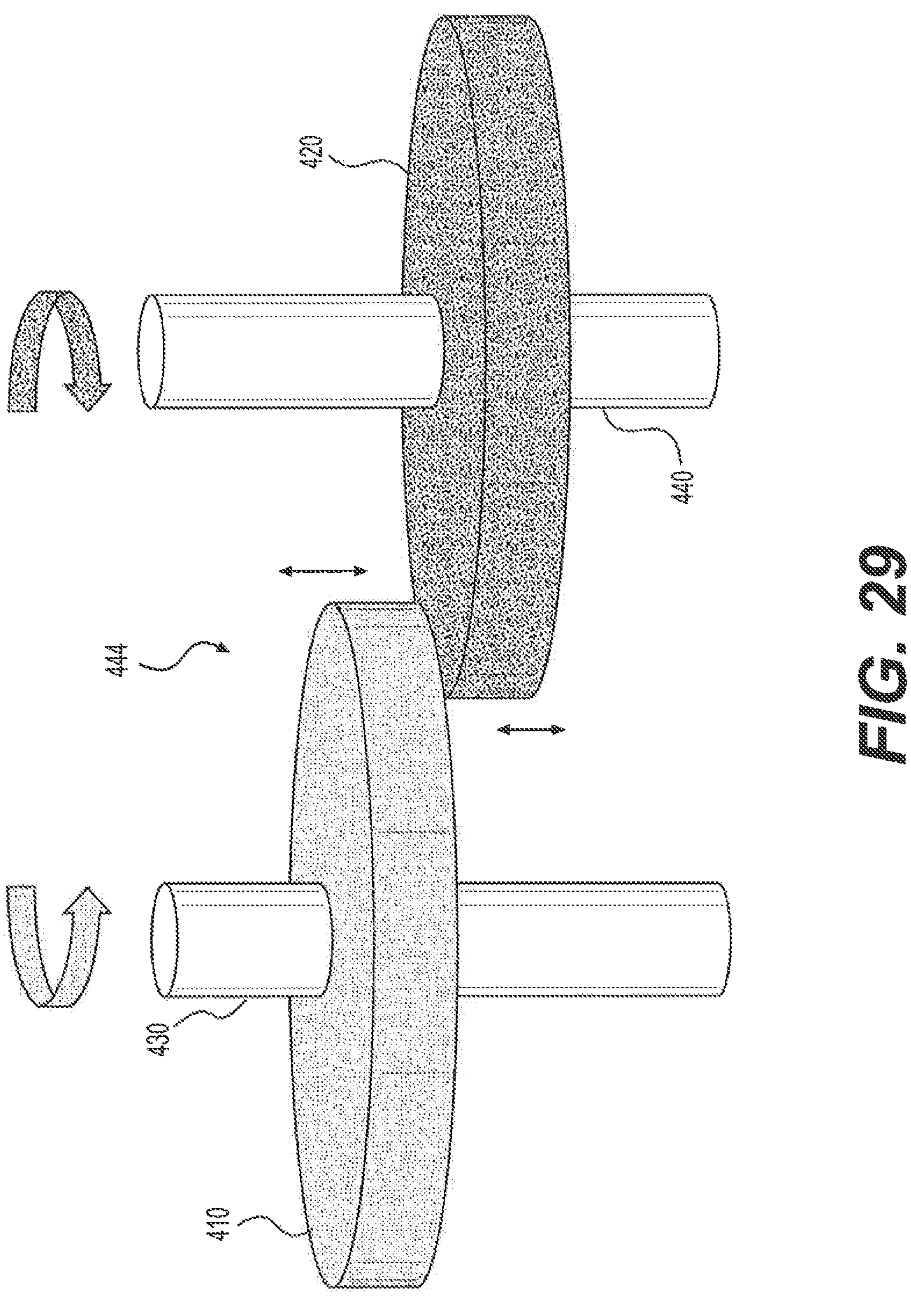
FIG. 29 is a schematic view of support members, according to an exemplary embodiment.

In another embodiment, support members 410, 420 can be arranged as shown in FIG. 29. Here, shafts 430, 440 are off-axis and parallel to each other. Such an arrangement can permit support members 410, 420 to overlap, as shown in a central region 444. A reaction can occur within region 444, again with high energy release. Forces generated by the reaction may be partially absorbed by flexing of support members 410, 420, and/or the mechanisms described above in FIG. 27. A coupler (not shown) used in conjunction with shafts 430, 440 as shown in FIG. 29, may include a radial thrust bearing to operate with the lateral forces generated on shafts 430, 440.

Figure 30:
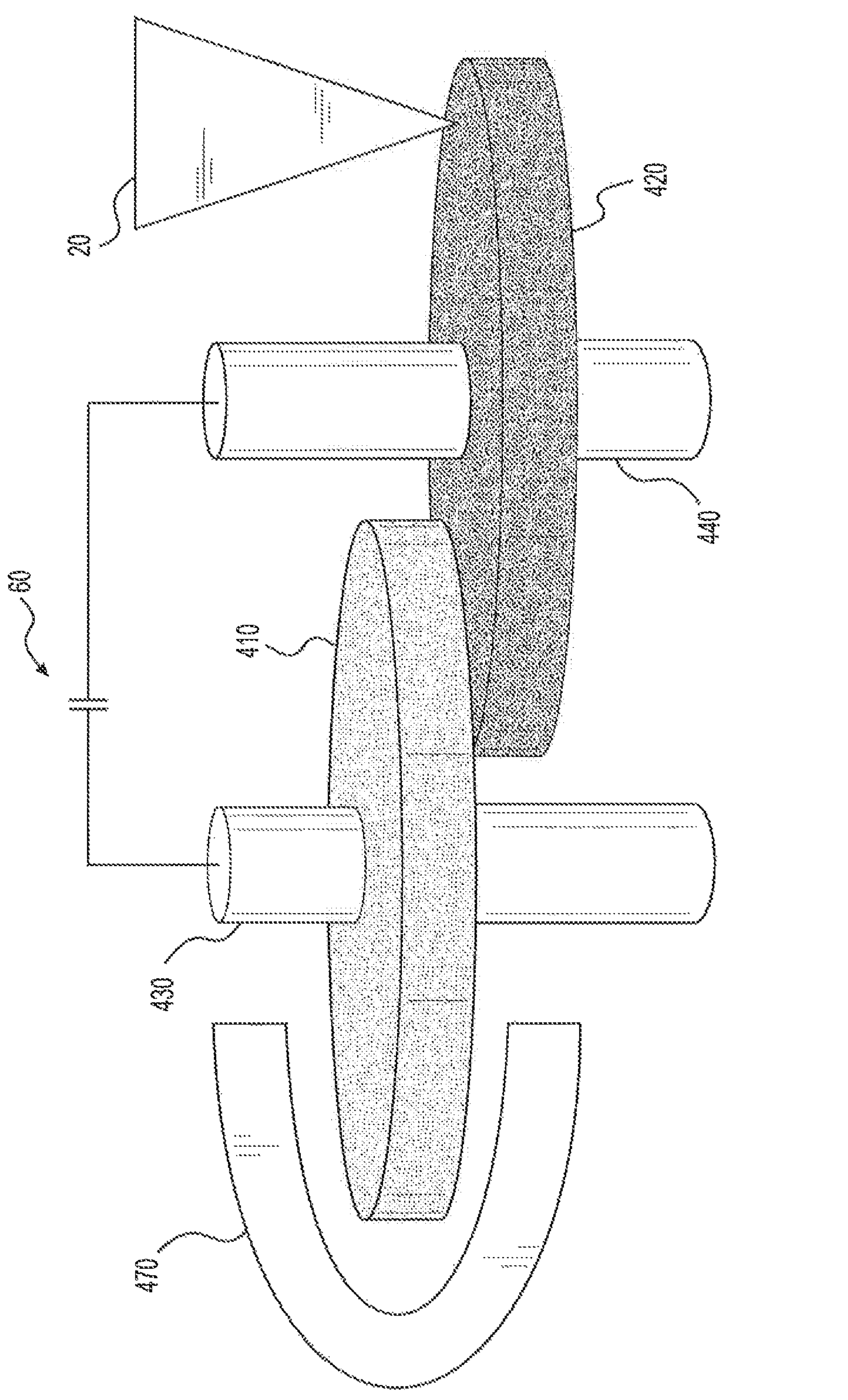
FIG. 30 is a schematic view of support members, according to an exemplary embodiment.

Support members 400 can also be supplied with fuel using one or more fuel supplies 20, as shown in FIG. 30. Fuel supply 20, as described above, can provide various types of fuel described herein to select regions of one or more support members 400. One or more operation elements 470 can also be provided. Operation element 470 can be configured to at least one of monitor, clean, control, or at least partially regenerate support member 400. For example, operation element 470 could include a camera operating in a visual, infra-red, ultra-sound, or other wavelength to inspect support member 400. Such inspection could provide an early warning system to alert system 10 that support member 400 is not operating appropriately, requires maintenance, or is likely to fail. Element 470 could also include a brush, nozzle, scraper, or other device configured to at least partially clean support member 400. Operation element 470 may control a speed of support member 400 or a force applied to support member 400 or operate as a brake.

Element 470 may also include devices to at least partially regenerate support member 400. For example, element 470 could include devices to reapply a surface to support member 400, or subject support member 400 to heating or cooling to permit partial repair of support member 400. Element 470 could be configured to apply a protective coating on member 400, which may be followed by a heating or cooling step to fix and set the coating. Routine maintenance could also be performed using operation element 470.

Operation of one or more support members 400 requires the presence and operation of one or more contact elements 450, which are described below in detail. Similar to teeth 100 and gaps 110 of gear 40, as described above, contact elements 450 are configured to interact to provide a region for a reaction involving fuel 30. Similar to above, one or more support members 400 may also be coupled to one or more power supplies 60 configured to provide power to one or more support members 400.

Figure 31B:
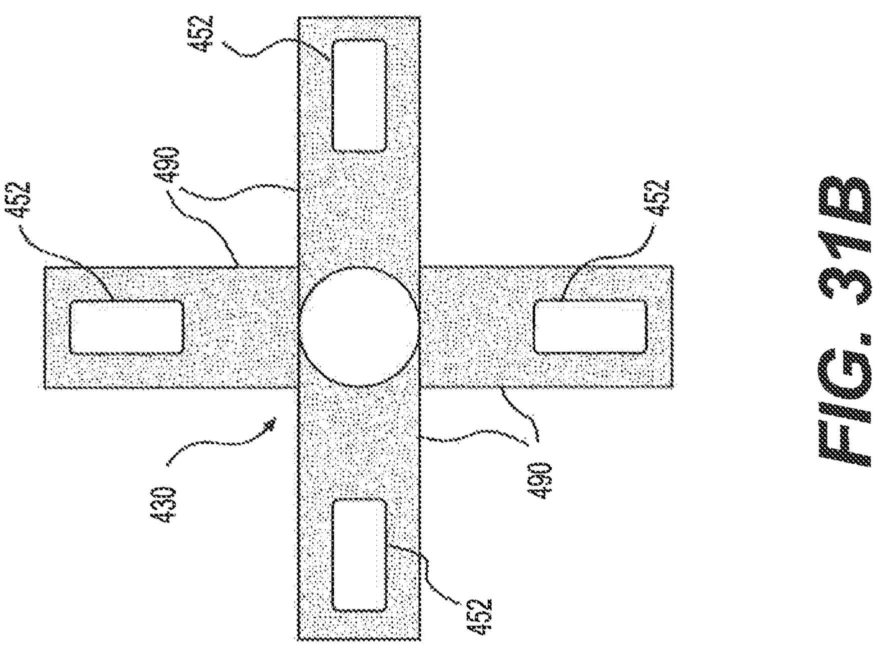
FIGS. 31A and 31B are underneath views of support members, according to an exemplary embodiment.
Figure 31A:
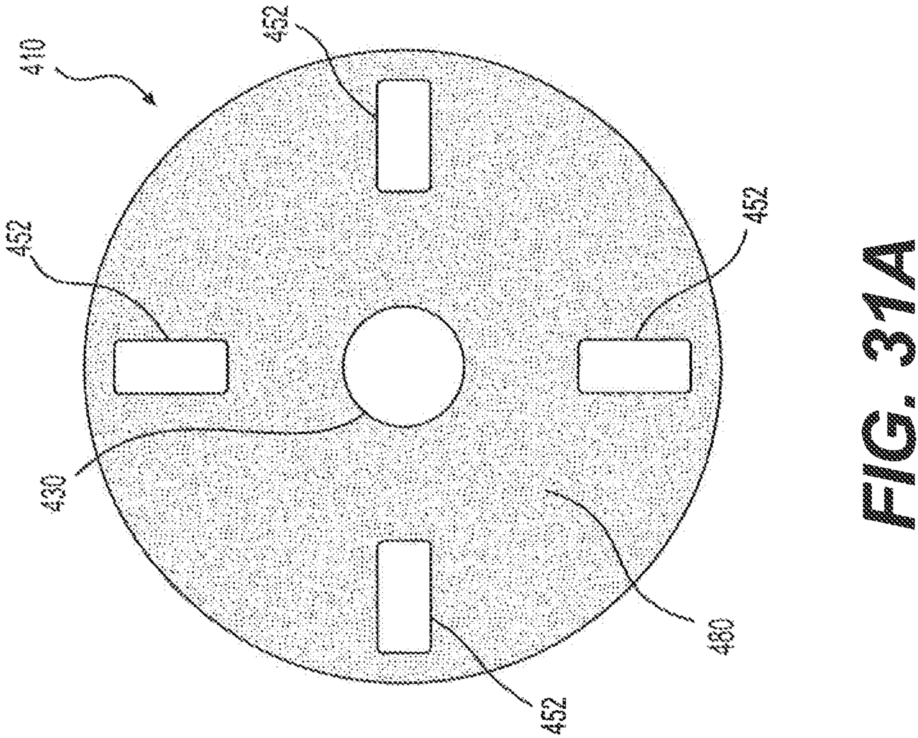

In some embodiments, support member 400 can be generally circular, as shown in FIG. 31A, showing an underside surface 480 of support member 410. Member 400 can also be any suitable shape or dimension. Surface 480 can include one or more first contact elements 452. As shown, contact elements 452 can be generally located about a periphery of surface 480. In other embodiments, one or more contact elements 452 can be variously located across surface 480. In other embodiments, as shown in FIG. 31B, support member 410 can include one or support elements 490 extending generally from shaft 430. Support elements 490 can be any suitable shape, size, or configuration to provide support for one or more first contact elements 452. In other embodiments, contact elements 450 can be located on a stationary surface.

Figures 32A, 32B, 32C, 32D:
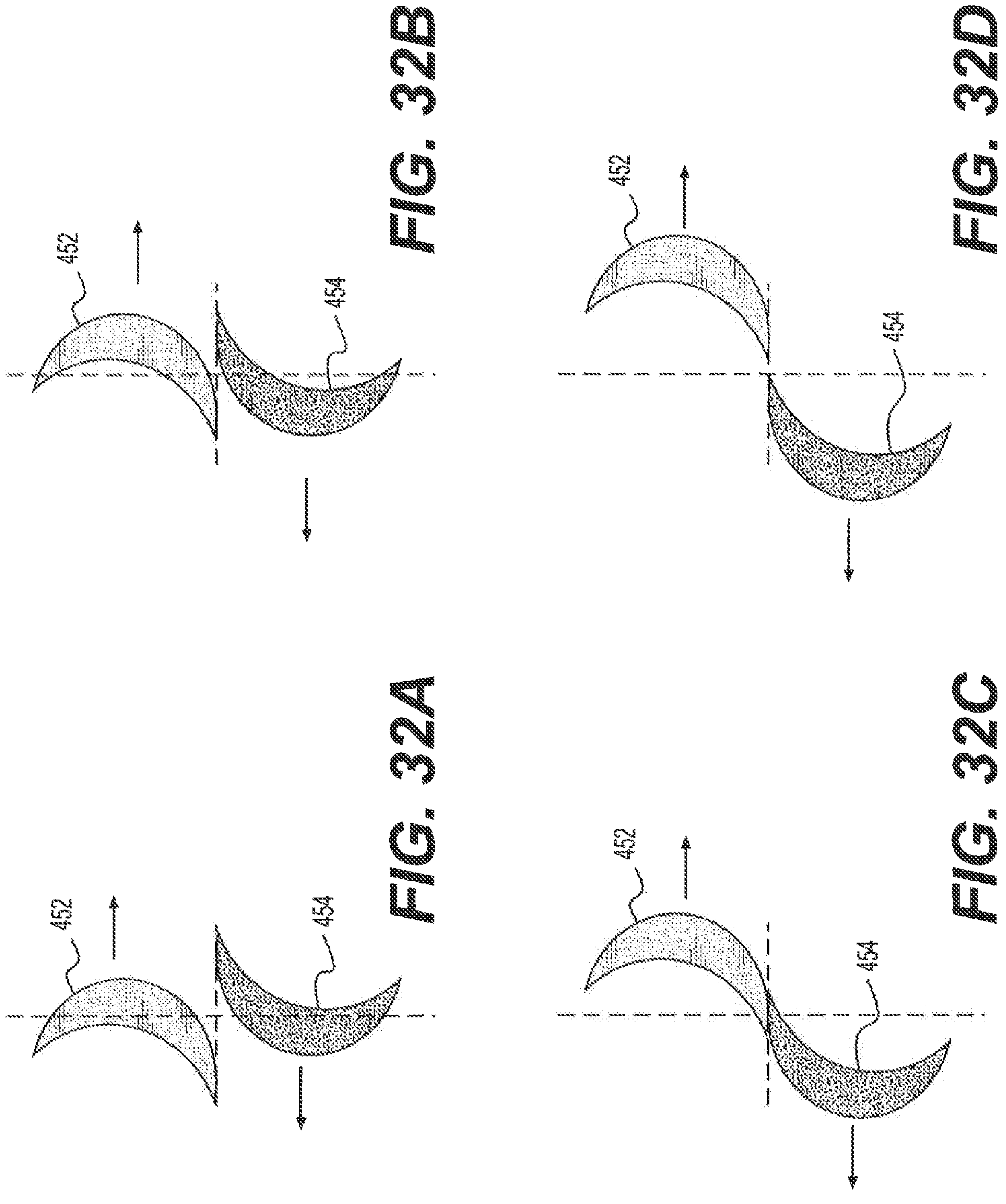
FIGS. 32A-D are views of contact elements in operation, according to an exemplary embodiment.
Figure 33:
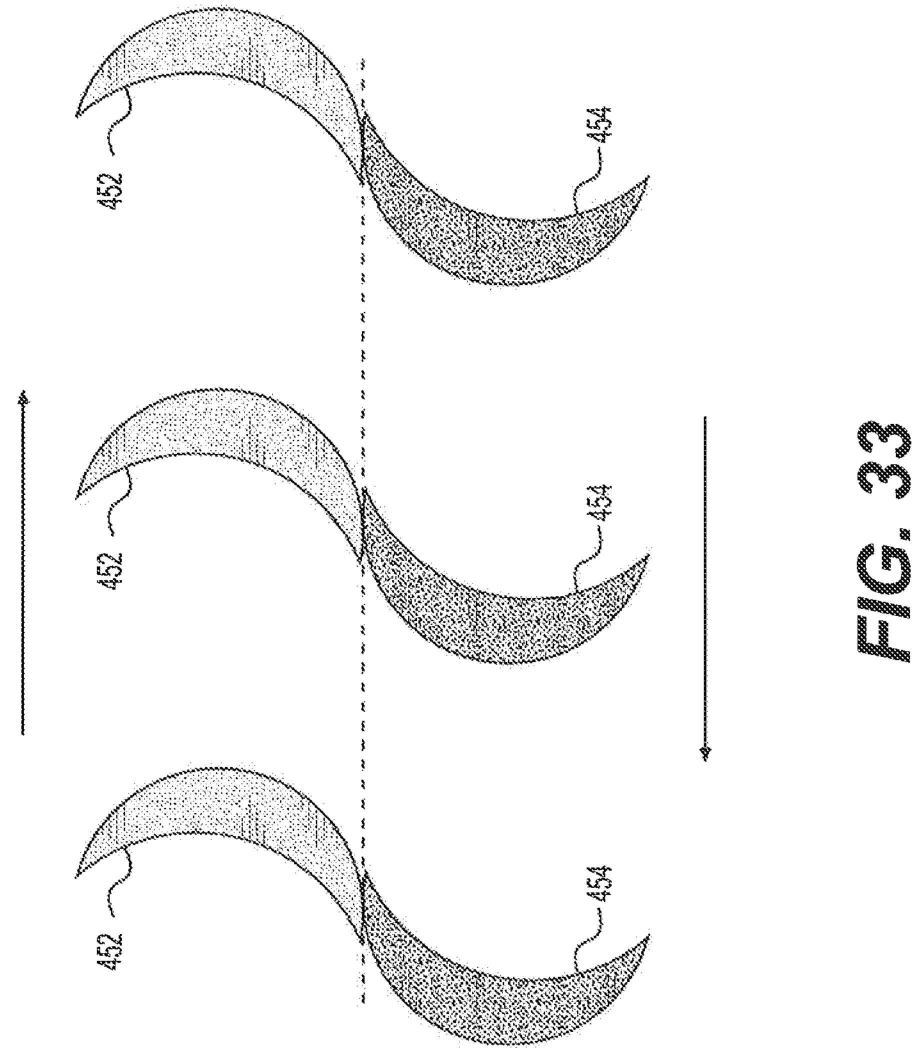
FIG. 33 is views of support members in operation, according to an exemplary embodiment.

FIGS. 32A-D show cut-away side views of contact elements 452, 454, according to one embodiment, moving relative to each other. As shown, contact element 452, coupled to support member 410 (not shown), moves right and contact element 454, coupled to support member 420 (not shown), moves left. In other embodiments, only one contact element 450 could move and the other may remain stationary. Initially, as shown in FIG. 32A, first contact element 452 is located above and to the left of second contact element 454. First contact element 452 moves right and second contact element 454 moves left such that a lower region of first contact element 452 is brought into close proximity to or physically contacts an upper region of second contact element 454. As explained below, this proximity (e.g., close contact) or physical contact can permit a reaction to occur. In another embodiment, one or more contact elements 452, 454 can interact each other simultaneously, as shown in FIG. 33.

Figure 34:
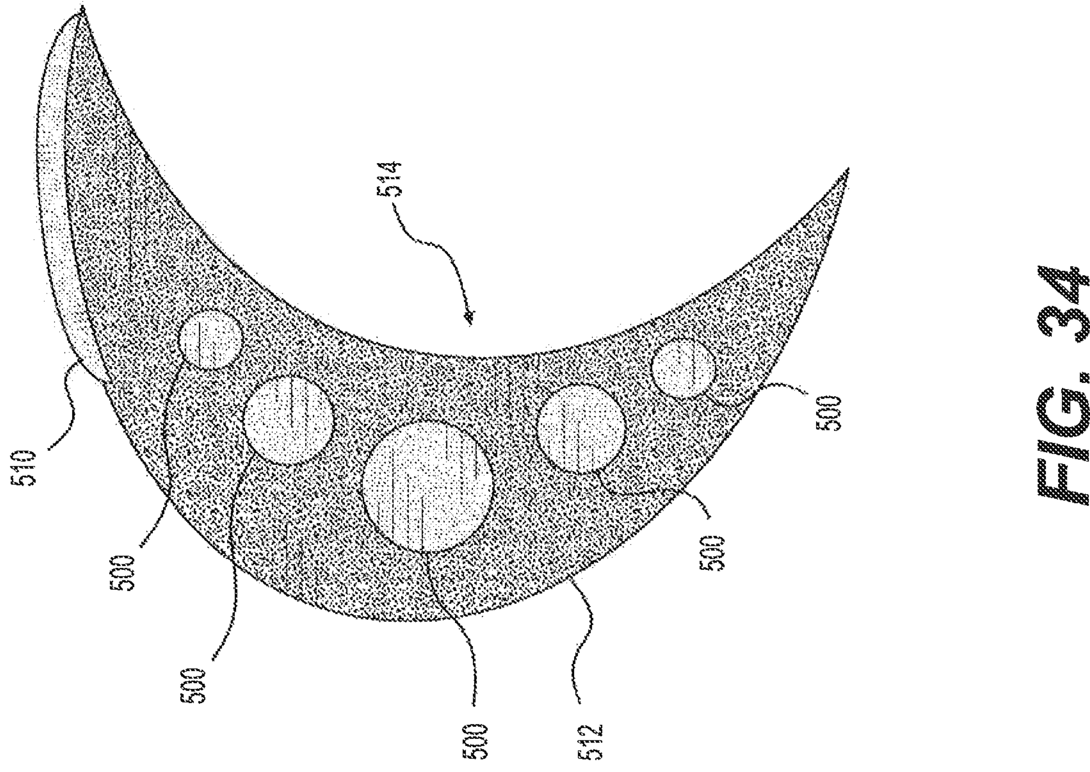
FIG. 34 is an enlarged cut-away view of a contact element, according to an exemplary embodiment.

FIG. 34 illustrates an enlarged cut-away view of contact element 450. As described above, contact element 450 can be variously coupled to or from part of support member 400. Contact element 450 can also include one or more lumens 500. One or more lumens could provide cooling to contact element 450, deliver fuel, or decrease weight of contact element 450. As described above for conduit 290, one or more lumens 500 could include a large surface area to aid heat transfer. Contact element 450 can also include one or more contact regions 510. Contact region 510 can include a material different to that of contact element 450. Contact region 510 could also be formed via a different process to that of contact element 450. Although not shown, other parts of contact element 450 could include one or more contact regions 510.

Contact element 450 can also include a leading edge 512 and a trailing edge 514. Although shown as curved, one or more edges of element 450 can be linear (e.g., see FIG. 36). Contact element 450 can be any suitable shape and size, depending on, for example, the structural requirements necessitated by the reaction conditions. In addition, contact element 450 may be variously coupled to support member 400 (not shown). Coupling can be via physical bonding (e.g., welding, adhesives), mechanical coupling (e.g., rivets, bolts, etc.), or other coupling mechanisms. It also contemplated that one or more contact elements are integral with one or more support members 400. Such one-piece construction, similar to blades in a turbine, may provide manufacturing advantages, weight advantages, enhanced tolerance to reaction conditions, and ease maintenance requirements. Hybrid, composite, and other constructions are also possible. Similar to as described above for gear 40, contact element 450 can be conductive and can include one or more conductive materials (not shown). Such conductivity may include general conductivity, or specific pathways or regions of element 450 may be conductive. Different sections of element 450 may also have different conductivities.

Figures 35A, 35B, 35C, 35D:
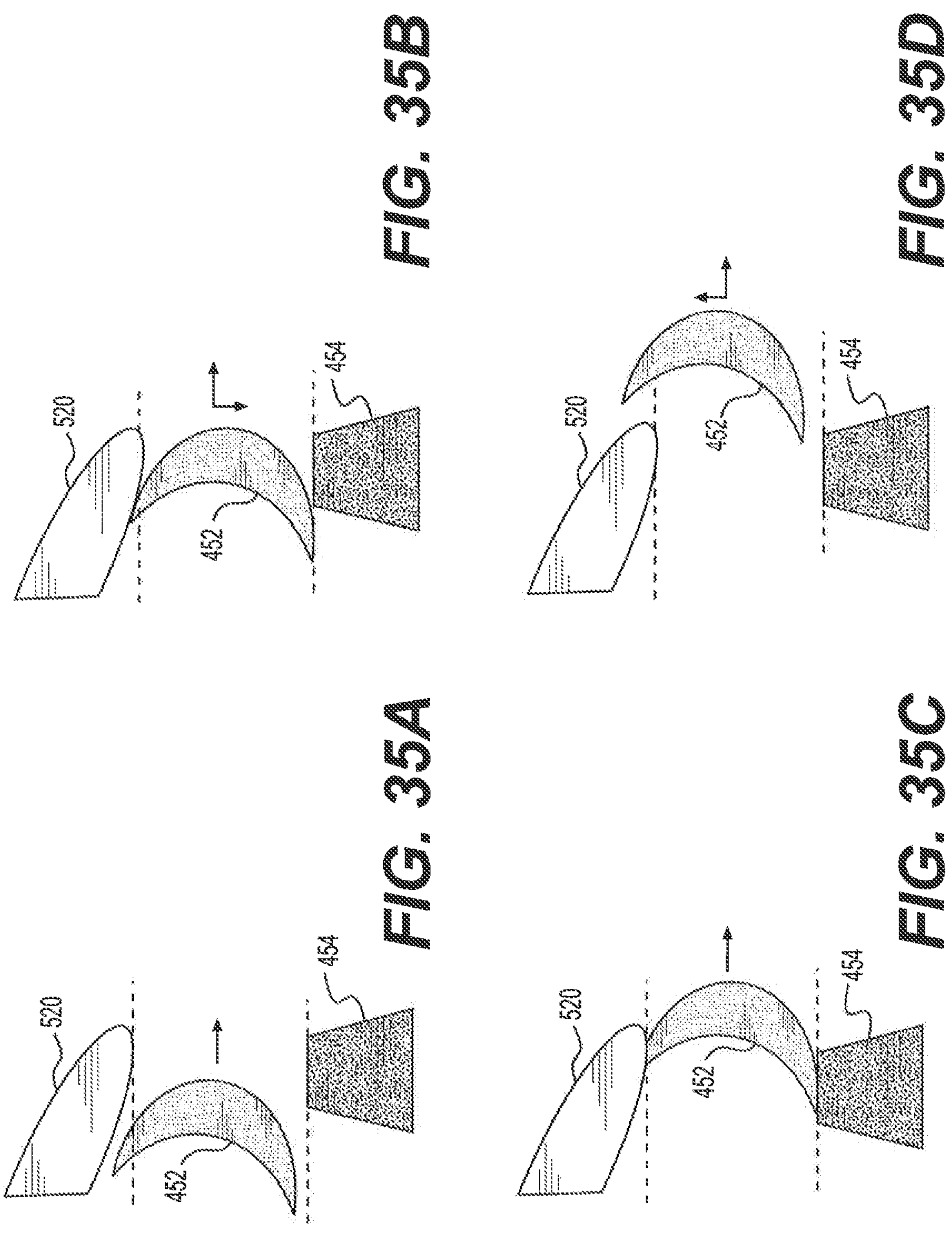
FIGS. 35A-D are views of contact elements in operation, according to an exemplary embodiment.

In some embodiments, such as, with support members 400 as shown in FIG. 25, deflection of one or more contact elements 450 may be required. For example, to allow a reaction to take place within a select region between one or more support members 400. In order to deflect contact element 450, a deflection member 520 may be used. Deflection member 520 may be positioned to at least partially deflect one or more contact elements 450. For example, as shown in FIGS. 35A-D, deflection member 520 may be positioned to alter a movement of contact element 452. As shown in FIG. 35A, contact element 452 can move right. Then, when in contact with deflection member 520 (FIG. 35B), contact element 452 can also move in a downward direction such that contact element 452 comes into contact with contact element 454. Once the two elements 452, 454 are in contact (FIG. 35C), a reaction can occur by applying a current across elements 452, 454. Following the reaction, contact element 452 can move past deflection member 520 and move in an upward direction, as shown in FIG. 35D.

Figures 36A, 36B, 36C:
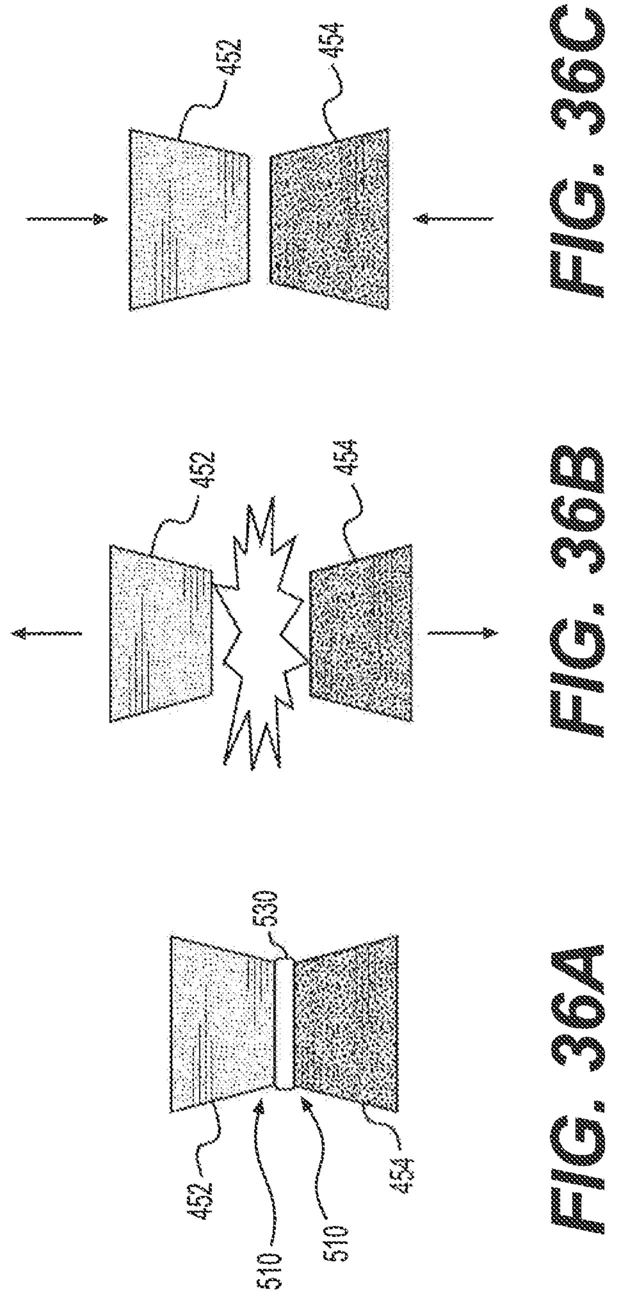
FIGS. 36A-C are views of contact elements in operation, according to an exemplary embodiment.

A reaction with contact elements 452, 454 and fuel, according to some embodiments, will now be described in detail. As shown in FIGS. 36A-C, a fuel layer 530 may be located generally between first contact element 452 and second contact element 454. Fuel layer 530 may extend at least partially across contact region 510 of first contact element 452 and/or second contact element 454. Fuel layer 530 may comprise various materials, including fuel 20, and may be deposited using various devices and methods, as described herein. Fuel layer 530 may also be located generally between contact elements 452, 454 as physical contact with either or both elements may not be required (FIG. 36A).

Following appropriate positioning of fuel layer 530 between contact elements 452, 454, a current may be applied across contact elements 452, 454. Part or all of contact elements 452, 454 may be conductive, similar to described above for gear 40. For example, one or more conductive materials may be provided within or about contact elements 452, 454. The voltage and current applied is described herein, and can be dependent on the type of fuel 20 contained with fuel layer 530. Following the current application, a high energy reaction can occur, moving contact elements 452, 454 apart (FIG. 36B). The extent of any movement will depend on a number of factors, including, for example, energy and power released by the reaction, shape, size, and material of contact elements and any supporting structure.

As shown in FIG. 36C, following the reaction, contact elements 452, 454 can move toward each other. The movement may be highly dampened, depending on associated structures and devices, as explained above with regard to FIG. 27. It some aspects, some oscillating movement may occur.

Figures 37A, 37B, 37C:
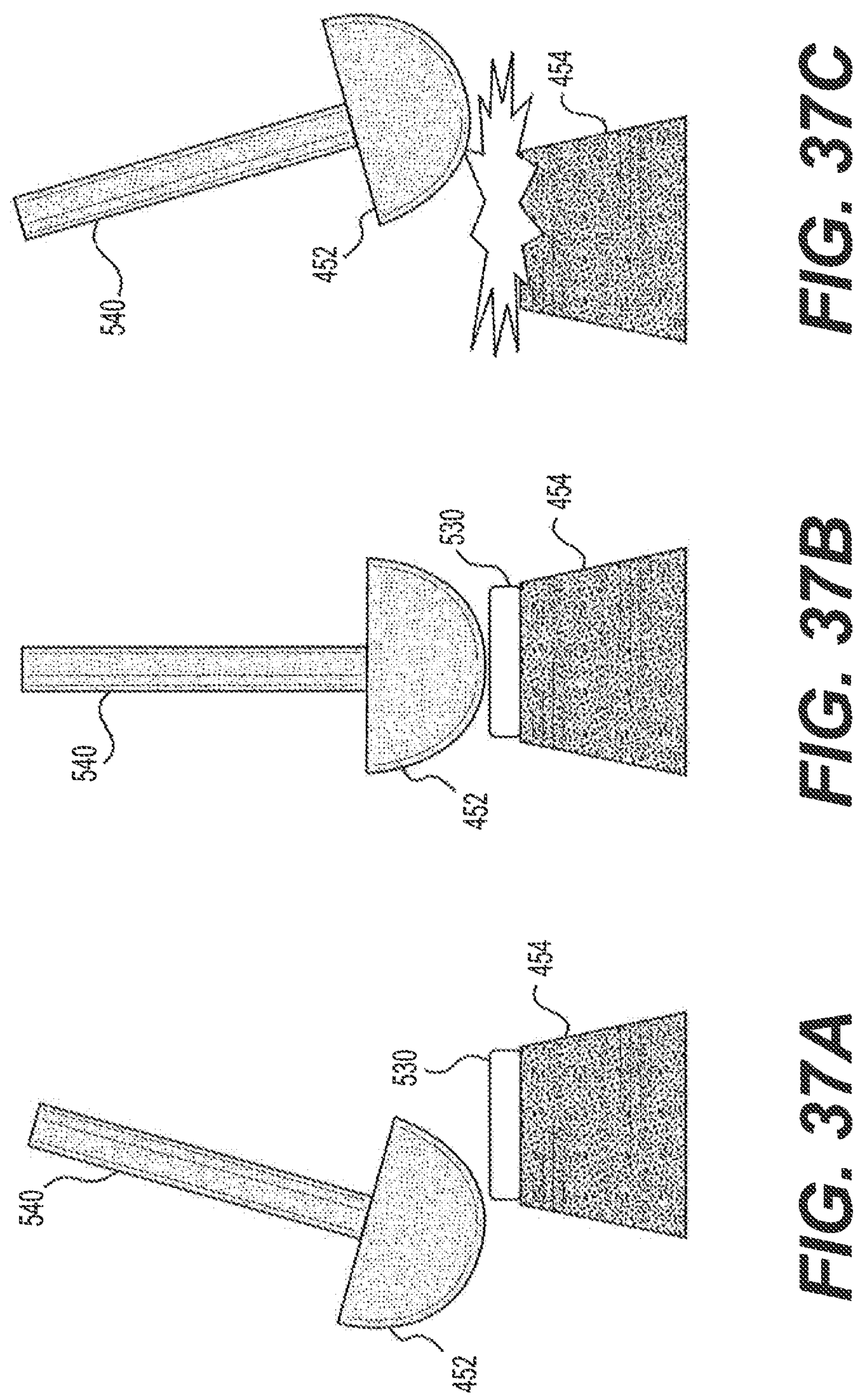
FIGS. 37A-C are views of contact elements in operation, according to an exemplary embodiment.

While the embodiments described above include rotational movement between contact elements 450, it is also contemplated that other types of movement may be used. For example, a reciprocating movement may be used. FIGS. 37A-C shows an example of reciprocating movement where contact element 452 is coupled to a pendulum 540. In operation, pendulum 540 moves back and forth over second contact element 454. Before contact elements 452, 454 interact with each other, fuel layer 530 may be generally located between elements 452, 454 (FIG. 37A). When first contact element 452 is approximately positioned adjacent to or over second contact element 454 (FIG. 37B), a current may be applied across contact elements 452, 454. The resulting energy release may force first contact element 452 to swing away from the second contact element 454 (FIG. 37C), with some of the energy released being absorbed by pendulum 540 and the movement of contact element 452. Pendulum 540 may then swing back again, and the cycle may be repeated.

Figures 38A, 38B, 38C:
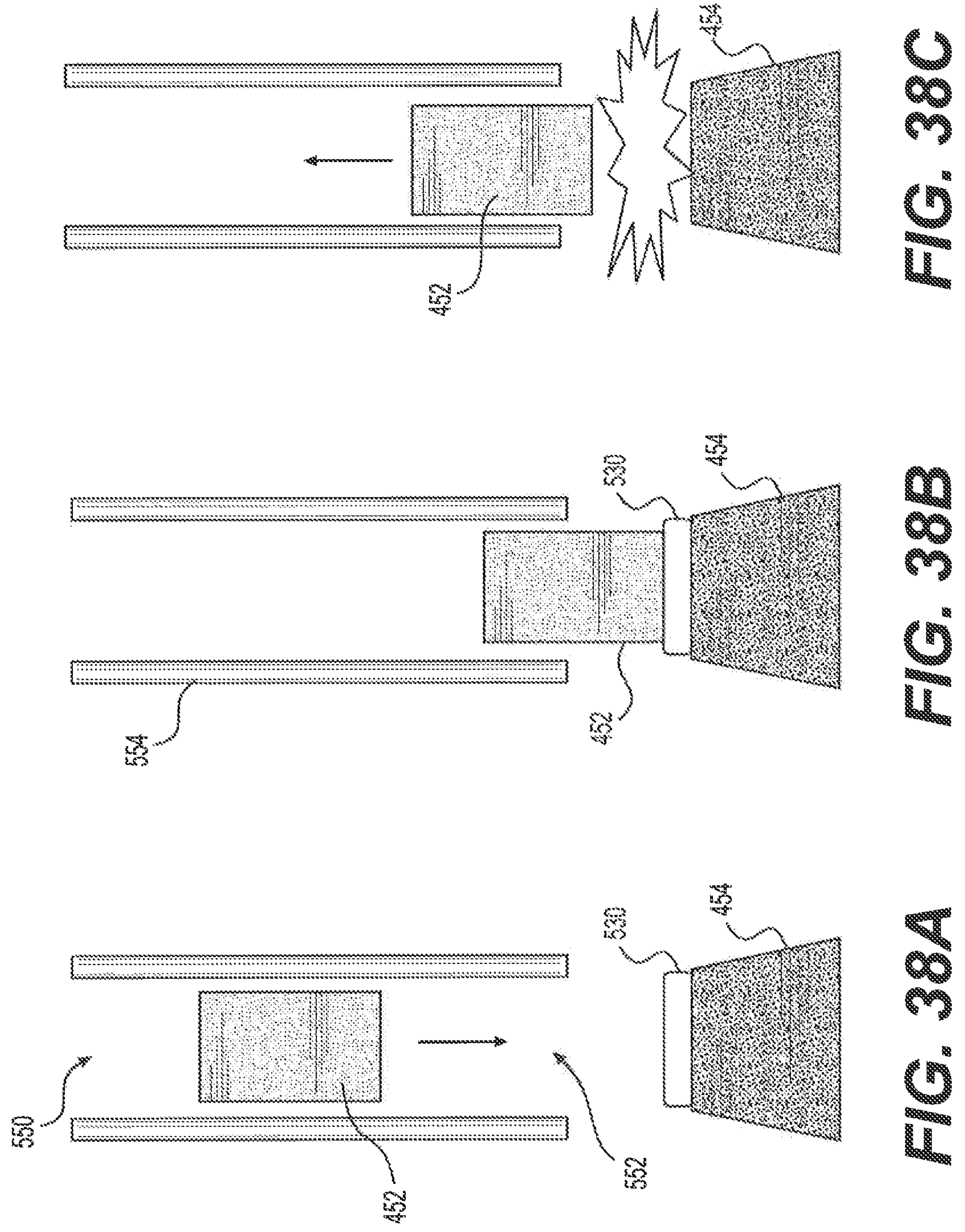
FIGS. 38A-C are views of contact elements in operation, according to an exemplary embodiment.

In another embodiment, contact elements may move in a linear direction relative to each other. For example, as shown in FIGS. 38A-C, first contact element 452 may be located within a passage 550 configured to receive first contact element 452. An aperture 552 of passage 550 may be located adjacent to second contact element 454 such that contact elements 452, 454 can move toward or away from each other in a generally linear motion. As shown in FIG. 38A, contact element 452 can move towards fuel layer 530 located on second contact element 454. A current could be applied to first contact element 452 via a wall 554 of passage 550, or via another mechanism, to react fuel layer 530 (FIG. 38B). The reaction could then propel first contact element 452 away from second contact element 454 and upwards within passage 550 (FIG. 38C).

Various systems for different movement between contact elements 450 can be combined with one or more features described above. For example, the disk, pendulum, or passage embodiments described above could include one or more features described and shown in FIG. 27. For example, a spring (not shown) could be placed within passage 550 of the passage embodiment (FIGS. 38A-C) to provide a dampening force to first contact element 452. In another example, a coupler (not shown) could be placed at the upper end of pendulum 540 to at least partially control a movement, velocity, force received, or force exerted on first contact element 452 in that embodiment (FIGS. 37A-C).

Figure 39:
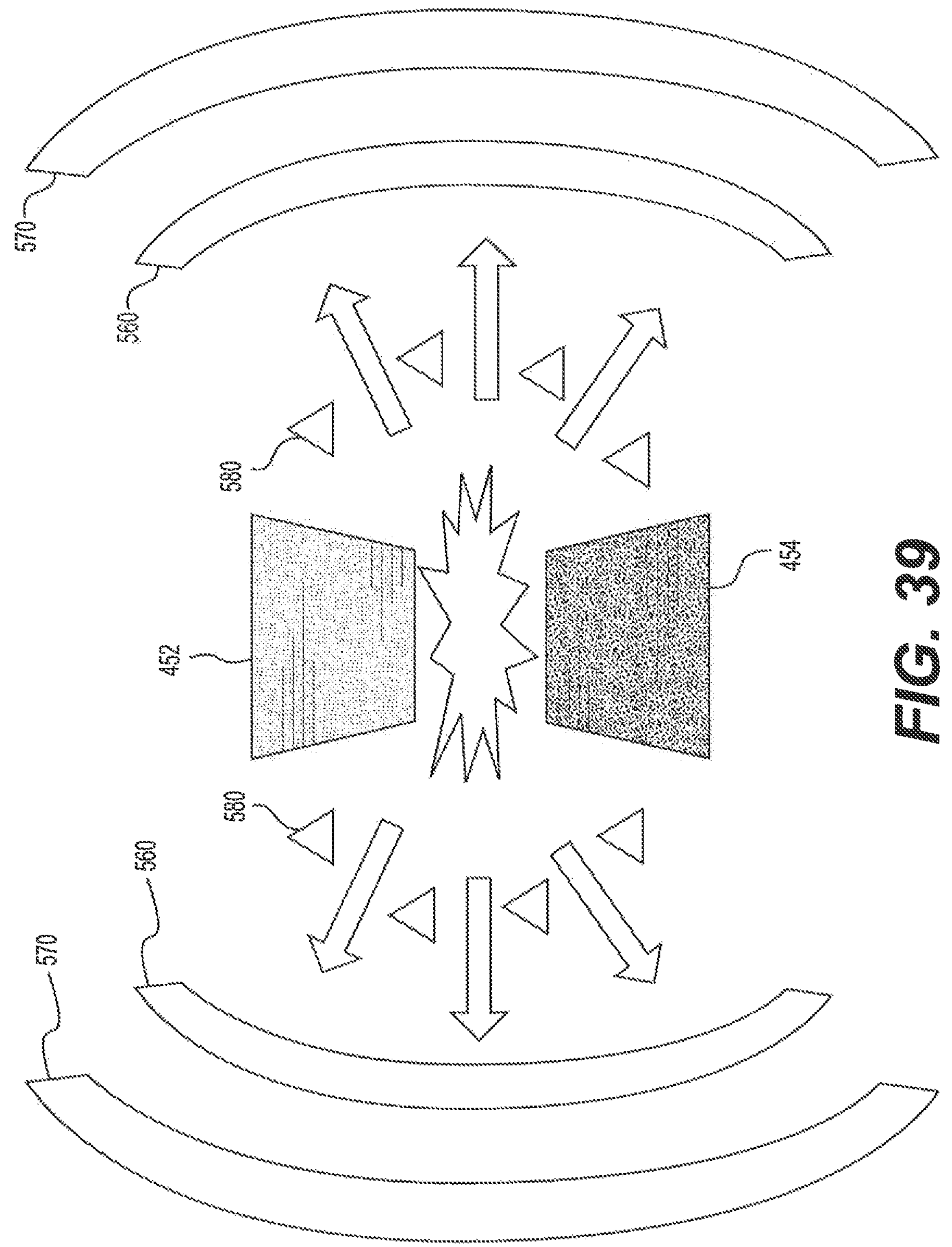
FIG. 39 is a schematic view of contact elements with a photovoltaic cell, according to an exemplary embodiment.

The various embodiments described herein could also be combined with one or more photovoltaic cells, as described herein. In order to improve the performance of a photovoltaic cell 570, or similar device, various components can be used to reduce the impact or effect of the energy released by the reactions described herein. For example, as shown in FIG. 39, a protective membrane 560 could be positioned at least partially between one or both contact elements 452, 454 and photovoltaic cell 570. Membrane 560 may be configured to partially diffuse a shock wave, deflect some particles created by the reaction, or provide at least a partial barrier to provide addition protection for cell 570. Membrane 560 may be formed from a continuous material, and may be transparent. In some embodiments, membrane 560 could filter out one or more wavelengths. Membrane 560 could be directly coupled to cell 570, or be located at a distance from cell 570.

In other embodiments, a series of barriers 580 may be provided. Barriers may be located generally between the site of a reaction between elements 452, 454 and cell 570. Barriers 580 could be variously arranged, and may be located along a similar radius or in layers of different radii, to assist or provide protection for cell 570. For example, barriers 580 may include a series of baffles, cage members or other objects to direct or diffuse a shock wave to protect cell 570. In yet other embodiments, one or more operations or structures of membrane 570 or barriers 580 could be incorporated into a single structure, or be formed as part of cell 570.

K. SF-CIHT Cell Powered Axial Fan Application

The photovoltaic conversion of the optical power output from the hydrino reaction represents a new market for the well-established solar industry. An additional source of renewable energy that comprises a significant industry regards wind power wherein windmills are used to generate electricity. One of the determinants of wind farms is that they change the climate of significant environmental regions by changing the wind patterns. Wind farms can change local climates. In an embodiment of the SF-CIHT generator, windmills are used to alter climate in a desirable manner. In an embodiment, a plurality of windmills is each driven by a SF-CIHT generator to blow moist off-shore air onto land that condenses and precipitates on the arid land to make it non-arid.

An additional source of renewable energy that comprises a significant industry regards wind power wherein windmills are used to generate electricity. One of the determinants of wind farms is that they change the climate of significant environmental regions by changing the wind patterns. Wind farms can change local climates. In an embodiment of the SF-CIHT generator, windmills are used to alter climate in a desirable manner. In an embodiment, a plurality of windmills is each driven by a SF-CIHT generator to blow moist off-shore air onto land that condenses and precipitates on the arid land to make it non-arid. The amount of water that can be moved onto to the land can be calculated from the power equation of a wind turbine. The kinetic power of the wind through a windmill P is given by $$P = \frac{1}{2}\rho A v^3 \tag{202}$$

where ρ is the air density (1.3 kg/$m^3$), A is the area swept out by the blades, and v is the velocity of the wind when powering the turbine. The velocity v is also the wind velocity that the turbine can produce over the area A when powered by the power P applied by the SF-CIHT generator wherein the performance factor of the corresponding axial fan is taken as 1/2 for an order-of-magnitude estimate. Currently, commercial windmills are available having 164 m diameter blades that produce 7 MW of power. Thus, the wind velocity is $$v = \left(\frac{2P}{\rho A}\right)^{\frac{1}{3}} = 8 \text{ m/s} \tag{203}$$

The mass of air moved per time $$\frac{dm}{dt}$$

is given by $$\frac{dm}{dt} = \rho A v = 2.2 \times 10^5 \text{ kg/s} \quad (204)$$

The amount of $H_2O$ is 3% of the mass of the air blown or $$\frac{dm}{dt}(H_2O) = 6.6 \times 10^3 \text{ kg/s}.$$

An acre of land is 43,560 sq ft or $4\times10^7$ $cm^2$. Rain of 1 cm depth requires $4\times10^7$ $cm^3$ or $4\times10^4$ kg of $H_2O$. Given the rate of $H_2O$ movement, this amount of water can be supplied every $$\frac{4\times10^4 \text{ kg of } H_2O}{6.6\times10^3 \text{ kg/s}} = 6 \text{ s/acre}.$$

Thus, in a week 100,000 acres can be made to bloom. A wind farm comprising 150 windmills will irrigate 15 million acres. As an alternative beneficial application in hurricane prone regions, a study by Stanford University [http://www.youtube.com/watch?v=M7uRtxl8j2U] has shown that passive (power generating) windmills can abate the high winds of a hurricane and dissipate the gale before it forms. This application can be taken be greatly accentuated by powering windmills with SF-CIHT generators to cause the wind to blow in the opposite direction. Thus, the capacity of a wind farm used in this application can be greatly reduced.

XI. Experimental

A. Exemplary SF-CIHT Cell Test Results on Energy and Solid Fuel Regeneration In an experimental test the sample comprised a 1 $cm^2$ nickel screen conductor coated with a thin (<1 mm thick) tape cast coating of NiOOH, 11 wt % carbon, and 27 wt % Ni powder. The material was confined between the two copper electrodes of a Taylor-Winfield model ND-24-75 spot welder and subjected to a short burst of low-voltage, high-current electrical energy. The applied 60 Hz voltage was about 8 V peak, and the peak current was about 20,000 A. After about 0.14 ms with an energy input of about 46 J, the material vaporized in about 1 ms. Several gauges of wire were tested to determine if 8 V was sufficient to cause an exploding wire phenomenon observed with high-energy, multi-kilovolt-charged, high-capacitance capacitors that are short circuited. Only known resistive heating to glowing red and heating to melting in the case of an 0.25 mm diameter Au wire were observed.

The thermodynamically calculated energy to vaporize just the 350 mg of NiOOH and 50 mg of Ni metal was 3.22 kJ or 9.20 kJ/g NiOOH. Since the NiOOH decomposition energy is essentially zero, this experiment demonstrated a large energy release. The blast initiated after a negligible total energy of 40 J was applied. The blast caused 3.22 kJ of thermal energy to be released in 3 ms corresponding to 1,100,000 W (1.1 MW) thermal power. Given the sample dimensions of 1 $cm^2$ area and <1 mm thickness, the volumetric power density was in excess of $11\times10^9$ W/l thermal. From the fit of the visible spectrum recorded with an Ocean Optics visible spectrometer to the blackbody radiation curve, the gas temperature was 5500 K.

Consider that the calculated thermal energy to achieve the observed vaporization of just the 350 mg of NiOOH and 50 mg of Ni mesh components of the reaction mixture is 3.22 kJ. The moles of $H_2$ in 350 mg of NiOOH solid fuel is 2 mmoles. Based on the calculated enthalpy of 50 MJ/mole $H_2(1/4)$ for the hydrino reaction of $H_2$ to $H_2(1/4)$ with a stoichiometry of 2/3 of the H goes to HOH catalyst and 1/3 to hydrino $H_2(1/4)$, the corresponding maximum theoretical energy from forming $H_2(1/4)$ is 33 kJ; so, about 10% of the available hydrogen was converted to $H_2(1/4)$. The corresponding hydrino reaction yield is 64.4 umoles $H_2(1/4)$.

Another embodiment of the solid fuel comprised 100 mg of Co powder and 20 mg of $MgCl_2$ that was hydrated. The reactants were compressed into a pellet and ignited with the Taylor-Winfield model ND-24-75 spot welder by subjecting the pellet to a short burst of low-voltage, high-current electrical energy. The applied 60 Hz voltage was about 8 V peak, and the peak current was about 20,000 A. The blast occurred in an argon filled glove bag and released an estimated 3 kJ of plasma energy. The particles of the plasma condensed as a nanopowder. The product was hydrated with 10 mg $H_2O$, and the ignition was repeated. The repeat blast of the regenerated solid fuel was more powerful than the first, releasing about 5 kJ of energy. In another embodiment, Ag replaced Co.

B. Calorimetry of Solid Fuel of the SF-CIHT Cell

Calorimetry was performed using a Parr 1341 plain-jacketed calorimeter with a Parr 6774 calorimeter thermometer option on a solid fuel pellet. A Parr 1108 oxygen combustion chamber of the calorimeter was modified to permit initiation of the chemical reaction with high current. Copper rod ignition electrodes that comprised ½" outer diameter (OD) by 12" length copper cylinders were fed through the sealed chamber containing a graphite pellet (~1000 mg, L×W×H=0.18"×0.6"×0.3") as a control resistive load for calibration of the heat capacity of the calorimeter or a solid fuel pellet wherein the ends had a copper clamp that tightly confined each sample. The calorimeter water bath was loaded with 2,000 g DI water (as per Parr manual). The power source for calibration and ignition of the solid fuel pellet was a Taylor-Winfield model ND-24-75 spot welder that supplied a short burst of electrical energy in the form of a 60 Hz low-voltage of about 8 V RMS and high-current of about 15,000 to 20,000 A. The input energy of the calibration and ignition of the solid fuel was given as the product of the voltage and current integrated over the time of the input. The voltage was measured by a data acquisition system (DAS) comprising a PC with a National Instruments USB-6210 data acquisition module and Labview VI. The current was also measured by the same DAS using a Rogowski coil (Model CWT600LF with a 700 mm cable) that was accurate to 0.3% as the signal source. V and I input data was obtained at 10 KS/s and a voltage attenuator was used to bring analog input voltage to within the +/−10V range of the USB-6210.

The calibrated heat capacity of the calorimeter and electrode apparatus was determined to be 12,000 J/° C. using the graphite pellet with an energy input of 995 J by the spot welder. The sample of solid fuel comprising Cu (45 mg)+CuO (15 mg)+$H_2O$ (15 mg) that was sealed in an aluminum DSC pan (70 mg) (Aluminum crucible 30 μl, D:6.7×3 (Setaram, S08/HBB37408) and Aluminum cover D: 6,7, stamped, tight (Setaram, S08/HBB37409)) was ignited with an applied peak 60 Hz voltage of 3 V and a peak current of about 11,220 A. The input energy measured from the voltage and current over time was 46 J to ignite the sample as indicated by a disruption spike in the waveforms with a total of 899 J input by the power pulse of the spot welder, and the total output energy calculated for the calorimetry thermal response to the energy released from the ignited solid fuel using the calibrated heat capacity was 3,035.7 J. By subtracting the input energy, the net energy was 2,136.7 J for the 0.075 g sample. In control experiments with $H_2O$, the alumina pan did not undergo a reaction other than become vaporized in the blast. XRD also showed no aluminum oxide formation. Thus, the theoretical chemical reaction energy was zero, and the solid fuel produced 28,500 J/g of excess energy in the formation of hydrinos.

C. Photovoltaic Power Conversion

Figure 40:
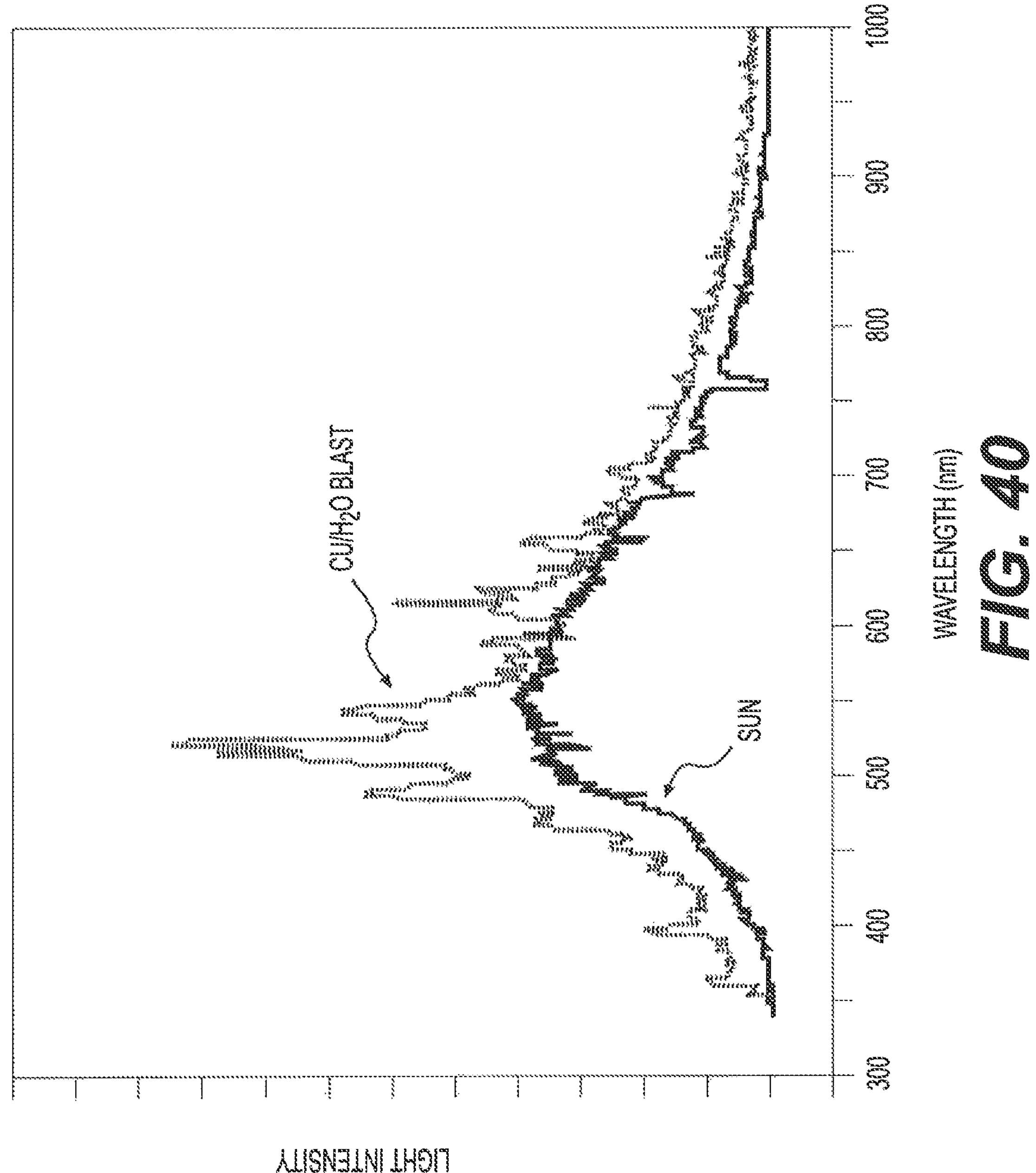
FIG. 40 is the normalized superposition of visible spectra of the plasma source and the Sun demonstrating that they both emit blackbody radiation of about 5800-6000K according to an exemplary embodiment.

The sample of solid fuel comprising Cu (45 mg)+CuO (15 mg)+$H_2O$ (15 mg) that was sealed in an aluminum DSC pan (70 mg) (Aluminum crucible 30 μl, D:6.7×3 (Setaram, S08/HBB37408) and Aluminum cover D: 6,7, stamped, tight (Setaram, S08/HBB37409)) was ignited with an applied peak 60 Hz voltage of 3-6 V and a peak current of about 10,000-15,000 A. The visible spectrum was recorded with an Ocean Optics visible spectrometer (Ocean Optics Jaz, with ILX511b detector, OFLV-3 filter, L2 lens, 5 um slit, 350-1000 nm). The spectrum fit a blackbody of about 6000K. The blackbody temperature of the Sun is 5800 K. Since the Sun and the SF-CIHT plasma are both at 5800 K-6000 K (FIG. 40), and the Sun is a standard blackbody of 1000 $W/m^2$ at Earth, a solar cell served as a power meter. The optical power density of the plasma at a given distance from the ignition center to a solar cell was calculated based on the relative solar cell power density response to the plasma source relative to that of the Sun. The total optical power of the plasma source was then calculated by multiplying the power density and the solid angle area of a spherical shell on which the density was determined.

Taking the power of sunlight of 1000 $W/m^2$ as a standard light source, the efficiency of a monocrystalline solar panel was determined Using the energy recorded on a monocrystalline solar panel as well as its area, and duration of the ignition event of 20 us determined by 150,000 frames per second high-speed video, the power density of the plasma was determined to be $6\times10^6$ $W/m^2$. The optical power of the plasma was confirmed with the Ocean Optics spectrometer. The separation distance of the entrance of the fiber optic cable from the plasma center that resulted in the spectral intensity to match that of a standard point-source power light source was determined. Then, the power of the plasma source was given by the correcting the standard power by the separation distance squared. Typical separation distances were large such as 700 cm.

By multiplying the power density by the solid-angle spherical area at the 10 inches radius, the distance between the ignition center and the solar panel, the total optical power of the plasma was determined to be 0.8 $m^2\lambda$ $6\times10^6$ $W/m^2=4.8\times10^6$ W optical power. The total energy given by the total power times the blast duration of 20 us was $(4.8\times10^6\ W)(20\times10^{-6}\ s)=96$ J. The typical calorimetrically measured energy released by detonation of the solid fuel was about 1000 J. The lesser amount of recorded optical energy was considered due to the slow response time of a monocrystalline solar cell that disadvantages the fast ignition emission. GaAs cell may be more suitable.

The 5800 K blackbody temperature of the Sun and that of the ignition plasma are about the same because the heating mechanism is the same in both cases, the catalysis of H to hydrino. The temperature of high explosives is also as high as 5500 K as expected since the source of the high temperature is the formation of hydrinos. Since solar cell s have been optimize to convert a blackbody radiation of 5800 K into electricity photovoltaic conversion using solar cells is a suitable means of power conversion of the SF-CIHT generator as confirmed by these tests.

A series of ignitions was performed on solid fuel pellets each comprising 100 mg Cu+30 mg deionized water sealed in an aluminum DSC pan (75 mg) (Aluminum crucible 30 μl, D:6.7×3 (Setaram, S08/HBB37408) and Aluminum cover D: 6,7, stamped, tight (Setaram, S08/HBB37409)). The pellets were adhered to a copper metal strip at 1.9 cm spacing, and the strip was formed around the roller disk of a National Electric Welding machines seam welder (100 kVA Model #100AOPT SPCT 24) and ignited with an applied peak 60 Hz voltage of about 4-8 V and a peak current of about 10,000-35,000 A. The rotation speed was adjusted such that the denotations occurred when the roller moved each pellet to top-dead center position of the seam welder at a detonation frequency of 1 Hz. The bright flashes of light were converted to electricity with a photovoltaic converter and the electricity was dissipated in a light-emitting diode (LED) array.

A three-sided metal frame with attached Lexan walls was setup around the seam welder disks such that the nearest separation of the walls of the rectangular enclosure from the welder disks was about 15 cm. A 30 W, 12 V solar panel was attached to each of the three walls of the enclosure. Each panel comprised high efficiency 6" polycrystalline cells, low iron tempered glass and EVA film with TPT back sheet to encapsulated cells with an anodized aluminum alloy frame (Type 6063-T5)(UL Solar, http://www.ulsolar.com/30_Watt_12_Volt_multicrystalline_solar_panel_p/stp030p.htm). Other solar panel specifications were: Cell (Polycrystalline Silicon): 156 mm×39 mm; Number of cells and connections: 36 (4×9); Dimension of Module: 26.2×16.2×0.98 in; Weight: 8 lbs. The electrical characteristics were Power at STC: 30 Watt; Maximum Power Voltage (Vpm): 17.3 Volt; Maximum Power Current (Ipm): 1.77 Amp; Open Circuit Voltage (Voc): 21.9 Volt; Short Circuit Current (Isc): 1.93 Amp; Tolerance: ±5%; Standard Test Conditions: Temperature 25° C., Irradiance 1000 $W/M^2$, AM=1.5; Maximum System Voltage: 600V DC; Series Fuse Rating: 10 Amp; Temperature Coefficient Isc: 0.06%/K, Voc: −0.36%/K, Pmax: −0.5%/K; Operating Temperature: −40° C. to +85° C.; Storage Humidity: 90%; Type of Output Terminal: Junction Box; Cable: 9 ft, 3000 mm.

The solar panels were connected to a LED array. The LED array comprised a Genssi LED Off Road Light 4×4 Work Light Waterproof 27 W 12V 6000 K (30 Degree Spot) http://www.amazon.com/Genssi-Light-Waterproof-6000K-Degree/dp/B005WWLQ8G/ref=sr_1_1?ie=UTF8&qid=1396219947&sr=8-1&keywords=B005WWLQ8G, a LED-wholesalers 16.4 Feet (5 Meter) Flexible LED Light Strip with 300xSMD3528 and Adhesive Back, 12 Volt, White, 2026WH (24 W total), http://www.amazon.com/LEDwholesalers-Flexible-LED-Strip-300xSMD3528/dp/B002Q8-V8DM/ref=sr_1_1?ie=UTF8&qid=1396220045&sr=8-

1&keywords=B002Q8V8DM, and a 9 W 12 V Underwater LED Light Landscape Fountain Pond Lamp Bulb White http://www.amazon.com/Underwater-Light-Landscape-Fountain-White/dp/B 00AQWVHJU/ref=sr_1_1?ie=UTF8 & qid=1396220111&sr=8-1&keywords=B00AQWVHJU. The total estimated power output at the rated voltage and wattage of the LEDs was 27 W+24 W+9 W=60 W. The collective output power of the three solar panels was 90 W under 1 sun steady state conditions.

The series of sequential detonations at 1 Hz maintained the LED array at essentially continuous operation at full light output. Consider the energy balance of the three solar panel collection from each of the solid-fuel-pellet detonations. The LEDs output about 60 W for about 1 s even though the blast even was much, shorter, 100 us. The polycrystalline photovoltaic material had a response time and maximum power that was not well suited for a multi-megawatt short burst. But, the cell serves as an integrator of about 60 J energy over a 1 s time interval. The refection of the light at the Lexan was determined to be 50% and the polycrystalline cells were about 10% efficient at converting 5800 K light into electricity. Correcting the 60 J for reflection and 10% efficiency corresponds to 1200 J. The corresponding optical power over the 100 us event is 12 MW. The independent bomb calorimetrically measured energy released by the denotation of each pellet was about 1000 J. The time of detonation was determined to be 100 us by fast detection with a photodiode. Thus, the power was determined to be about 10 MW. The power density of optical power determined by a visible spectrometer was over 1 $MW/m^2$ at distance greater than about 200 cm. The optical power density was determined to be consistent with the expected radiation for a blackbody at 6000 K according to the Stefan-Boltzmann law. The photovoltaic converter gives a reasonable energy balance compared to the calorimetric and spectroscopic power result.

D. Plasmadynamic Power Conversion 0.05 ml (50 mg) of $H_2O$ was added to 20 mg or either $Co_3O_4$ or CuO that was sealed in an aluminum DSC pan (Aluminum crucible 30 μl, D:6.7×3 (Setaram, S08/HBB37408) and Aluminum cover D: 6,7, stamped, tight (Setaram, S08/HBB37409)). Using a Taylor-Winfield model ND-24-75 spot welder, each sample was ignited with a current of between 15,000 to 25,000 A at about 8 V RMS applied to the ignition electrodes that comprised ⅝" outer diameter (OD) by 3" length copper cylinders wherein the flat ends confined the sample. A large power burst was observed that vaporized each sample as an energetic, highly-ionized, expanding plasma. PDC electrodes comprised two 1/16" OD copper wires. The magnetized PDC electrode was shaped as an open loop with a diameter of 1" that was placed circumferentially around the ignition electrodes, in the plane of the fuel sample. Since the current was axial, the magnetic field from the high current was radial, parallel to the contour of the loop PDC electrode. The counter unmagnetized PDC electrode was parallel to the ignition electrodes and the direction of the high current; thus, the radial magnetic field lines were perpendicular to this PDC electrode. The counter PDC electrode extended 2.5" above and below the plane of the sample. The PDC voltage was measured across a standard 0.1 ohm resistor. The voltage of the PDC electrodes following ignition corresponding was 25 V.

E. Differential Scanning Calorimetry (DSC) of Solid Fuels

Solid fuels were tested for excess energy over the maximum theoretical using a Setaram DSC 131 differential scanning calorimeter using Au-coated crucibles with representative results shown in TABLE 7.

TABLE 7

Exemplary DSC Test Results.

| Date | Reactants | Mass (mg) | Temp (° C.) | Heating (J/g) | Cooling (J/g) | Exp. Total (J/g) | Theo Energy (J/g) |
|---|---|---|---|---|---|---|---|
| Sep. 30, 2013 | 4.6 mg Cu(OH)2 + 11.0 mg FeBr2 | 15.6 | 280 | −195.51 | −19.822 | −215.33 | −62.97 |
| Oct. 10, 2013 | 5.7 mg FeOOH | 5.7 | 450 | −116.661 | 6.189 | −110.472 | −51.69 |
| Oct. 28, 2013 | 14.3 mg CuBr2 + 1.2 mg H2O | 15.5 | 340 | −78.7 | −30.4 | −109.1 | +885.4 |
| Dec. 2, 2013 | 3.9 mg Activated Carbon + 1.9 mg H2O | 5.8 | 550 | −134.985 | −156.464 | −291.449 | +3190.33 |

F. Spectroscopic Identification of Molecular Hydrino 0.05 ml (50 mg) of $H_2O$ was added to 20 mg or either $Co_3O_4$ or CuO that was sealed in an aluminum DSC pan (Aluminum crucible 30 μl, D:6.7×3 (Setaram, S08/HBB37408) and Aluminum cover D: 6,7, stamped, non-tight (Setaram, S08/HBB37409)) and ignited with a current of between 15,000 to 25,000 A at about 8 V RMS using a Taylor-Winfield model ND-24-75 spot welder. A large power burst was observed that vaporized the samples, each as an energetic, highly-ionized, expanding plasma. A MoCu foil witness plate (50-50 at %, AMETEK, 0.020" thickness) was placed 3.5 inches from the center of the ignited sample such that the expanding plasma was incident on the surface to embed $H_2(1/4)$ molecules into the surface.

Using a Thermo Scientific DXR SmartRaman with a 780 nm diode laser in the macro mode, a 40 $cm^{-1}$ broad absorption peak was observed on the MoCu foil following exposure to the $H_2(1/4)$ containing plasma. The peak was not observed in the virgin alloy, and the peak intensity increased with increasing plasma intensity and laser intensity. Since no other element or compound is known that can absorb a single 40 $cm^{-1}$ (0.005 eV) near infrared line at 1.33 eV (the energy of the 780 nm laser minus 1950 $cm^{-1}$) $H_2(1/4)$ was considered. The absorption peak starting at 1950 $cm^{-1}$ matched the free space rotational energy of $H_2(1/4)$ (0.2414 eV) to four significant figures, and the width of 40 $cm^{-1}$ matches the orbital-nuclear coupling energy splitting [Mills GUTCP].

The absorption peak matching the $H_2(1/4)$ rotational energy is a real peak and cannot be explained by any known species. The excitation of the hydrino rotation may cause the absorption peak by an inverse Raman effect (IRE). Here, the continuum caused by the laser is absorbed and shifted to the laser frequency wherein the continuum is strong enough to maintain the rotational excited state population to permit the antiStokes energy contribution. Typically, the laser power is very high for an IRE, but the MoCu surface was found to cause surface enhanced Raman scattering (SERS). The absorption was assigned to an inverse Raman effect (IRE) for the $H_2(1/4)$ rotational energy for the J'=1 to J"=0 transition. This result shows that $H_2(1/4)$ is a free rotor which is the case with $H_2$ in silicon matrix. The results on the plasma-exposed MoCu foils match those observed previously on CIHT cell as reported in Mills prior publication: R. Mills, J. Lotoski, J. Kong, G Chu, J. He, J. Trevey, High-Power-Density Catalyst Induced Hydrino Transition (CIHT) Electrochemical Cell, (2014) that is herein incorporated by reference in its entirety.

MAS $^1$H NMR, electron-beam excitation emission spectroscopy, Raman spectroscopy, and photoluminescence emission spectroscopy were performed on samples of reaction products comprising CIHT electrolyte, CIHT electrodes, and inorganic compound getter KCl—KOH mixture placed in the sealed container of closed CIHT cells.

MAS NMR of molecular hydrino trapped in a protic matrix represents a means to exploit the unique characteristics of molecular hydrino for its identification via its interaction with the matrix. A unique consideration regarding the NMR spectrum is the possible molecular hydrino quantum states. Similar to $H_2$ exited states, molecular hydrinos $H_2(1/p)$ have states with l=0, 1, 2, . . . , p−1. Even the l=0 quantum state has a relatively large quadrupole moment, and additionally, the corresponding orbital angular momentum of l≠0 states gives rise to a magnetic moment [Mills GUT] that could cause an upfield matrix shift. This effect is especially favored when the matrix comprises an exchangeable H such as a matrix having waters of hydration or an alkaline hydroxide solid matrix wherein a local interaction with $H_2(1/p)$ influences a larger population due to rapid exchange. CIHT cell getter KOH—KCl showed a shift of the MAS NMR active component of the matrix (KOH) from +4.4 ppm to about −4 to −5 ppm after exposure to the atmosphere inside of the sealed CIHT cell. For example, the MAS NMR spectrum of the initial KOH—KCl (1:1) getter, the same KOH—KCl (1:1) getter from CIHT cells comprising [MoNi/LiOH—LiBr/NiO] and [CoCu (H perm)/LiOH—LiBr/NiO] that output 2.5 Wh, 80 mA, at 125% gain, and 6.49 Wh, 150 mA, at 186% gain, respectively, showed that the known downfield peak of OH matrix shifted from about +4 ppm to the upfield region of about −4 ppm. Molecular hydrino produced by the CIHT cell shifted the matrix from positive to significantly upfield. The different quantum numbers possible for the p=4 state can give rise to different upfield matrix shifts consistent with observations of multiple such peaks in the region of −4 ppm. The MAS NMR peak of the KOH matrix upfield shifted by forming a complex with molecular hydrino that can be sharp when the upfield shifted hydroxide ion (OH) acts as a free rotor, consistent with prior observations. The MAS-NMR results are consistent with prior positive ion ToF-SIMS spectra that showed multimer clusters of matrix compounds with di-hydrogen as part of the structure, $M:H_2$ (M=KOH or $K_2CO_3$). Specifically, the positive ion spectra of prior CIHT cell getters comprising KOH and $K_2CO_3$ such as of $K_2CO_3$—KCl (30:70 wt %) showed $K^+(H_2:KOH)$, and $K^+(H_2:K_2CO_3)$, consistent with $H_2(1/p)$ as a complex in the structure [R. Mills, X Yu, Y. Lu, G Chu, J. He, J. Lotoski, "Catalyst induced hydrino transition (CIHT) electrochemical cell," (2014), International Journal of Energy Research].

The direct identification of molecular hydrino by its characteristic extraordinarily high ro-vibrational energies was sought using Raman spectroscopy. Another distinguishing characteristic is that the selection rules for molecular hydrino are different from those of ordinary molecular hydrogen. Similarly to $H_2$ excited states, molecular hydrinos have states with l=0, 1, 2, . . . , p−1 wherein the prolate spheroidal photon fields of $H_2(1/p)$; p=1, 2, 3, . . . , 137 have spherical harmonic angular components of quantum number l relative to the semimajor axis [Mills GUT]. Transitions between these prolate spheroidal harmonic states are permissive of rotational transitions of ΔJ=0,±1 during a pure vibrational transition without an electronic transition as observed for $H_2$ excited states. The lifetimes of the angular states are sufficiently long such that $H_2(1/p)$ may uniquely undergo a pure ro-vibrational transition having the selection rule ΔJ=0,±1.

The emitting ro-vibrational molecular hydrino state may be excited by a high-energy electron collision or the by a laser wherein due to the rotational energy of $p^2(J+1)0.01509$ eV [Mills GUT] excited rotational states cannot be populated as a statistical thermodynamic population at ambient temperatures since the corresponding thermal energy is less than 0.02 eV. Thus, the ro-vibrational state population distribution reflects the excitation probability of the external source. Moreover, due to the thirty-five times higher vibrational energy of $p^2 0.515$ eV over the rotational energy, only the first level, υ=1, is expected to be excited by the external source. Molecular hydrino states can undergo l quantum number changes at ambient temperature, and the J quantum state may changed during e-beam or laser irradiation as the power is thermalized. Thus, the initial state may be any one of l=0, 1, 2, 3 independently of the J quantum number. Thus, rotational and ro-vibrational transitions are Raman and IR active with the R, Q, P branches being allowed wherein the angular momentum is conserved between the rotational and electronic state changes. Permitted by the change in f quantum number, the de-excitation vibrational transition υ=1→υ=0 with a rotational energy up conversion (J'−J"=−1), a down conversion (J'−J"=+1), and no change (J'−J"=0) gives rise to the P, R, and Q branches, respectively. The Q-branch peak corresponding to the pure vibrational transition υ=1→υ=0; ΔJ=0 is predicted to be the most intense with a rapid decrease in intensity for the P and R series of transition peaks of higher order wherein due to the available energy of internal conversion, more peaks of higher intensity are expected for the P branch relative to the R branch. An influence of the matrix is expected to cause a vibrational energy shift from that of a free vibrator, and a matrix rotational energy barrier is anticipated to give rise to about the same energy shift to each of the P and R branch peaks manifest as a nonzero intercept of the linear energy separation of the series of rotational peaks.

It was reported previously [R. Mills, X Yu, Y. Lu, G Chu, J. He, J. Lotoski, "Catalyst induced hydrino transition (CIHT) electrochemical cell," (2014), International Journal or Energy Research] that ro-vibrational emission of $H_2(1/4)$ trapped in the crystalline lattice of getters of CIHT cell gas was excited by an incident 6 keV electron gun with a beam current of 8 μA in the pressure range of $5\times10^{-6}$ Torr, and recorded by windowless UV spectroscopy. By the same method $H_2(1/4)$ trapped in the metal crystalline lattice of MoCu was observed by electron-beam excitation emission spectroscopy. An example of the resolved ro-vibrational spectrum of $H_2(1/4)$ (so called 260 nm band) recorded from the MoCu anode of the CIHT cell [MoCu(50/50) (H permeation)/LiOH+LiBr/NiO] that output 5.97 Wh, 80 mA, at 190% gain showed the peak maximum at 258 nm with representative positions of the peaks at 227, 238, 250, 263, 277, and 293 nm, having an equal spacing of 0.2491 eV. The results are in very good agreement with the predicted values for $H_2(1/4)$ for the transitions of the matrix-shifted vibrational and free rotor rotational transitions of $\upsilon=1\rightarrow\upsilon=0$ and Q(0), R(0), R(1), P(1), P(2), and P(3), respectively, wherein Q(0) is identifiable as the most intense peak of the series. The peak width (FWHM) was 4 nm Broadening of ro-vibrational transitions of $H_2(1/4)$ relative to ordinary $H_2$ in a crystalline lattice is expected since the energies involved are extraordinary, being sixteen times higher, and significantly couple to phonon bands of the lattice resulting in resonance broadening. The 260 nm band was not observed on the MoCu starting material. The 260 nm band was observed as a second order Raman fluorescence spectrum from KOH—KCl crystals that served as a getter of $H_2(1/4)$ gas when sealed in CIHT cells as described previously [R. Mills, X Yu, Y. Lu, G Chu, J. He, J. Lotoski, "Catalyst induced hydrino transition (CIHT) electrochemical cell," (2014), International Journal or Energy Research]. The 260 nm band was also observed on the CoCu anode.

$H_2(1/4)$ was further confirmed using Raman spectroscopy wherein due to the large energy difference between ortho and para, the latter was expected to dominate the population. Given that para is even, the typical selection rule for pure rotational transitions is $\Delta J=\pm 2$ for even integers. However, orbital-rotational angular momentum coupling gives rise to a change in the l quantum number with the conservation of the angular momentum of the photon that excites the rotational level wherein the resonant photon energy is shifted in frequency by the orbital-nuclear hyperfine energy relative to the transition in the absence of the l quantum number change. Moreover, for $l\neq 0$, the nuclei are aligned along the internuclear axis as given in Chp 12 of Ref. [Mills GUT]. The rotational selection rule for Stokes spectra defined as initial state minus final state is $\Delta J=J'-J''=-1$, the orbital angular momentum selection rule is $\Delta l=\pm 1$, and the transition becomes allowed by the conservation of angular momentum during the coupling of the rotational and the orbital angular momentum excitations [Mills GUT]. And, no intensity dependency on nuclear spin is expected.

Using a Thermo Scientific DXR SmartRaman with a 780 nm diode laser in the macro mode, a 40 $cm^{-1}$ broad absorption peak was observed on MoCu hydrogen permeation anodes after the production of excess electricity. The peak was not observed in the virgin alloy, and the peak intensity increased with increasing excess energy and laser intensity. Moreover it was present pre and post sonication indicating that the only possible elements to consider as the source were Mo, Cu, H, and O as confirmed by SEM-EDX. Permutations of control compounds did not reproduce the peak. The peak was also observed on cells having Mo, CoCu, and MoNiAl anodes such as the cell [CoCu (H permeation)/LiOH—LiBr/NiO] that output 6.49 Wh, 150 mA, at 186% gain and the cell [MoNiAl (45.5/45.5/9 wt %)/LiOH-LiBr/NiO] that output 2.40 Wh, 80 mA, at 176% gain. In separate experiments, KOH—KCl gettered gas from these cells gave a very intense fluorescence or photoluminescence series of peaks that were assigned to $H_2(1/4)$ ro-vibration. Since no other element or compound is known that can absorb a single 40 $cm^{-1}$ (0.005 eV) near infrared line at 1.33 eV (the energy of the 780 nm laser minus 2000 $cm^{-1}$) $H_2(1/4)$ was considered. The absorption peak starting at 1950 $cm^{-1}$ matched the free space rotational energy of $H_2(1/4)$ (0.2414 eV) to four significant figures, and the width of 40 $cm^{-1}$ matches the orbital-nuclear coupling energy splitting [Mills GUT].

The absorption peak matching the $H_2(1/4)$ rotational energy is a real peak and cannot be explained by any known species. The excitation of the hydrino rotation may cause the absorption peak by two mechanisms. In the first, the Stokes light is absorbed by the lattice due to a strong interaction of the rotating hydrino as a lattice inclusion. This is akin to resonance broadening observed with the 260 nm e-beam band. The second comprises a known inverse Raman effect. Here, the continuum caused by the laser is absorbed and shifted to the laser frequency wherein the continuum is strong enough to maintain the rotational excited state population to permit the antiStokes energy contribution. Typically, the laser power is very high for an IRE, but molecular hydrino may be a special case due to its non-zero t quantum number and corresponding selections rules. Moreover, MoCu is anticipated to cause a Surface Enhanced Raman Scattering (SERS) due to the small dimensions of the Mo and Cu grain boundaries of the mixture of metals. So, the results are discussed from the context of the latter mechanism.

The absorption was assigned to an inverse Raman effect (IRE) for the $H_2(1/4)$ rotational energy for the J'=1 to J"=0 transition [Mills GUT]. This result showed that $H_2(1/4)$ is a free rotor which is the case with $H_2$ in silicon matrix. Moreover, since $H_2(1/4)$ may form complexes with hydroxide as shown by MAS NMR and ToF-SIMs, and a matrix shift is observed with the electron-bean excitation emission spectrum and the photoluminescence spectrum due to the influence of the local environment at the $H_2(1/4)$ site in the lattice, the IRE is anticipated to shift as well in different matrices and also with pressure [R. Mills, X Yu, Y. Lu, G Chu, J. He, J. Lotoski, "Catalyst induced hydrino transition (CIHT) electrochemical cell," (2014), International Journal or Energy Research]. Likewise, the Raman peaks of $H_2$ as a matrix inclusion shift with pressure. Several instances were observed by Raman spectral screening of metals and inorganic compounds. Ti and Nb showed a small absorption peak of about 20 counts starting at 1950 $cm^{-1}$. Al showed a much larger peak. Instances of inorganic compounds included LiOH and LiOH—LiBr that showed the peak at 2308 $cm^{-1}$ and 2608 $cm^{-1}$, respectively. Ball milling LiOH—LiBr caused a reaction to greatly intensify the IRE peak and shift it to be centered at 2308 $cm^{-1}$ like LiOH as well as form a peak centered at 1990 $cm^{-1}$. An especially strong absorption peak was observed at 2447 $cm^{-1}$ from $Ca(OH)_2$ that forms $H_2O$. The latter may serve as a catalyst to form $H_2(1/4)$ upon dehydration of $Ca(OH)_2$ at 512° C. or by reaction with $CO_2$. These are solid fuel type reactions to form hydrinos as reported previously [R. Mills, X Yu, Y. Lu, G Chu, J. He, J. Lotoski, "Catalyst induced hydrino transition (CIHT) electrochemical cell," (2014), International Journal or Energy Research]. LiOH and $Ca(OH)_2$ both showed a $H_2(1/4)$ IRE peak, and the LiOH is commercially formed from $Ca(OH)_2$ by reaction with $Li_2CO_3$. Thus, $Ca(OH)_2+Li_2CO_3$ mixture was caused to react by ball milling, and a very intense $H_2(1/4)$ IRE peak was observed centered at 1997 $cm^{-1}$.

An indium foil was exposed for one minute to the product gas following each ignition of a series of solid fuel pellet ignitions. Fifty solid fuel pellets were ignited sequentially in an argon atmosphere each comprising 100 mg Cu+30 mg deionized water sealed in an aluminum DSC pan (70 mg)

(Aluminum crucible 30 μl, D:6.7×3 (Setaram, S08/HBB37408) and Aluminum cover D: 6,7, stamped, tight (Setaram, S08/HBB37409)). Each ignition of the solid fuel pellet was performed using a Taylor-Winfield model ND-24-75 spot welder that supplied a short burst of electrical energy in the form of a 60 Hz low-voltage of about 8 V RMS and high-current of about 15,000 to 20,000 A. Using a Thermo Scientific DXR SmartRaman with a 780 nm diode laser in the macro mode, a 1950 $cm^{-1}$ IRE peak was observed. The peak that was not observed in the virgin sample was assigned to $H_2(1/4)$ rotation.

$H_2(1/4)$ as the product of solid fuel reactions was reported previously [R. Mills, X Yu, Y. Lu, G Chu, J. He, J. Lotoski, "Catalyst induced hydrino transition (CIHT) electrochemical cell," (2014), International Journal of Energy Research; R. Mills, J. Lotoski, W. Good, J. He, "Solid Fuels that Form HOH Catalyst," (2014)]. The energy released by forming hydrinos according to Eqs. (6-9) was shown to give rise to high kinetic energy H. Using solid fuel Li+$LiNH_2$+dissociator Ru—$Al_2O_3$ that can form H and HOH catalyst by decomposition of $Al(OH)_3$ and reaction of Li with $H_2O$ and $LiNH_2$, ions arriving before m/e=1 were observed by ToF-SIMS that confirmed the energy release of Eq. (9) is manifest as high kinetic energy $H^-$. Other ions such as oxygen (m/e=16) showed no early peak. The relation between time of flight T, mass m, and acceleration voltage V is $$T = A\sqrt{\frac{m}{V}} \tag{205}$$

where A is a constant that depends on ion flight distance. From the observed early peak at m/e=0.968 with an acceleration voltage of 3 kV, the kinetic energy imparted to the H species from the hydrino reaction is about 204 eV that is a match to the HOH catalyst reaction given by Eqs. (6-9). The same early spectrum was observed in the positive mode corresponding to $H^+$, but the intensity was lower.

XPS was performed on the solid fuel. The XPS of LiHBr formed by the reaction of Li, LiBr, $LiNH_2$, dissociator R—Ni (comprising about 2 wt % $Al(OH)_3$), and 1 atm $H_2$, showed a peak at 494.5 eV and 495.6 eV for XPS spectra on reaction products of two different runs that could not be assigned to any known elements. Na, Sn, and Zn being the only possibilities were easy to eliminate based on the absence of any other corresponding peaks of these elements since only Li, Br, C, and O peaks were observed. The peak matched the energy of the theoretically allowed double ionization [R. Mills, X Yu, Y. Lu, G Chu, J. He, J. Lotoski, "Catalyst induced hydrino transition (CIHT) electrochemical cell," (2014), International Journal or Energy Research] of molecular hydrino $H_2(1/4)$. Molecular hydrino was further confirmed as a product by Raman and FTIR spectroscopy. The Raman spectrum of solid fuel product LiHBr showed a $H_2(1/4)$ inverse Raman effect absorption peak centered at 1994 $cm^{-1}$. The FTIR spectrum of solid fuel product LiHBr showed a new sharp peak at 1988 $cm^{-1}$ that is a close match to the free rotor energy of $H_2(1/4)$. Furthermore, the MAS NMR showed a strong up-field shift peak consistent with that shown for other CIHT cell KOH—KCl (1:1) getter samples such as one from a CIHT cell comprising [Mo/LiOH-LiBr/NiO] that output 2.5 Wh, 80 mA, at 125% gain that showed upfield shifted matrix peaks at −4.04 and −4.38 ppm and one from a CIHT cell comprising [CoCu (H permeation)/LiOH—LiBr/NiO] that output 6.49 Wh, 150 mA, at 186% gain that showed upfield shifted matrix peaks at −4.09 and −4.34 ppm.

XPS was also performed on the anodes of CIHT cells such as [MoCu (H permeation)/LiOH—LiBr/NiO] (1.56 Wh, 50 mA, at 189% gain), and [MoNi (H permeation)/LiOH—LiBr/NiO] (1.53 Wh, 50 mA, at 190%). The 496 eV peak was observed as well. The peak was assigned to $H_2(1/4)$ since the other possibilities were eliminated. Specifically, in each case, the 496 eV peak could not be associated with Mo 1s, as its intensity would much smaller than Mo 3p peaks and the energy would be higher that that observed, and it could not assigned to Na KLL, since there is no Na 1 s in the spectrum.

Using a Scienta 300 XPS spectrometer, XPS was performed at Lehigh University on the indium metal getter that showed strong 1940 $cm^{-1}$ IRE peak following exposure to the gases from the ignition of the solid fuel comprising 100 mg Cu+30 mg deionized water sealed in an aluminum DSC pan (70 mg) (Aluminum crucible 30 μl, D:6.7×3 (Setaram, S08/HBB37408) and Aluminum cover D: 6,7, stamped, tight (Setaram, S08/HBB37409)). A 496 eV peak was observed that could not be assigned to any known element that was assigned to $H_2(1/4)$.

Another successful cross-confirmatory technique in the search for hydrino spectra involved the use of the Raman spectrometer wherein the ro-vibration of $H_2(1/4)$ matching the 260 nm e-beam band was observed as second order fluorescence. The gas from the cells [Mo, 10 bipolar plates/LiOH—LiBr—MgO/NiO] (2550.5 Wh, 1.7 A, 9.5V, at 234% gain), [MoCu/LiOH—LiBr/NiO] (3.5 Wh, 80 mA, at 120% gain), [MoNi/LiOH—LiBr/NiO] (1.8 Wh, 80 mA, at 140%) was gettered with KOH—KCl (50-50 at %), and [CoCu (H permeation)/LiOH—LiBr/NiO] (6.49 Wh, 150 mA, at 186% gain), and the Raman spectra were recorded on the getters using the Horiba Jobin Yvon LabRAM Aramis Raman spectrometer with a HeCd 325 nm laser in microscope mode with a magnification of 40×. In each case, an intense series of 1000 $cm^{-1}$ (0.1234 eV) equal-energy spaced Raman peaks were observed in the 8000 $cm^{-1}$ to 18,000 $cm^{-1}$ region. The conversion of the Raman spectrum into the fluorescence or photoluminescence spectrum revealed a match as the second order ro-vibrational spectrum of $H_2(1/4)$ corresponding to the 260 nm band first observed by e-beam excitation [R. Mills, X Yu, Y. Lu, G Chu, J. He, J. Lotoski, "Catalyst induced hydrino transition (CIHT) electrochemical cell," (2014), International Journal or Energy Research]. The peak assignments to the Q, R, and P branches for the spectra are Q(0), R(0), R(1), R(2), R(3), R(4), P(1), P(2), P(3), P(4), P(5), and P(6) observed at 12,199, 11,207, 10,191, 9141, 8100, 13,183, 14,168, 15,121, 16,064, 16,993, and 17,892 $cm^{-1}$, respectively. The excitation was deemed to be by the high-energy UV and EUV He and Cd emission of the laser wherein the laser optics are transparent to at least 170 nm and the grating (Labram Aramis 2400 g/mm 460 mm focal length system with 1024×26 $\mu m^2$ pixels CCD) is dispersive and has its maximum efficiency at the shorter wavelength side of the spectral range, the same range as the 260 nm band. For example, cadmium has a very intense line at 214.4 nm (5.8 eV) that matches the ro-vibrational excitation energy of $H_2(1/4)$ in KCl matrix based on the e-beam excitation data. The CCD is also most responsive at 500 nm, the region of the second order of the 260 nm band centered at 520 nm.

The photoluminescence bands were also correlated with the upfield shifted NMR peaks. For example, the KOH—KCl (1:1) getter from MoNi anode CIHT cells comprising [MoNi/LiOH—LiBr/NiO] having upfield shifted matrix peaks at −4.04 and −4.38 ppm and the KOH—KCl (1:1) getter from CoCu H permeation anode CIHT cells comprising [CoCu (H permeation)/LiOH—LiBr/NiO] having upfield shifted matrix peaks at −4.09 and −4.34 ppm showed the series of photoluminescence peaks corresponding to the 260 nm e-beam.

A Raman spectrum was performed on a 1 g KOH—KCl (1:1) getter sample that was held 2" away from the center of 15 consecutive initiations of 15 separate solid fuel pellets each comprising CuO (30 mg)+Cu (10 mg)+$H_2O$ (14.5 mg) that was sealed in an aluminum DSC pan (Aluminum crucible 30 μl, D:6.7×3 (Setaram, S08/HBB37408) and Aluminum cover D: 6,7, stamped, tight (Setaram, S08/HBB37409)). Each sample of solid fuel was ignited with a Taylor-Winfield model ND-24-75 spot welder that supplied a short burst of low-voltage, high-current electrical energy. The applied 60 Hz voltage was about 8 V peak, and the peak current was about 20,000 A. The getter sample was contained in an alumina crucible that was covered with a polymer mesh wire tied around the crucible. The mesh prevented any solid reaction products from entering the sample while allowing gas to pass through. The fifteen separate solid fuel samples were rapidly successively ignited, and the getter sample that accumulated the 15 exposures was transferred to Ar glove box where it was homogenously mixed using a mortar and pestle. Using the Horiba Jobin Yvon LabRAM Aramis Raman spectrometer with a HeCd 325 nm laser in microscope mode with a magnification of 40×, the series of 1000 $cm^{-1}$ equal-energy spaced Raman peaks that matched the second order rotational emission of $H_2(1/4)$ within the $\upsilon=1\rightarrow\upsilon=0$ transition was observed. Specifically, the Q, R, and P branch peaks Q(0), R(0), R(1), R(2), P(1), P(2), P(3), P(4), and P(5), were observed at 12,194, 11,239, 10,147, 13,268, 14,189, 15,127, 16,065, 17,020, and 17,907 $cm^{-1}$, respectively, that confirmed molecular hydrino $H_2(1/4)$ as the source of the energetic blast of the ignited solid fuel.

The hydrino getter KOH:KCl (1:1) was heated at 250° C. for 15 minutes and cooled (control), then placed in a crucible and exposed to 50 sequential ignitions of solid fuel pellets in an argon atmosphere at room temperature. Fifty solid fuel pellets were ignited sequentially in an argon atmosphere each comprising 100 mg Cu+30 mg deionized water sealed in an aluminum DSC pan (70 mg) (Aluminum crucible 30 μl, D:6.7×3 (Setaram, S08/HBB37408) and Aluminum cover D: 6,7, stamped, tight (Setaram, S08/HBB37409)). Each ignition of the solid fuel pellet was performed using a Taylor-Winfield model ND-24-75 spot welder that supplied a short burst of electrical energy in the form of a 60 Hz low-voltage of about 8 V RMS and high-current of about 15,000 to 20,000 A. The Raman spectra were recorded on the getter using the Horiba Jobin Yvon LabRAM Aramis Raman spectrometer with a HeCd 325 nm laser in microscope mode with a magnification of 40×. An intense increase in the series of 1000 $cm^{-1}$ (0.1234 eV) equal-energy spaced Raman peaks were observed in the 8000 $cm^{-1}$ to 18,000 $cm^{-1}$ region that was assigned to the second order ro-vibrational spectrum of $H_2(1/4)$.

Overall, the Raman results such as the observation of the 0.241 eV (1940 $cm^{-1}$) Raman inverse Raman effect peak and the 0.2414 eV-spaced Raman photoluminescence band that matched the 260 nm e-beam spectrum is strong confirmation of molecular hydrino having an internuclear distance that is 1/4 that of $H_2$. The evidence in the latter case is further substantiated by being in a region having no known first order peaks or possible assignment of matrix peaks at four significant figure agreement with theoretical predictions.

EUV spectroscopy was performed on a solid fuel sample comprising a 0.08 $cm^2$ nickel screen conductor coated with a thin (<1 mm thick) tape cast coating of NiOOH, 11 wt % carbon, and 27 wt % Ni powder contained in a vacuum chamber evacuated to $5\times10^4$ Torr. The material was confined between the two copper electrodes of an Acme Electric Welder Company model 3-42-75, 75 KVA spot welder such that the horizontal plane of the sample was aligned with the optics of a EUV spectrometer as confirmed by an alignment laser. The sample was subjected to a short burst of low-voltage, high-current electrical energy. The applied 60 Hz voltage was about 8 V peak, and the peak current was about 20,000 A. The EUV spectrum was recorded using a McPherson grazing incidence EUV spectrometer (Model 248/310G) equipped with a platinum-coated 600 g/mm grating and an Aluminum (Al) (800 nm thickness, Luxel Corporation) filter to block visible light. The angle of incidence was 87°. The wavelength resolution with an entrance slit width of 100 μm was about 0.15 nm at the CCD center and 0.5 nm at the limits of the CCD wavelength range window of 50 nm. The distance from the plasma source being the ignited solid fuel to the spectrometer entrance was 70 cm. The EUV light was detected by a CCD detector (Andor iDus) cooled to −60° C. The CCD detector was centered at 35 nm. Continuum radiation in the region of 10 to 40 nm was observed. The Al window was confirmed to be intact following the recording of the blast spectrum. A blast outside of a quartz window that cuts any EUV light by passes visible light showed a flat spectrum confirming that the short wavelength continuum spectrum was not due to scattered visible light that passed the Al filter. A high voltage helium pinch discharge spectrum showed only He atomic and ion lines which were used to wavelength calibrate the spectrum. Thus, the high-energy light was confirmed to be a real signal. The radiation of energy of about 125 eV is not possible due to field acceleration since the maximum applied voltage was less than 8 V; moreover, no know chemical reaction can release more than a few eV's. The nascent $H_2O$ molecule may serve as a catalyst by accepting 81.6 eV (m=3) to form an intermediate that decays with the emission of a continuum band having an energy cutoff of $9^2\cdot13.6$ eV=122.4 eV and a short wavelength cutoff of $$\lambda_{\left(H\rightarrow H\left[\frac{a_H}{p=m+1}\right]\right)} = \frac{91.2}{3^2}\ \text{nm} = 10.1\ \text{nm}. \qquad \text{(Eqs. (32-33))}$$

The continuum radiation band in the 10 nm region and going to longer wavelengths matched the theoretically predicted transition of H to the hydrino state H(1/4) according to Eqs. (43-47).

G. Water Arc Plasma Power Source Based on the Catalysis of H by HOH Catalyst The $H_2O$ arc plasma system comprised an energy storage capacitor connected between a copper baseplate-and-rod electrode and a concentric outer copper cylindrical electrode that contained water wherein the rod of the baseplate-and-rod electrode was below the water column. The rod was embedded in a Nylon insulator sleeve in the cylindrical electrode section and a Nylon block between the baseplate and the cylinder. A column of tap water stood between the center rod electrode and the outer cylindrical and circumferential electrode. A capacitor bank comprising six capacitors (115 nF, ±10% 20 kV DC, model M104A203B000) connected in parallel by two copper plates with one lead connected to ground and the other lead connected to the base plate of the water arc cell. The capacitor bank was charged by a high voltage power supply (Universal Voltronics, 20 kV DC, Model 1650R2) through a connection having a 1 Mohm resistor and discharged by an atmospheric-air switch that comprised stainless steel electrodes. The high voltage was in the range of about −8 kV to −14 kV. Exemplary parameters for 4 ml of $H_2O$ in the open cell that was tested were a capacitance of about 0.68 μF, an intrinsic resistance of about 0.3Ω, a cylindrical electrode inner diameter (ID) and depth of 0.5 inches and 2.5 inches, respectively, a rod outer diameter (OD) of ¼ inches, a distance between cylindrical electrode and center rod of ⅛", a charging voltage of about −8 kV to −14 kV, and the circuit time constant of about 0.2 μs. $H_2O$ ignition to form hydrinos at a high rate was achieved by the triggered water arc discharge wherein the arc caused the formation of atomic hydrogen and HOH catalyst that reacted to form hydrinos with the liberation of high power. The high power was evident by the production of a supersonic ejection of the entire $H_2O$ content 10 feet high into the laboratory wherein the ejected plume impacted the ceiling.

Calorimetry was performed using a Parr 1341 plain-jacketed calorimeter with a Parr 6775A data logging dual channel digital thermometer and a Parr 1108 oxygen combustion chamber that was modified to permit initiation of the chemical reaction with high current. Copper rod ignition electrodes leads that comprised ¼" outer diameter (OD) copper cylinders were fed through the sealed chamber and connected to the arc cell electrodes. The $H_2O$ arc plasma cell was placed inside the Parr bomb cell submerged under 200 g water added inside with the remainder of the volume filled with air. The calorimeter water bath was loaded with 1800 g tap water (the total $H_2O$ was 2,000 as per Parr manual), and the bomb cell was submerged in this water reservoir. The charging voltage of the capacitor was measured by a high voltage probe (CPS HVP-252 0252-00-0012 calibrated to within 0.02% of a NIST reference probe) and displayed by a NIST traceable calibrated Fluke 45 digital multimeter. The charging voltage of the capacitor measured with the Fluke was confirmed by a high voltage probe (Tektronix 6015) and displayed by an oscilloscope. The input energy to the water arc cell plasma was calculated by $$E_{input} = \frac{1}{2}CV^2,$$

where C is the capacitance of the capacitor bank and V is the voltage before discharge of the capacitors. The temperature of the bath was measured by a thermistor probe, which was immersed in water.

The heat capacity of the calorimeter was calibrated by heating the bath with a resistor (10 Ohm) and a DC constant power supply. It was also calibrated with the same resistor and the discharge current from the capacitor bank.

The calorimeter heat capacity was determined to be 10300 J/K. In our experiment, the input energy was about 500 J with C=0.68 uF and V=−12 kV for 10 discharges. The corresponding output energy was about 800 J.

What is claimed is:

1. A power system that generates at least one of direct electrical energy and thermal energy comprising:

at least one vessel;

a reaction mixture comprising reactants comprising a mixture of a metal, a metal oxide, and $H_2O$, wherein the reaction mixture does not comprise $CO_2$, CO, $SO_2$, or $NO_2$, and the metal is at least one of the group of CU, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In;

at least one set of electrodes, wherein the reaction mixture completes the circuit between the electrodes, a source of electrical power connected to the electrodes and configured to deliver current electrical energy to the reactant mixture to produce light and thermal output from the reaction mixture, wherein the light and thermal output are optionally converted into blackbody radiation;

a reloading system;

at least one system to regenerate metal from the metal oxide, and at least one photovoltaic converter configured to convert the light and/or blackbody radiation into electrical energy.

2. The power system of claim 1 wherein the reactants further comprise at least one of $O_2$, HOOH, $OOH^-$, peroxide ion, superoxide ion, hydride, $H_2$, a halide, an oxyhydroxide, a hydroxide, a hydrated compound, a hydrated compound selected from the group of at least one of a halide, an oxide, an oxyhydroxide, and a hydroxide.

3. The power system of claim 1 further comprising a hygroscopic material wherein the hygroscopic material comprises at least one of the group of lithium bromide, calcium chloride, magnesium chloride, zinc chloride, potassium carbonate, potassium phosphate, carnallite such as $KMgCl_3 \cdot 6(H_2O)$, ferric ammonium citrate, potassium hydroxide and sodium hydroxide and concentrated sulfuric and phosphoric acids, cellulose fibers, sugar, caramel, honey, glycerol, ethanol, methanol, diesel fuel, methamphetamine, a fertilizer chemical, a salt, a desiccant, silica, activated charcoal, calcium sulfate, calcium chloride, a molecular sieves, a zeolite, a deliquescent material, zinc chloride, calcium chloride, potassium hydroxide, sodium hydroxide and a deliquescent salt.

4. The power system of claim 1 wherein the current electrical energy delivered to the reaction mixture comprises at least one of the following:

a voltage selected to cause a high AC, DC, or an AC-DC mixture of current that is in the range of 100 A to 1,000,000 A;

a DC or peak AC current density in the range of 100 $A/cm^2$ to 1,000,000 $A/cm^2$;

a DC or peak AC voltage determined by the current times the resistance of the reaction mixture from about 0.1 V to 500 KV; and an AC frequency in the range of about 0.1 Hz to 10 GHz.

5. The power system of claim 1 wherein the regeneration system comprises at least one of a hydration, thermal, chemical, and electrochemical system.

6. The power system of claim 1, wherein the photovoltaic power converter includes a photon-to-electric power converter.

7. The power system of claim 1, wherein the photovoltaic power converter comprises a concentrated photovoltaic device.

8. The power system of claim 1, wherein the photovoltaic power converter includes a plurality of multi junction photovoltaic cells.

9. The power system of claim 1, further comprising an output power conditioner operably coupled to the photovoltaic power converter; and an output power terminal operably coupled to the output power conditioner.

10. The power system of claim 1, further comprising an inverter.

11. The power system of claim 1, further comprising an energy storage device.

* * * * *